US009954126B2

(12) United States Patent
Smith et al.

(10) Patent No.: US 9,954,126 B2
(45) Date of Patent: Apr. 24, 2018

(54) THREE-DIMENSIONAL PHOTOVOLTAIC DEVICES INCLUDING CAVITY-CONTAINING CORES AND METHODS OF MANUFACTURE

(71) Applicant: Q1 Nanosystems Corporation, El Dorado Hills, CA (US)

(72) Inventors: Robert Smith, Placerville, CA (US); Larry Bawden, El Dorado Hills, CA (US); John Bohland, Folsom, CA (US)

(73) Assignee: Q1 NANOSYSTEMS CORPORATION, El Dorado Hills, CA (US)

( * ) Notice: Subject to any disclaimer, the term of this patent is extended or adjusted under 35 U.S.C. 154(b) by 309 days.

(21) Appl. No.: 14/872,580

(22) Filed: Oct. 1, 2015

(65) Prior Publication Data
US 2016/0043251 A1   Feb. 11, 2016

Related U.S. Application Data

(63) Continuation-in-part of application No. 13/866,387, filed on Apr. 19, 2013, now abandoned, which is a
(Continued)

(51) Int. Cl.
*H01L 31/0352* (2006.01)
*H01L 31/18* (2006.01)
(Continued)

(52) U.S. Cl.
CPC .. *H01L 31/03529* (2013.01); *H01L 31/02366* (2013.01); *H01L 31/0392* (2013.01);
(Continued)

(58) Field of Classification Search
CPC ........... H01L 31/03529; H01L 31/0547; H01L 31/056; H01L 31/035227; H01L 31/0392; H01L 31/068; H02S 20/23
See application file for complete search history.

(56) References Cited

U.S. PATENT DOCUMENTS 3,150,999 A   9/1964  Rudenberg et al.
3,969,746 A   7/1976  Kendall et al.
(Continued)

FOREIGN PATENT DOCUMENTS

CN   1855552 A   11/2006
EP   1 703 569 A2   9/2006
(Continued)

OTHER PUBLICATIONS

Extended European Search Report issued for European Patent Application No. 14769607.4-1504 dated Jan. 2, 2017.
(Continued)

*Primary Examiner* — Nahida Sultana
(74) *Attorney, Agent, or Firm* — The Marbury Law Group, PLLC

(57) ABSTRACT

Various stamping methods may reduce defects and increase throughput for manufacturing metamaterial devices. Metamaterial devices with an array of photovoltaic bristles, and/or vias, may enable each photovoltaic bristle to have a high probability of photon absorption. The high probability of photon absorption may lead to increased efficiency and more power generation from an array of photovoltaic bristles. Reduced defects in the metamaterial device may decrease manufacturing cost, increase reliability of the metamaterial device, and increase the probability of photon absorption for a metamaterial device. The increase in manufacturing throughput and reduced defects may reduce manufacturing costs to enable the embodiment metamaterial devices to reach grid parity.

14 Claims, 81 Drawing Sheets

Related U.S. Application Data continuation-in-part of application No. 13/830,295, filed on Mar. 14, 2013, now abandoned.

(51) Int. Cl.

| | | |
|---|---|---|
| *H01L 31/0236* | (2006.01) | |
| *H01L 31/0392* | (2006.01) | |
| *H01L 31/068* | (2012.01) | |
| *H01L 31/075* | (2012.01) | |
| *H01L 31/056* | (2014.01) | |
| *H02S 20/23* | (2014.01) | |
| *H01L 31/054* | (2014.01) | |

(52) U.S. Cl.
CPC .... *H01L 31/035227* (2013.01); *H01L 31/056* (2014.12); *H01L 31/0547* (2014.12); *H01L 31/068* (2013.01); *H01L 31/075* (2013.01); *H01L 31/18* (2013.01); *H02S 20/23* (2014.12); *Y02B 10/12* (2013.01); *Y02E 10/52* (2013.01); *Y02E 10/547* (2013.01); *Y02E 10/548* (2013.01)

(56) References Cited

U.S. PATENT DOCUMENTS

| | | |
|---|---|---|
| 4,099,986 A | 7/1978 | Diepers |
| RE29,833 E | 11/1978 | Mlavsky |
| 4,155,781 A | 5/1979 | Diepers |
| 4,234,352 A | 11/1980 | Swanson |
| 4,454,372 A | 6/1984 | Appleby |
| 4,500,408 A | 2/1985 | Boys et al. |
| 4,816,082 A | 3/1989 | Guha et al. |
| 5,178,685 A | 1/1993 | Borenstein et al. |
| 5,238,519 A | 8/1993 | Nath et al. |
| 5,371,470 A | 12/1994 | Jeng |
| 5,411,897 A | 5/1995 | Harvey et al. |
| 5,476,553 A | 12/1995 | Hanoka et al. |
| 5,916,375 A | 6/1999 | Agui et al. |
| 5,928,439 A | 7/1999 | Ota et al. |
| 6,033,928 A | 3/2000 | Eriguchi et al. |
| 6,087,197 A | 7/2000 | Eriguchi et al. |
| 6,337,283 B1 | 1/2002 | Verlinden et al. |
| 6,372,538 B1 | 4/2002 | Wendt et al. |
| 6,372,980 B1 | 4/2002 | Freundlich |
| 6,383,923 B1 | 5/2002 | Brown et al. |
| 6,423,568 B1 | 7/2002 | Verlinden et al. |
| 6,448,105 B1 | 9/2002 | Sterk |
| 6,468,828 B1 | 10/2002 | Glatfelter et al. |
| 6,518,494 B1 | 2/2003 | Shibuya et al. |
| 6,548,751 B2 | 4/2003 | Sverdrup, Jr. et al. |
| 6,559,479 B1 | 5/2003 | Ludemann |
| 6,583,349 B2 | 6/2003 | Tanaka |
| 6,620,996 B2 | 9/2003 | Sugawara et al. |
| 6,638,823 B2 | 10/2003 | Cho et al. |
| 6,649,824 B1 | 11/2003 | Den et al. |
| 6,660,930 B1 | 12/2003 | Gonsiorawski |
| 6,716,017 B2 | 4/2004 | Papadopoulas |
| 6,852,920 B2 | 2/2005 | Sager et al. |
| 6,872,450 B2 | 3/2005 | Liu et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,946,597 B2 | 9/2005 | Sager et al. |
| 7,051,945 B2 | 5/2006 | Empedocles et al. |
| 7,064,372 B2 | 6/2006 | Duan et al. |
| 7,067,867 B2 | 6/2006 | Duan et al. |
| 7,083,104 B1 | 8/2006 | Empedocles et al. |
| 7,135,350 B1 | 11/2006 | Smith et al. |
| 7,253,017 B1 | 8/2007 | Roscheisen et al. |
| 7,265,037 B2 | 9/2007 | Yang et al. |
| 7,589,880 B2 | 9/2009 | Kempa et al. |
| 7,649,665 B2 | 1/2010 | Kempa et al. |
| 7,686,606 B2 | 3/2010 | Harper et al. |
| 7,754,964 B2 | 7/2010 | Kempa et al. |
| 7,847,180 B2 | 12/2010 | Argo et al. |
| 7,943,847 B2 | 5/2011 | Kempa et al. |
| 2002/0011641 A1 | 1/2002 | Oswald et al. |
| 2002/0084503 A1 | 7/2002 | Lee et al. |
| 2002/0130311 A1 | 9/2002 | Lieber et al. |
| 2002/0175408 A1 | 11/2002 | Majumdar et al. |
| 2003/0041894 A1 | 3/2003 | Sverdrup, Jr. et al. |
| 2004/0018525 A1 | 1/2004 | Wirtz et al. |
| 2004/0025933 A1 | 2/2004 | Chittibabu et al. |
| 2004/0025934 A1 | 2/2004 | Chittibabu et al. |
| 2004/0060591 A1 | 4/2004 | Den |
| 2004/0063320 A1 | 4/2004 | Hollars |
| 2004/0075464 A1 | 4/2004 | Samuelson et al. |
| 2004/0112421 A1 | 6/2004 | Spivack et al. |
| 2004/0123896 A1 | 7/2004 | Lemmon et al. |
| 2004/0144420 A1 | 7/2004 | Takeyama et al. |
| 2004/0144985 A1 | 7/2004 | Zhang et al. |
| 2004/0146560 A1 | 7/2004 | Whiteford et al. |
| 2004/0250848 A1 | 12/2004 | Sager et al. |
| 2005/0040374 A1 | 2/2005 | Chittibabu et al. |
| 2005/0079659 A1 | 4/2005 | Duan et al. |
| 2005/0098204 A1 | 5/2005 | Roscheisen et al. |
| 2005/0098205 A1 | 5/2005 | Roscheisen et al. |
| 2005/0121068 A1 | 6/2005 | Sager et al. |
| 2005/0126628 A1 | 6/2005 | Scher et al. |
| 2005/0161662 A1 | 7/2005 | Majumdar et al. |
| 2005/0181587 A1 | 8/2005 | Duan et al. |
| 2005/0189015 A1 | 9/2005 | Rohatgi et al. |
| 2005/0217717 A1 | 10/2005 | Faris |
| 2005/0224790 A1 | 10/2005 | Jin et al. |
| 2006/0006463 A1 | 1/2006 | Islam et al. |
| 2006/0024438 A1 | 2/2006 | Ku et al. |
| 2006/0038182 A1 | 2/2006 | Rogers et al. |
| 2006/0151820 A1 | 7/2006 | Duan et al. |
| 2006/0207647 A1 | 9/2006 | Tsakalakos et al. |
| 2007/0025139 A1 | 2/2007 | Parsons |
| 2007/0029561 A1 | 2/2007 | Cho et al. |
| 2007/0036951 A1 | 2/2007 | Nguyen et al. |
| 2007/0137697 A1 | 6/2007 | Kempa et al. |
| 2007/0200192 A1* | 8/2007 | Shinohara ............. H01L 31/076 257/448 |
| 2007/0235714 A1 | 10/2007 | Kwon et al. |
| 2007/0240757 A1 | 10/2007 | Ren et al. |
| 2008/0106001 A1 | 5/2008 | Slafer |
| 2008/0191371 A1 | 8/2008 | Matsuyama |
| 2008/0251122 A1 | 10/2008 | Ready |
| 2008/0299247 A1 | 12/2008 | Ogino et al. |
| 2009/0194160 A1 | 8/2009 | Chin et al. |
| 2009/0211637 A1 | 8/2009 | Eaglesham |
| 2009/0250105 A1 | 10/2009 | Lee |
| 2010/0112748 A1 | 5/2010 | Vidu et al. |
| 2010/0258163 A1 | 10/2010 | Zheng et al. |
| 2010/0319759 A1 | 12/2010 | Fisher et al. |
| 2011/0036395 A1 | 2/2011 | Argo et al. |
| 2011/0214709 A1 | 9/2011 | Evelsizer et al. |
| 2011/0277827 A1 | 11/2011 | Yang et al. |
| 2011/0308564 A1 | 12/2011 | Kempa et al. |
| 2012/0031454 A1 | 2/2012 | Fogel et al. |
| 2012/0032168 A1 | 2/2012 | Cho et al. |
| 2012/0055536 A1 | 3/2012 | Saito et al. |
| 2012/0132930 A1* | 5/2012 | Young ................. H01L 31/0481 257/84 |
| 2012/0152888 A1 | 6/2012 | Jeong et al. |
| 2014/0261612 A1* | 9/2014 | Smith ............. H01L 31/035281 136/244 |
| 2014/0302190 A1 | 10/2014 | Hsu |
| 2015/0318432 A1* | 11/2015 | Zhang ............... H01L 21/02422 438/57 |
| 2016/0071990 A1* | 3/2016 | Smith ............... H01L 31/02366 438/95 |
| 2016/0163913 A1* | 6/2016 | Gonzalez ............ H01L 31/1876 29/846 |

FOREIGN PATENT DOCUMENTS

| | | |
|---|---|---|
| JP | 53-31987 | 3/1978 |
| JP | 3-151672 A | 6/1991 |
| JP | 4-296060 A | 10/1992 |

(56) References Cited

FOREIGN PATENT DOCUMENTS

| | | | |
|---|---|---|---|
| JP | 6104463 A | 4/1994 | |
| JP | 6-342924 A | 12/1994 | |
| JP | 9-118511 | 5/1997 | |
| JP | 9237907 A | 9/1997 | |
| JP | 2006261666 A2 | 9/2006 | |
| JP | 2010-027981 A | 2/2010 | |
| JP | 2010027981 A | 2/2010 | |
| JP | 2011-166091 A | 8/2011 | |
| JP | 2011-222774 A | 11/2011 | |
| KR | 2005-0004360 | 1/2005 | |
| KR | 10-1203116 B1 | 11/2012 | |
| WO | 2004/044948 A2 | 5/2004 | |
| WO | 2007/040594 A2 | 4/2007 | |
| WO | 2008/048233 A2 | 4/2008 | |
| WO | 2010/151556 A1 | 12/2010 | |
| WO | 2012/061266 A2 | 5/2012 | |

OTHER PUBLICATIONS

Communication pursuant to Rules 70(2) and 70a(2) EPC issued for European Patent Application No. 14769607.4-1504 dated Jan. 19, 2017.
Chinese Office Action issued for Chinese Application No. 201480027502.1; dated Jul. 8, 2016.
Notification Concerning Transmittal of International Preliminary Report on Patentability issued in International Application No. PCT/US2014/028383 dated Sep. 24, 2015.
International Search Report and Written Opinion received for International Application No. PCT/US2014/028383, dated Jul. 18, 2014.
Indium Tin Oxide; Material Property Database; http://mit.edu/~6.777/matprops/Ito.htm; accessed May 14, 2014.
John David Jackson; Professor of Physics, University of Illinois; Classical Electrodynamics; John Wiley & Sons, Inc.1998.
Optical Constants of IN O—SnO (ITO, Indium Tin Oxide); Refractive index of In2O3—SnO2 (ITO, Indium tin oxide) [Crystals etc.]—Refractive Index INFO; http://refractiveindex.info/legacy/?group=CRYSTALS&material=ITO; accessed on May 14, 2014.
Optical Constants of ZnO (Zinc Oxide); Refractive index of IZnO (Zinc Oxide) [CRYSTALS etc.]—Refractive Index INFO; http://refractiveindex.info/legacy/?group=CRYSTALS&material=ZnO; accessed on May 14, 2014.
Jeong-Eun Kim et al.; Electrical and Optical Properties of Zinc Oxide Thin Films Deposited Using Atomic Layers Deposition; Journal of the Korean Ceramic Society; vol. 47, No. 4, pp. 353-356; 2010.
Darius Snieckus, "A Different Dimension", US Solar, innovation; www.rechargenews.com; Feb. 4, 2011.
Kayes et al., "Comparison of the device physics principles of planar and radial p-n junction nanorod solar cells" Journal of Applied Physics 97, American Institute of Physics 2005.
Kayes, Brendan "Radial P—N Junction Nanorod Solar Cells" Applied Physics Candidacy Presentation Sep. 7, 2004.
Final Office Action Summary from U.S. Appl. No. 12/508,815 dated May 30, 2012.
Non-Final Office Action Summary from U.S. Appl. No. 12/911,657 dated Feb. 6, 2012.
Restriction/Election Requirement from U.S. Appl. No. 12/508,815 dated Aug. 2, 2011.
PCT International Preliminary Report on Patentability from application No. PCTIUS2010/039552 dated Jan. 12, 2012.
"Konarka: Vision and Mission" 2011 Konarka Technologies, Inc., www.konarkatech.com/aboutl, 2 pages.
Glaeser, Andreas M., "Model studies of Rayleigh instabilities via microdesigned interfaces," Lawrence Berkeley National Laboratory, Oct. 17, 2000, 39 pages.
Non-Final Office Action Summary from U.S. Appl. No. 12/508,815 dated Nov. 10, 2011.
Sharma et al., "Diameter control of Ti-catalyzed silicon nanowires," 2004 Elsevier B.V., Journal of Crystal Growth, vol. 267, www.sciencedirect.com, pp. 613-618.
PeriodicTable.com, Technical Data for Palladium, available at http://www.periodictable.com/Elements/046/data.html, last visited Nov. 18, 2009.
Restriction Requirement from U.S. Appl. No. 12/911,657 dated Sep. 1, 2011.
Office Action Summary from Japanese Application No. 2008-540018 dated Oct. 4, 2011 (no translation).
Office Action Summary from Japanese Application No. 2008-540017 dated Sep. 27, 2011 (no translation).
Rumpler, Jr., "Optoelectric Integration Using the Magnetically Assisted Statistical Assembly Technique: Initial Magnetic Characterization and Process Development," MIT Thesis, Department of Electrical Engineering and Computer Science, Sep. 5, 2002, 102 pages.
Notice of Allowance and Fee(s) Due from U.S. Appl. No. 11/466,411 dated Oct. 6, 2010.
International Preliminary Report of Patentability from PCT Application No. PCT/US06/32987 dated Jul. 22, 2009.
International Search Report and Written Opinion from PCT Application No. PCT/US06/32986 dated Sep. 10, 2008.
Peng et al., "Aligned Singel-Crystalline Si Nanowire Arrays for Photovoltaic Applications" www3.interscience.wiley.com/journal/111081086/abstract?CRETRY=1&SRETRY=>.
Gaire et al., "Mechanical Testing of Isolated Amorphous Silicon Slanted Nanorods" Journal of Nanoscience and Nanotechnology, vol. 5,1893-1897, 2005.
Kayes et al., "Synthesis and Characterization of Silicon Nanorod Arrays for Solar Cell Applications", Cal Tech Disclosure; May 19, 2006.
Y. Zhang et al., "Coaxial Nanocable: Silicon Carbide and Silicon Oxide Sheathed with Boron Nitride and Carbon", www.sciencemag.org, Science vol. 281, Aug. 14, 1998.
PeriodicTable.com, Technical Data for Gold, available at http://www.peridioctable.com/Elements/079/data.html(last visited Nov. 18, 2009).
PeriodicTable.com, Technical Data for Tellurium, available at http://www.periodictable.com/Elements/052/data.html (last visited Nov. 18, 2009).
Encyclopedia Britannica, Shear Modulus, available at http://www.britannica.com/EBchecked/topic/539275/shear-modulus (last visited Feb. 25, 20103).
Stroeve et al. 2004, Fabrication of Nanocables by Electrochemical Depostiion Inside Metal Nanotubes, J. Am. Chem. Soc., 2004, 126: 15022-15023.
Stroeve et al. 2005, Modeling Electrochemcial Deposition inside Nanotubes to Obtain Metal-Semiconductor Multiscale Nanocables or Concial Nanopores, J. Phys. Chem. B, 2005, 109: 14523-14528.
Xia et al., Ag Nanowires Coated with Ag/Pd Alloy Sheaths and Their Use as Substrates for Reversible Absorption and Desportion of Hydrogen, J. Am. Chem. Soc. 2004, 126: 5940-5941.
PeriodicTable.com, Technical Data for Silver, available at http://www.peridioctable.com/Elements/047/data.html (last visited Nov. 18, 2009).
Solar Electrical System Sizing Sheet, Go Solar®, www.solarexpert.com/Pvinsolation.html, downloaded Mar. 2, 2011.
Karpov et al., "Physics of CdTe Photovoltaics: From Front to Back," Invited talk F10.1, MRS Spring Meeting 2005, Mar. 28-Apr. 1, San Francisco, CA, pp. 1-12.
Kayes et al., "Radial PN Junction Nanorod Solar Cells: Device Physics Principles and Routes to Fabrication in Silicon," Photovoltaic Specialists Conference, Aug. 8, 2005.
Non-Final Office Action Summary from U.S. Appl. No. 11/466,416 dated Feb. 17, 2012.
Final Office Action Summary from U.S. Appl. No. 11/466,416 dated May 26, 2011.
Restriction Requirement from U.S. Appl. No. 11/466,411 dated Jun. 24, 2009.
Restriction Requirement from U.S. Appl. No. 11/466,411 dated Nov. 9, 2009.

(56) References Cited

OTHER PUBLICATIONS

Non-Final Office Action Summary from U.S. Appl. No. 11/466,411 dated Nov. 27, 2009.
Non-Final Office Action Summary from U.S. Appl. No. 11/466,416 dated Dec. 23, 2010.
International Search Report and Written Opinion from PCT Application No. PCT/US2010/039552 dated Aug. 18, 2010.
Restriction Requirement from U.S. Appl. No. 11/466,416 dated Aug. 5, 2009.
Non-Final Office Action Summary from U.S. Appl. No. 11/466,416, dated Dec. 9, 2009.
Final Office Action Summary from U.S. Appl. No. 11/4466,411, dated Jun. 8, 2010.
International Search Report and Written Opinion from PCT Application No. PCT/US06/32987 dated Jul. 18, 2008.
Wagner et al., Band-gap narrowing in heavily doped silicon: a comparison of optical and electrical data, Journal of Applied Physics, vol. 63, No. 2, pp. 425-429, Jan. 15, 1998.

\* cited by examiner

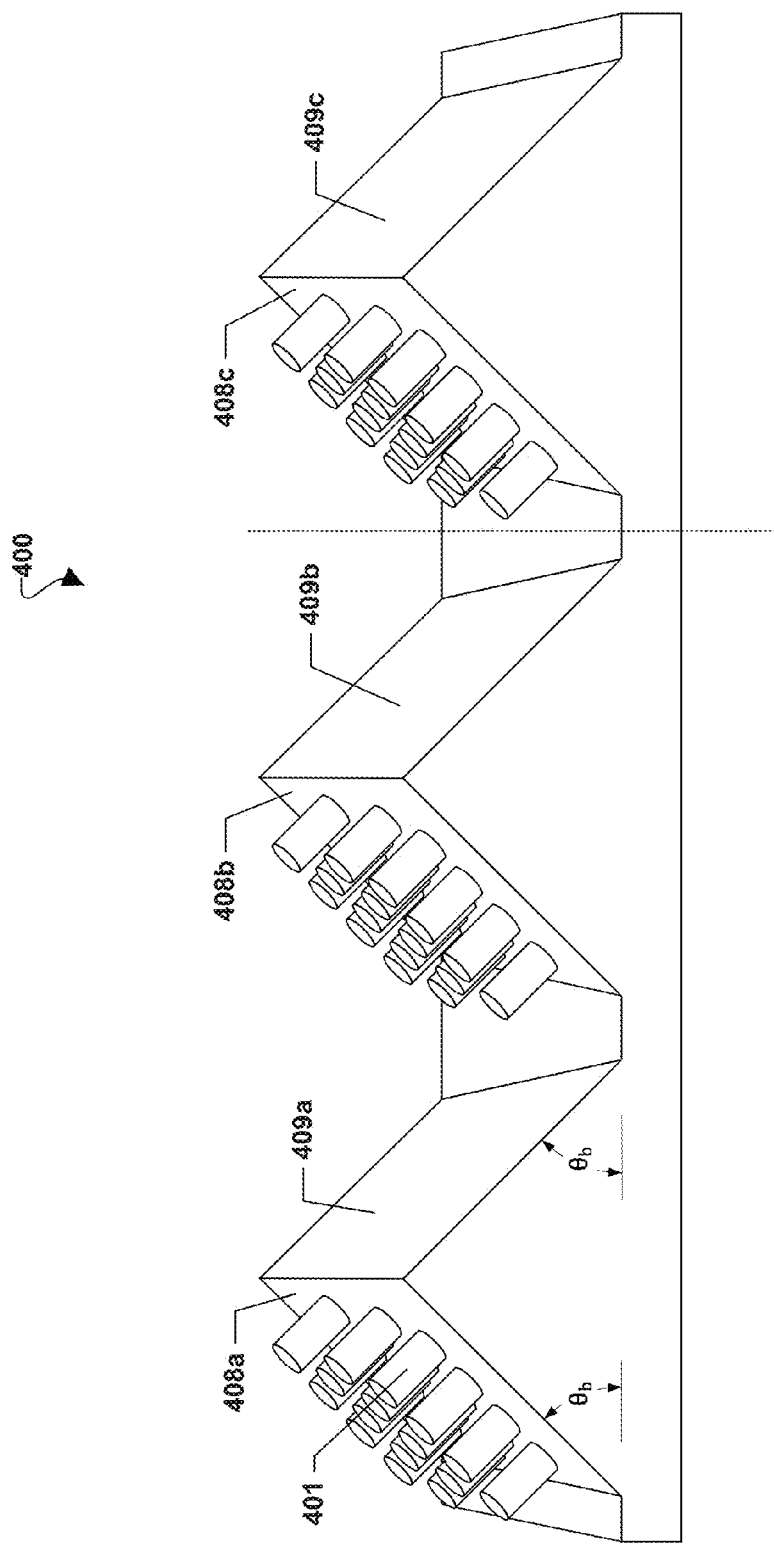

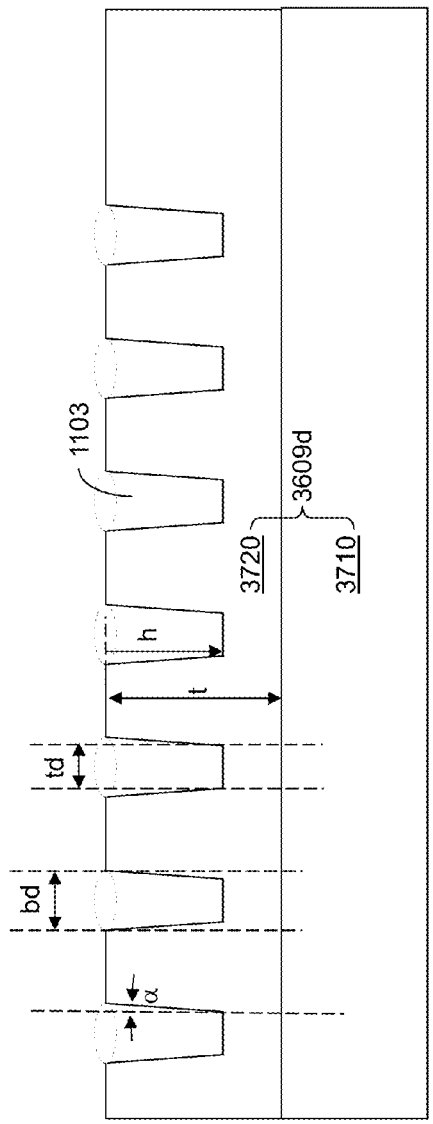
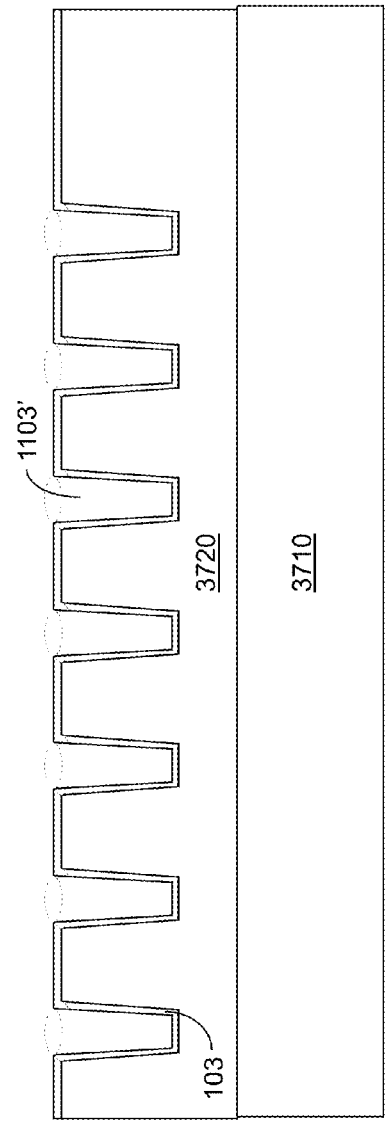

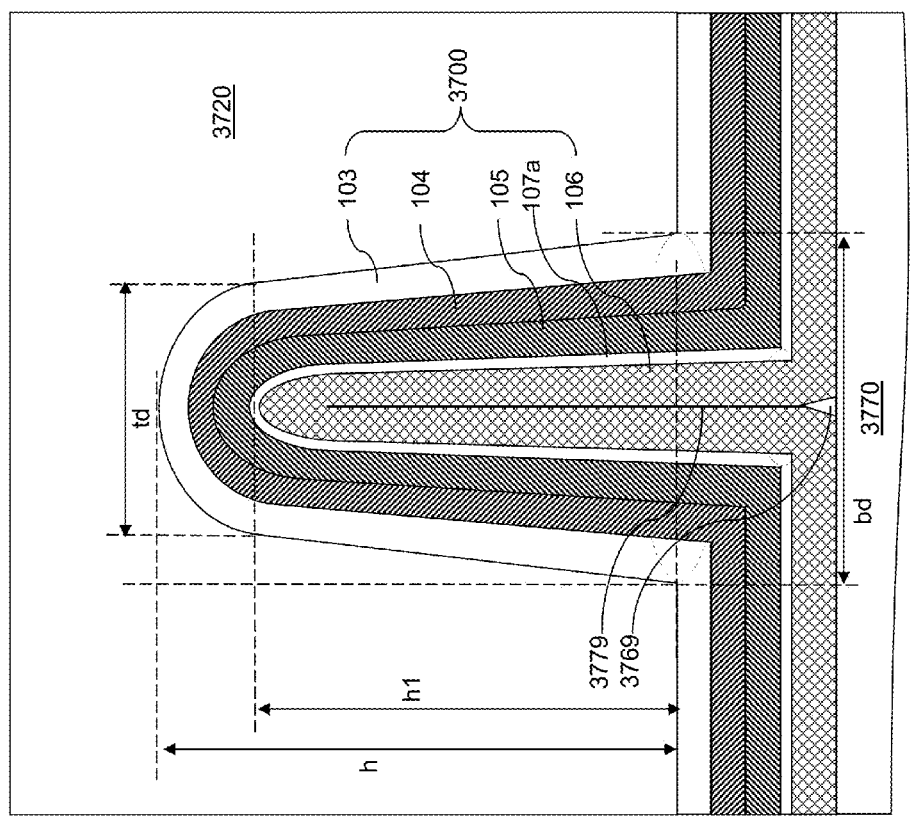

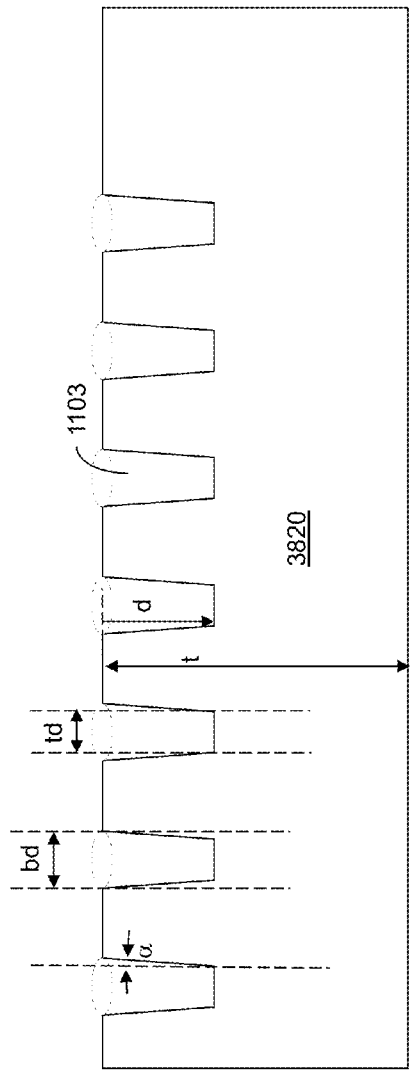
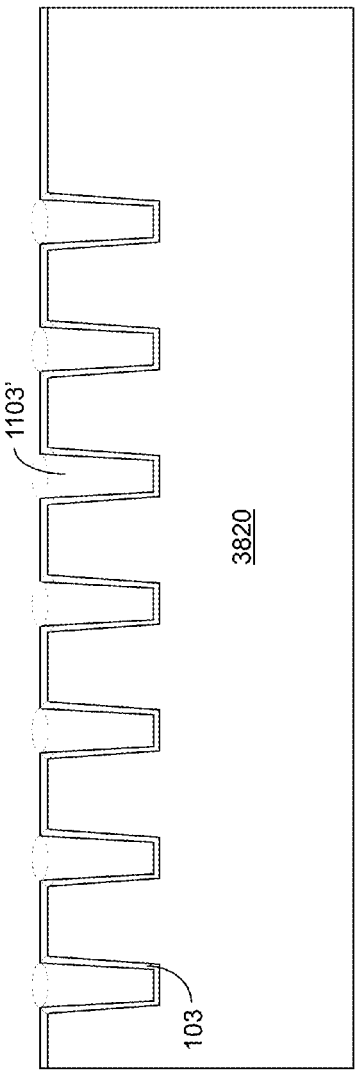

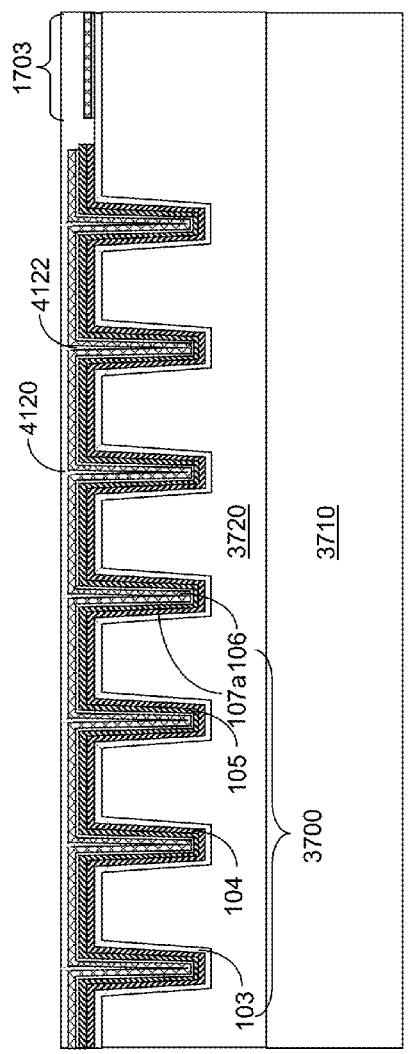
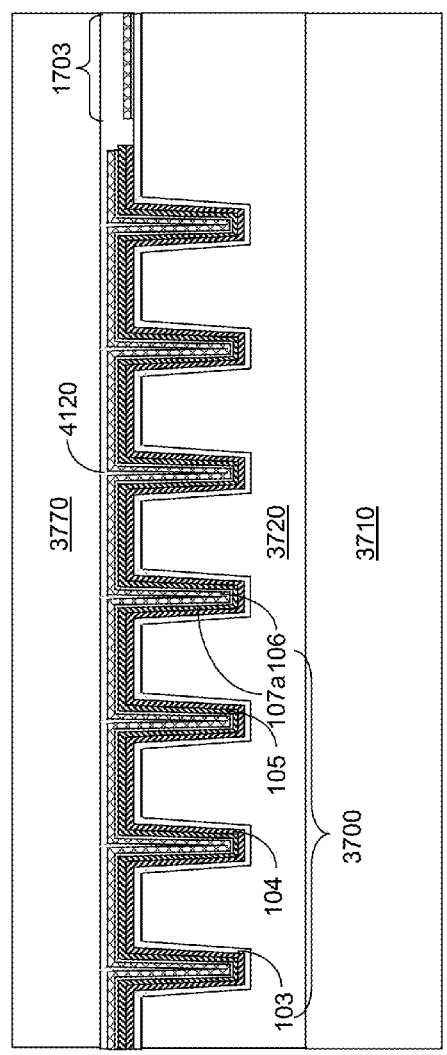
FIG. 41A
FIG. 41B

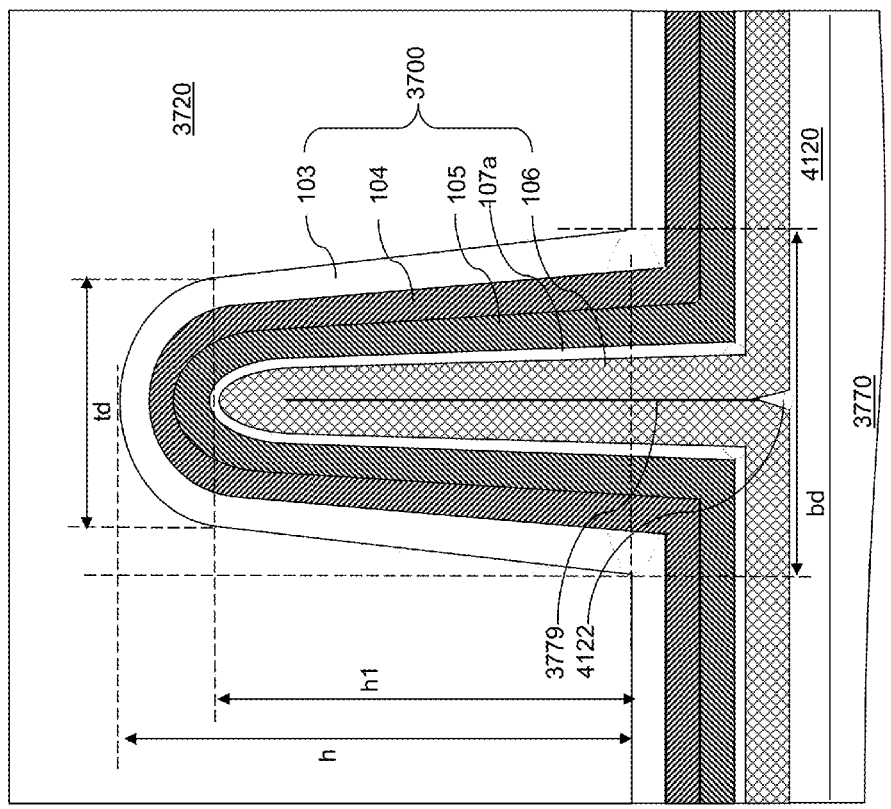

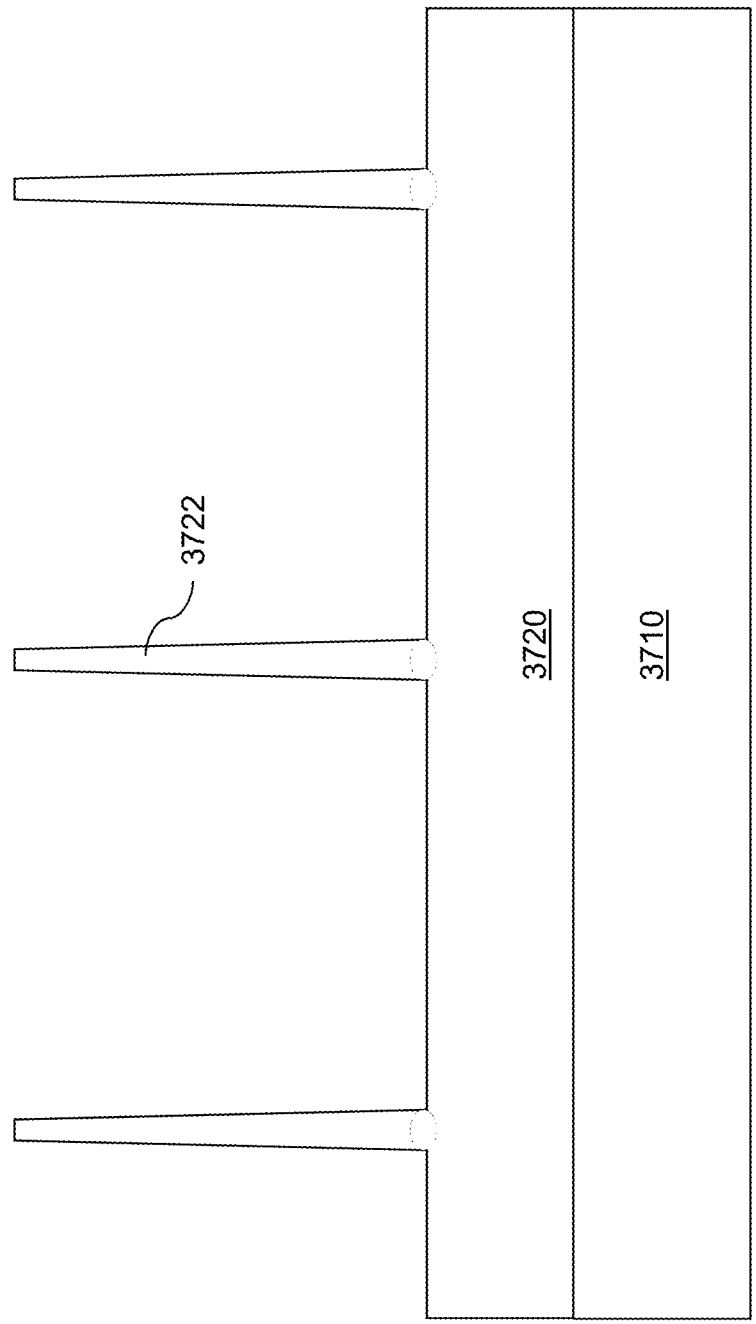

THREE-DIMENSIONAL PHOTOVOLTAIC DEVICES INCLUDING CAVITY-CONTAINING CORES AND METHODS OF MANUFACTURE

RELATED APPLICATIONS

This application is a continuation-in-part of U.S. patent application Ser. No. 13/866,387 entitled "Methods for Manufacturing Three Dimensional Metamaterial Devices with Photovoltaic Bristles" and filed on Apr. 19, 2013, which is a continuation-in-part of U.S. patent application Ser. No. 13/830,295 entitled "Methods for Manufacturing Three Dimensional Metamaterial Devices with Photovoltaic Bristles" and filed on Mar. 14, 2013, the entire contents of which are hereby incorporated by reference. This application is also related to U.S. patent application Ser. No. 13/751,914, entitled "Three-Dimensional Metamaterial Device with Photovoltaic Bristles" filed Jan. 28, 2013, the entire contents of which are hereby incorporated by reference for purposes of disclosing dimensions, materials and configurations of photovoltaic bristles that may be manufactured by the embodiment processes disclosed herein.

FIELD

This application generally relates to photovoltaic devices, and more specifically to the methods of manufacturing photovoltaic cells featuring a large number of photovoltaic bristles.

BACKGROUND

Solar power is a popular clean energy, but it is generally more expensive than its fossil fuel competitors (e.g., oil, coal, and natural gas) and other traditional energy sources (e.g., hydropower). Typically, solar energy is relatively expensive because traditional photovoltaic cells with a planar configuration have generally low total efficiency. Total efficiency is based upon the total power produced from a solar panel throughout the day as the sun transits across the sky. Total efficiency is different from the theoretical efficiency, which is the fraction of light energy converted to electricity by the photovoltaic cells with a zero angle of incidence (e.g., the instant when the sun is directly above the metamaterial). Thus, a high total efficiency photovoltaic cell is needed to make solar energy cost-competitive with fossil fuels and traditional energy sources.

SUMMARY

The various embodiment methods of manufacturing and assembling may be used to produce photovoltaic cells formed from a plurality of photovoltaic bristles whose photovoltaic and conductive materials are configured to exhibit a high probability of photon absorption and internal reflection. As a result of the high probability of photon absorption and internal photon reflections, the photovoltaic cells of photovoltaic bristles exhibit high total efficiency in converting light energy into electrical energy. The high total efficiency of the embodiment photovoltaic cells may lead to increased efficiency and more power generation from the photovoltaic cell.

In various embodiments, printing techniques may be used to ensure high throughput and low defects in manufacturing the metamaterial device. The high throughput and low defects may reduce the manufacturing cost to enable the embodiment metamaterial devices to reach grid parity. In various embodiments, arrays of cores or vias may be manufactured from an original master template. An embodiment roll-to-web system and method may create daughter templates or master webs from the original master template to protect the original master template from repeat processing, thereby reducing defects. An embodiment web-to-plate system and method may create an array of cores or vias on a substrate from the master web. The master web, or plate, may be subjected to further processing (depositing photovoltaic layers, conductive layers, etc.) to create the embodiment metamaterial device.

In various embodiments, a system for manufacturing a photovoltaic structure is provided, which may include a web-to-plate system configured to imprint a die including a pattern of protruding structures onto a moldable material layer to generate a pattern of trenches extending downward from a top surface of the moldable material layer. The die may be incorporated into a web. The system may further include a deposition system configured to sequentially deposit a transparent conductive material layer, a photovoltaic material layer, and a core conductive material layer within the pattern of trenches in the moldable material layer.

Various embodiments include a method of manufacturing a metamaterial. In some embodiments a moldable material layer may be provided on, or in, a substrate. A die including a pattern of protruding structures and incorporated into a web may be imprinted onto the moldable material layer to generate a pattern of trenches extending downward from a top surface of the moldable material layer. A transparent conductive material layer, a photovoltaic material layer, and a core conductive material layer may be sequentially deposited within the pattern of trenches in the moldable material layer.

Various embodiments may include a photovoltaic structure. The photovoltaic structure includes a dielectric material layer comprising a planar portion having a uniform thickness and an array of protruding portions extending from a planar surface of the planar portion. The photovoltaic structure further comprises a layer stack located on the dielectric material layer and comprising a core conductive material layer, a photovoltaic material layer, and a transparent conductive material layer. The core conductive material layer is in contact with the planar surface and the protruding portions of the dielectric material layer. The transparent conductive material layer is spaced from the core conductive material layer by the photovoltaic material layer. Each combination of a protruding portion of the dielectric material layer and portions of the layer stack surrounding the protruding portion constitutes a photovoltaic bristle.

Various embodiments may include a method of forming a photovoltaic structure. A top surface of a moldable material layer is patterned with an array pattern. The array pattern includes an array of vertically extending shapes that protrude upward or downward from that top surface of the moldable material layer. A layer stack is deposited over the array pattern. The layer stack comprises a transparent conductive material layer, a photovoltaic material layer, and a core conductive material layer. A dielectric material layer is deposited over the layer stack. A two-dimensional array of photovoltaic bristles is formed. Each photovoltaic bristle comprises a vertically protruding portion of the layer stack and embedding a dielectric core comprising a dielectric material. The dielectric core contacts a sidewall of the core conductive material layer. The transparent conductive material layer is spaced from the core conductive material layer by the photovoltaic material layer.

Various embodiments may include a method for manufacturing a metamaterial including an array of photovoltaic bristles having approximately cylindrical shapes. An array of vias extending into a substrate is formed. Each via within the array has an approximately cylindrical shape and is laterally separated from one another, and is laterally surrounded, by the substrate. A transparent conductive layer is deposited over the array of vias. An absorber layer is deposited over the outer conductive layer. A core conductive material layer is deposited over the absorber layer. Each via is partially filled with the core conductive material layer to form a conductive core of a respective photovoltaic bristle. Cavities are filled within the vias by depositing a dielectric material layer over the core conductive material layer. A base layer is formed over the deposited conductive material. A dielectric core that comprises the dielectric material is formed within each photovoltaic bristle and between the core conductive material layer and the base layer.

Various embodiments may include a photovoltaic structure that may include a layer stack located over a substrate and may include a core conductive material layer, a photovoltaic material layer, and a transparent conductive material layer. The photovoltaic structure may further include a plurality of via cavities located underneath vertically protruding portions of the layer stack and above the substrate and free of any solid phase material therein.

Various embodiments may include a method of forming a photovoltaic structure that includes forming a pattern of trenches extending downward from a top surface of an optically transparent layer. A transparent conductive material layer, a photovoltaic material layer, and a core conductive material layer may be sequentially deposited within the pattern of trenches in the moldable material layer. A via cavity laterally bound by a surface of the core conductive material layer may be formed within, or above, each trench.

Various embodiments may include a method for manufacturing a metamaterial including an array of photovoltaic bristles having approximately cylindrical shapes. An array of vias extending into a substrate may be formed. Each via within the array has an approximately cylindrical shape and is laterally separated from one another, and is laterally surrounded, by the substrate. A transparent conductive layer is deposited over the array of vias. An absorber layer is deposited over the outer conductive layer. A core conductive material layer is deposited over the absorber layer. Each via is partially filled with the core conductive material layer to form a conductive core of a respective photovoltaic bristle. A base layer is formed over the deposited conductive material. A non-solid core that does not include the conductive material or a material of the base layer is formed within each photovoltaic bristle and between the core conductive material layer and the base layer.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIG. 4A is a perspective view of an embodiment metamaterial with arrays of photovoltaic bristles positioned on alternating slanted substrate surfaces of a corrugated substrate.

FIGS. 37A-37E are sequential vertical cross-sectional views of a first exemplary photovoltaic structure during a manufacturing process according to an embodiment.

FIG. 37J is a magnified vertical cross-sectional view of still another embodiment of the first exemplary photovoltaic structure.

FIGS. 38A-38E are sequential vertical cross-sectional views of a second exemplary photovoltaic structure during a manufacturing process according to an embodiment.

FIGS. 41A-41B are sequential vertical cross-sectional views of a third exemplary photovoltaic structure during a manufacturing process according to an embodiment.

FIGS. 41E-41I are alternate embodiments of the third exemplary photovoltaic structure.

FIGS. 43A-43C are sequential vertical cross-sectional views of a fifth exemplary photovoltaic structure during a manufacturing process according to an embodiment.

DETAILED DESCRIPTION

Figure 1A:
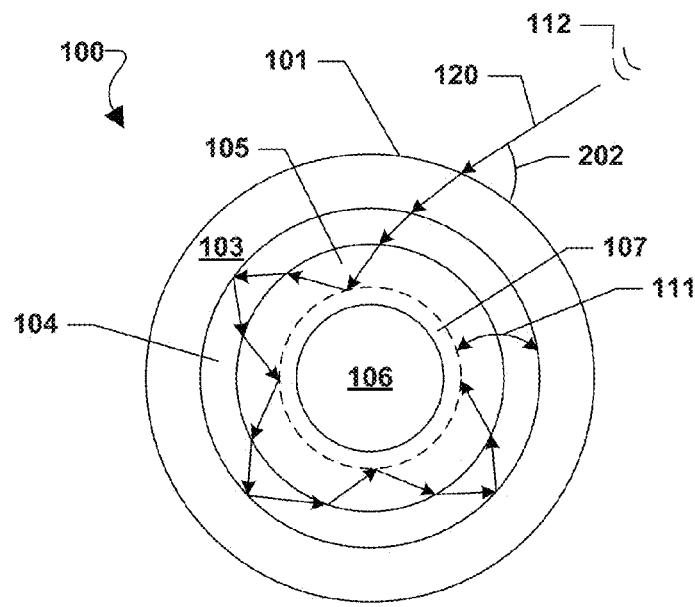
FIG. 1A is a cross-sectional top view of an embodiment photovoltaic bristle.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Any reference to claim elements in the singular, for example, using the articles "a,"

"an," or "the" is not to be construed as limiting the element to the singular. The terms "example," "exemplary," or any term of the like are used herein to mean serving as an example, instance, or illustration. References to particular examples and implementations are for illustrative purposes, and are not intended to limit the scope of the invention or the claims. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

The various geometrical features of the embodiment photovoltaic structures are described herein with reference to spatial orientations (e.g., top, bottom, horizontal, vertical, etc.) of the photovoltaic structures (such as an upright orientation or an inverted orientation) as illustrated in the figures. Such references to special orientations of the various features described or recited in claims is for ease of description with reference to the figures, and are not intended to impose limits or requirements on the finished product produced by the various embodiment methods. Thus, references to horizontal and vertical are merely with reference to the orientation of structures illustrated in the figures, and not intended to impose limits or restrictions on the manner or orientation in which the structures may be deployed. For example, an embodiment of the structures formed by the embodiment fabrication methods orients the finished product so that the conical shapes described as having a vertical dimension are deployed at an angle to the vertical with respect to the ground.

As used herein, the term "photovoltaic bristle" refers to a three-dimensional structure approximately cylindrical with a height approximately equal to 1-100 microns, a diameter of approximately 0.2-50 microns that includes at least one photovoltaically-active semiconductor layer sandwiched between a conductive inner layer or core and a transparent outer conductive layer (e.g., TCO and a nonconductive outer layer). The term "bristle" is used merely because the structures have a length greater than their diameter, the structures have a generally (on average) circular cross-section, and the overall dimensions of the structures are on the dimensions of sub-microns to tens of microns. In the embodiment illustrated herein the photovoltaic bristles have an approximately cylindrical shape, by which it is meant that a substantial portion of the exterior surface of the structures have a cross-section that is approximately circular or elliptical with both radii being approximately coexistent. Due to manufacturing variability, no single photovoltaic bristle may be exactly cylindrical in profile, but when considered over a large number of photovoltaic bristles the average profile is approximately cylindrical. In another embodiment, the photovoltaic bristles may have a non-circular cross-section, such as hexagonal, octagonal, elliptical, etc. as may facilitate manufacturing.

When the embodiment photovoltaic bristles are arranged on a substrate in an order or disordered array, the resulting structure may form a metamaterial structure. As used herein, the term "metamaterial" or "metamaterial substrate" refers to an array of photovoltaic bristles on a substrate. Metamaterials as used herein are artificial materials that are engineered with metals or polymers that are arranged in a particular structured or non-structured pattern that result in material properties (including light absorption and refraction properties) that are different from the component materials. The cumulative effect of light interacting with the array of photovoltaic bristles may be affected by controlling the shape, geometry, size, orientation, material properties, material thicknesses, and arrangement of the bristles making up the metamaterial as described herein.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure.

Traditional planar photovoltaic cells are flat. In traditional planar photovoltaic cells, a limited number of photons are absorbed at any given point in time. Photon absorption occurs through the thickness of the traditional planar photovoltaic cell (e.g., top-to-bottom) from the point of photon entry until the photon is converted to electrical energy. Traditional planar photovoltaic cells convert photons into electrical energy when photons interact with a photovoltaic layer. However, some photons pass through the photovoltaic layer without generating electron-hole pairs, and thus represent lost energy. While the number of photons absorbed may be increased by making the photovoltaic layer thicker, increasing the thickness increases the fraction of electron-hole pairs that recombine, converting their electrical potential into heat. Additionally, thicker photovoltaic films exhibit an exponential attenuation loss, which leads to a decrease in photon conversion. For this reason, traditional planar photovoltaic cells have emphasized thin photovoltaic layers, accepting the reduced photon-absorption rate in favor of increased conversion of electron-hole pairs into electrical current and reduced heating. The theoretical peak efficiency, as well as the total efficiency of traditional planar photovoltaic cells is thus limited by the planar geometry and the unattenuated fraction of photons that may be absorbed in a maximized optical path length through the photovoltaic layer.

Conventional planar photovoltaic cells also suffer from low total efficiency in static deployments (i.e., without sun tracking equipment) since their instantaneous power conversion efficiency decreases significantly when the sun is not directly overhead (i.e., before and after noon). Peak efficiencies of traditional planar photovoltaic cells are affected by their orientation with respect to the sun, which may change depending on the time of day and the season. The standard test conditions for calculating peak efficiencies of solar cells are based on optimum conditions, such as testing the photovoltaic cells at solar noon or with a light source directly above the cells. If light strikes traditional photovoltaic cells at an acute angle to the surface (i.e., other than perpendicular to the surface) the instantaneous power conversion efficiency is much less than the peak efficiency. Traditional planar photovoltaic cells in the northern hemisphere are typically tilted toward the south by an angle based on the latitude in order to improve their efficiency. While such fixed angles may account for the angle of the sun at noon due to latitude, the photovoltaic cells receive sunlight at an angle during the morning and afternoon (i.e., most of the day). Thus, traditional planar photovoltaic cells actually result in a low total efficiency and low total power generation when measured beyond a single moment in time.

The various embodiments include photovoltaic cells that exhibit metamaterial characteristics from regular or irregular arrays of photovoltaic bristles configured so the conversion of light into electricity occurs within layers of the photovoltaic bristles. Since the photovoltaic bristles extend above the surface of the substrate and are spaced apart, the arrays provide the photovoltaic cells of the various embodiments with volumetric photon absorption properties that lead to energy conversion performance that exceeds the levels achievable with traditional planar photovoltaic cells. The volumetric photon absorption properties enable the various embodiment photovoltaic cells to generate more power than traditional planar photovoltaic cells with the same footprint. Due to the small size of the photovoltaic bristles, the photovoltaically-active layers within each bristle are relatively thin, minimizing power losses due to electron-hole recombination. The thin photovoltaically-active layers help reduce attenuation losses normally present in thicker photovoltaic films because the photovoltaic bristles include a thin radial absorption depth and a relatively thicker vertical absorption depth maximizing photon absorption and power generation through the combined long circumferential absorption path length and short radial electron path length. When individual photovoltaic bristles are combined in an array on or within a substrate, a metamaterial structure may be formed that exhibits a high probability of photon absorption and internal reflection that leads to increased energy conversion efficiencies and power generation. Various embodiment structures also provide additional performance-enhancing benefits as will be described in more detail below.

Further performance enhancements may be obtained by positioning the embodiment photovoltaic cells so that the photovoltaic bristles' sidewalls are at an angle to the incident photons. This may improve the probability that photons will be absorbed into the photovoltaic bristles due to wave interactions between photons and the outer conductive layer on each photovoltaic bristle. Orienting the embodiment photovoltaic bristles at an angle to the incident photons also increases the circumferential optical depth of the photovoltaic bristles exposed to the light, because in such an orientation the photons strike the sides of the bristles and not just the tops of the bristles. The off-axis photon absorbing characteristics of the photovoltaic bristles also enables the embodiment photovoltaic cells to exhibit significant total energy conversion efficiency for indirect and scattered light, thereby increasing the number of photons available for absorption compared to a conventional photovoltaic cell.

An embodiment described herein includes photovoltaic cells featuring arrays of photovoltaic bristles on roughly corrugated surfaces in order to present the bristles at an angle to incident sunlight. Further embodiments described herein include methods for manufacturing photovoltaic cells featuring arrays of photovoltaic bristles, as well as assembly of such photovoltaic cells into solar panels.

For purposes of background on the physics and geometries that enable photovoltaic bristles to achieve significant improvements in peak power performance, an overview of embodiment photovoltaic bristles and corresponding photovoltaic cells is now presented. More details on the dimensions, materials and configurations of embodiment photovoltaic bristles are disclosed in U.S. patent application Ser. No. 13/751,914 that is incorporated by reference above.

Figure 1B:
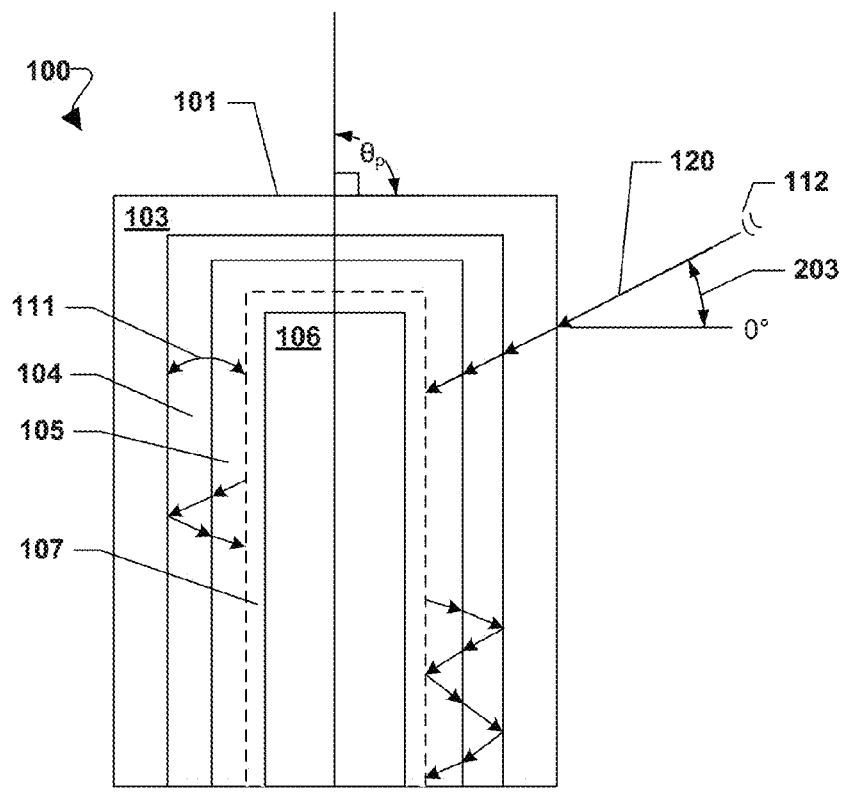
FIG. 1B is a cross-sectional side view of an embodiment photovoltaic bristle.

FIG. 1A illustrates a cross-sectional top view of one photovoltaic bristle 101 and FIG. 1B illustrates a cross-sectional side view of the photovoltaic bristle 101 of FIG. 1A. FIGS. 1A and 1B illustrate the path traveled by a photon entering the side of the outer periphery of the photovoltaic bristle 101. A photovoltaic bristle 101 may guide an absorbed photon 112 so that it follows an internal path 113 that exhibits a high probability that the photon remains within the photovoltaic bristle 101 due to total internal reflection. A photovoltaic bristle may exhibit total internal reflection by controlling the thickness of the layers 103 and 111 and by radially ordering the materials by indexes of refractions from a low index of refraction on the outside to a higher index of reaction in each inner layer, the photovoltaic bristle 101 may refract or guide photons 112 toward the core of the photovoltaic bristle 101. Since the core 106 may be highly conductive, it is also highly reflective, so that it will reflect photons 112. As illustrated, due to the large difference in index of refraction between the absorber layer and the outer conductive layer 103, photons striking this boundary at an angle will be refracted inward. As a result of these reflections and refractions, photons 112 may be effectively trapped within the absorption layer 111 for a longer period of time, thereby increasing the probability of interaction with the absorption layer 11 causing an electron-hole pair to be formed. Increasing the probability of photon absorption may result in more electrical current being generated for the same amount of incident light energy by the embodiment photovoltaic cells than is achievable by conventional photovoltaic cells.

Figure 2A:
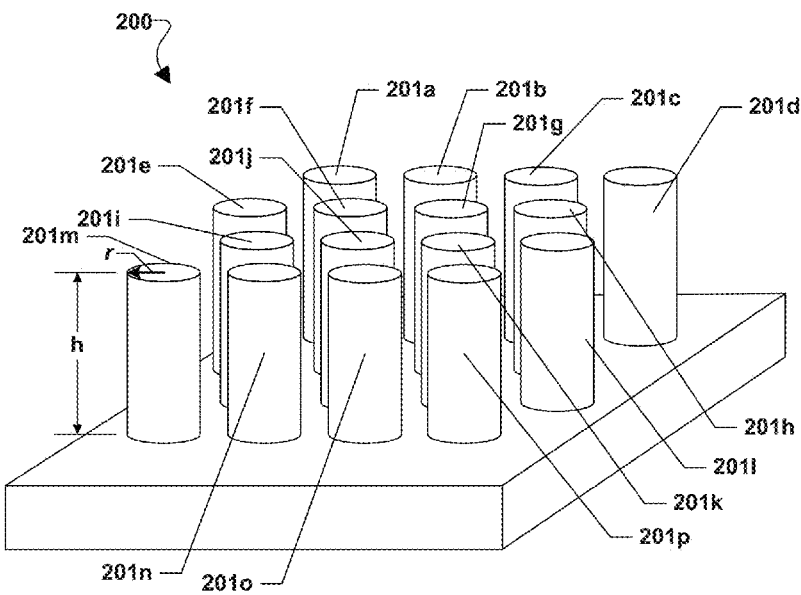
FIG. 2A is a perspective view of an embodiment metamaterial of an array of photovoltaic bristles positioned on a flat substrate.
Figure 2B:
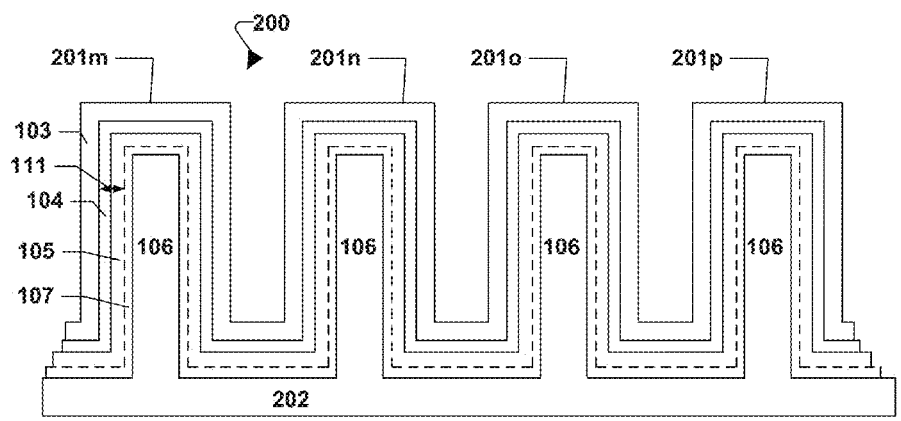
FIG. 2B is a cross-sectional side view of an embodiment metamaterial array of photovoltaic bristles positioned on a flat substrate.

It should be noted that the embodiment shown in FIGS. 2A-2B may include an inner reflector due to a metal core 106. In other embodiments, a refraction layer may be applied over the core 106 to achieve the same photon reflection effects. In such an embodiment, a reflective layer may be formed over the conductive core and under the absorber layer, such as a semiconductor or dielectric material layer having a lower index of refraction than the absorber layer. This refraction layer may be configured to reflect the photon at the interface between the reflection layer and the absorber layer, and not rely on reflection off of the conductive core 106. For example, such a diffraction layer may be formed from an aluminum doped zinc oxide layer of about 500-1500 angstroms in thickness. Reflected photons then refract through each layer 104, 105 until they reach the outer conductive layer 103, where the difference in the index of refraction between the absorption sublayer 105 and the outer conductive layer 103 causes the photons to reflect back into the absorption layers of the photovoltaic bristle. The reflected photons that are not reflected inwardly at the boundary between the outer conductive layer 103 and the absorption sublayer 105 may pass through the outer conductive layer 103 and be reflected off of the interface between the outer conductive layer 103 and air due to the difference in the index of refraction at this interface. In either manner, photons may remain within the photovoltaic bristle passing back and forth through the absorption layer 111 until they are eventually absorbed or exit the bristle.

Each photovoltaic bristle 101 is made up of a core 106 that may be conductive or has a conductive outer surface, an absorption layer 111 and an outer conductive layer 103, which will typically be a transparent conductive layer such as a transparent conductive oxide or transparent conductive nitride. Due to the cylindrical form of photovoltaic bristles, the absorption layer 111 surrounds the core 106, and the outer conductive layer 103 surrounds the absorption layer 111. Although, two absorber sublayers 104, 105 are shown, it should be noted that the absorption layer 111 may include any number of absorber sublayers or regions of photovoltaically-active materials or combinations of photovoltaic materials. For example, the absorption layer 111 may include multiple absorber sublayers or regions that form a p-n junction, a p-i-n junction, or multi junction regions, which have a generally circular cross-section as illustrated in FIG. 1A. If the absorption layer 111 forms a p-i-n junction with three absorber sublayers, one sublayer may be the intrinsic portion forming the p-i-n junction. If the core 106 is a semiconductor core forming a p-n junction with a single absorber sublayer, the absorption layer 111 may include only one sublayer. Regardless of the number, the absorber sublayers or regions 104, 105 may be made from one or more of silicon, amorphous silicon, polycrystalline silicon, single crystal silicon, cadmium telluride, gallium arsenide, aluminum gallium arsenide, cadmium sulfide, copper indium selenide, and copper indium gallium selenide.

The relative radial positions of the p-type, intrinsic, or n-type sublayers/regions may vary in different embodiments. For example, in an embodiment the p-type semiconductor material may be positioned radially inside the n-type semiconductor material. In another embodiment, the n-type semiconductor material may be positioned radially inside the p-type semiconductor material. In addition, multiple materials may be used to create a sequence of p-n and/or n-p junctions, or p-i-n junctions in the absorption layer. For example, the absorption layer may include an absorber sublayer of p-type cadmium telluride (CdTe) and an absorber sublayer of n-type cadmium sulfide (CdS). In an embodiment, the absorption layer 111 may be fully depleted. For example, the p-type region and the n-type region forming the sublayer or region 104 and the sublayer or region 105 may be fully depleted.

In an example embodiment, the absorption layer 111 may include a p-type semiconductor sublayer 105, such as p-type cadmium telluride, and an n-type semiconductor sublayer of a different material, such as n-type-cadmium sulfide. In another example embodiment, one sublayer 104 may be a p-type region, such as p-type amorphous silicon, and another sublayer 105 may be an n-type region of the same material as the sublayer 104 but doped to form an n-type semiconductor, such as n-type amorphous silicon.

The outer conductive layer 103 has a radial thickness which may be measured radially from the outer surface of the absorption layer 111 to the outer surface of the outer conductive layer 103 (i.e., the outer surface of the photovoltaic bristle). In an embodiment, the outer conductive layer 103 is a transparent conductive oxide ("TCO"), such as a metal oxide. In an embodiment, the outer conductive layer 103 may include a dopant creating a p-type or n-type transparent conductive oxide. For example, the transparent conductive oxide layer 103 may be one of intrinsic zinc oxide, indium tin oxide, and cadmium tin oxide (Cd2SnO4). In an embodiment, the outer conductive layer 103 may include a transparent conductive nitride such as titanium nitride (TiN). In another embodiment, the outer conductive layer 103 may include a buffer with or without the dopant. Some examples of an outer conductive layer 103, which may be a transparent conductive oxide with a dopant, include boron-doped zinc oxide, fluorine doped zinc oxide, gallium doped zinc oxide, and aluminum doped zinc oxide. Some examples of buffers that may be added to a transparent conductive oxide include zinc stannate (Zn2SnO4), titanium dioxide (TiO2), and similar materials well known in the art.

Although not shown in FIGS. 1A-1B, the outer conductive layer 103 may include any number of conductive and/or non-conductive sublayers to achieve a particular total optical thickness while simultaneously having a thin conductive sublayer. With multiple sublayers, the outer conductive layer 103 may also benefit from adding flexibility to the photovoltaic bristles for a more resilient photovoltaic bristle metamaterial device. The addition of a non-conductive sublayer may have refractive properties that improve off-angle photon absorption efficiency. Analysis and observations of prototypes indicate that outer conductive layers between 500 and 15,000 angstroms result in a decrease in electrical resistance in the conductive layers from field effects at the structural discontinuities in the photovoltaic bristles. However, the outer conductive layer 103 of a bristle may need to be of a minimum optical thickness exceeding 500 angstroms to achieve the photon trapping and guiding effect shown in FIG. 1A. Thus, the outer conductive layer 103 may include multiple layers to achieve the conflicting optical thickness requirement and the requirement for electrical resistivity benefits from field effects. As an example, the outer conductive layer 103 may have two sublayers including a conductive sublayer such TCO and a non-conductive sublayer such as an optically transparent polymer. As another example, the non-conductive sublayer may be a bi-layer including TCO and a polymer or glass. As a further example, the outer conductive layer 103 may include three sublayers where a non-conductive sublayer separates two conductive sublayers.

In an embodiment, the core 106 may be of a variety of conductive materials and non-conductive materials. In an embodiment, the core 106 may be a solid conductive core such as a metal. For example, the solid conductive core may be gold, copper, nickel, molybdenum, iron, aluminum, or silver. In an embodiment, the core 106 may include the same material as the substrate 202 (shown in FIG. 2B). For example, the core 106 and the substrate 202 may include a polymer. In another embodiment, the core 106 may include a different material than the substrate 202. In another embodiment, an inner conductive layer 107 may surround the core 106. For example, the inner conductive layer 107 may be gold, copper, nickel, molybdenum, iron, aluminum, or silver to create a conductive core. In an embodiment, the core 106 may include a polymer with an inner conductive layer 107 surrounding the polymer. The inner conductive layer 107 may include similar material as the outer conductive layer 103. For example, the inner conductive layer 107 may include a transparent conductive oxide, a transparent conductive nitride, and/or a non-conductive transparent material. The inner conductive layer 107 may include multiple layers (e.g., sublayers of TCO and a non-conductive optically transparent polymer) to achieve the conflicting benefits of field effects and proper optical depth for the photovoltaic device. In an embodiment, the core 106 may include a semiconductor material. For example, the core 106 may be made from one or more of silicon, amorphous silicon, polycrystalline silicon, single crystal silicon, cadmium telluride, gallium arsenide, aluminum gallium arsenide, cadmium sulfide, copper indium selenide, and copper indium gallium selenide.

FIG. 1B also illustrates that photons striking the photovoltaic bristle 101 will have a higher probability of absorption when they strike the sidewall of a photovoltaic bristle at a compound angle that is less than 90 degrees but more the 0 degrees to the surface, where an angle perpendicular to the sidewall surface is considered to be 0 degrees. The compound incident angle includes a vertical plane component 133 (shown in FIG. 1B) and a horizontal plane component 132 (shown in FIG. 1A). The horizontal plane component 132 is defined by a photon 112 striking the outer surface of the bristle at a point along the perimeter of the circular cross-section plane forming an angle with the perimeter where an angle perpendicular to the perimeter is considered 0 degrees. Similarly, the vertical plane component 133 is defined by the photon 112 striking the outer surface of the bristle at a point along the height forming a vertical angle with the surface where an angle perpendicular to the surface is considered 0 degrees.

Analysis of photon absorption characteristics of the outer conductive layer have revealed that photons striking the surface of the sidewall of the photovoltaic bristle perpendicular to the horizontal component 132 and the vertical component 133 may result in a compound angle of 0 degrees and an increased probability of being reflected off the surface. Similarly, photons striking the surface of the sidewall of the photovoltaic bristle parallel to the vertical and the horizontal component will also have an increased probability of being reflected off the surface. However, photons striking the side surface at a compound angle between 10° and 80° have a high probability of being absorbed into the outer conductive layer 203. Once absorbed, the internal refraction characteristics of the absorber sublayers 104, 105 and outer conductive layer 103 cause the photons to remain within the photovoltaic bristle 101 for an extended time or path length. This characteristic is very different from conventional photovoltaic cells, which exhibit the maximum power conversion efficiency when the angle of incidence of photons is normal to its single planar surface.

The difference between the incident angle corresponding to conventional photovoltaic cells and the photovoltaic bristles is illustrated by angle θp in FIG. 1B. The preferred incident angle for a traditional solar cell, θp, would form a right angle with the top of the bristle as well as the substrate of the full metamaterial device (not shown). Thus, not only does the photovoltaic bristle exhibit better absorption characteristics at off-angles (not perpendicular or parallel to the surface), the reference point for measuring an off-angle is different from that of a conventional photovoltaic cells. For a metamaterial device with photovoltaic bristles, the reference point is measured from the sidewall of a bristle in two planes, which is unachievable by a planar photovoltaic cell. Thus, due to the off-angle absorption characteristics of photovoltaic bristles, the embodiment photovoltaic cells exhibit significant power conversion efficiency across a broad range of angle of incidence. This translates to more power generation throughout the day than achievable from fixed solar panels with conventional planar solar arrays that produce their peak efficiencies (i.e., maximum power generation) when the sun is directly overhead.

FIG. 2A illustrates a perspective view of metamaterial 200 including an array of photovoltaic bristles 201a, 201b, 201c, 201d, 201e, 201f, 201g, 201h, 201i, 201j, 201k, 201l, 201m, 201n, 201o, 201p extending from a flat substrate 202 (shown in FIG. 2B). While illustrated with twelve photovoltaic bristles 201a-201p, a metamaterial may include a larger number of photovoltaic bristles. The number of photovoltaic bristles 201 will depend upon the dimensions and spacing of the bristles and the size of the photovoltaic cell. As with conventional photovoltaic cells, metamaterials may be assembled together in large numbers to form panels (i.e., solar panels) of a size that are suitable for a variety of installations.

Each photovoltaic bristle 201a-201p is characterized by its height "h," which is the distance that each bristle extends from the substrate 202. Photovoltaic bristles 201a-201p are also characterized by their radius "r". In an embodiment, all photovoltaic bristles 201a-201p within an array will have approximately the same height h and approximately the same radius r in order to facilitate manufacturing. However, in other embodiments, photovoltaic bristles 201a-201p within the array may be manufactured with different heights and diameters.

In an embodiment, the number of photovoltaic bristles in a photovoltaic cell may depend upon the substrate surface area available within the cell and the packing density or inter-bristle spacing. In an embodiment, photovoltaic bristles may be positioned on the substrate with a packing density or inter-bristle spacing that is determined based upon the bristle dimensions (i.e., h and r dimensions) as well as other parameters, and/or pattern variations. For example, a hexagonal pattern may be used rather than the trigonometric pattern shown in FIG. 2A.

In the various embodiments, the dimensions and the inter-bristle spacing of photovoltaic bristles may be balanced against the shading of neighboring bristles. In other words, increasing the number of photovoltaic bristles on a plane may increase the surface area available for absorbing photons. However, each photovoltaic bristle casts a small shadow, so increasing the photovoltaic bristle density of a photovoltaic cell beyond a certain point may result in a significant portion of each bristle being shadowed by its neighbors. While such shadowing may not reduce the number of photons that are absorbed within the array, shadowing may decrease the number of photons that are absorbed by each photovoltaic bristle, and thus there may be a plateau in the photon absorption versus packing density of photovoltaic bristles.

A further consideration beyond shadowing is the wave interaction effects of the array of closely packed photovoltaic bristles. The interior-bristle spacing may be adjusted to increase the probability that photons entering the array are absorbed by the photovoltaic bristles' metamaterial properties considering the bulk material properties of the layered films that makeup the array. For example, specific characteristics such as extinction coefficient or absorption path length may predict an optimal dimensional design, although one may choose to deviate from this prediction resulting in a sacrifice in performance.

FIG. 2B is a cross-sectional side view of a section of metamaterial 200 including photovoltaic bristles 201m, 201n, 201o, and 201p as illustrated in FIG. 2A. As shown in FIG. 2B the photovoltaic bristles extend from a substrate 202. In an embodiment, the core 106 may be the same material as the substrate 202 and an inner conductive layer 107 may surround the core 106. The absorber layer 111 may surround the inner conductive layer 107 and the outer conductive layer 103 may surround the absorber layer 111. The absorber layer 111 may include any number of sublayer or regions. As illustrated in FIG. 2B, the absorber layer 111 may include two sublayers or regions 104, 105. In an embodiment, the two absorber sublayers or regions 104, 105 may be any semiconductor material where one sublayer or region is doped as n-type and the other is doped as p-type.

The metamaterial 200 may include a substrate 202 of any suitable substrate material known to one skilled in the art. For example, the substrate 202 may be glass, doped semiconductor, diamond, metal, a polymer, ceramics, or a variety of composite materials. The substrate 202 material may be used elsewhere in the metamaterial 200, such as a material used in any layer of a photovoltaic bristle 201m-201n. Alternatively, the material used in the substrate 202 may be different from other materials used in the photovoltaic bristles 201m-201n. In an embodiment, the core 106 and the substrate 202 may include a common material. For example, the substrate 202 and the core 106 may include glass, semiconductor material, a polymer, ceramics, or composites. In a further embodiment, the core 106 and substrate 202 may include similar materials, while the inner conductive layer 107 is added over the substrate 202 and surrounding the core 106 creating a conductive core. The inner conductive layer 107 may include metal such as gold, copper, nickel, molybdenum, iron, aluminum, or silver. Alternatively, the inner conductive layer may include any of the materials used for the outer conductive layer 103 which may be used in combination with the previously listed metals.

In an embodiment, the inner conductive layer 107 may also be an inner refraction or reflection layer that is added on top of the core 106 in order to provide an inner reflection interface for photons. In this embodiment, a layer of semiconductive or insulator material, such as B:ZnO, Al:ZnO, ZnO, or ITO, may be applied over the metal core. This layer may be at least one-half wavelength in thickness, depending on the refractive index of the material. For example, such a layer made of Al:ZnO (AZO) may be approximately 500 angstroms to 1500 angstroms thick over which the absorber layer may be applied. Such an AZO layer has a refractive index that is lower than the absorber layer. This difference in refractive index coupled with the curvature of the interface of these two layers will reflect the photons before they reach the metal core. The reflection induced by this design may exhibit lower losses than the designs in which photons reflect from a metal surface of the core. The use of such a refraction layer may be included in any of the embodiments illustrated and described herein. For example, in the embodiments in which the center of the core is a plastic rod, a metal layer is applied over the plastic core and then the AZO is applied over the metal layer. In further embodiments, this refractive layer forming a reflecting interface may be formed using multiple layers, such as: ITO-AZO; ITO-AZO-ITO; TiO2-TiN—TiO2; ZnO-AZO-ZnO; etc. Such multiple layers may function similar to a Bragg reflector used in fiber optics.

In order to increase the percentage of solar photons striking photovoltaic bristles at the appropriate angle of incidence, one embodiment orients the photovoltaic bristles at an angle on a corrugated substrate. Positioning photovoltaic bristles at an angle to incident light increases the probability of off-axis photon absorption, which may reflect and propagate photons around and within the photovoltaic bristles, thereby developing an equilibrium standing wave and increasing probability of converting photon energy into electrical energy. Consequently, embodiment photovoltaic cells with such a corrugated shape may generate more electrical power than is possible from conventional photovoltaic cells.

In addition to increasing the probability of photon absorption, embodiment corrugated photovoltaic cells provide more surfaces and more photovoltaic bristles for photon absorption within a given planar footprint than a comparable flat substrate configuration. Each corrugated photovoltaic cell may include a large number of angled surfaces with photovoltaic bristles, compared to a conventional flat substrate photovoltaic cell that has only a single flat surface or absorbing photons. The improvements from the corrugated photovoltaic cell results in an increase in optical volume enabling more photon absorption and power generation from such a metamaterial device.

Figure 3A:
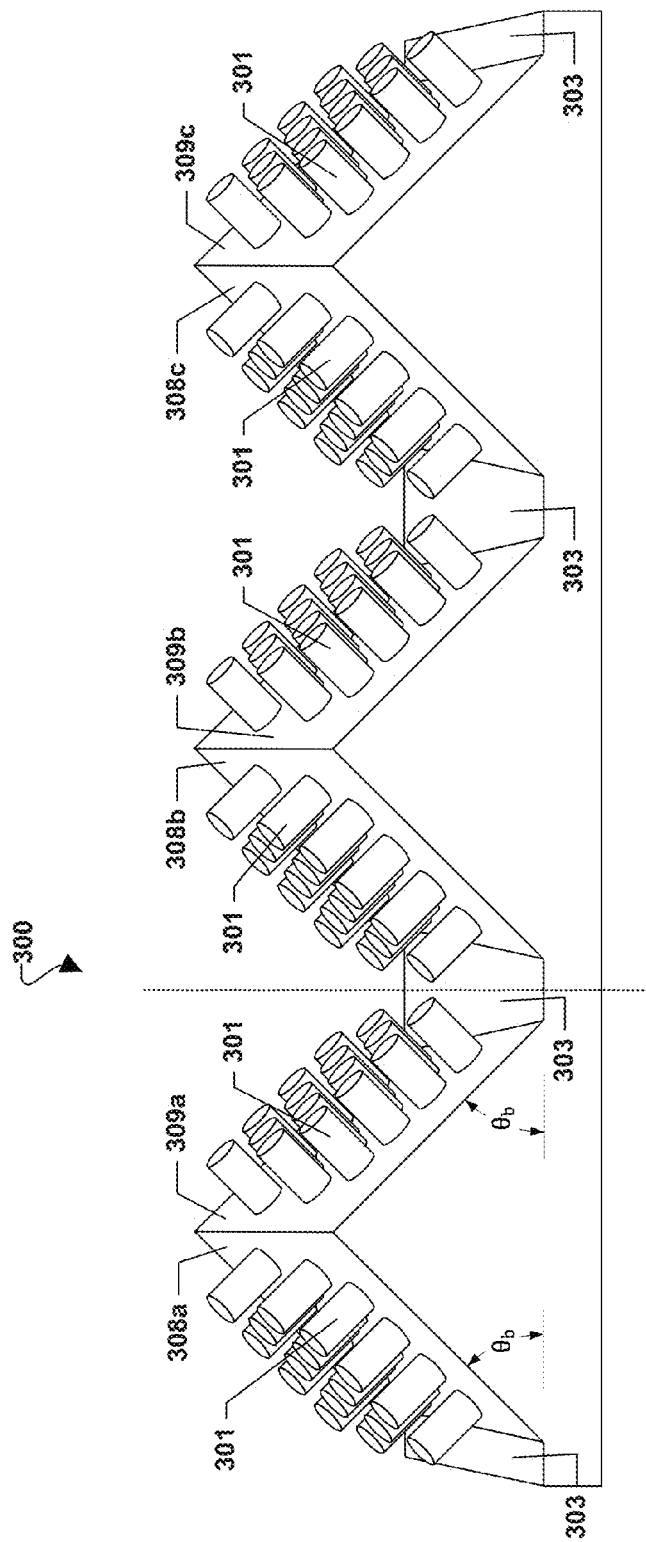
FIG. 3A is a perspective view of an embodiment metamaterial with arrays of photovoltaic bristles positioned on a corrugated substrate.

FIG. 3A is a perspective view of an embodiment metamaterial 300 including a corrugated shaped substrate 302 (shown in FIG. 3B) with arrays of photovoltaic bristles 301 positioned on each slanted substrate surface 308a, 308b, 308c, 309a, 309b, and 309c. Although FIG. 3A depicts six slanted substrate surfaces, in an embodiment, the metamaterial 300 may have a larger number of slanted substrate surfaces. In FIG. 3A, each slanted substrate surface 308a-308c, and 309a-309c may form an angle θb with the flat foundation 303 of the substrate 302. In an embodiment angle θb may be between about 30 and about 60 degrees. In further embodiments the angle θb may be 30-35 degrees, 35-40 degrees, 40-45 degrees, 45-50 degrees, 50-55 degrees, and 55-60 degrees. In an embodiment, arrays of photovoltaic bristles 301 may be oriented so that their long axis is normal to the slanted substrate surfaces 308a-308c and 309a-309c including angle θb to increase the probability of photon absorption and photon trapping and guiding from photons striking the sidewalls of each photovoltaic bristles 301 at compound angles approximately between 10 and 80. It should be noted that each slanted substrate surface 308a-308c and 309a-309c may include any number of photovoltaic bristles 301 (i.e. more than the twelve photovoltaic bristles 301 shown in the figure).

Figure 3B:
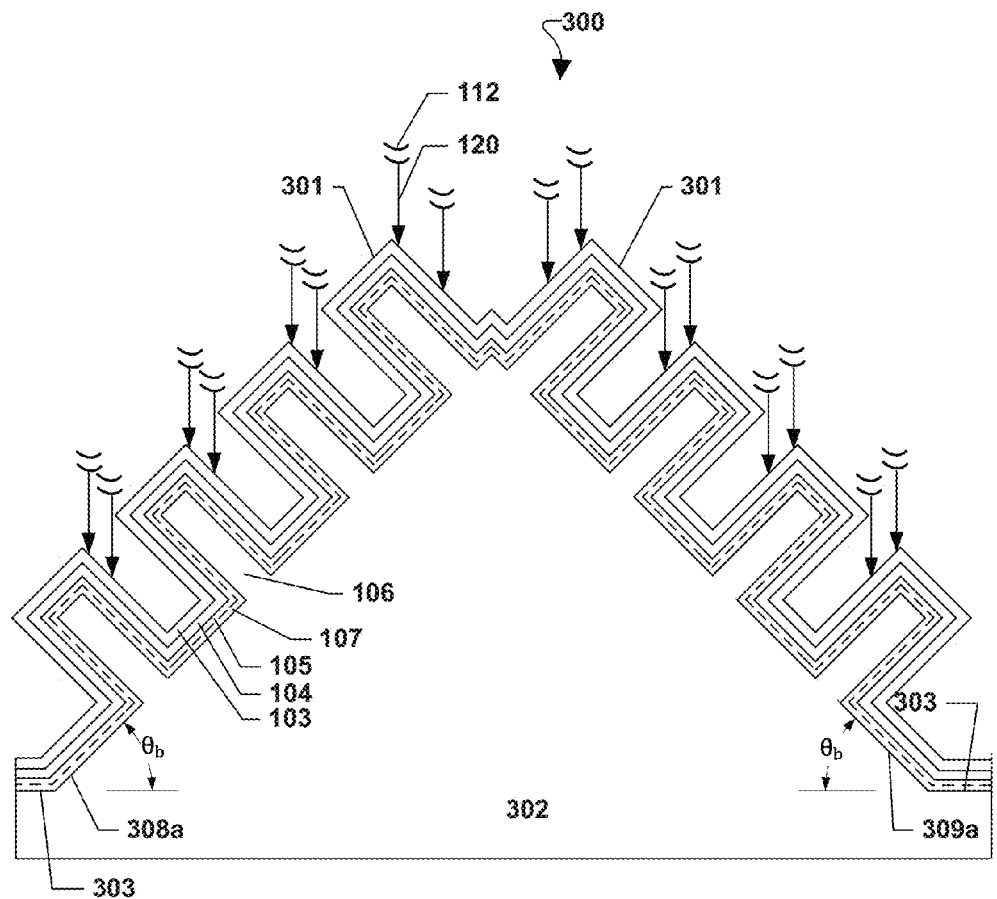
FIG. 3B is a cross-sectional side view of an embodiment metamaterial with arrays of photovoltaic bristles positioned on a corrugated substrate.

FIG. 3B is a cross-sectional side view of a section of a metamaterial 300 including slanted substrate surfaces 308a and 309a at angles θb with the foundation 303 and an array of photovoltaic bristles 301 on each slanted substrate surface. As described above, each photovoltaic bristle 301 may include a core 106, an inner conductive layer 107, and an absorber layer 111 with absorber sublayers 104, 105 surrounding the inner conductive layer, and an outer conductive layer 103 surrounding the absorber layer 111. In an embodiment, the core 106 may be the same material as the substrate 302. The photovoltaic bristles 301 extend from the corrugated surface 302 perpendicular to each slanted surface 308, 309. As illustrated in the figure, this angle enables photons 112 traveling along the photon path 113 to enter the sidewall of the photovoltaic bristle 301 at a compound angle of approximately 10°-80°.

In another embodiment, photovoltaic bristles are positioned only on alternating slanted surfaces of the corrugated substrate, with the opposite surfaces lacking such structures. This embodiment configuration may reduce manufacturing costs while presenting photovoltaic bristles on the surfaces most likely to receive solar radiation when deployed. Additionally, the slanted surfaces that do not include photovoltaic bristles may be coated with a reflective material (e.g., a metal) so that photons striking that surface are reflected at a desirable angle into the photovoltaic bristles on the opposite surface. Such an embodiment is illustrated in FIGS. 4A and 4B.

Figure 4B:
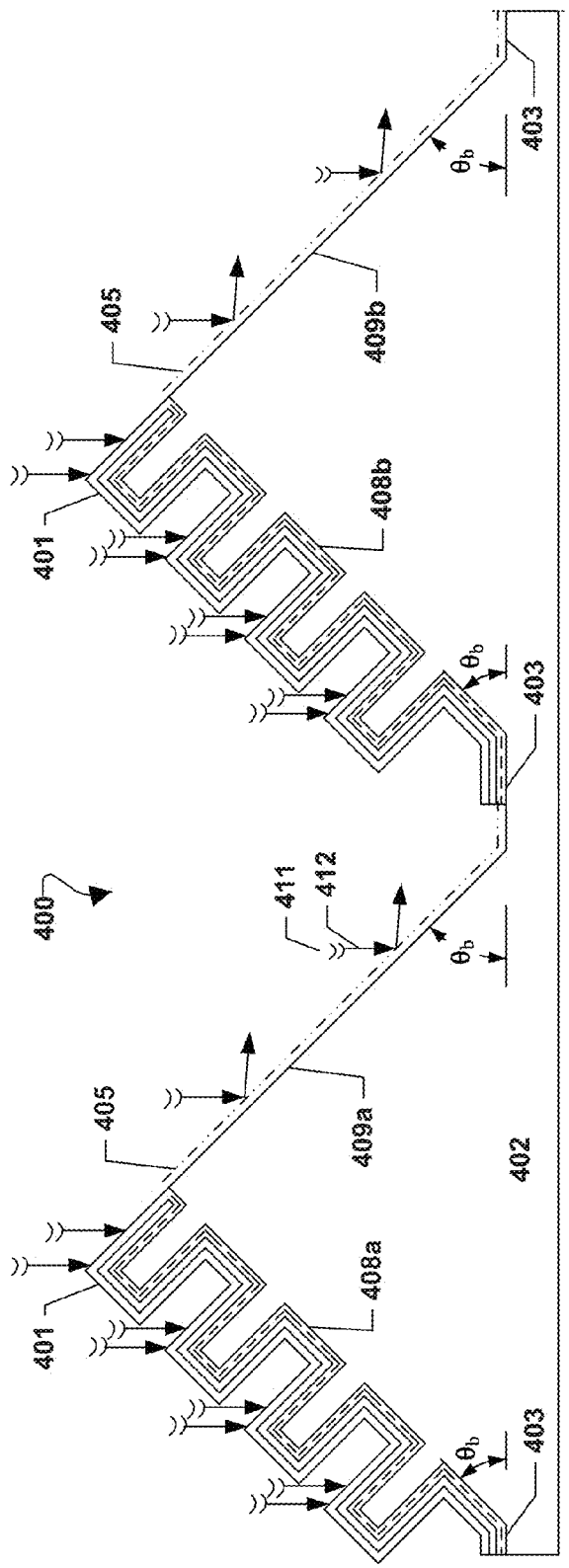
FIG. 4B is a cross-sectional side view of an embodiment metamaterial with arrays of photovoltaic bristles positioned on alternating slanted substrate surfaces of a corrugated substrate.

FIG. 4A is a perspective view of metamaterial 400 including a corrugated shaped substrate 402 (shown in FIG. 4B) and arrays of photovoltaic bristles 401 positioned at normal from the planes of alternating slanted substrate surfaces 408a, 408b, and 408c. In an embodiment, slanted substrate surfaces 409a, 409b, and 409c may be without arrays of photovoltaic bristles 401 and may be configured with a reflective surface coating, such as a metal, that may reflect photons into the photovoltaic bristles on the opposite surface as illustrated in FIG. 4B. Although FIG. 4A depicts six slanted substrate surfaces, in an embodiment, the metamaterial 400 may have a larger or smaller number of slanted substrate surfaces.

FIG. 4B is a cross-sectional side view of a section of metamaterial 400 with a corrugated substrate 402 including slanted substrate surfaces 408a, 408b, 409a, 409b at angles θb with the foundation 403. In an embodiment, each slanted substrate surface 408a, 408b may include an array of photovoltaic bristles 401 configured approximately normal to the slanted substrate surface. In an embodiment, slanted substrate surfaces 409a and 409b may include a reflective layer 405. As such, the reflective layer 405 may reflect photons 411 along a photon path 412 so that the reflected photons 411' strikes the photovoltaic bristles extending from the adjacent slanted substrate surface 408b of the substrate 402. In an embodiment, a reflective layer 405 (i.e., reflective film) may be any material that has high reflective characteristics to reflect photons usable for the embodied metamaterial.

Figure 5:
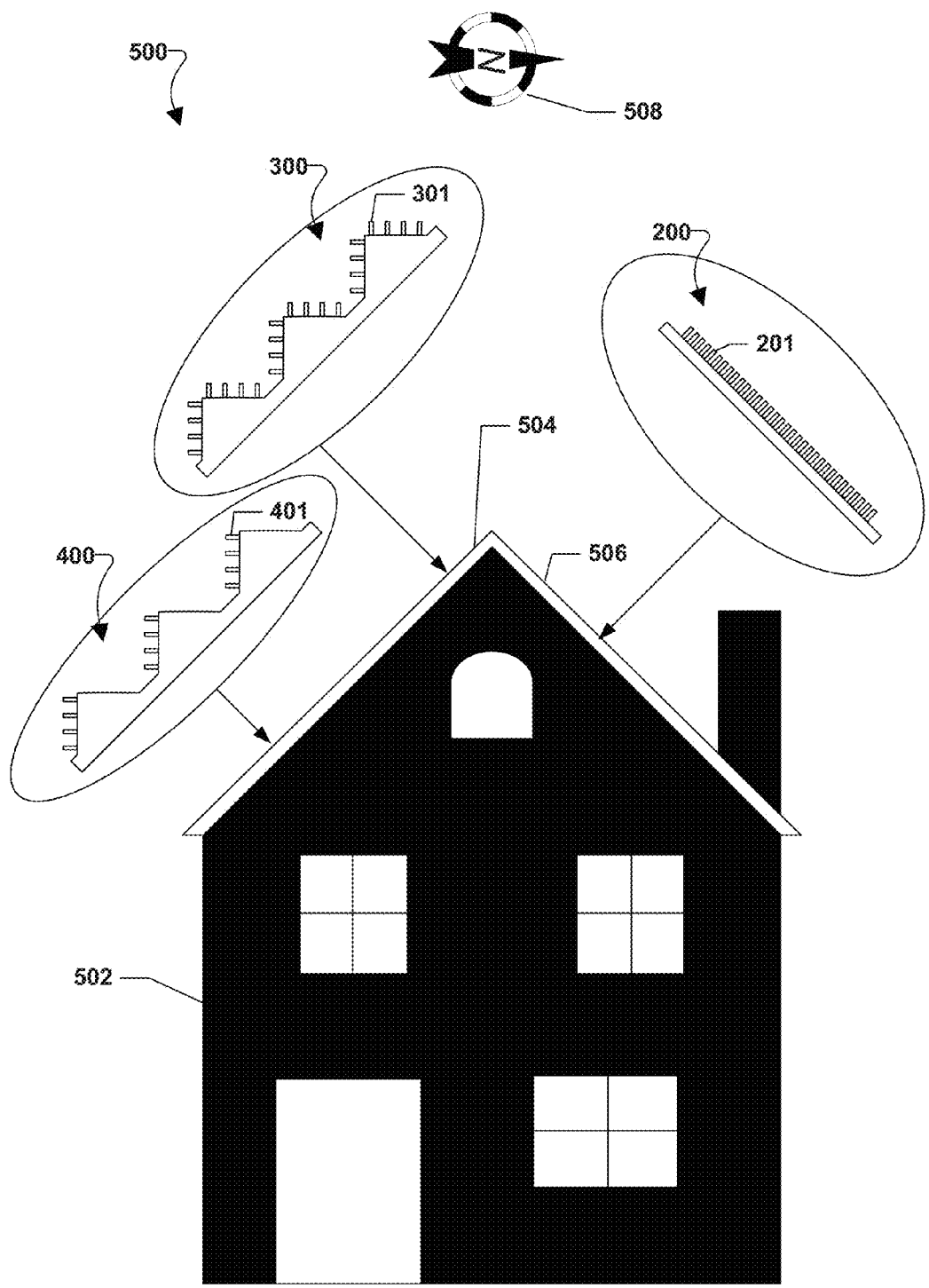
FIG. 5 is an illustration of embodiments shown in FIGS. 2A, 3A, and 4A positioned on the slanted planes of a structure facing away or towards the equator.

FIG. 5 illustrates an advantage of the various embodiment photovoltaic cells when installed on a typical structure 502 (e.g., a house) having a roof with angled surfaces 504, 506. In this illustrative figure, photovoltaic cells 200 on a northern facing roof surface may have a flat profile and feature photovoltaic bristles 201 that extend perpendicular from the surface. Since this surface of the roof 506 receives sunlight at an angle, the incident sunlight on this surface is preferable for increasing photon absorption on such a photovoltaic cell 200. On the southern facing roof surface 504, corrugated photovoltaic cells 300, 400 may be used since the sunlight will be striking the roof surface 504 at closer to a perpendicular angle of incidence. The 301, 304 angular orientation of the photovoltaic bristles on such corrugated photovoltaic cells 300, 400 ensures that incident sunlight strikes the photovoltaic bristles at angles of incidence that will increase photon absorption.

Various embodiment methods of making photovoltaic bristles are now presented.

An embodiment method 800 for manufacturing photovoltaic bristles using a press or stamping process is illustrated in FIGS. 6A-6H, 7A-7C, FIG. 8. This embodiment method 800 may enable fabricating photovoltaic bristles using low-cost substrate materials such as plastics and polymers that may be processed rapidly in large volumes. This embodiment method will be described with reference to FIGS. 6A-6H and FIG. 8 together. Although the figures illustrate and the text describes a rod imprint design, a via design may be similarly created as shown and described with reference to method 1600. Additionally, any of a variety of raised shapes other than cylindrical rods or cones may be produced on the substrate using the embodiment methods and embodiment imprinting systems, including ridges, a mesh of interlocking ridges, hemispheres, etc.

Figure 6A:
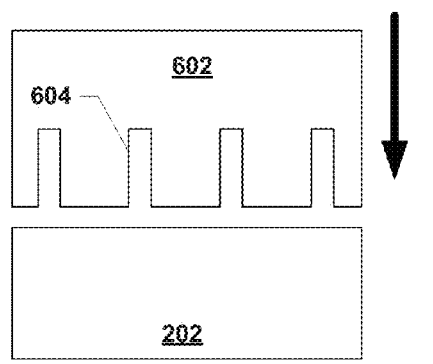
FIGS. 6A-6H are cross-sectional side views illustrating an embodiment method for forming an array of photovoltaic bristles for a metamaterial device stamping process.
Figure 6B:
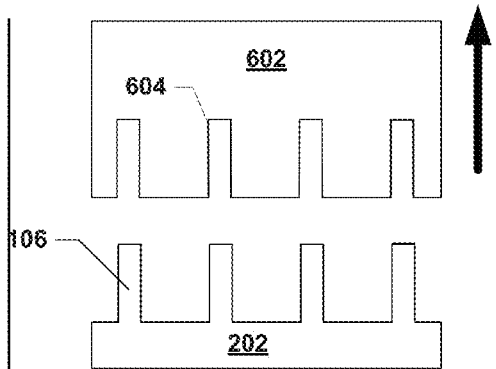

In method 800 in block 804, a plastic or polymer block or starting material may be processed in order to prepare it for a pressing or forming operation. The methods used for preparing such a polymer for pressing will depend upon the type of plastic or polymer selected. As illustrated in FIGS. 6A and 6B, in block 808 a die or mold 602 including a number of bristle holes 604 for forming the bristle cores may be pressed into the plastic or polymer material 202 and then removed, thereby forming an array of cores 106 out of the plastic polymer 202. In an embodiment, vertical stamp 602 moves in a downward vertical manner into a polymer substrate 202 forming cores 106 and moving vertically away from the substrate 202 and the formed cores 106. Alternatively, a rolling press or rolling die may be applied to a moving sheet or tray of material similar to printing press techniques.

When using a rolling press or rolling die a separate roll-to-web and web-to-plate sub-process may create the associated rolling stamps and the array of cores on the substrate for use in method 800. The sub-process is discussed in depth later in this application with reference to FIGS. 33A-33G, 34, 35A-35E, 36A-36E. Generally, a master template is created using photolithographic techniques or nanoimprint lithography. The master template imprints a pattern on a polymer sheet or a web. The sheet or web may be a base material with a thin polymer imprintable layer or coating. For example, the sheet could be glass and/or the web could be polyester. The web is then used in combination with rollers (e.g., a rolling stamp) to stamp cores on a substrate similar to substrate 202 with cores 106 illustrated in FIG. 6B.

In block 810, the newly formed array of cores 106 may be cured or otherwise processed in order to improve the material properties, such as to harden the material. This may involve processing with heat, ultraviolet radiation, and/or chemical vapor exposure, as would be well-known in the polymer arts and depend upon the type of material used. In an embodiment, the material processing in block 810 may be accomplished as part of the stamping operation in block 808, either as part of the stamping operation and as a host stamping process, or entirely as a post-stamping process. For example, a rolling stamp may include an ultraviolet light that is configured so that when the rolling stamp rotates over the unformed substrate 202 the ultraviolet light simultaneously cures or partially cures the newly formed cores 106.

Figure 6C:
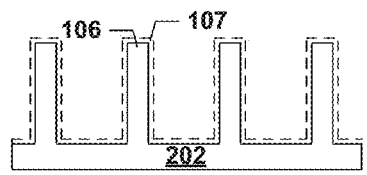

As illustrated in FIG. 6C, in block 812, an inner conductive layer 107 may be formed over the cores 106. This may be accomplished by chemical vapor deposition, plasma enhanced chemical vapor deposition, physical deposition, plasma deposition, sputtering techniques, or electro-deposition techniques. The inner conductive layer 107 may further be formed or thickened by electroplating processes. Multiple conductive layers may be applied as part of block 812. In an embodiment, the inner conductive layer or layers may be one or more of copper, aluminum, gold, nickel, titanium, silver, tin, tantalum, and chromium, as well as alloys of such metals. This process forms an inner conducting core for the photovoltaic bristle.

Figure 6D:
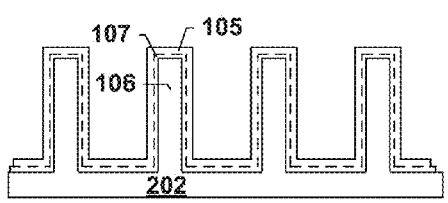

To form the photovoltaic portion of the photovoltaic bristles, a number of semiconductor layers may be applied to the inner conducting core using well-known semiconductor processing methods. As illustrated in FIG. 6D, in block 804, a first absorber layer of semiconductor material may be formed over the inner conductive layer. For example, the first absorber layer 105 may include silicon, amorphous silicon, polycrystalline silicon, single crystal silicon, cadmium telluride, cadmium sulfide, gallium arsenide, copper indium selenide, and copper indium gallium selenide. The first absorber layer 105 over the inner conductive layer 107 by electroplating, chemical vapor deposition, atomic layer deposition, etc.

Figure 6E:
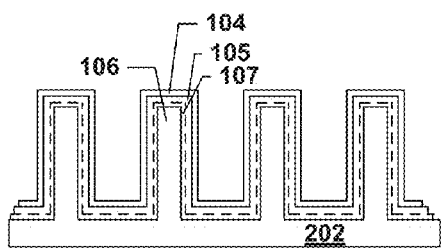

As illustrated in FIG. 6E, in block 842 a second semiconductor material layer may be formed over the first absorber layer, with the first and second absorber layers having material properties to create a p-n junction or n-p junction configured to release electrons upon absorbing a photon. Any deposition method used to add the first absorber layer 105 may also be used to add the second absorber layer 104. In an embodiment, the deposition method for the second absorber layer 104 may be the same deposition method used for adding the first absorber layer 105. In an embodiment, the second absorber layer 104 may include a semiconductor material. For example, the second absorber layer 104 may include silicon, amorphous silicon, polycrystalline silicon, single crystal silicon, cadmium telluride, cadmium sulfide, gallium arsenide, copper indium selenide, and copper indium gallium selenide. In an embodiment, the second absorber layer 104 may be an absorber sublayer or region comprising the same material as the first absorber layer 105 with a different dopant. For example, the first absorber layer 105 may be p-doped amorphous silicon and the second absorber layer 104 may be n-doped amorphous silicon. In an embodiment, the second absorber layer 104 may be an absorber sublayer comprising a different material as the first absorber layer 105. For example, the first absorber layer 105 may be p-doped cadmium telluride and the second absorber layer 104 may be n-doped cadmium sulfide. In optional block 846, additional absorber layers of semiconductor materials may be applied to form multiple p-n and/or n-p junctions (e.g., n-p-n or p-n-p junctions).

Figure 6F:
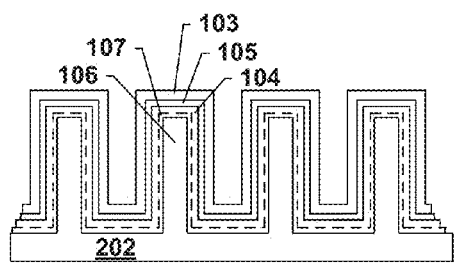
Figure 6G:
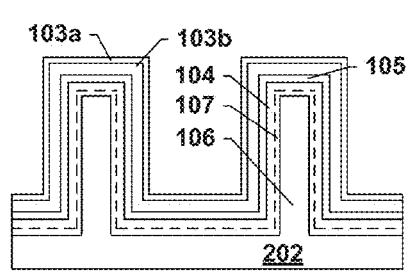

With the photon absorber layers formed, an outer conductive layer may be formed in block 848 as illustrated in FIG. 6G. The outer conductive layer may be a transparent conducting oxide or transparent conducting nitride, as are well-known in the photovoltaic technologies. In an embodiment, the only two absorber layers 104, 105 may be applied, and thus the outer conductive layer 103 is deposited (e.g., by chemical deposition or physical deposition) over the last absorber layer 104 as shown in FIG. 6F. In optional block 852, additional outer conductive layers may be applied depending upon the configuration of the photovoltaic bristles. Although the outer conductive layer in FIG. 6G includes two layers, any number of layers may make up the outer conductive layer 103.

Figure 7A:
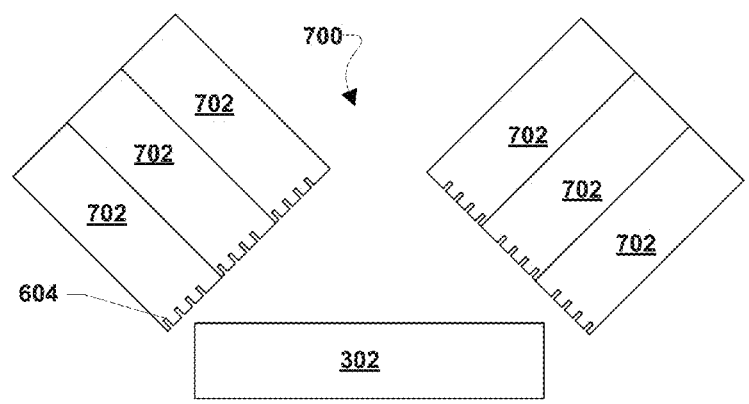
FIGS. 7A, 7B, and 7C are side views of a molding process embodiment for forming a substrate and form arrays of cores on the shaped substrate.
Figure 7B:
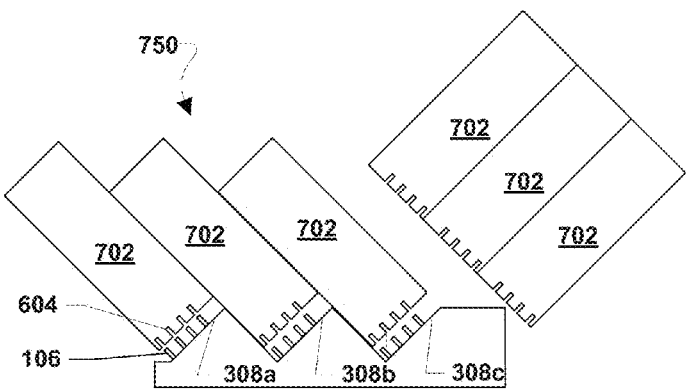
Figure 7C:
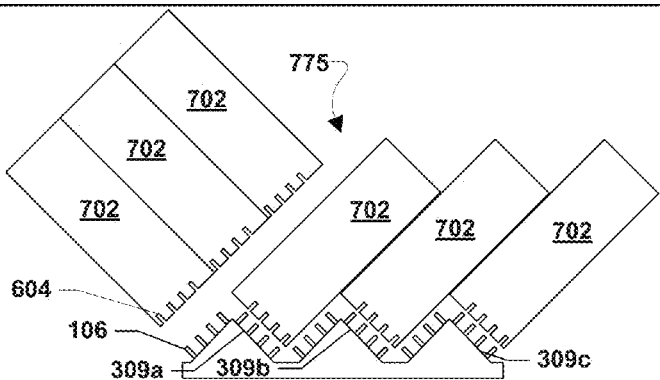

Corrugated photovoltaic cells may also be configured using similar processes as illustrated in FIGS. 7A-7C. For example, as illustrated in these figures, the operations of forming an array of cores in the plastic or polymer in block 808 may be accomplished by alternately pressing the material 302 with dies that are oriented at the desired angle of the corrugated surfaces. For example, photovoltaic bristles 106 may be formed on corrugated surfaces in the first orientation by pressing the material with dies 702 oriented along one angle as illustrated in FIG. 7B, followed by pressing the opposite surfaces with opposite oriented dies 702 as illustrated in FIG. 7C.

To form the embodiment illustrated in FIG. 4C in which photovoltaic bristles are formed on only alternating sides of the corrugated surface, only a single pressing step as illustrated in FIG. 7B may be accomplished. In some embodiments, in optional block 854 a reflective layer may be applied to the surfaces that do not feature photovoltaic bristles. This may be accomplished using photoelectric graphic methods, such as coding the photovoltaic bristles with a photoresist that is removed from the other surfaces before a reflective layers applied.

Figure 6H:
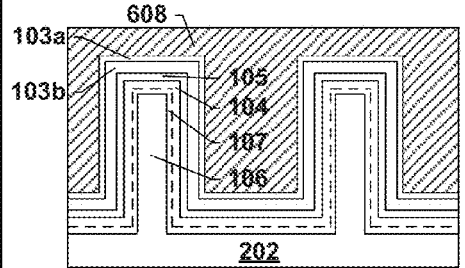

As illustrated in FIG. 6H, in optional block 856 the conductive traces may be added to portions of the solar cells to gather and distribute electricity from the photovoltaic bristles, thereby reducing the path length of electrons through the transparent conducting oxide layers. Finally in optional block 858, a transparent coating may be applied over the bristles in order to provide desirable strength and photon absorption c characteristics. For example, a transparent coating 608 may seal each bristle in a transparent material providing stability to each bristle to prevent the bristles from breaking. The transparent coating 608 may be conventional shatterproof material such as ethylene-vinyl acetate (EVA).

Figure 6I:
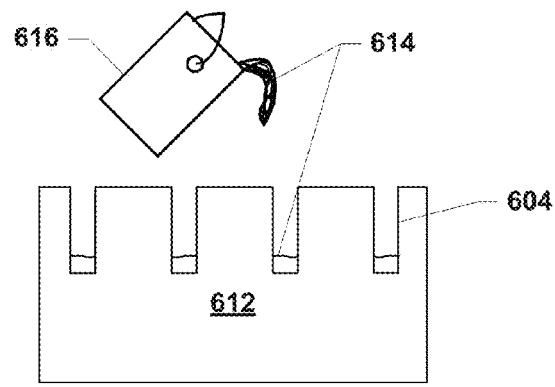
FIGS. 6I-6K are cross-sectional side views illustrating an embodiment method for forming an array of photovoltaic bristles using a molding process.
Figure 6J:
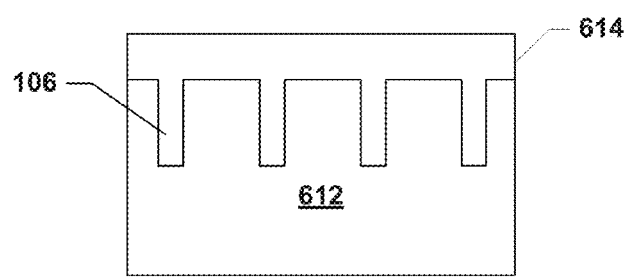
Figure 6K:
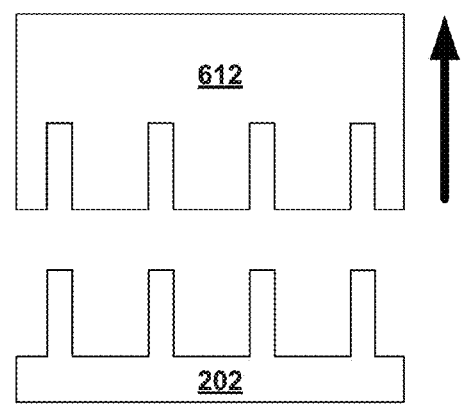

In a further embodiment method that uses some of the same processes as in method 800, the material forming the cores 106 may be poured and formed in a mold 612 instead of being pressed, as illustrated in FIGS. 6I through 6K. As illustrated in FIG. 6I, instead of a die 602, the same basic shape may be inverted to form a mold 612 onto which may be poured the material 614 to form the cores and supporting substrate. This material 614 may be a plastic or polymer, but may also be other materials, such as a metal, a ceramic paste, or a liquid glass (e.g., common glass). In this embodiment, the operations of forming the array of cores in block 808 include pouring the base material 614 into the mold 612, sufficiently covering the mold surface to provide a substrate 202 as shown in FIG. 6J. The material may be cured in block 810 in this state before the mold 612 is removed as shown in FIG. 6K. Thereafter, the operations of depositing absorber layers and outer conductive layers may be accomplished as described above with reference to blocks 812-858.

Figure 9A:
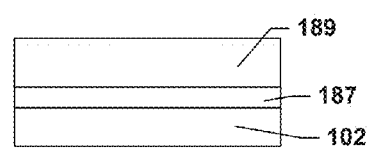
FIGS. 9A-9J are cross-sectional side views illustrating an embodiment method of a plating process to form an array of bristles for a metamaterial device.

Another embodiment method for forming an array of bristles for a metamaterial device involves plating up metal cores using photolithographic methods to create a template on a substrate. The plating up method is illustrated in FIGS. 9A-9J and FIG. 10. In block 1008 a metal layer may be deposited over a substrate. As illustrated in FIG. 9A the metal layer 187 may be deposited over the substrate 202 by chemical deposition or physical deposition. In block 1010 a photoresist layer over the metal layer. The photoresist layer 189 may be deposited over the metal layer 187 by chemical vapor deposition or physical deposition as shown in FIG. 9A. The photoresist layer 189 may be a positive photoresist or a negative photoresist.

Figure 9B:
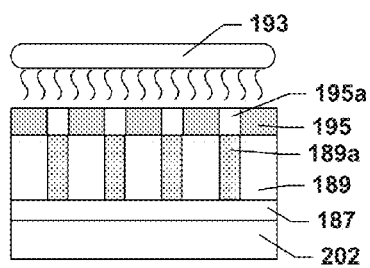

In block 1012 a mask may be applied over the photoresist. As shown in FIG. 9B, the mask 195 may include holes 195a through which ultraviolet light may pass so that only the photoresist beneath the holes is exposed as shown in FIG. 9B. In block 1014 the photoresist layer may be exposed to an ultraviolet light through the mask to create exposed photoresist portions 189a as shown in FIG. 9B. When a positive photoresist is used, the exposed photoresist portions 189a match the mask holes 195a. However, if a negative photoresist is used, ultraviolet light may be able to pass through the entire mask except through solid portions of the mask which block the ultraviolet light. After the ultraviolet light is applied to the photoresist 189 creating exposed portions 189a, the mask 195 is removed leaving the entire photoresist layer 189.

Figure 9C:
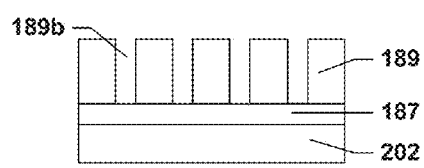

In block 1016 the method may include developing the photoresist layer to create a template of masked portions. A developer may be used to dissolve only the exposed portions of the photoresist. Assuming the method uses a positive photoresist 189, the exposed photoresist portions 189a are removed creating voids 189b in the photoresist layer that extend to the metal layer 187 as shown in FIG. 9C. These voids 189a along with the remaining photoresist layer 189 form a template over the metal layer 187.

Figure 9D:
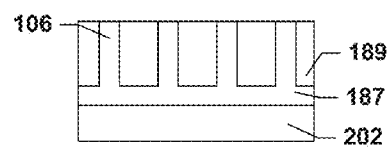

In block 1018 additional metal may be added to the metal layer through the photoresist layer using electroplating, chemical vapor deposition or plasma deposition methods, forming metal cores. As shown in FIG. 9D the metal cores 106 may fill the voids 189b within the photoresist 189 by electroplating metal in the voids 189b. Metal cores may also extend above the photoresist layer. Alternatively, a second metal layer may fill the voids 189b and covers the remaining portions of the photoresist layer 189 (not shown). The metal cores 106 may be the same material as the metal layer 187 such as gold, copper, nickel, molybdenum, iron, aluminum, or silver, or an alloy of the same.

Figure 9E:
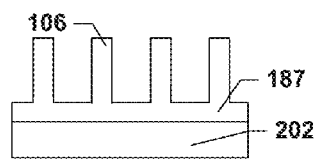

In block 1020 the photoresist layer may be removed using conventional methods. As shown in FIGS. 9D and 9E, the metal cores 106 may only fill the voids 189b created by the exposed photoresist layer through an electroplating process. When the photoresist layer 189 is removed, only the formed metal cores 106 (within voids 189b) remain. Alternatively, if a second metal layer fills the voids 189b and covers the photoresist layer 189, a lift-off process known in the art may remove the photoresist layer 189 and the second metal layer leaving only the metal cores 106. The resulting metal cores 106 from the lift-off process may have height greater than the voids 189b.

Figure 9F:
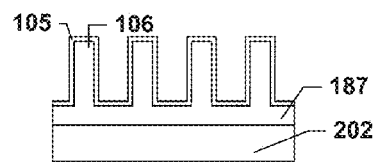

In block 1040 a first absorber layer (i.e., sublayer) 105 may be deposited over the metal core 106 for metamaterials 200 illustrated in FIG. 9F. In an embodiment, the first absorber layer 105 may include a semiconductor material. For example, the first absorber layer 105 may include silicon, amorphous silicon, polycrystalline silicon, single crystal silicon, cadmium telluride, cadmium sulfide, gallium arsenide, copper indium selenide, and copper indium gallium selenide. In an embodiment, the first absorber layer 105 may be deposited over the metal core 106 by electroplating, chemical vapor deposition, atomic layer deposition, etc. In an embodiment, the first absorber layer 105 may be deposited over the inner conductive layer 107 by sputtering, electron beam, pulsed laser deposition, etc.

Figure 9G:
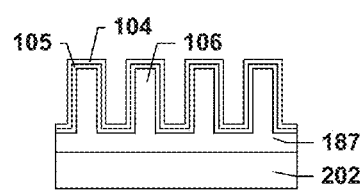

In block 1042 a second absorber layer 104 may be deposited over the first absorber layer 105 for metamaterial 200 as illustrated in FIG. 9G. Any deposition method used with respect to the first absorber layer 105 may also be used with the second absorber layer 104. In an embodiment, the second absorber layer 104 may include silicon, amorphous silicon, polycrystalline silicon, single crystal silicon, cadmium telluride, cadmium sulfide, gallium arsenide, copper indium selenide, and copper indium gallium selenide. In an embodiment, the second absorber layer 104 may be an absorber sublayer or region comprising the same material as the first absorber layer 105 with a different dopant. For example, the first absorber layer 105 may be p-doped amorphous silicon and the second absorber layer 104 may be n-doped amorphous silicon. In an embodiment, the second absorber layer 104 may be an absorber sublayer comprising a different material as the first absorber layer 105. For example, the first absorber layer 105 may be p-doped cadmium telluride and the second absorber layer 104 may be n-doped cadmium sulfide.

Figure 9H:
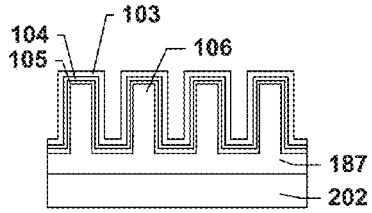

In some implementation multiple absorber layers may be applied. So in optional block 1046, one, two or more additional absorber layers may be applied over the previous layer in a manner similar to the process steps in blocks 1040 and 1042. As shown in FIG. 9H, in block 1048, an outer conductive layer 103 may be deposited over the last absorber layer (e.g., second absorber layer 104), such as by chemical deposition or physical deposition.

Figure 9I:
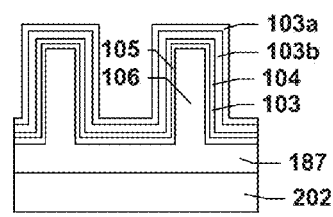

As illustrated in FIG. 9I, additional outer conductive layers may be applied in optional block 1052. In an embodiment, the outer conductive layers may include a transparent non-conductive layer 103a (e.g., an optical transparent polymer) and a conductive layer 103b (e.g., a transparent conducting oxide). Although the outer conductive layer shown in FIG. 9I includes two layers, any number of layers may make up the outer conductive layer 103. The non-conductive layer 103a illustrated in FIG. 9I may be a conformal layer which may act as a protective coating similar to the transparent coating 608 described below. The conformal non-conductive layer 103a may be added by dip coating, chemical vapor deposition, physical deposition, and atomic layer deposition, and evaporation techniques.

Figure 23:
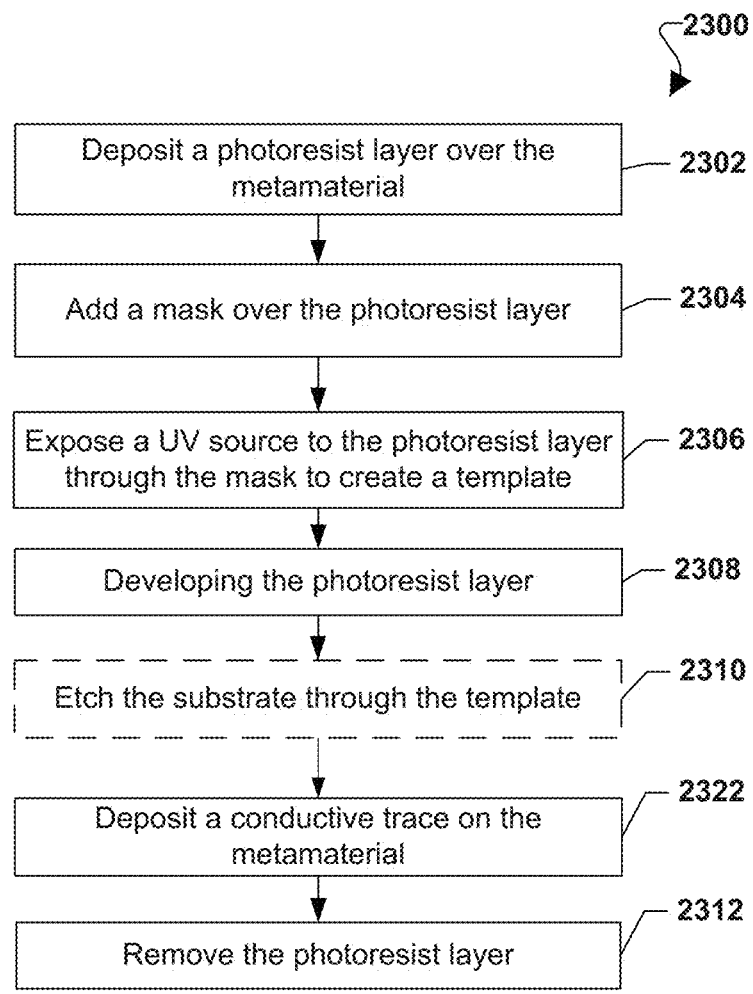
FIG. 23 is a process flow diagram of the embodiment method for depositing current conducting traces on the outer conductive layer of a metamaterial illustrated in FIGS. 22A-22H.
Figure 25:
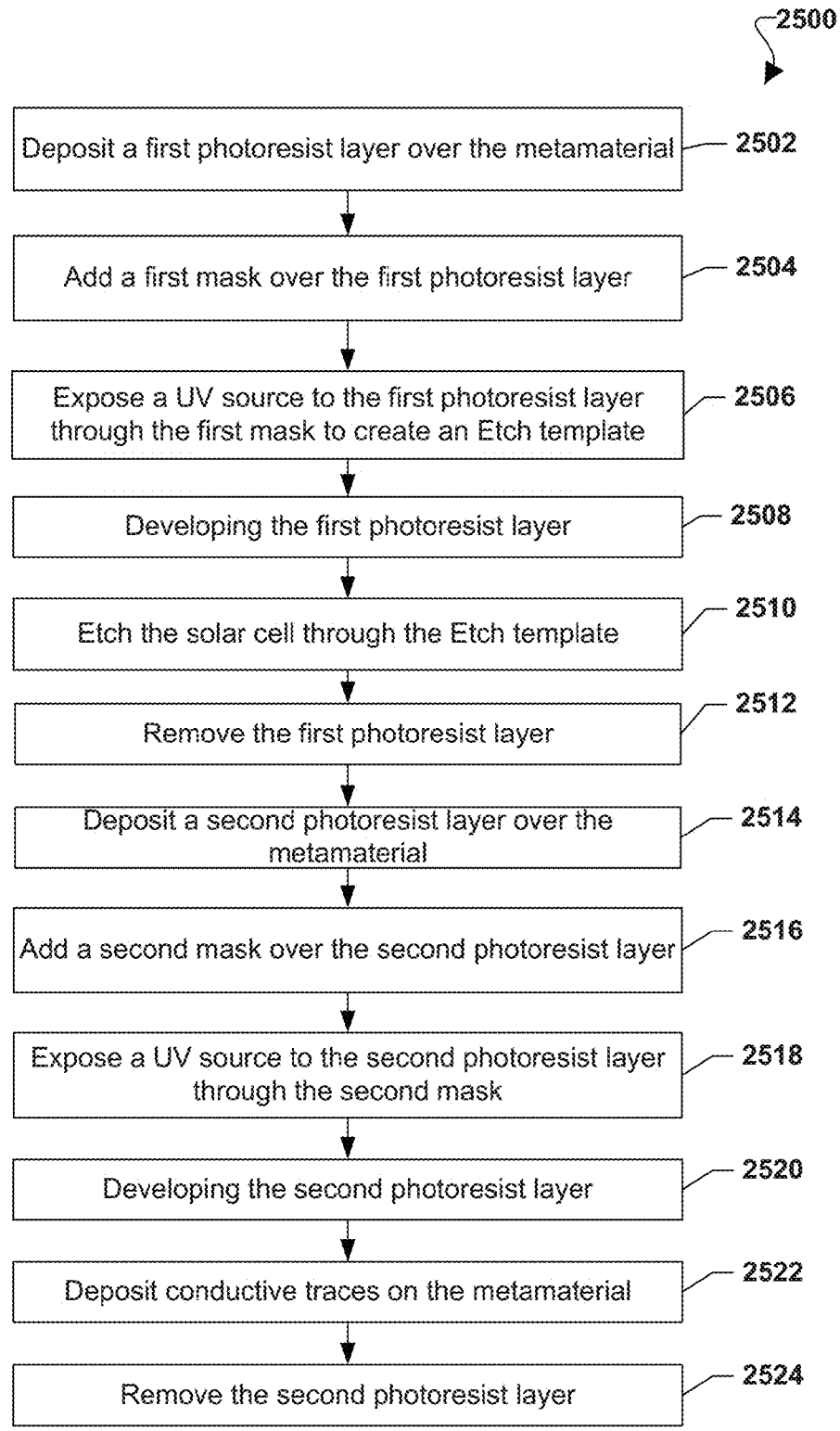
FIG. 25 is a process flow diagram of the embodiment method for depositing current conducting traces on an inner conductive layer of a metamaterial illustrated in FIGS. 24A-24J.

In optional block 1056, current conducting traces may be added to the metamaterials 200 and 300. As explained later with reference to FIGS. 23 and 25, the current conducting traces may be added by creating a template using photolithography and depositing a highly conductive material in a selected position from the template. The current conducting trace may be deposited on the metamaterial by any known deposition method such as chemical vapor deposition, physical deposition, plating, or ink jet material deposition. The ink jet deposition methods may utilize piezoelectric ink jets to add silver or other colloidal conductive material to the desired position without damaging the metamaterial.

Alternatively, the current conductive traces may be added by etching with laser ablation in combination with a deposition method such as ink jet. Tuned wavelength lasers may etch desired layers by controlling the laser's wavelength for different layers within the metamaterial. Once etching is complete, the method may include adding the electrical connections such as the current conducting traces at the desired positions on the metamaterial by chemical vapor deposition, physical deposition, plating or inkjet deposition.

As a further alternative, the metamaterial may be etched using ink jet technology to apply an acid to precise locations followed by applying the conductive material using the same technology, or any other deposition method known in the art.

Regardless of method used, the current conducting traces may allow for efficient transfer of electricity by adding a lower resistant electrical path within the metamaterials.

Figure 9J:
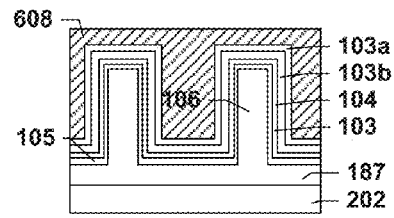
Figure 10:
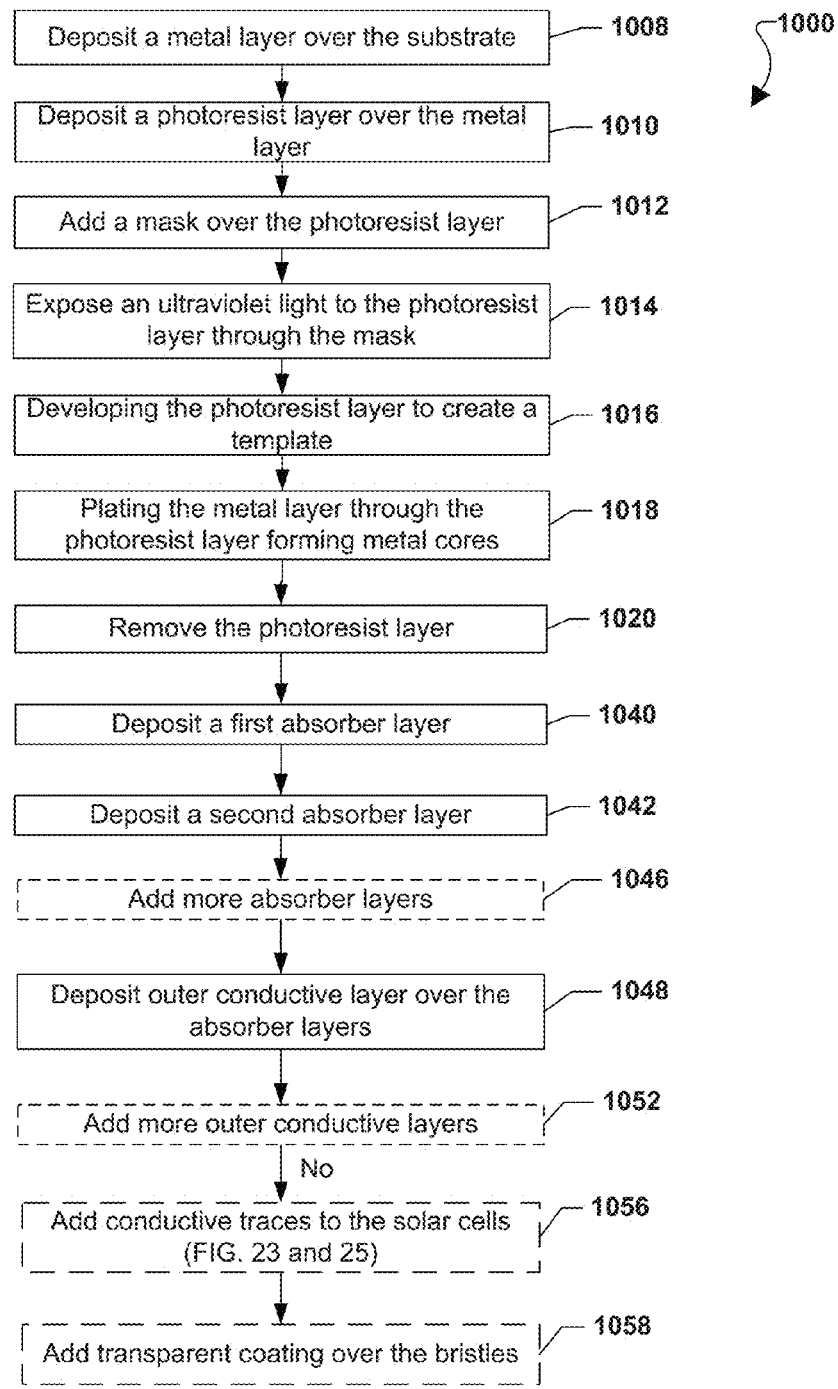
FIG. 10 illustrates an embodiment plating method for forming the embodiment metamaterials.

In optional block 1058 a transparent coating may be deposited over the bristles. As illustrated in FIG. 9J, the transparent coating 608 is different from the outer conductive layer 103 and its sublayers 103a and 103b. The transparent coating 608 may completely fill the voids between each bristle and extending beyond the height of each bristle. As shown, the transparent coating 608 may not be conformal, thus leading to deposition methods that use liquid solutions. Accordingly, the method of depositing transparent coating 608 may include one or more of the following: immersion coating techniques, spray gel techniques, extrusion techniques, a spreader bar, photoresist techniques, sol gel techniques, or any other methods known in the art. The transparent coating 608 may seal each bristle providing stability and preventing them from breaking, as well as insulating each bristle from any heat created by the metamaterial device. Observations and experimentations also indicate enhanced peak power generation as the sun translates across the sky for a metamaterial device with a transparent coating 608 having an index of refraction similar to glass (e.g., around 1.5). All of these benefits may add enhanced power performance and total power generation of the metamaterial device.

A further method for forming an array of bristles for metamaterial 200 includes forming bristles by etching vias in a substrate through a photolithographic template. The method includes adding an inner conductive layer 107 and a base layer 202b over the original substrate 202a and in the vias. The method then includes turning the metamaterial device over and depositing absorber layers 104, 105, outer conductive layers 103a, 103b and a transparent coating over the inner conductive layer. This via method is illustrated in FIGS. 11A-11L and FIG. 12.

Figure 11A:
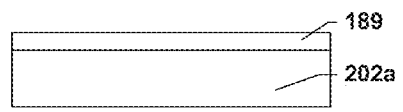
FIGS. 11A-11L are cross-sectional side views illustrating an embodiment method for forming the embodiment metamaterial by creating vias using photolithographic and etching techniques and subsequently removing the original substrate.
Figure 11B:
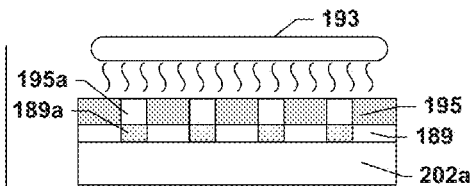

In block 1210 a photoresist layer may be deposited over the substrate. The photoresist layer 189 may be deposited over the substrate 202a by chemical vapor deposition or physical deposition as shown in FIG. 11A. Although FIGS. 11B-11D illustrates a positive photoresist, the photoresist layer 189 may be negative photoresist.

In block 1212 a mask may be deposited over the photoresist layer. The mask 195 may be any suitable mask known in the art. As shown in FIG. 12B, the mask 195 may include mask holes 195a. Alternatively, if using a negative photoresist, the pores 195a may be filters for blocking ultraviolet light.

In block 1214 the method may include exposing an ultraviolet light to the photoresist layer through the mask. The ultraviolet light from the ultraviolet light source 193 passes through the mask holes 195a into the photoresist layer 189 creating exposed portions 189a of the photoresist layer as shown in FIG. 11B. The exposed photoresist portions 189a match the mask holes 195a. However, if a negative photoresist is used, ultraviolet light may be able to pass through the entire mask except through filters where at the locations of mask holes 195a, which block the ultraviolet light. Regardless, after the ultraviolet light is applied to the photoresist layer 189 creating exposed portions 189a, the mask 195 is removed leaving the entire photoresist 189.

Figure 11C:
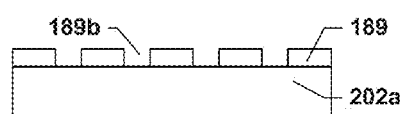
Figure 11D:
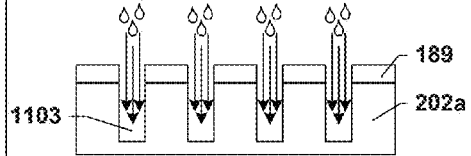

In block 1216 the method may include developing the photoresist layer to create a template, such as by using developer to dissolve the exposed portions of the photoresist as shown in FIG. 11C. After dissolving the required portions of the photoresist layer, the remaining photoresist layer 189 portions forms a template over the substrate 202a.

In block 1218 the substrate may be etched through the template creating vias. Etching may include wet etching or dry etching. Regardless of the etching technique, vias 1103 are formed from within the substrate 202a.

Figure 11E:
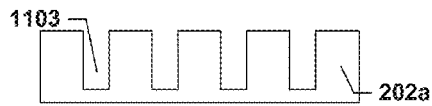

In block 1220 the photoresist layer may be removed as shown in FIGS. 11D-11E, leaving only the original substrate 202a with formed vias 1103. Any process known in the art may remove the photoresist layer 189 from the substrate. For example, the photoresist may be removed by stripping or dissolving the remaining portion of the photoresist.

Figure 11F:
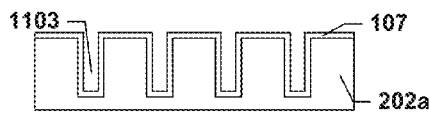

In block 1222 an inner conductive layer may be deposited in the vias. As shown in FIG. 11F, the inner conductive layer 107 may be deposited as a layer that covers the bottoms and the sides of the vias 1103 as well as covering the top of the substrate 202a. Although the method steps do not explicitly show it, the inner conductive layer 107 may include multiple layers similar to the outer conductive layer 103 later described with reference to blocks 1248, 1450, and 1452.

Figure 11G:
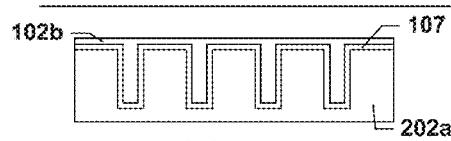

As shown in FIG. 11G, in block 1224 the base layer may be deposited over the inner conductive layer 107. Although the base layer 202b is a separate layer than the original substrate 202a, it may be the same material as the original substrate 202a. Alternatively, the base layer 202b may be a different substance. It should be noted, that although FIG. 11G illustrates the base layer 202b completely fills the vias 1103, the base layer 202b may only partially fill the vias 1103 and may be deposited similar to the inner conductive layer 107 resulting in an unfilled void and a non-solid core.

Figure 11H:
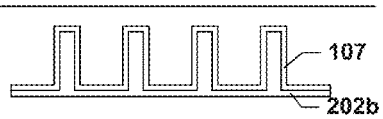

In block 1226 the device may be turned over, and the substrate etched in block 1228. FIG. 11H illustrates the metamaterial device turned over (i.e., flipped 180 degrees) as well as the original substrate etched away leaving the inner conductive layer 107 and the base layer 202b. A wet etching process (i.e., using acid) or a dry etching process may remove the original substrate 202a.

Figure 11I:
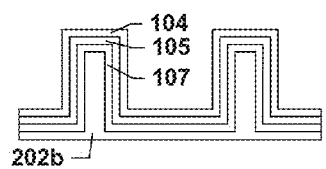

In block 1240, a first absorber layer (i.e., sublayer) 105 may be deposited over the inner conductive layer 107 for metamaterial 200 as illustrated in FIG. 11I. In an embodiment, the first absorber layer 105 may include a semiconductor material. For example, the first absorber layer 105 may include silicon, amorphous silicon, polycrystalline silicon, single crystal silicon, cadmium telluride, cadmium sulfide, gallium arsenide, copper indium selenide, and copper indium gallium selenide. In an embodiment, the manufacturing system may add the first absorber layer 105 over the metal core 106 by electroplating, chemical vapor deposition, atomic layer deposition, etc. In an embodiment, the manufacturing system may add the first absorber layer 105 over the inner conductive layer 107 by sputtering, electron beam physical deposition, pulsed laser deposition, etc.

In block 1242 a second absorber layer may be deposited over the first absorber layer 105 for metamaterial 200 as illustrated in FIG. 11I. Any deposition method used to deposit the first absorber layer 105 may be used to deposit the second absorber layer 104. In an embodiment, the deposition method for the second absorber layer 104 may be the same deposition method used for adding the first absorber layer 105. In an embodiment, the second absorber layer 104 may include a semiconductor material. For example, the second absorber layer 104 may include silicon, amorphous silicon, polycrystalline silicon, single crystal silicon, cadmium telluride, cadmium sulfide, gallium arsenide, copper indium selenide, and copper indium gallium selenide. In an embodiment, the second absorber layer 104 may be an absorber sublayer or region comprising the same material as the first absorber layer 105 with a different dopant. For example, the first absorber layer 105 may be p-doped amorphous silicon and the second absorber layer 104 may be n-doped amorphous silicon. In an embodiment, the second absorber layer 104 may be an absorber sublayer comprising a different material as the first absorber layer 105. For example, the first absorber layer 105 may be p-doped cadmium telluride and the second absorber layer 104 may be n-doped cadmium sulfide.

Figure 11J:
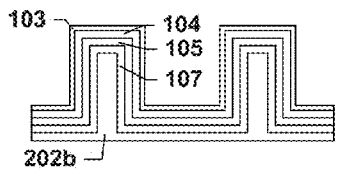
Figure 11K:
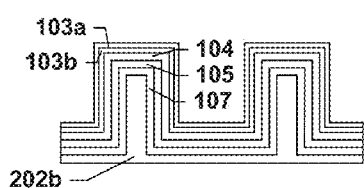

As mentioned above, in some implementations multiple absorber layers may be applied, so in optional block 1246 such additional absorber layers may be over the previous layer in a manner similar to the process steps in blocks 1240 and 1242. As shown in FIG. 11J, in block 1248, an outer conductive layer 103 may be deposited over the last absorber layer (e.g., second absorber layer 104). In optional block 1252, multiple outer conductive layers may be applied as illustrated in FIG. 11K. As discussed above, such outer conductive layers may be applied using chemical deposition or physical deposition.

In optional block 1256, current conducting traces may be deposited on the metamaterials 200. As explained later with reference to FIGS. 23 and 25, the current conducting traces may be added by creating a template using photolithography and depositing a highly conductive material in a selected position from the template. The current conducting traces may be deposited on the metamaterial by any known deposition method such as chemical vapor deposition, physical deposition, plating, or ink jet material deposition. The ink jet deposition may utilize piezoelectric technology and add silver or any other colloidal material to the desired position without damaging the metamaterial. Alternatively, the current conductive traces may be added by etching with laser ablation in combination with a deposition method such as ink jet techniques. Tuned wavelength lasers may etch desired layers by controlling the laser's wavelength for different layers within the metamaterial. Once etching is complete, the method may include adding the electrical connections such as the current conducting traces at the desired positions on the metamaterial by chemical vapor deposition, physical deposition, plating or inkjet deposition. As a further alternative, the metamaterial may be etched by ink jet technology using acid followed by deposition of conductive material using the same technology or any other deposition method known in the art. Regardless of method used, the current conducting traces may allow for efficient transfer of electricity by adding a lower resistant electrical path within the metamaterials.

Figure 11L:
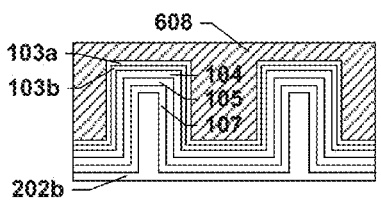
Figure 12:
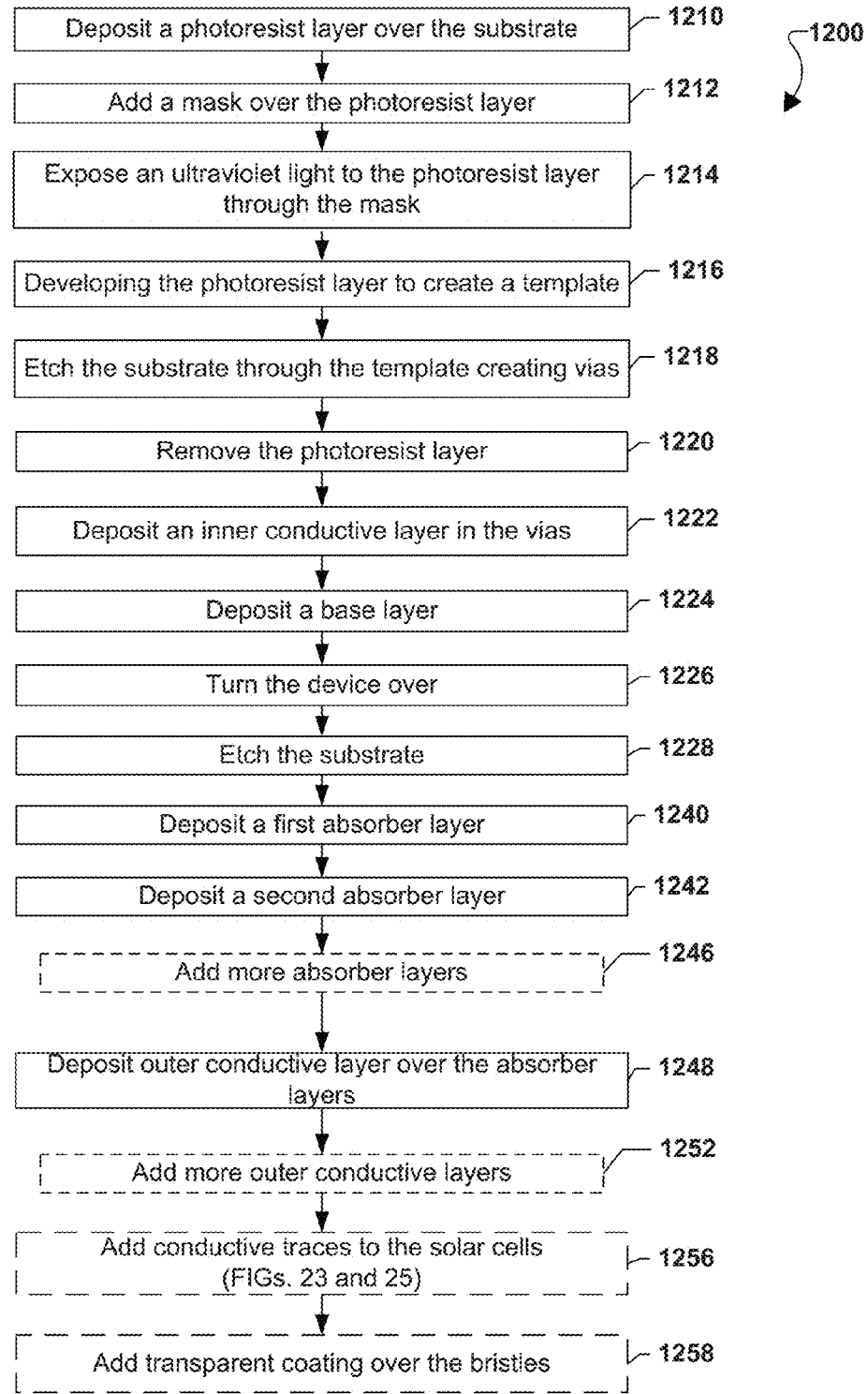
FIG. 12 is a process flow diagram illustrating the embodiment method for forming the embodiment metamaterials illustrated in FIGS. 11A-11L.

As illustrated in FIG. 11L, in optional block 1258 a transparent coating may be applied over the bristles. Such a transparent coating 608 may be different from the outer conductive layer 103 and any sublayers 103a and 103b. The transparent coating 608 may fully fill the voids between each bristle and extend beyond the height of each bristle. As shown, the transparent coating 608 may not be conformal thus leading to deposition methods that use liquid solutions. Thus, the method of depositing transparent coating 608 may include using one or more of the following immersion coating, spray gel techniques, extrusion techniques, a spreader bar, photoresist techniques, sol gel techniques, or any other methods known in the art. In an embodiment, the transparent coating 608 may be a shatterproof material such as EVA. The transparent coating 608 may seal each bristle providing stability and to prevent them from breaking as well as insulate each bristle from any heat created by the metamaterial device. Observations and experimentations also indicate enhanced peak power generation as the sun translates across the sky for a metamaterial device with a transparent coating 608 having a index of refraction similar to glass (e.g., around 1.5). All these benefits may add enhanced power performance and total power generation of the metamaterial device.

A further method for forming an array of bristles for a metamaterial 200 includes forming the bristles by etching vias in a substrate through a photolithographic template. Bristles are formed within the vias by depositing an outer conductive layer, absorber layers, an inner conductive layer, an optional base layer. After forming the bristles, the metamaterial may be turned over where the original substrate is left intact serving as a protective coating and an optical enhancement for the metamaterial 200. This via method is illustrated in FIGS. 13A-13L and FIG. 14. As shown in FIG. 13A-13L and the method steps in FIG. 14, an etching technique may be used to create vias, which is particularly useful when using a glass substrate.

Figure 13A:
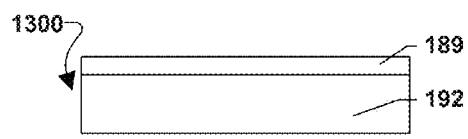
FIGS. 13A-13L are cross-sectional side views illustrating an embodiment method for forming the embodiment metamaterial by creating vias using photolithographic and etching techniques while leaving the etched substrate intact.
Figure 13B:
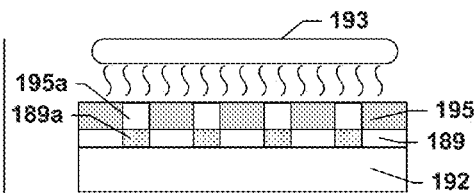
Figure 13C:
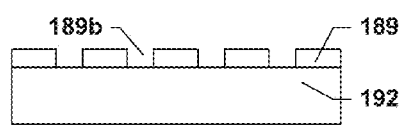
Figure 13D:
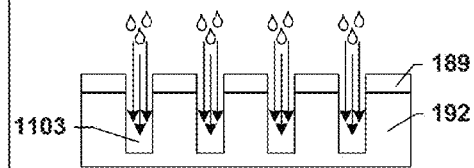
Figure 14:
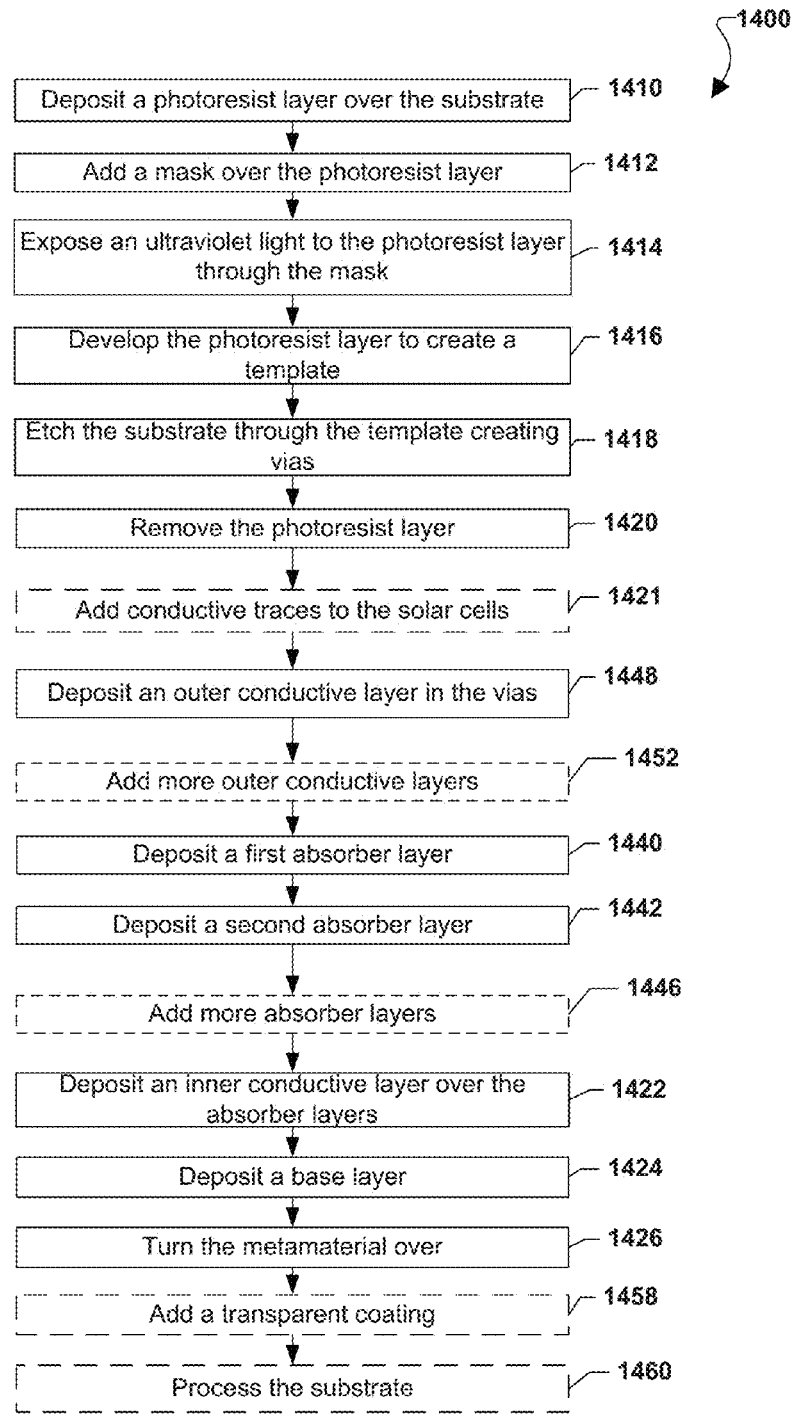
FIG. 14 is a process flow diagram of the embodiment method illustrated in FIGS. 13A-13L.

In block 1410 a photoresist may be deposited over the substrate. The photoresist layer 189 may be deposited over the substrate 202a by spin on, spray on, or other controlled flow methods know in the art as shown in FIG. 13A. Although FIGS. 13B-13D illustrate a positive photoresist, the photoresist layer 189 may be negative photoresist.

In block 1412 a mask may be positioned over the photoresist layer. The mask 195 may be any suitable mask known in the art. As shown in FIG. 12B, the mask 195 may include mask holes 195a. Alternatively, if using a negative photoresist, the pores 195a may be filters for blocking ultraviolet light.

In block 1414 the method may include exposing an ultraviolet light to the photoresist layer through the mask. The mask 195 may be any suitable mask known in the art. As shown in FIG. 13B, the mask 195 may include mask holes 195a.

In block 1416 the method may include developing the photoresist layer to dissolve the exposed portions of the photoresist layer. Assuming a positive photoresist layer 189, the exposed portions 189a are removed creating voids 189b in the photoresist layer that extend to the substrate 202a as shown in FIG. 13C. After dissolving the required portions of the photoresist layer 189, the remaining photoresist layer 189 forms a template over the substrate 192.

In block 1418 the substrate may be etched through the template creating vias. Etching may include wet etching or dry etching. Regardless of the etching technique employed, vias 1103 are formed from within the substrate 192.

Figure 13E:
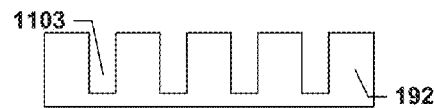
Figure 13F:
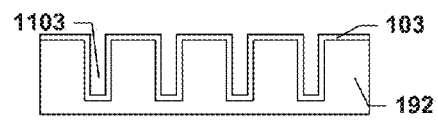

In block 1420 the photoresist layer may be removed leaving the substrate 192 with formed vias 1103 as shown in FIGS. 13D-13E.

Since the outside layers of the photovoltaic bristles are laid down first, conductive traces used to draw current from the photovoltaic cells may be laid down as a first step. Thus, in optional block 1421, conductive traces may be applied to the substrate. Vias for such conductive traces may be formed as part of the operations in blocks 1410-1420. Alternatively, conductive traces may be applied to the substrate using dedicated photolithography steps, laser ablation steps, and deposition steps such as those described above and below. In a particular embodiment, the conductive traces may be applied using spray jet techniques. In block 1422 an outer conductive layer may be deposited in the vias, such as by chemical vapor deposition or physical deposition. If conductive traces are prior to the outer conductive layer, the method may include depositing the outer conductive layer 103 over the conductive traces as a conformal film.

Figure 13G:
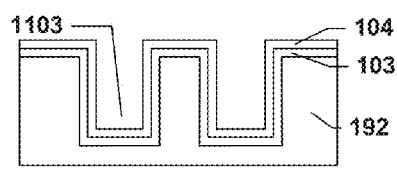
Figure 13H:
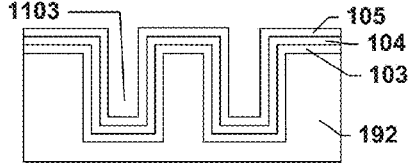

Although not shown in FIGS. 13A-13L, the metamaterial may include an outer conductive layer 103 with multiple sublayers. So, in optional block 1452 another outer conductive layer may be applied over the previous layer, essentially repeating blocks 1450 and 1452. As shown in FIGS. 13G-13H, in block 1440 a first absorber layer may be deposited on the outer conductive layer(s), and in block 1442 a second absorber layer may be deposited over the first absorber layer. The first and second absorber layer 104, 105 may be applied by chemical vapor deposition.

Figure 13I:
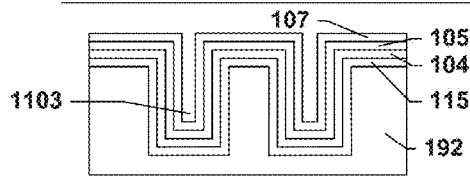

In block 1446 additional absorber layer applied over the previous layer in a manner similar to the process steps in blocks 1440 and 1442. In block 1448, an inner conductive layer 107 may be applied over the last absorber layer (e.g., second absorber layer 105). In an embodiment, the method may include adding only two absorber layers 104, 105 and thus the inner conductive layer 107 is deposited over the last absorber layer 105 by chemical deposition or physical deposition as shown in FIG. 13I. Although the method steps do not explicitly show it, the inner conductive layer 107 may also include multiple layers similar to the outer conductive layer 103.

Figure 13J:
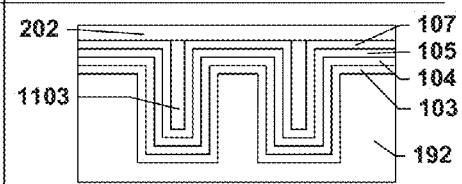

In block 1424 a base layer may be deposited. As shown in FIG. 13J, the base layer 202 may be different from the substrate 192 associated with block 1410. The base layer 202 may be deposited over the inner conductive layer 107 and serves as the actual bottom substrate of the metamaterial device once the vias are turned over. The base layer 202 may fill the vias 1103 creating bristles with solid cores. Alternatively, as shown in FIG. 13J, the base layer 202 may not fill the vias 1103, creating bristles with non-solid cores. Regardless, the base layer 202 may be deposited over the inner conductive layer 107 by any method known in the art.

Figure 13K:
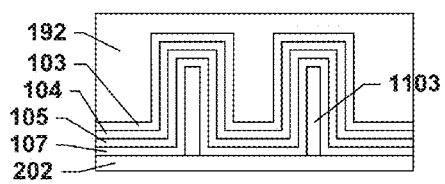
Figure 13L:
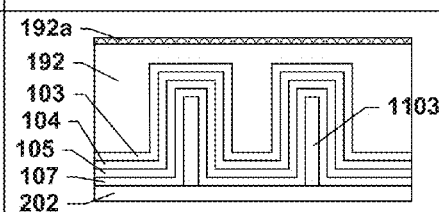

In block 1426 the metamaterial may be turned over as shown in FIG. 13K, so that the bristles are turned upright presenting the original substrate 192 covering the outer conductive layer 103 at the top and the base layer 202 at the bottom of the device. In optional block 1460 the substrate may be further processed, such as to form an antireflection layer or rough outer surface 192a as shown in FIG. 13L.

Figure 13M:
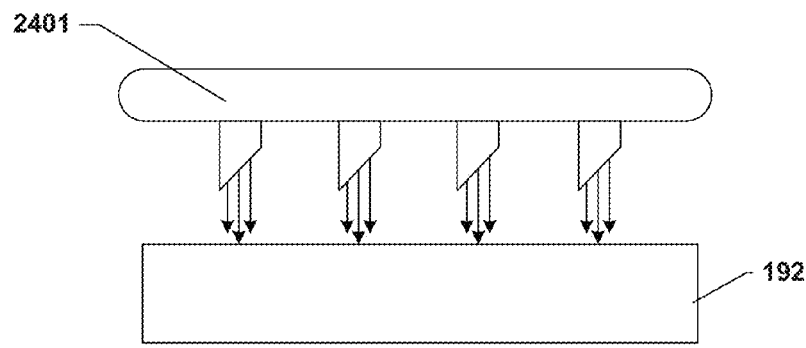
FIGS. 13M-13O are cross-sectional side views illustrating an alternative embodiment method for creating vias using lasers.
Figure 13N:
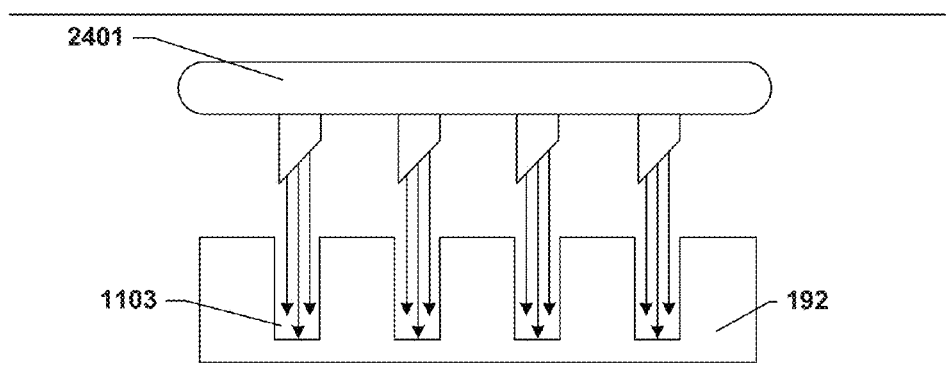
Figure 13O:
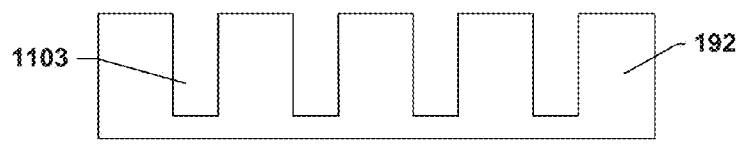

In an alternative embodiment method, lasers 2401 may create vias 1103 out of a substrate or index matched material as illustrated in FIGS. 13M through 13O. The lasers 2401 may be controlled in terms of exposure time and energy in order to control the depth and size of the vias. After creating the vias 1103, the method 1400 operations described above with references to blocks 1421, 1448, 1452, 1440, 1442, 1446, 1442, 1422, 1424, 1426, 1458, and 1460 may be followed.

Stamps may create vias out of a substrate such as a transparent polymer. When using a polymer, a UV source may cure the stamped vias creating a more rigid structure followed by adding conductive layers, absorber layers, and a base layer. The stamping via method for forming an array of bristles for a metamaterial device is illustrated in FIGS. 15A-15J and FIG. 16.

Figure 15A:
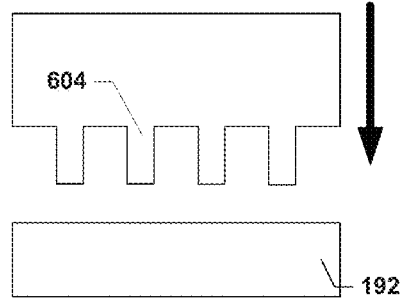
FIGS. 15A-15J are cross-sectional side views illustrating an embodiment method for forming the embodiment metamaterial by creating vias using a stamping method and leaving the substrate intact.
Figure 15B:
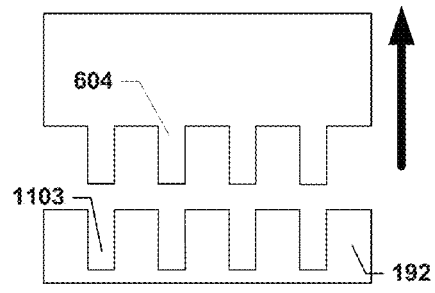
Figure 15C:
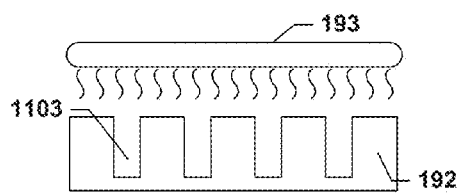

In block 1608 an array of vias may be formed out of the processed polymer. As illustrated in FIGS. 15A-15B, a stamping process may be used to create vias 1103 out of a polymer substrate 192. In block 1610 the formed polymer may be cured or otherwise treated to yield desired material properties. For example, such curing/treating may include heating and/or exposure to an ultraviolet light source 193.

The stamping process may include a rolling press or rolling die to create vias 1103 on a substrate 192 similar to FIG. 15B. When using a rolling press or a rolling die, a roll-to-web and a web-to-plate sub-process may create the associated stamps and vias method 1600. The rolling press or rolling die sub-process is described in more detail below with reference to FIGS. 33A-33G, 34, 35A-35E, 36A-36E.

Figure 15D:
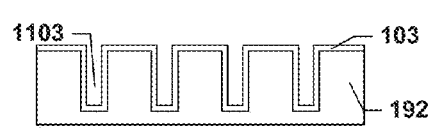

Similar to method 1400, the method 1600 includes laying down the outside layers of the photovoltaic bristles are laid down first, so conductive traces used to draw current from the photovoltaic cells may be laid down prior to the outer conductive layer 103. Thus, in optional block 1612, conductive traces may be applied to the substrate. Vias for such conductive traces may be formed as part of the operations in blocks 1608-1610. Alternatively, conductive traces may be applied to the substrate using dedicated photolithography steps, laser ablation steps, and deposition steps such as those described above and below. In particular embodiment, the method may include applying conductive traces using a spray jet techniques. In block 1622 an outer conductive layer may be deposited in the vias. If conductive traces are added prior to the outer conductive layer 103, the method may include depositing the outer conductive layer 103 over the conductive traces as a conformal film. As illustrated in FIG. 15D, the outer conductive layer 103 may be deposited over the polymer 192 and in the vias 1103.

Although it is not shown in FIGS. 15A-15J, multiple outer conductive layers 103 or sublayers may be applied. So, in optional block 1652 additional outer conductive layers may be applied over the previous layer.

Figure 15E:
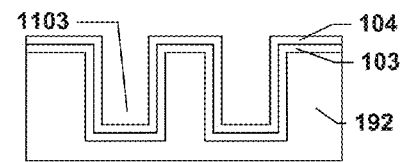
Figure 15F:
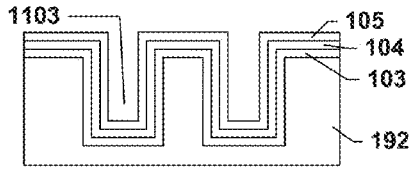

As shown in FIGS. 15E-15F, in block 1640 a first absorber layer may be applied over the outer conductive layer(s), and in block 1642 a second absorber layer may be deposited over the first absorber layer. The method may deposit the first and second absorber layer 104, 105 by chemical vapor deposition. In optional block 1646 additional absorber layers may be deposited over the other absorber layers in a manner similar to the process steps in blocks 1640 and 1642.

Figure 15G:
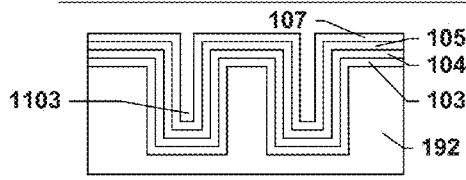

As shown in FIG. 15G, in block 1648, an inner conductive layer 107 may be applied over the last absorber layer (e.g., second absorber layer 105), such as by chemical vapor deposition or physical deposition. The inner conductive layer 107 may also include multiple layers similar to the outer conductive layer 103 earlier described with reference to blocks 1622, 1650, and 1652.

Figure 15H:
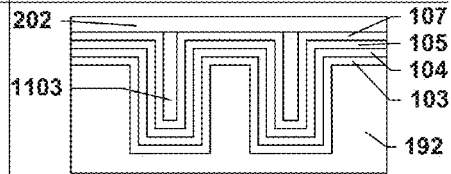

As shown in FIG. 15H, in optional block 1624 a base layer may be applied. The base layer 202 may be different from the polymer 192 applied in block 1608 because the base layer 202 is deposited over the inner conductive layer 107 and serves as the actual bottom substrate of the metamaterial device once turned over. Although the polymer 192 may be of the same material as the base layer 202, the polymer 192 may serve as an outer transparent coating to the metamaterial device once the metamaterial is complete. The base layer 202 may fill the vias 1103 creating bristles with solid cores. Alternatively, as shown in FIG. 15J, the base layer 202 may not fill the vias 1103, creating bristles with non-solid cores. Regardless, the base layer 202 may be deposited over the inner conductive layer 107 by any method known in the art.

Figure 15I:
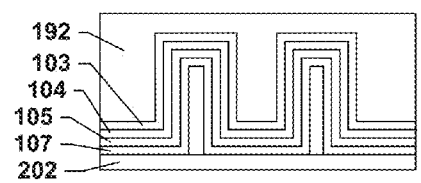
Figure 15J:
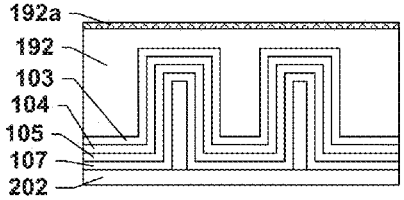

As shown in FIG. 15I, in block 1626 the metamaterial may be turned over for further processing. In optional block 1660 the substrate 192 may be processed to give it desired physical properties, such as hardening or polishing. The processing may include forming an antireflection layer or rough outer surface 192a as shown in FIG. 15J.

Figure 15K:
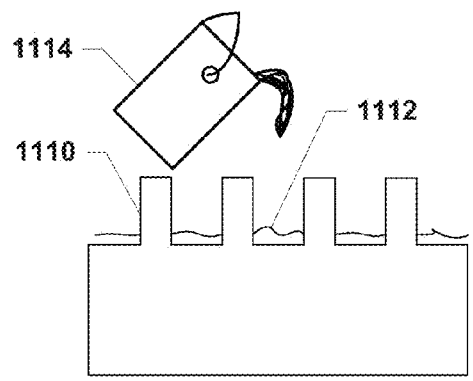
FIGS. 15K-15M are cross-sectional side views for forming the embodiment metamaterial by molding a substrate and leaving the substrate intact.
Figure 15L:
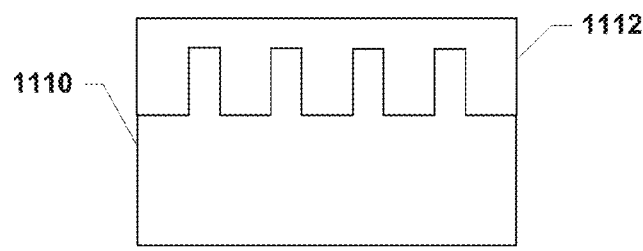
Figure 15M:
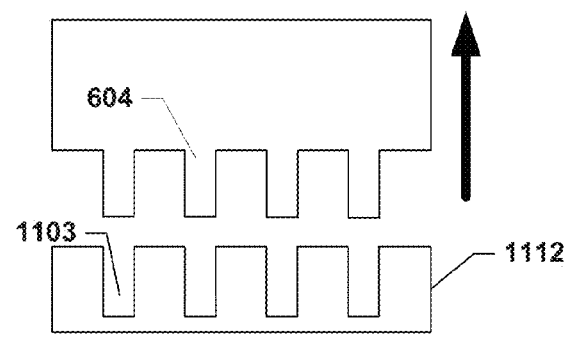
Figure 16:
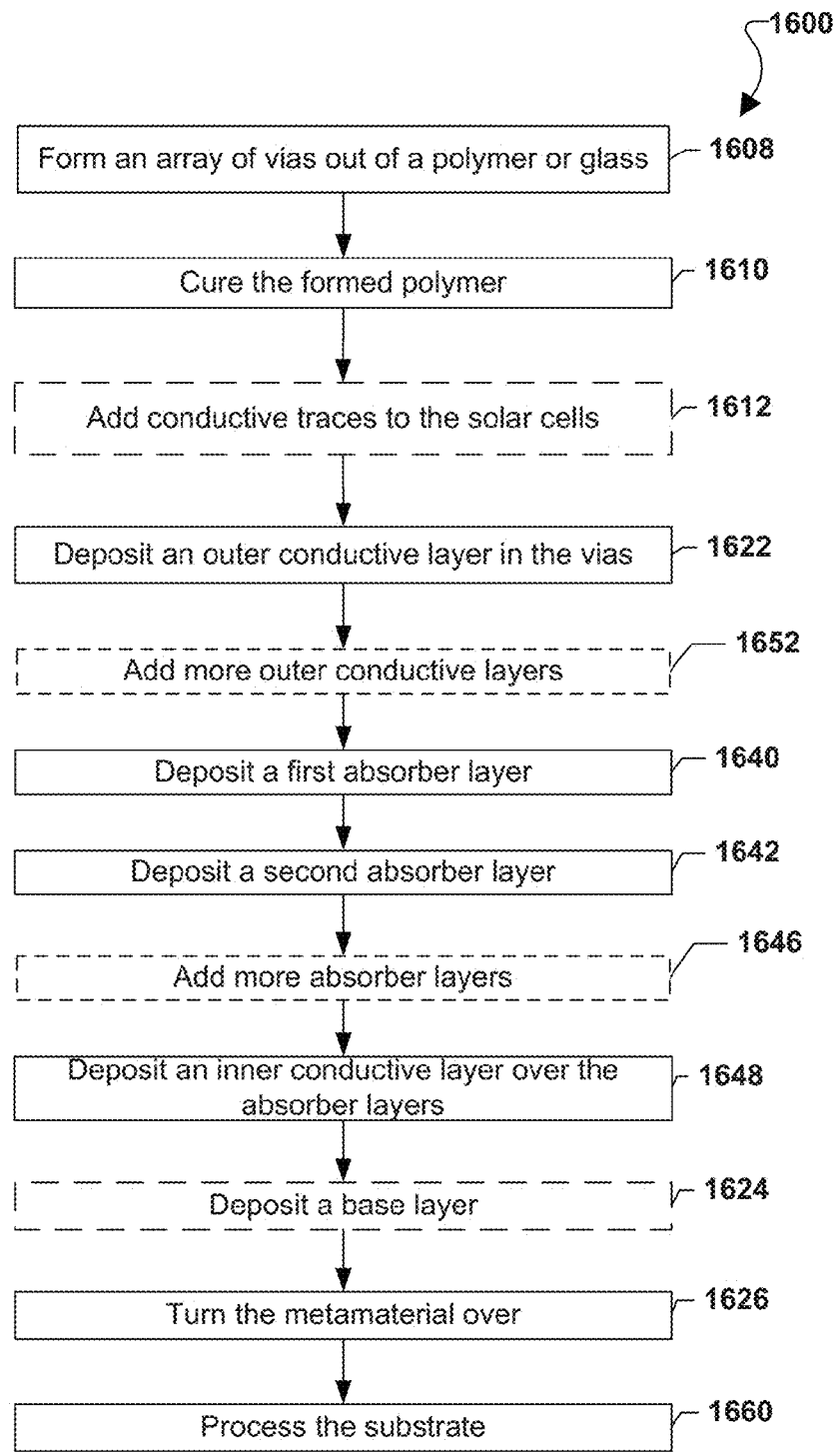
FIG. 16 is a process diagram of the embodiment method for forming the metamaterial illustrated in FIGS. 15A-15J.

In a further embodiment method that uses some of the same processes as in method 1600, material 1112 in which vias 1103 are poured into a mold 1110 instead of being pressed, as illustrated in FIGS. 15K through 15M. As illustrated in FIG. 15K, instead of a die, the same basic shape may be inverted to form a mold 1110 onto which may be poured the material 1112 to form the vias 1103 and supporting substrate. This material 1113 may be a transparent plastic, polymer or glass that will ultimately have the desired optical properties in the finished product. In this embodiment, the operations of forming the array of vias 1103 in block 1608 include pouring the base material 1112 into the mold 1110, sufficiently covering the mold surface to provide a substrate 1112 as shown in FIG. 15L. The material may be cured in block 1610 in this state before the mold 1110 is removed as shown in FIG. 15M. Thereafter, the operations of depositing outer conductive layers, absorber layers and inner conductors may be accomplished as described above with reference to blocks 1612-1626.

As a further alternative embodiment, vias may be formed by adding an index-matched nano-imprinted layer over a substrate. The nano-imprinted layer includes the vias for methods 1200, 1400, 1600 and may use suitable nano-imprinting techniques known in the art. For example, methods 1200, 1400, and 1600 may include depositing a nano-imprinted layer material with an index of refraction of 1.5 over a glass or polymer substrate.

Figure 8:
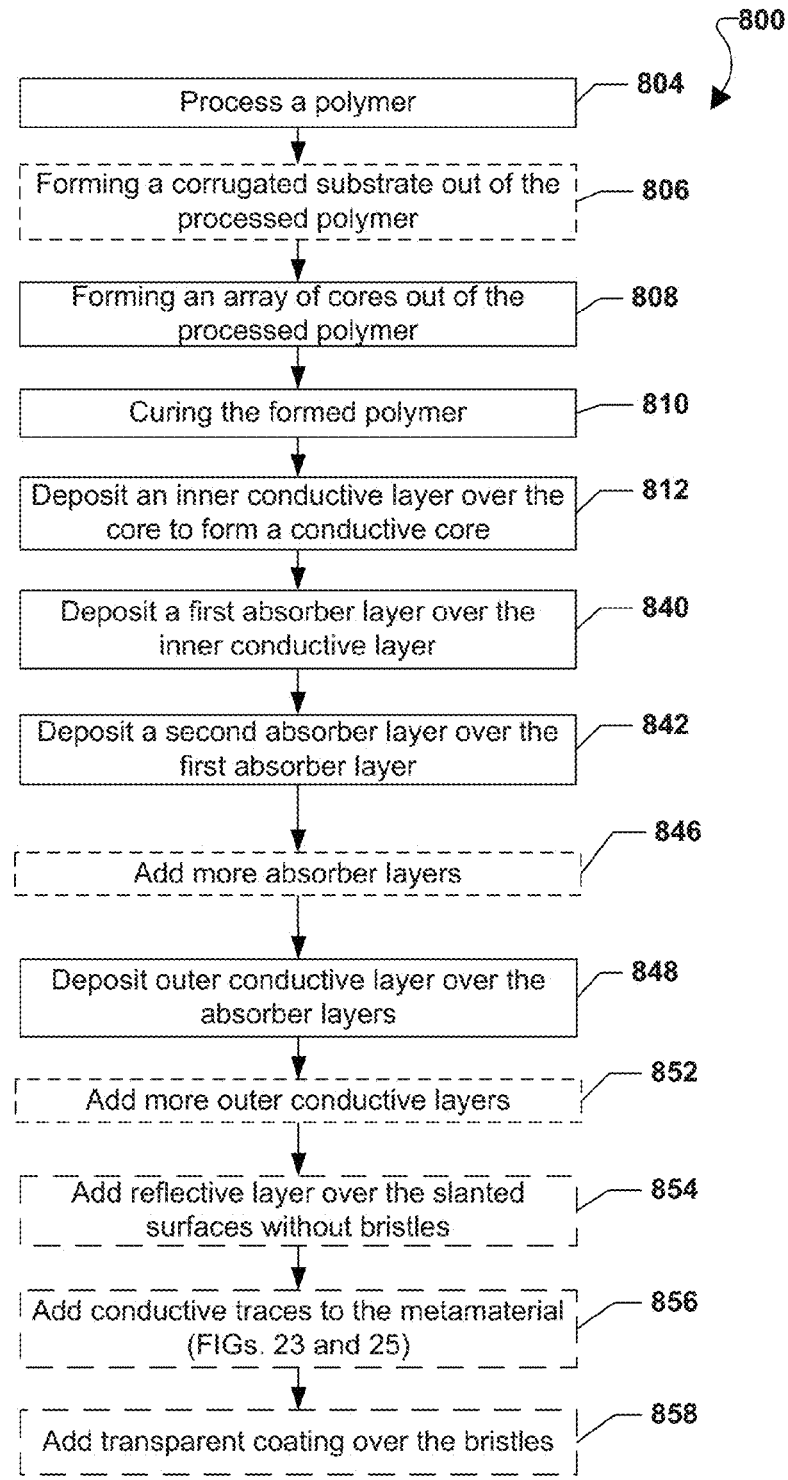
FIG. 8 is a process flow diagram illustrating the embodiment methods illustrated in FIGS. 6A-6K and 7A-7C.

As mentioned with reference to block 808 of FIG. 8 forming an array of cores out of the processed polymer may include using a rolling die or rolling press. Similarly, with reference to block 1608 of FIG. 16, forming an array of vias may also include using a rolling die or rolling press. Although a rolling press may be directly applied to a substrate or a moldable layer on top of the substrate, using such a method may damage a master template having a particular pattern for creating the cores or vias. Thus, to increase yield and throughput of creating substrates with an array of cores or vias, a master template may be used to create daughter templates on a web, and each daughter template web may be applied to a substrate to create the desired core or via pattern in a surface material that will be subsequently processed to form the solar arrays. For example, a master template including cores may imprint vias on a substrate applied to a web creating a daughter template. The daughter template with vias may then be applied to a substrate to create cores on the substrate. After curing to increase material strength of the newly formed cores, the substrate may be further processed using embodiment methods such as described above with reference to FIG. 8 and blocks 810-858. As an alternative example, a master template including vias may be applied to a substrate on a web to create a daughter template featuring rods that may then be applied to a substrate to imprint vias into the substrate (or a layer over a substrate). The via imprinted substrate may be further processed using embodiment methods such as described above with reference to FIG. 16 and blocks 1612-1660.

An embodiment method 3400 for manufacturing an array of cores for photovoltaic bristles using a rolling press or die is illustrated in FIGS. 33A-33G and FIG. 34. Using a rolling press or die method as described below may enable processing methods that reduce the number of defects in fabricating photovoltaic bristles by creating reusable master templates and daughter dies that may be inspected with inspection results used in a feedback control system to bypass imperfect portions.

Figure 33A:
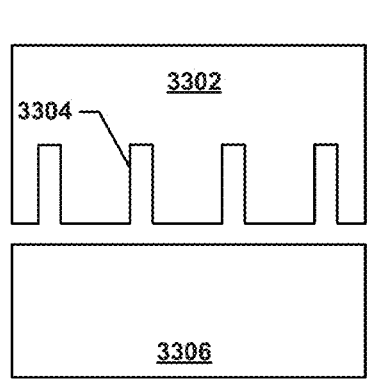
FIGS. 33A-33G are cross-sectional side views illustrating an embodiment method for forming an array of photovoltaic bristles for a metamaterial device stamping process.
Figure 33B:
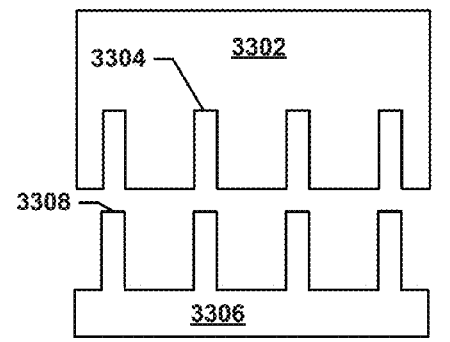

Referring to FIGS. 33A-33G and FIG. 34 together, in block 3402 of method 3400 an original master may be created to form a patterned array of bristles for the metamaterial device. Stamping processes such as nano-imprint lithography may create the original master 3306 with rods 3308 from a flexible material as illustrated in FIGS. 33A and 33B. Any known process in the relevant art may be used to create such master templates. Companies such as EVG, Obducat, NIL Technology, Nanoex, Molecular Imprints, and Süss Microtech work with nanoimprint lithography and have refined reliable nanoprint lithography techniques. As an alternative, traditional photolithography also may create the original master.

If using nanoimprint lithography, the process may include imprinting the desired pattern onto the original master 3306 created out of a flexible material such as a polymer or polydimethylsiloxane (PDMS). In optional block 3404 a suitable metal, such as nickel, may be electroformed over the original master to create a rigid master template or shim. Such metal plating may also be applied after the master is formed into or onto a roller as described below with reference to block 3408. The rigid master template may be used to create flexible master templates such as the master webs described below. Whether created by the rigid master template or formed as the original master, flexible templates such as PDMS may be used to imprint patterns on more rigid materials.

Figure 33C:
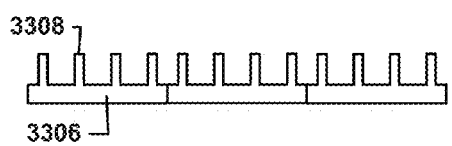
Figure 33D:
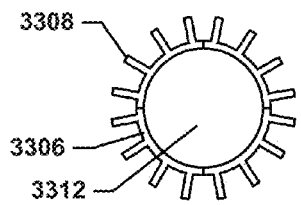

The master template may be formed in one piece, or a large master template may be formed from stitching together the master template in block 3406. Whether the master template is flexible or rigid, multiple masters may be stitched together as illustrated in FIG. 33C. Once the large master template is formed, in block 3408, the large master template may be wrapped around a drum roller (or formed into a roller) as illustrated in FIG. 33D. The drum roller may then be used for subsequent processing in a roll-to-web system as described below.

The web material may be a polymer or polyester film, such a Dupont's Mylar®. By way of example, the web material may have a thickness of 25 to 250 microns, a length of 100 to 2000 feet, and a width of 0.5 to 6 feet. In block 3410 a first moldable material, such as a lacquer, spin-on-glass coatings, a sol-gel, or PDMS, may be applied to a web to coat a thin layer of the material over the web. Since the web itself is flexible, a flexible material such as PDMS may be less restricting than sol-gel, spin-on-glass coatings when moving through the rollers and subsequent processing.

Figure 33E:
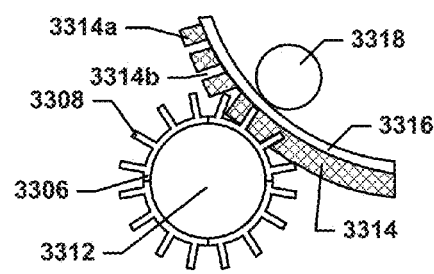

In block 3412 the first pattern from the large master template may be imprinted to the coated web to create a second imprint pattern on the web as illustrated in FIG. 33E. In this process operation, the drum roller with a rod pattern imprints vias 3314b into the coated material on the web by pressing the web and the coated material against a transfer spacing roller 3318. Alternatively, the drum roller with a via pattern creates a rod pattern from the coated material on the web (not shown). In block 3414 the second imprint pattern on the web may be cured or otherwise processed to increase its material strength. An ultra violet light or a thermal mechanism for applying heat may be used to cure the second imprinted pattern. If using PDMS as a moldable material, a thermal mechanism may apply heat to cure the imprinted pattern. The result of these processor operations is a daughter die web suitable for use in subsequent operations for creating a substrate with cores (or alternatively vias) on a substrate that will eventually become solar cells. As an alternative embodiment method, the web itself may be a flexible substrate and with a cured second imprinted pattern the web substrate may be suitable for use in embodiment methods (e.g., method 800 or 1600) describe herein to create metamaterial devices.

In block 3416 the master web may be installed on rollers in a web-to-plate process. In block 3418 a moldable material may be applied to a substrate or surface on which the solar arrays will be formed. For example, the moldable material may be a polymer that may be cured (e.g., by exposing it to ultra violet radiation) after it is applied to a substrate or support surface and imprinted as described below. As another example, the moldable material may be a flexible thermally curable sol-gel that is applied to a substrate or support surface and imprinted as described below. Alternatively, the substrate itself may be a moldable material and thus the operations in block 3418 may involve creating the substrate of moldable material.

Figure 33F:
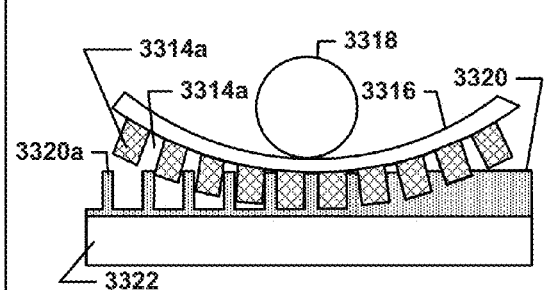

As illustrated in FIG. 33F, the second pattern from the master web may be imprinted on the moldable material to create a third imprint pattern on or in the substrate in block 3420. In the example illustrated in FIG. 33F, a daughter die web with vias 3314b will form cores 3320a of the moldable material 3320 on the substrate 3322. As described below, the process pressing the daughter die 3316 into the moldable material 3320 on the substrate 3322 may be controlled so that the two surfaces come together without sliding, which could deform or fail to form the desired cores 3320a (or vias).

Figure 33G:
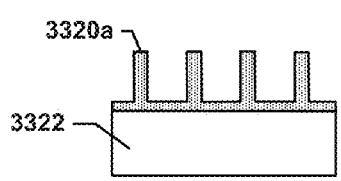
Figure 34:
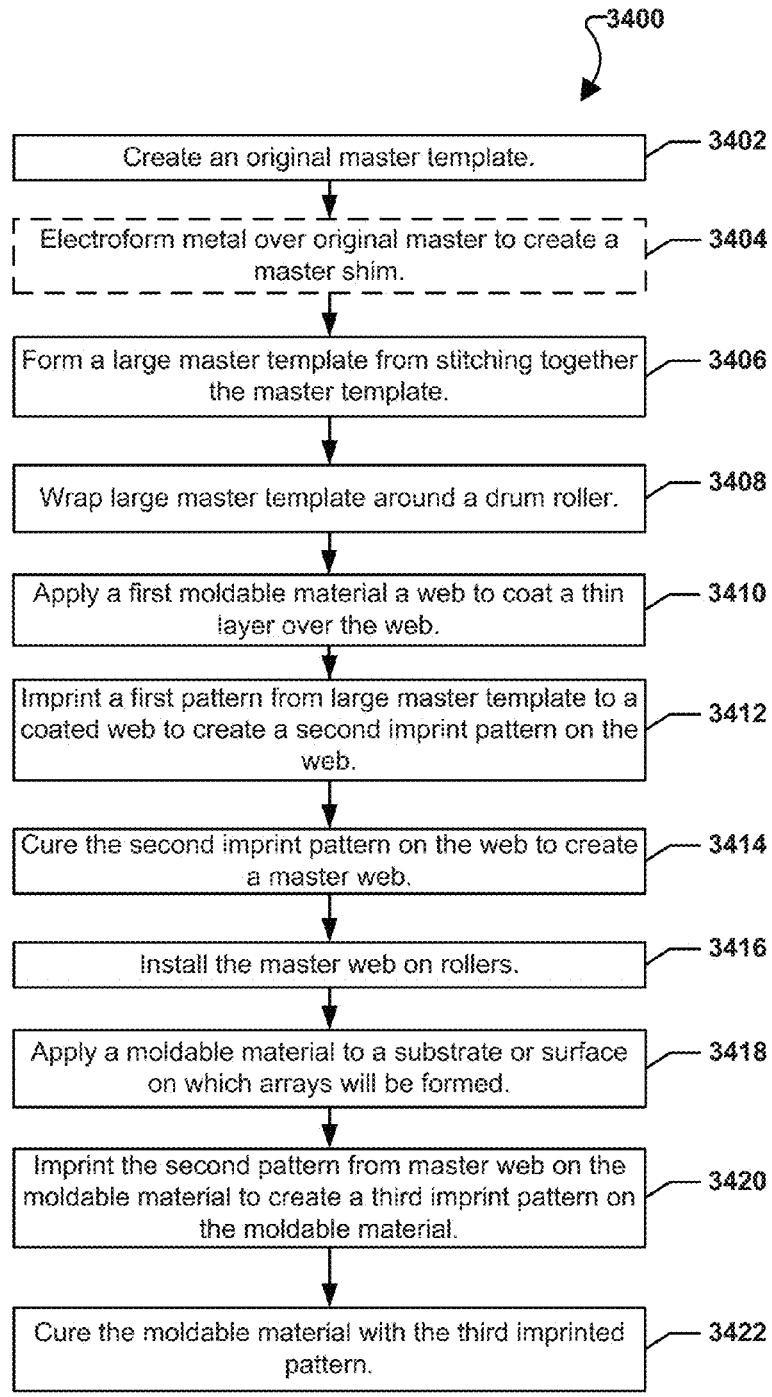
FIG. 34 is a process flow diagram illustrating the embodiment method illustrated in FIGS. 33A-33G.

In block 3422 the cores 3320a (which are the third imprinted pattern) illustrated in FIG. 33G or vias (not shown) may be cured or otherwise processed to increase their strength and rigidity before subsequent processing according to embodiment methods described above with reference to FIGS. 8 and 16. As mentioned above, such curing or processing of the cores or vias may involve exposure to ultra violet light (e.g., to increase cross linking in a polymer material) or heating (e.g., to convert sol gel into a glass or ceramic).

Figure 35A:
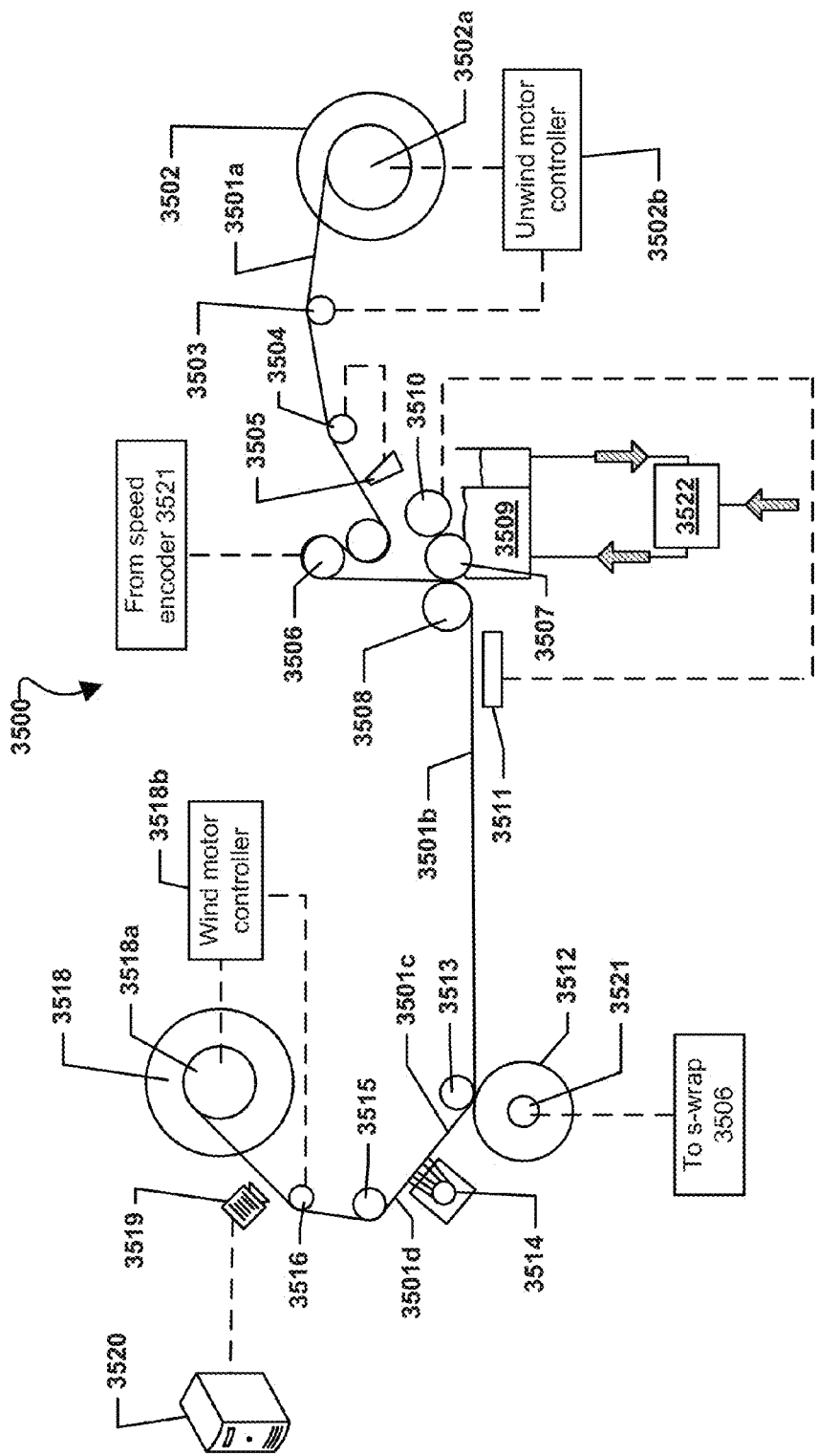
FIG. 35A is a system diagram illustrating an embodiment roll-to-web system.

FIG. 35A illustrates an embodiment roll-to-web system 3500 suitable for use in the operations described above with reference to blocks 3406-3414 in method 3400. The illustration of the roll-to-web system 3500 in FIG. 35A and the following description is provided as an illustrative example and is not intended to limit the scope of the claims as other roll-to-web system configurations (e.g., different roller configurations, different web paths and different sequences of operations) are possible without departing from the scope of the present invention.

In the embodiment roll-to-web system 3500 illustrated in FIG. 35A, a web material may pass through a series of rollers configured and controlled to maintain tension and orientation, apply a moldable material to the web, and imprint a first pattern from a master die on the moldable material to create a second pattern of cores or vias in the moldable material. That second pattern of cores or vias in the moldable material may be subsequently cured/processed to form the daughter die on the web.

The roll-to-web system 3500 may include an unwind roller 3502 that may be driven by an unwind motor 3502a connected to an unwind motor controller 3502b to control the rotation of the unwind roller. An uncoated web 3501a may be installed on the unwind roller 3502 and be unwound throughout the roll-to-web system 3500. From the unwound roller 3502, the uncoated web 3501a may roll over a tension sensor 3312. The tension sensor may provide web-tension information to the unwind motor controller 3502b which may use this information as feedback along with torque sensing feedback from the unwind motor 3502a to control web tension through the roll-to-web system 3500.

The uncoated web 3501a may travel over a tracking roller 3504, which may be adjusted by the control system to control the lateral position of the web in the system in response to signals from an edge sensor 3505. By adjusting the tracking roller 3504, the web's position on the rollers may also be adjusted to an optimum position/orientation to prevent skewing of the pattern on the web. For example, if the web is too far to the left side of the rollers, the tracking roller may be adjusted to move the web back toward the center of the rollers.

The uncoated web 3501a may travel through S-wrap rollers 3506, which control the velocity and tension of the web 3501 as it passes through the roll-to-web system 3500. The S-wrap rollers 3506 may adjust the velocity of the web 3501 traveling through the roll-to-web system 3500 based on data from drum roller speed encoders 3521. In this manner, the S-wrap rollers may serve to synchronize the speed of the web as it meets with the drum roller (which includes the master die) that imprints the pattern on the web 3501. Closely controlling the relative speed of the web and the drum roller reduces the chance for defects to be printed on the daughter dies as well as the chance for damaging the master die on the drum roller.

The uncoated web 3501a may travel between a transfer roller 3507 and a rubber roller 3508. The transfer roller 3507 picks up a layer of moldable material 3509 and applies the layer to the web, while a shear roller 3510 ensures the applied layer is of the desired thickness. As the uncoated web 3501a travels between the rubber roller 3508 and the transfer roller 3507, the transfer roller 3507 collects the moldable material 3509 on the transfer roller 3507. Prior to the transfer roller 3507 applying the first moldable material 3509 to the uncoated web 3501a, the shear roller 3510 removes excess moldable material 3509 from the transfer roller 3507 to ensure a consistent coating on the web 3501a. A rubber roller 3508, potentially made of high durometer ground rubber, may provide support to the web 3501 while the transfer roller 3507 applies the first moldable material 3509.

After the transfer roller 3507 applies the first moldable material 3509 to the uncoated web 3501a, a thickness sensor 3511 may measure the thickness of the first moldable material 3509 on the coated web 3501b. The thickness sensor may be used by a control system that may send a signal to cause the shear roller 3510 shift position in order to maintain a consistent thickness and compensate for any thickness variations in the uncoated web 3501a. For example, if the thickness sensor indicates that the coated web's thickness is higher than a set point, the control system may cause the shear roller 3510 to move closer to the transfer roller 3507, thereby removing more of moldable material 3509 from the transfer roller 3507 prior to its application to the uncoated web 3501a.

The coated web 3501b passes between the drum roller 3512, which includes the master template, and a transfer spacing roller 3513 in order to imprint the daughter die pattern in the moldable material on coated web 3501b. The moldable material on the coated web 3501b accepts the first pattern as the coated web 3501b is pressed against the drum roller 3512 to create a second pattern in the moldable material 3509. The speed of rotation of the drum roller 3512 is closely controlled by a control system so that it spins in conformity with the speed of the moving web 3501 to precisely imprint the first pattern on the web. To do so, the control system may receive signals from speed encoders 3521 coupled to the S-wrap roller(s) 3506 and use this information in a closed-loop control algorithm to ensure that the surface of the drum roller matches the speed of the web 3501 passing beneath or over it. Depending on the type of moldable material, the imprinted web 3501c may be cured/processed (e.g., thermally or with ultra violet light) by a curing mechanism 3514.

The cured web 3501d may travel over a support roller 3515 and a second tension sensor 3516 prior to being collected on a wind roller 3518. The wind roller 3518 may be driven by a wind motor 3518a controlled by a wind motor controller 3518b. The wind motor controller 3518b may adjust the wind up speed of the wind roller 3518 based on the torque of the wind motor 3518a and signals from the second tension sensor 3516 to assist in maintaining proper web tension and a speed of advance.

The roll-to-web system 3500 may also include an inspection camera 3519 that may scan the cured web 3501d for defects. Images from the inspection camera 3519 may be processed by a computer to identify areas of defects, which may be recorded against position on the web in a web-mapping database 3520 that may be used in controlling the final printing process. As described below, a web-to-plate system 3600 may access the web-mapping database 3520 and adjust its system parameters (e.g., web speed, substrate linear speed, sheet gap mechanism) to avoid applying any mapped defects in the web 3501d to substrate being processed in such a system.

The roll-to-web system may also include a moldable material processing system 3522. The moldable material processing system 3522 may be fluidly connected to a moldable material container that houses the moldable material 3509 for the transfer roller 3507. The moldable material processing system 3522 may recirculate the moldable material 3507 through system components (filters, heat exchangers, etc) to ensure the moldable material 3507 is clean and at the proper temperature for applying to the web 3501a. The moldable material processing system 3522 may add moldable material 3509 as needed to ensure ample moldable material for the roll-to-web system 3500.

Various portions of the roll-to-web system 3500 may be subject to humidity and temperature controlled to ensure that the moldable material 3509 adheres to the web 3501 and that the moldable material 3509 accepts the desired pattern from the drum roller 3512 with minimal defects. This may be especially important if the moldable material 3509 is a sol-gel or other thermally cured material.

Figure 35B:
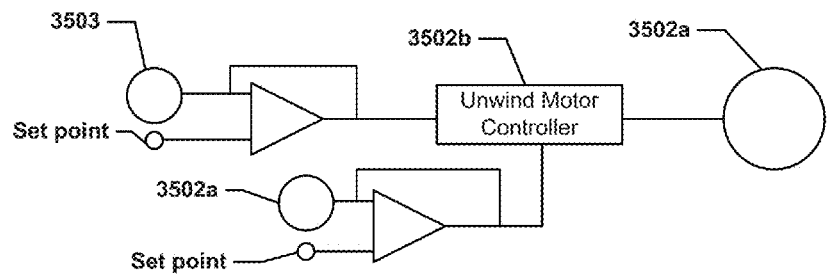
FIGS. 35B-35E are logic diagrams corresponding to the roll-to-web system illustrated in FIG. 35A.
Figure 35C:
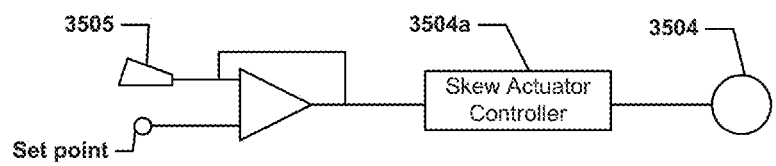
Figure 35D:
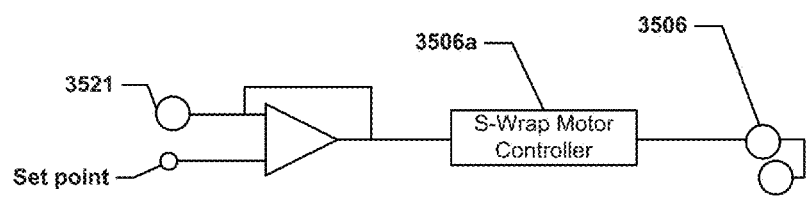
Figure 35E:
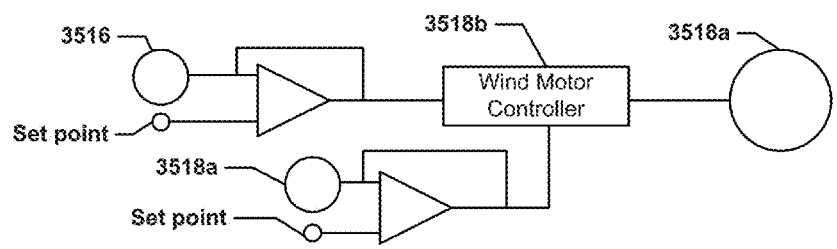

FIGS. 35B-35E illustrate example control systems that may be used to control various portions and components of the roll-to-web system 3500 described above enable high precision printing from the drum roller 3512 to the web 3501. FIG. 35B illustrates the electrical controls between the tension sensor 3503, the unwind motor 3502a, and the unwind motor controller 3502b. The unwind motor controller 3502b may utilize a PID controller system that adjusts the unwind motor 3502a based on inputs from the tension sensor 3503, a tension sensor set point, a torque input from the unwind motor 3502a, and a torque set point. A skew actuator controller 3504a illustrated in FIG. 35C may adjust the position of the tracking roller 3504 based on data from the edge sensor 3505 and a set point. An S-wrap motor controller 3506a illustrated in FIG. 35D may control speed of the s-wrap rollers 3506 and the corresponding web velocity through the roll-to-web system. The S-wrap motor controller 3506a controls S-wrap rollers 3506 to synchronize the web velocity with the drum roller's rotational speed based on data from the speed encoder 3521 and a set point. The wind motor controller 3518b illustrated in FIG. 35E is similar to the unwind motor controller 3502b illustrated in FIG. 35B, except that the wind motor controller 3518b accepts input data based on the second tension sensor 3516, a tension set point, torque data from the wind control motor 3518a, and a torque set point.

Figure 36A:
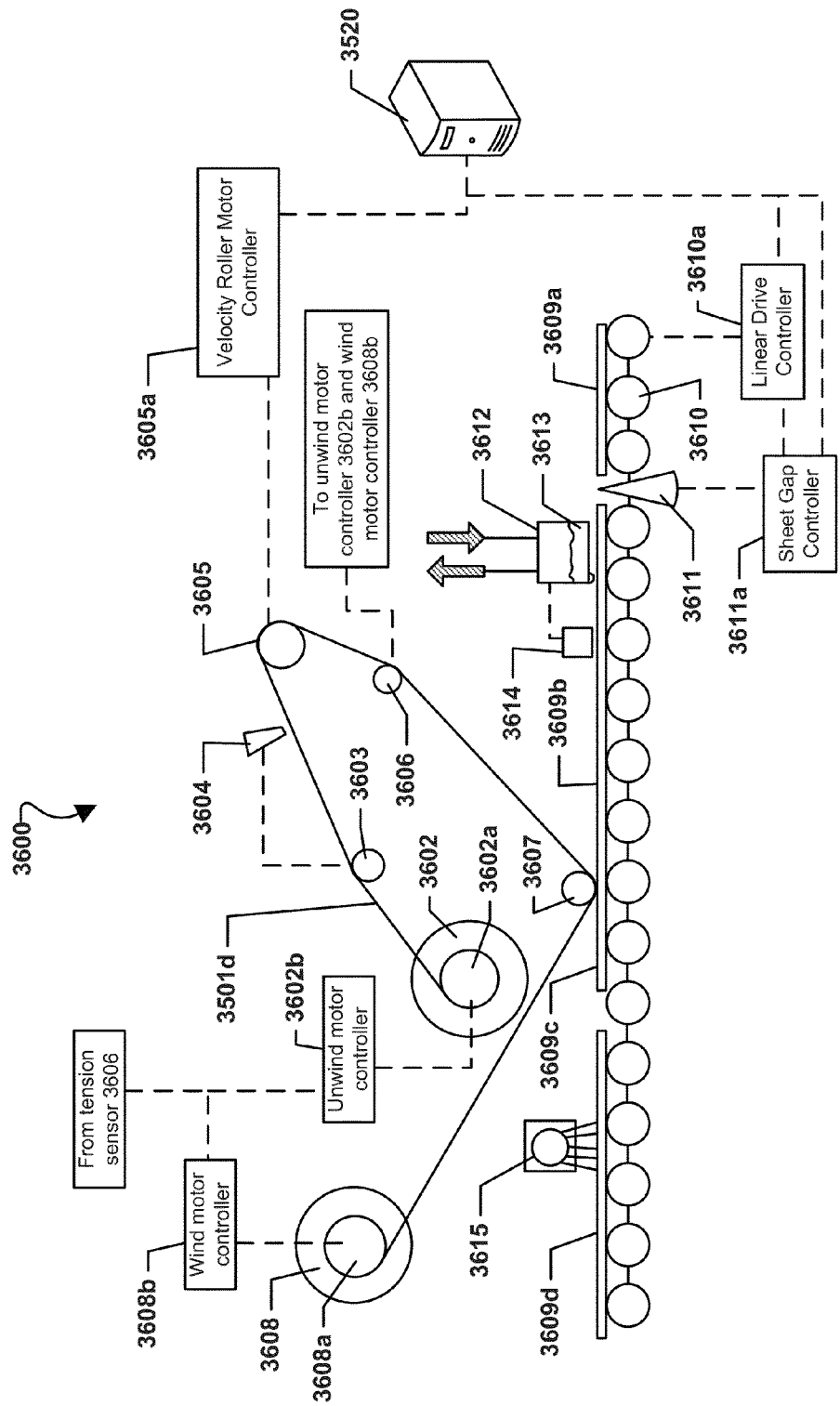
FIG. 36A is a system diagram illustrating an embodiment web-to-plate system.

FIG. 36A illustrates an embodiment web-to-plate system 3600 that may be suitable for forming the desired pattern of cores or vias on the substrate as described above with reference to blocks 3416-3422 in method 3400. The illustration of the web-to-plate system 3600 in FIG. 36A and the following description is provided as an illustrative example and is not intended to limit the scope of the claims as other web-to-plate system configurations (e.g., different roller configurations, different web paths and different sequences of operations) are possible without departing from the scope of the present invention.

The web-to-plate system 3600 may process a substrate that moves through the system on a linear drive mechanism by applying a moldable material to the surface of the substrate. As an alternative, if the substrate is the second moldable material, then a moldable material does not need be added to the substrate. The moldable material applied to the substrate in this process may be different from the moldable material that is applied to the web and used to form the daughter die pattern. The web-to-plate system 3600 also passes the daughter die web (which has the second template pattern as described above) through a series of rollers that control its tension and speed of advance, and presses it onto the moldable material on the substrate to create a third pattern, which is the desired cores or vias. The web-to-plate system 3600 has a web subsection and a plate subsection.

The web subsection will be discussed first. The web-to-plate system 3600 may also include a module or apparatus that cures/processes the third pattern in order to produce the substrate with a pattern of cores or vias suitable for the embodiment processes described above with reference to FIGS. 8 and 16 for applying photovoltaic materials.

The web 3501d on the web-to-plate system 3600 is weaved through various rollers to control tension and position, similar to the roll-to-web system 3500. The web-to-plate system 3600 may include an unwind roller 3602 driven/controlled by an unwind motor 3602a connected to an unwind motor controller 3602b configured to control the rotation of the unwind roller 3602. The daughter die web 3501d from the roll-to-web process described above may be installed on the unwind roller 3602. The daughter die web 3501d may travel across a tracking roller 3603 and an edge guide sensor 3604. The edge guide sensor 3604 may collect information regarding the position of the web 3501d on the rollers relative to a set point, and send that data to a controller of the tracking roller 3603. The controller of the tracking roller may use the data to adjust the position/orientation of the tracking roller 3603 in order to correct the orientation of the daughter die web 3501d in the system and prevent web skewing within the rollers.

The web-to-plate system 3600 may include a tension sensor 3606 that provides data to an unwind motor controller 3602b to enable the unwind motor controller 3602b to control the unwind motor 3602a to adjust the speed of the unwind roller 3606 based on tension data. The unwind motor controller 3602b may also use torque data from the unwind motor 3602a. Unlike the roll-to-web system 3500, in the web-to plate system 3600 the same tension sensor 3606 may also be connected to the wind motor controller 3608 to enable the wind motor controller 3608b to control the wind motor 3608a to adjust the speed of the wind roller 3608 based on the same tension data. The tension sensor 3606 may be positioned after the velocity roller 3605.

The web-to-plate system 3600 may not include S-wrap rollers to control the velocity of the web. Instead, the web-to-plate system 3600 may use a velocity roller 3605 to perform a similar function. The velocity roller 3605 may be connected to a velocity roller motor controller 3605a, which may adjust the velocity of the daughter die web 3501d to match the linear speed of the substrate based on data acquired from the linear drive controller 3601a. The velocity roller controller 3605a may also adjust the speed of the web 3501d based on web-mapping data from the web-mapping database 3520. For example, if there is a defect in the daughter die web, the velocity roller 3605 may increase the velocity of the daughter die web 3601d at a certain point in time to ensure that the defected portions are not imprinted on the substrate 3609a. Alternatively or additionally, the linear drive controller 3601a may be controlled to pause the advance of the substrates in order to enable a portion of the daughter die web with a defect to be advanced before imprinting of the next substrate begins.

The daughter die web 3501b may travel around the velocity roller 3605 past the tension sensor 3606 to a transfer gap roller 3607. The transfer gap roller may aid in pressing the daughter die web 3501d against the substrate to imprint the second pattern into moldable material on the substrate 3609a thereby creating the third pattern of cores or vias. Once the daughter die web 3501d imprints the second pattern on the substrate 3609a, the daughter die web 3501d may be wound around the wind roller 3608 and used for future processing.

The plate subsection of the web-to-plate system 3600 includes a linear drive mechanism 3610 configured to control the linear motion and linear velocity of the substrate 3609 through the web-to-plate system 3600. The linear drive mechanism 3610 is connected to a linear drive controller 3610a, which may control the speed of the substrate 3609 in the web-to-plate system 3600 based on data from the sheet gap controller 3611a, the web-mapping database 3520, and the velocity roller motor controller 3605a.

While the pre-imprinting substrate 3609a is traveling across the linear drive mechanism 3610, the sheet gap mechanism 3611 may stop the pre-imprinting substrate 3609a by a vertical actuation synchronized with the movement of the substrate 3609 and the daughter die web 3501d to reduce imprinting defects. For example, the sheet gap controller 3611a may receive web-mapping data regarding a known defect on the daughter die web's pattern from the web-mapping database 3520, and in response control the sheet gap mechanism 3611 to stop the substrate 3609a from moving forward in the system when a defective portion of the daughter die web is present on or near the transfer gap roller 3607 to avoid printing a defect from the daughter die web 3501d on to the substrate 3609a. As another example, the sheet gap mechanism 3611 may prevent the substrate 3609a from moving to the second moldable material applicator 3612, while the moldable material application is adjusted, refilled, etc. When the sheet gap mechanism is actuated, a sheet gap sensor or trigger may act as an input to other controllers in the system.

After passing the sheet gap mechanism 3611, a moldable material applicator 3612 may apply the moldable material 3613 over the substrate to create a coated substrate 3609b. A thickness sensor 3614 may detect the thickness of the moldable material on the coated substrate 3609b and provide feedback to the moldable material applicator 3612 for adjusting the amount of moldable material applied to the substrate 3609a. The coated substrate 3609b contacts the daughter die web 3501d with pressure applied by the transfer gap roller 3607 so that the second pattern from the daughter die web 3501d is imprinted on the coated substrate 3609b to create an imprinted substrate 3609c.

Depending on the type of moldable material, the imprinted substrate 3609c may be cured or processed in a curing mechanism 3615 to increase its material strength, such as via thermal and/or ultraviolet radiation curing. After curing, the final substrate 3609d is ready for further photovoltaic processing according to an embodiment method described above with reference to FIG. 8 or FIG. 16. Further processing may include adding absorber layers, inner conductive layers, outer conductive, microtraces, etc.

Figure 36B:
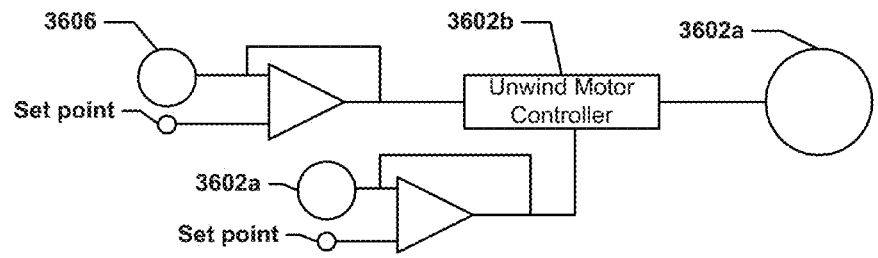
FIGS. 36B-36E are logic diagrams corresponding to the web-to-plate system illustrated in FIG. 36A.

FIGS. 36B-36E illustrate control systems that may be configured to enable high precision printing from the web to the substrate in the web-to-plate system 3600. FIG. 36B illustrates electrical controls between the tension sensor 3606, the unwind roller motor 3602a, and the unwind motor controller 3602b. The unwind motor controller 3502b may utilize a PID controller system that adjusts the unwind motor 3602a based on inputs from the tension sensor 3606, a tension sensor set point, a torque input from the unwind motor 3602a, and a torque set point. The tension input may be used as the lowest level input variable and torque from the unwind motor 3602a and the wind motor 3608a may be the major control variables. The unwind and wind motor controllers 3602b and 3608b, respectively, will look for a minimum value from the tension sensor 3606 to insure the web has tension. The differential between the wind/unwind torque and a respective set point may be used to determine dynamic wind or unwind force to be applied in order to maintain a desired tension. The wind and unwind controller 3602b and 3608b will evaluate the differential between the two motor systems to control the web tension. Software may run linear and non-linear proportional loop equations based on an input factor. The integral portion will smooth the interactions and the integral sample rate within a sample window. Due to the sensitive nature of the process and the time constants involved, the derivative portion may act as a dampener. Similar logic may be applied to the control of the roll-to-web system 3500. Further details regarding PID logic and control loops may be found in U.S. Pat. No. 4,500,408, entitled Apparatus for and Method of Controlling Sputter Coating.

Figure 36C:
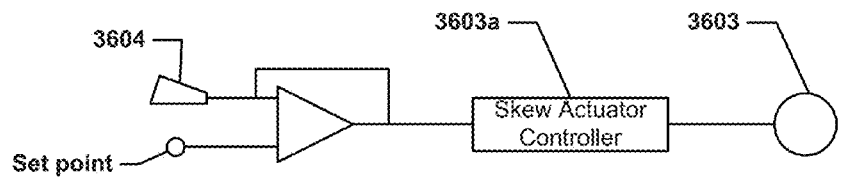
Figure 36D:
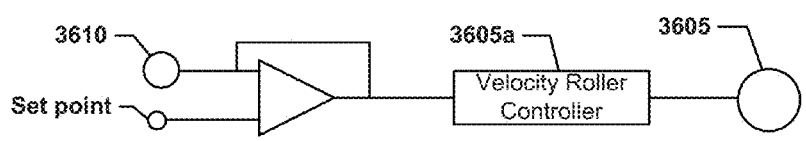
Figure 36E:
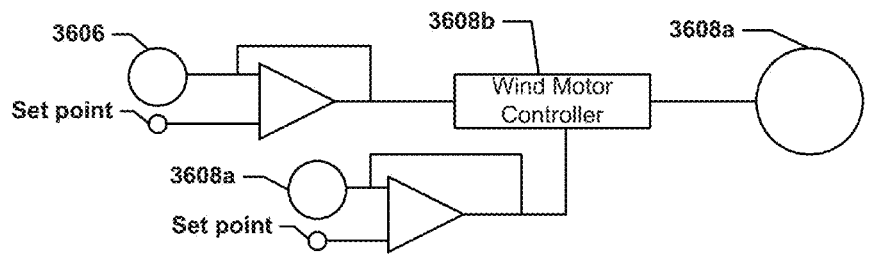

A skew actuator controller 3603a illustrated in FIG. 36C may adjust the position of the tracking roller 3603 based on data from the edge sensor 3604 and a set point. A velocity controller 3605a may control the speed of the velocity roller 3605 and the corresponding web velocity through the web-to-plate system 3600 as illustrated in FIG. 36D. The velocity motor controller 3605a may control the velocity roller 3605 to synchronize the web velocity with the linear drive speed controlled by the linear drive controller 3610a. The wind motor controller 3608b illustrated in FIG. 36E is similar to the unwind motor controller 3602b of FIG. 36B, except that the wind motor controller 3518a may accept input data based on torque data from the wind control motor 3518a, and a torque set point.

FIGS. 17-21 illustrate multiple embodiment metamaterials 1700, 1900, 2100 with current conducting traces 1701, 1702, 1703, 1901, 2101 applied to reduce electrical resistance within the metamaterials. The current conducting traces 1701, 1702, 1703, 1901, 2101 provide an electrical path for flowing electrons from the outer conductive layer 103 in metamaterials 200, 300, 400 to collector contacts on the edges of the cells. Electrons may travel from the outer conductive layer 103 via the current conducting traces 1701, 1702, 1703, 1901, 2101 to the outer edge of the metamaterials 1700, 1900, 2100 where they connect to bus bars or high capacity conductors. By reducing the electrical resistance within metamaterials 1700, 1900, 2100 less electrical energy will be converted to heat and more electrical power may be produced. The embodiment metamaterials 1700, 1900, 2100 described below may include current conducting traces 1701, 1702, 1703, 1901, 2101 in any combination or sub-combination.

Figure 17:
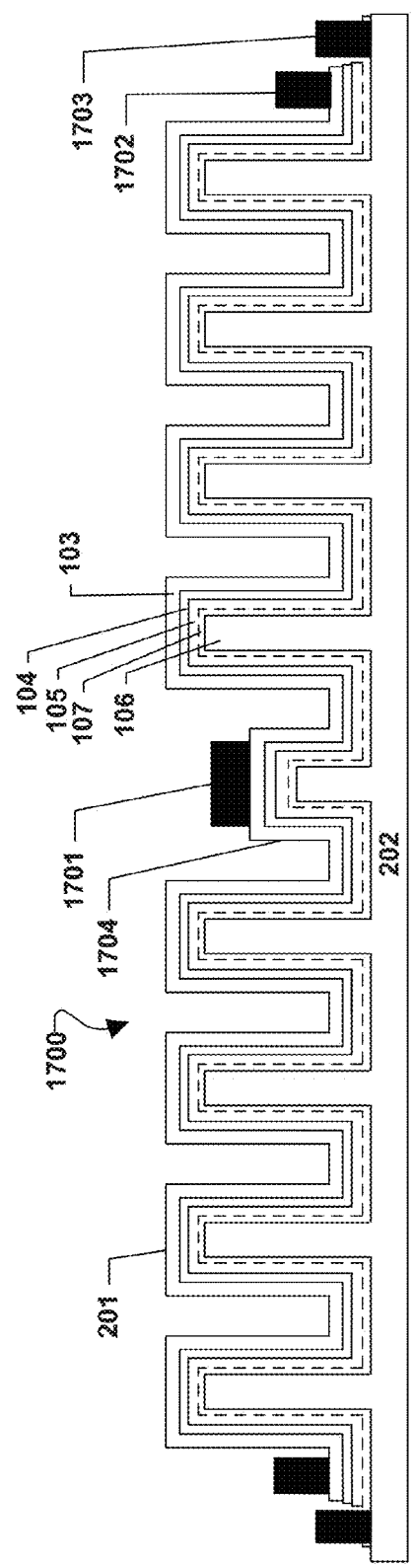
FIG. 17 is a cross-sectional side view of an array of photovoltaic bristles positioned on a flat substrate with current conducting traces on top of short photovoltaic bristles.

FIG. 17 illustrates a cross-sectional side view of a metamaterial 1700, which is similar to metamaterial 200 but with current conducting traces 1701, 1702, and 1703. In an embodiment, metamaterial 1700 may include current conducting trace 1701 on top of the outer conductive layer 103 of a row of shorter photovoltaic bristles 1704. Although FIG. 17 shows only one row of shorter photovoltaic bristles 1704 with a current conducting trace 1701 on the shorter photovoltaic bristles 1704, in an embodiment there may be multiple rows of shorter photovoltaic bristles 1704 with current conducting traces 1701 on top.

In an embodiment, metamaterial 1700 may include current conducting traces 1702, 1703 in different locations than current conducting trace 1701. As with the current conducting trace 1701, metamaterial 1700 may include current conducting trace 1702 on top of the outer conductive layer 103, but positioned at the end of the array of photovoltaic bristles 201. Metamaterial 1700 may include current conducting trace 1703 on top of the substrate 202 or in contact with the inner conductive layer 107 to allow efficient electron flow. Electrons may flow from the absorber sublayer 105 to the outer conductive layer 103 through the current conducting traces 1701, 1702 to the electrical destination (e.g., electrical storage, electrical converter, or motor) and the circuit is completed by connecting current conducting trace 1303 to the inner conductive layer 107 or metal substrate 202. Alternatively, electrons may flow from the absorber layer 105 through the inner conductive layer 107 to the current conducting trace 1303 and then to an electrical destination (e.g., electrical storage, power converter, etc).

Figure 18:
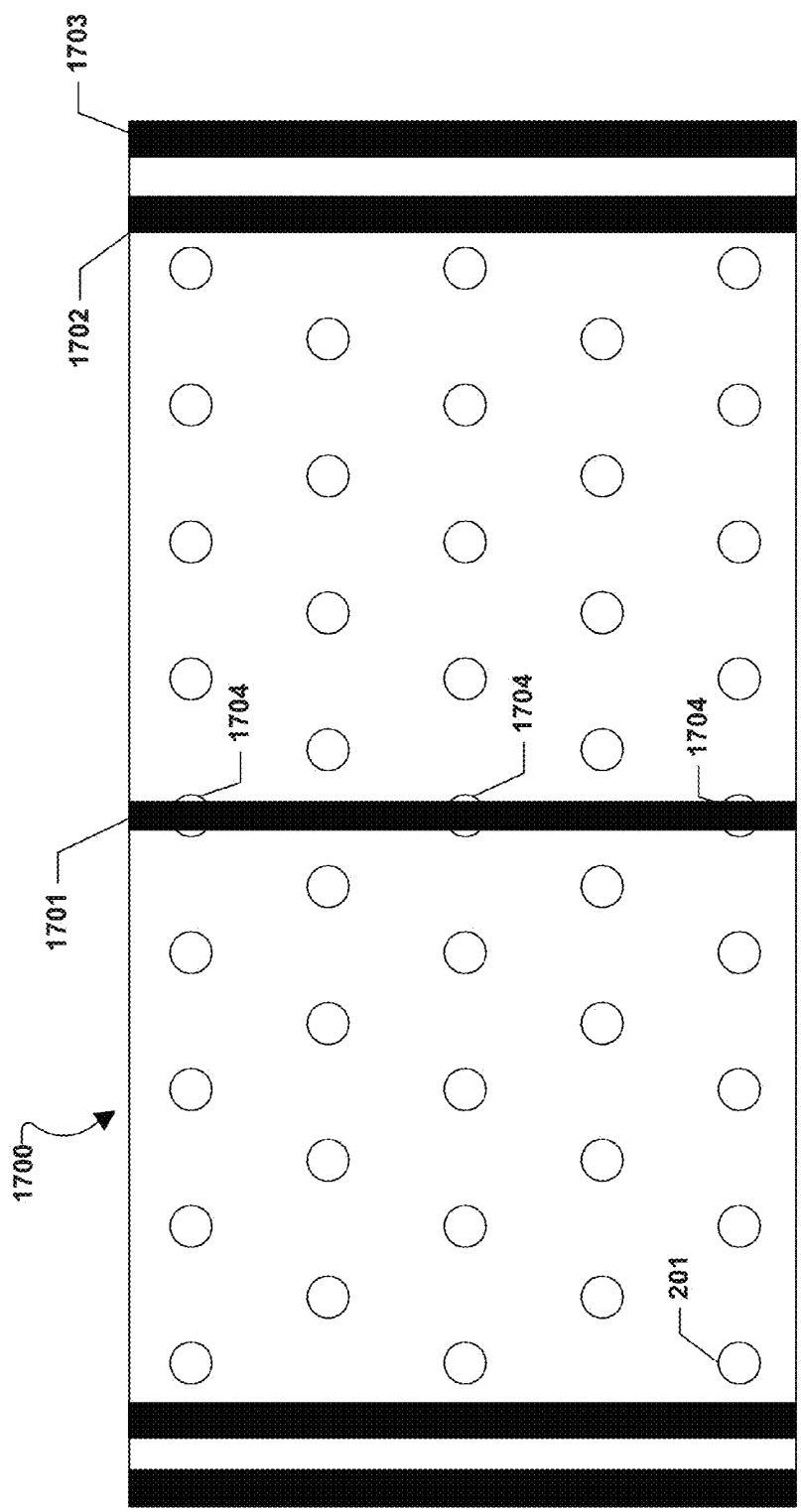
FIG. 18 is a top view of the metamaterial of FIG. 17.

FIG. 18 illustrates the top view of FIG. 17 of metamaterial 1700 with current conducting traces 1701, 1702, 1703. In an embodiment, metamaterial 1700 may include current conducting trace 1701 on top of an array of shortened photovoltaic bristles 1704 extending along the width of the array. Similarly, current conducting traces 1702 and 1703 may extend along in the same direction of the array. Connecting current conducting traces 1701 and 1702 to current conducting traces 1703 may create a complete circuit in the metamaterial 1700, thereby allowing current to flow through the array of bristles when struck by photons sufficient to generate electron movement.

Figure 19:
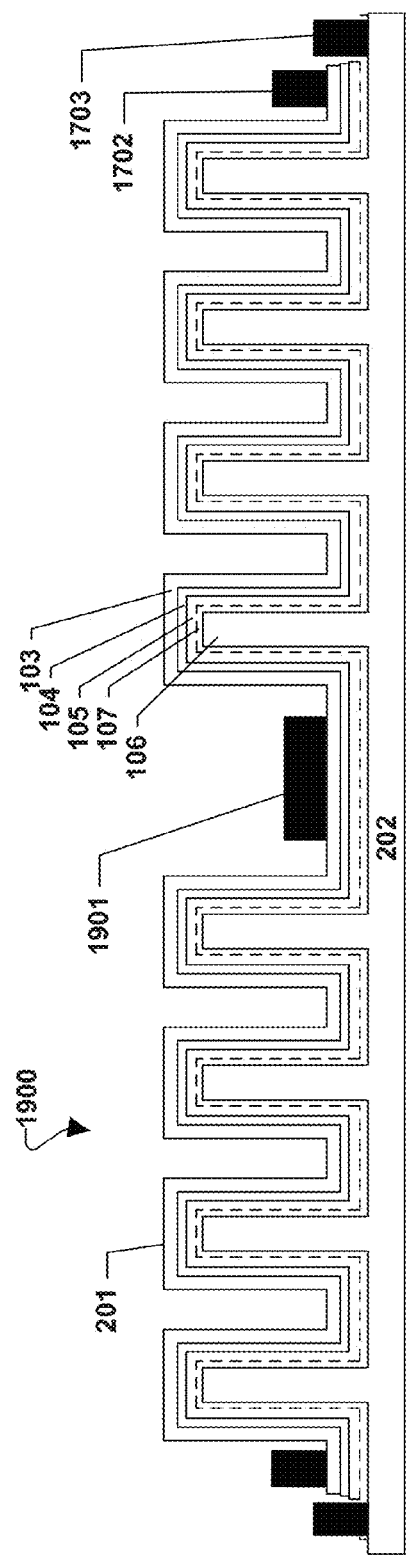
FIG. 19 is a cross-sectional side view of an array of photovoltaic bristles positioned on a flat substrate with current conducting traces between photovoltaic bristles.

FIG. 19 illustrates a cross-sectional side view of a metamaterial 1900, which is similar to metamaterial 200, but with current conducting traces 1901, 1702, 1703. In an embodiment, metamaterial 1900 may include current conducting trace 1901 on the outer conductive layer 103 between the photovoltaic bristles 201. As with FIG. 17, metamaterial 1900 may include current conducting traces 1702 on the outer conductive layer 103 and current conducting traces 1703 on the substrate 202 and/or in contact with the inner conductive layer 107. In contrast with FIG. 17, metamaterial 1900 may not include a row of shorter photovoltaic bristles 1704 because current conducting traces 1901 are between the photovoltaic bristles 201 on top of the outer conductive layer 103. However, in an embodiment, metamaterial 1900 may include a row of shorter photovoltaic bristles 1704 with a current conducting trace 1701 on the shorter photovoltaic bristles 1704 in addition to the current conducting traces 1901 positioned between photovoltaic bristles 201.

Figure 20:
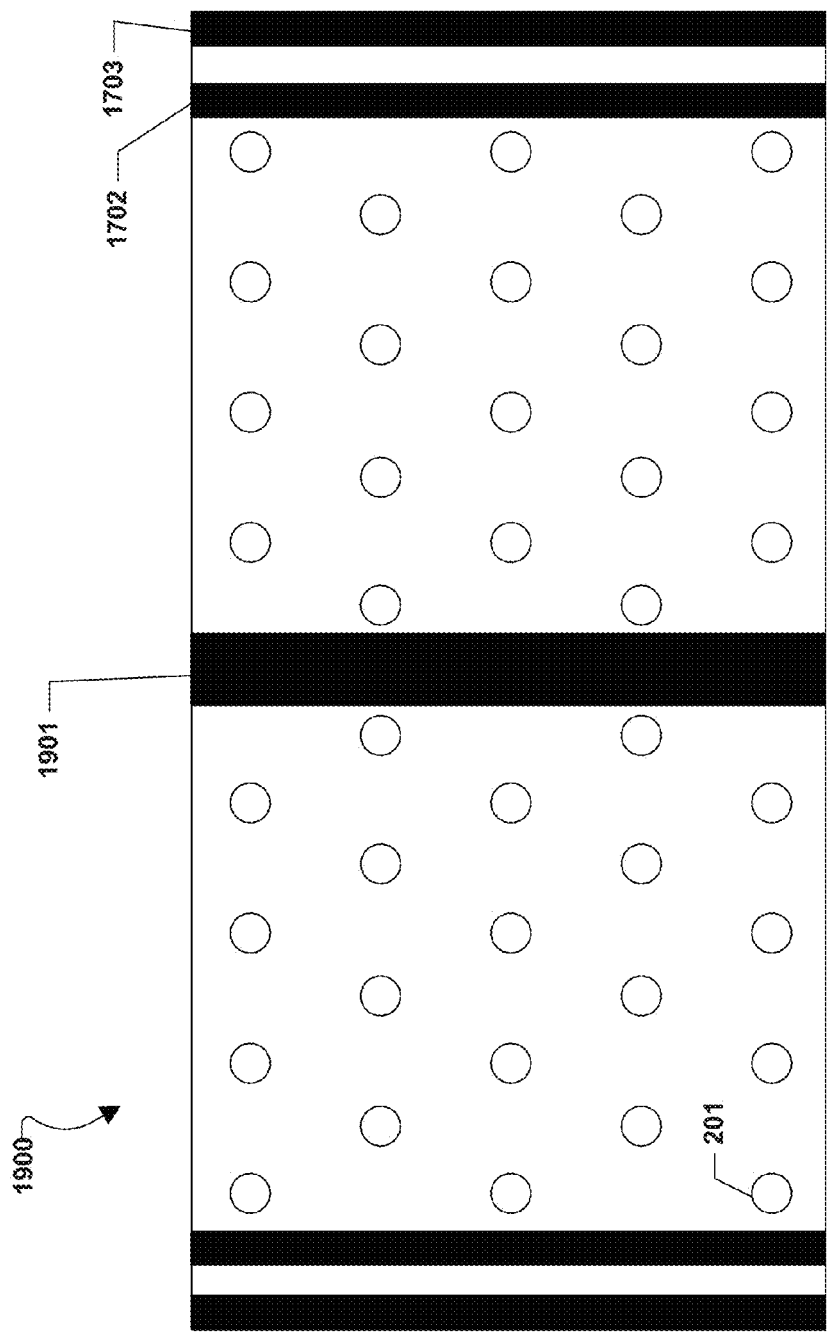
FIG. 20 is a top view of metamaterial of FIG. 19.

FIG. 20 illustrates the top view of FIG. 19 of an array of photovoltaic bristles 201 on a flat substrate 202 with current conducting traces 1901 positioned between photovoltaic bristles 201. Similar to the current conducting traces 1701, 1702, 1703 in FIG. 18, the current conducting traces 1901, 1702, and 1703 extend the entire width of the array. In an embodiment, the current conducting traces 1901, 1702, 1703 may extend in any direction. For example, the current conducting traces 1901, 1702, and 1703 may extend diagonally, along the length, and/or along the width of the metamaterial 1900.

Figure 21:
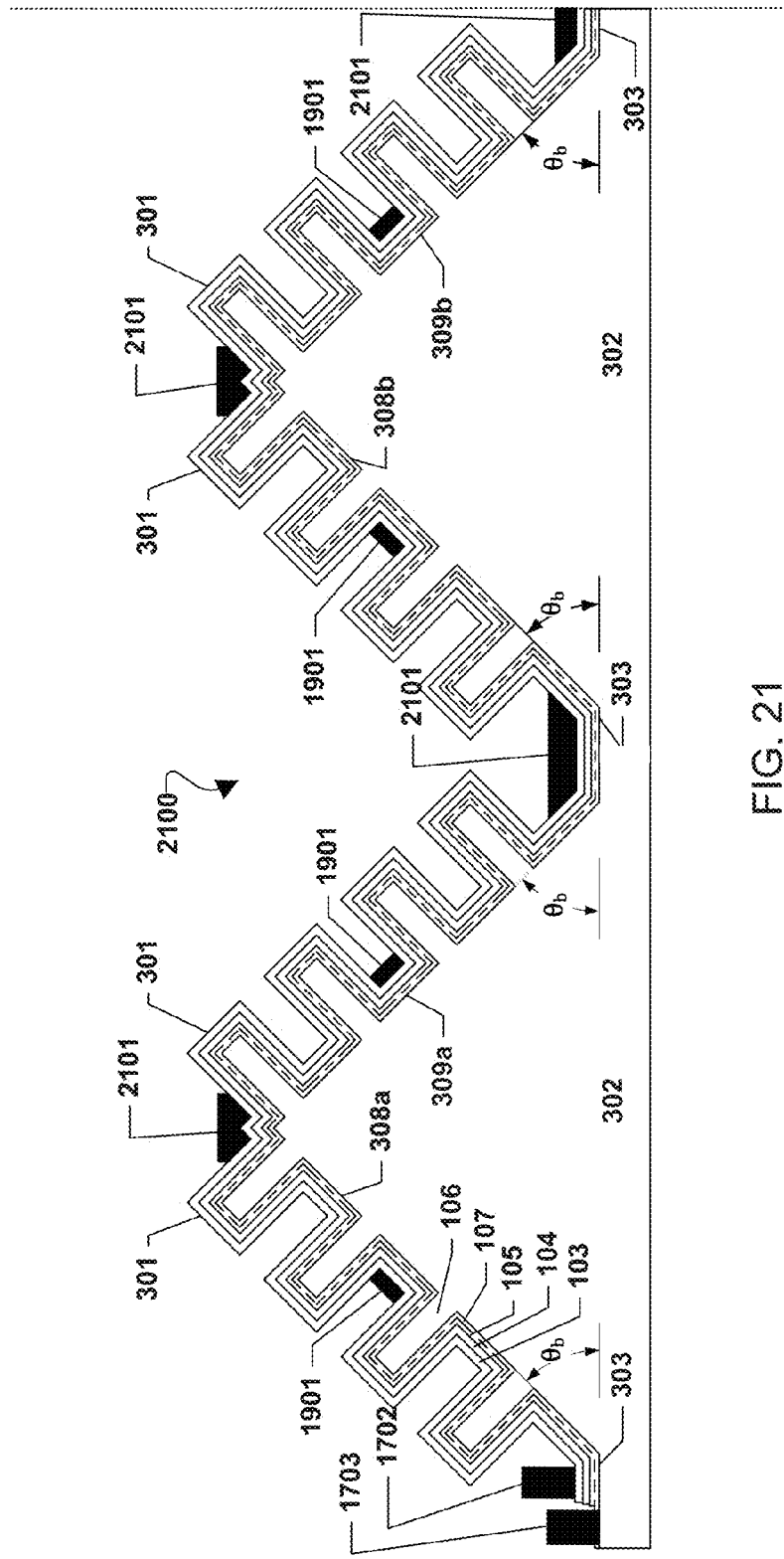
FIG. 21 is a cross-sectional side view of an array of photovoltaic bristles positioned on a corrugated substrate with current conducting traces between photovoltaic bristles.

FIG. 21 illustrates a cross-sectional side view of a portion of metamaterial 2100 similar to metamaterial 300, but with current conducting traces 2101, 1702, 1703. Metamaterial 2100 includes current conducting trace 2101, which may be located between photovoltaic bristles 301 as well as at the peak and trough of the slanted substrate surfaces 308a, 309a, 308b, 309b. In an embodiment, metamaterial 2100 includes current conducting traces 1702, 1703 at the ends of the metamaterial 2100 similar to FIGS. 17 and 19. Current conducting trace 1702 may be on the outer conductive layer 103 at the ends of the array of photovoltaic bristles 301. Current conducting trace 1703 may be on top of the substrate 302 and/or in contact with the inner conductive layer 107. In an embodiment, metamaterial 2100 may include current conducting traces 2101 on top of the outer conductive layer 103 and between photovoltaic bristles 301 located on the peak and/or the trough of the slanted substrate surfaces 308a, 309a, 308b, 309b. Although it is not shown in FIG. 21, the metamaterial 2100 may have current conducting traces 2101 positioned on the outer conductive layer 103 on top of shorter photovoltaic bristles 1704 as shown in FIG. 17. In an embodiment, metamaterial 2100 may be similar to metamaterial 400 as it may be without photovoltaic bristles 401 on slanted substrate surfaces 409a, 409b. For example, the metamaterial may include current conducting traces 2101 between photovoltaic bristles 401 only on alternating slanted substrate surfaces 408a, 408b, etc.

Photolithographic techniques may be used to deposit the current conducting traces 1701, 1702, 1703, 1901, and 2101 of FIGS. 17-21 on metamaterials 200, 300, and 400. These current conducting traces may be added to the metamaterials regardless of whether the metamaterials are created through stamping, vias, or any other technique. Although photolithographic techniques are used for adding each current conducting trace 1701, 1702, 1703, 1901, and 2101 to the metamaterial device, when adding current conducting trace 1703 to a metamaterial a different method may be used. Thus, FIGS. 22A-22F illustrate and FIG. 23 describes by the method steps for forming current conducting traces 1701, 1702, 1901, and 2101, while FIGS. 24A-24J illustrate and FIG. 25 describes the methods steps for forming current conducting trace 1703. Each method is discussed in turn.

Figure 22A:
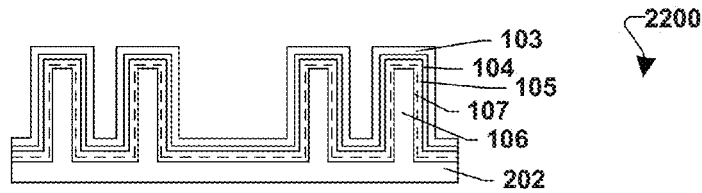
FIGS. 22A-22H are cross-sectional side views illustrating methods for adding current conducting traces to the outer conductive layer of a metamaterial.
Figure 22B:
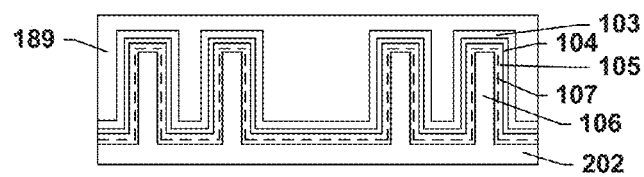
Figure 22C:
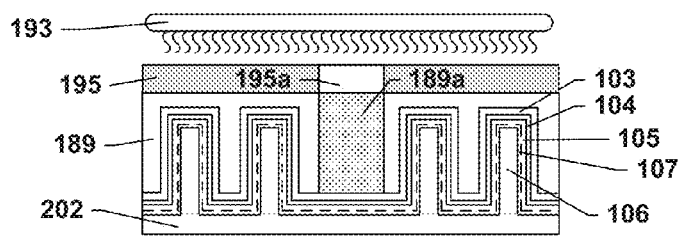
Figure 22D:
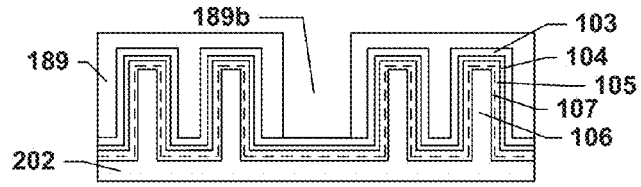
Figure 22E:
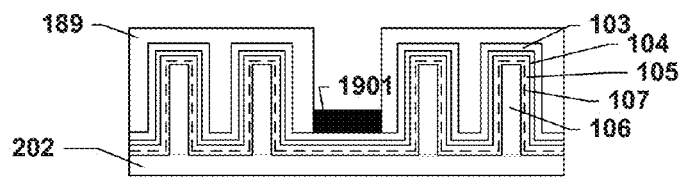
Figure 22F:
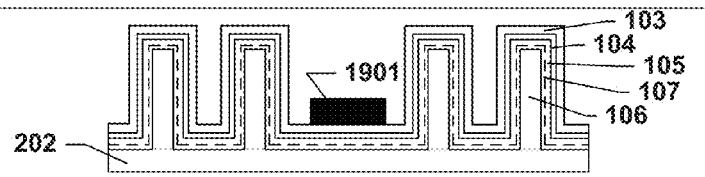

Current conducting traces 1701, 1702, 1901, and 2101 may be formed on metamaterials 200, 300, and/or 400. In block 2302 a photoresist layer may be deposited over the metamaterial. As shown in FIGS. 22A and 22B, a photoresist layer 189 may be deposited over the metamaterial. In block 2304 a mask may be positioned over the photoresist layer. In block 2306 the photoresist layer may be exposed to UV light through the mask. As illustrated in FIG. 22C, exposing only a portion of the photoresist 189 to UV radiation creates an exposed portion 189a within the photoresist layer 189. In block 2308 the photoresist layer 189 may be "developed" by exposing it to chemicals that remove the exposed portions 189a leaving a protective template, and the assembly may be etched to create pores 189b shown in FIG. 22D. In optional block 2310 the substrate may be etched through the template. This step may be required when the metamaterial is formed with vias in methods 1400 or 1500. When creating photovoltaic bristles using vias, the original substrate 192 (shown in FIGS. 13K and 15I) may form a protective coating over the bristles. Thus, the method may include an etching step to expose the outer conductive layer 103 through the substrate 192 before depositing current conducting traces 1701, 1702, 1901, and 2101 on the outer conductive layer 103 eventually followed by filling the etched void in the substrate 192 with a transparent coating. In block 2322 a current conducting trace may be deposited on the metamaterial. Current conducting traces 1701, 1702, 1901, and 2101 may be deposited on the outer conductive layer 103 through a photoresist template as shown in FIG. 22E. In block 2312 the photoresist layer may be removed. As shown in FIG. 22F, when the photoresist 189 is removed, only the bristles and the current conducting trace remains. After removing the photoresist, a transparent coasting may be applied to the solar cell covering the bristles and the deposited current conducting trace.

Figure 22G:
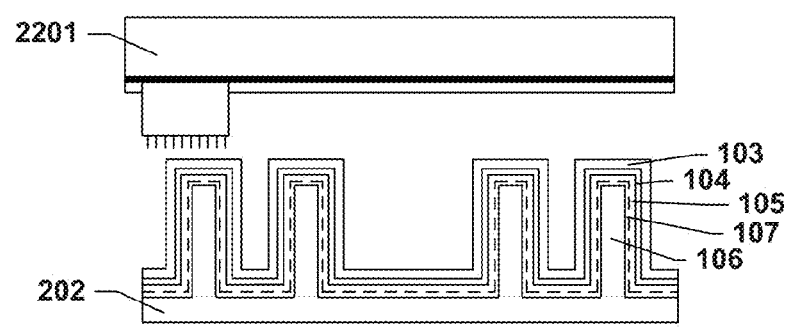
Figure 22H:
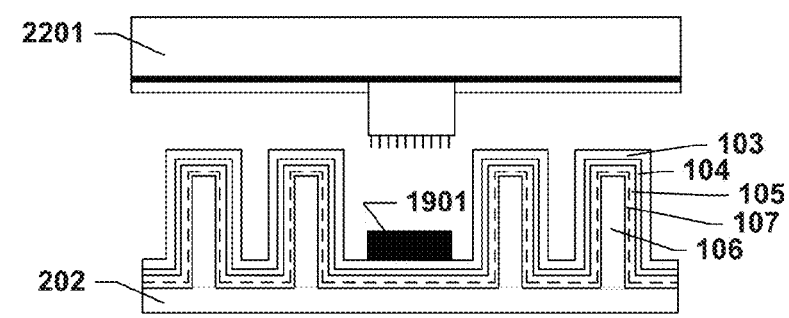

As an alternative to photolithographic techniques, a method for depositing the current conductive traces may include an ink jet device 2201 illustrated in FIGS. 22G and 22H to reduce manufacturing cost. The ink jet 2201 may deposit a conductive trace 1901 in desired locations (e.g., between bristles) by using colloidal material such as silver without the use of the multiple steps associated with photolithographic techniques. Thus, this alternative may include only one-step of depositing a conductive trace on the metamaterial in block 2322.

Figure 24A:
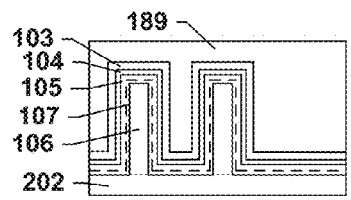
FIGS. 24A-24J are cross-sectional side views illustrating methods for adding current conducting traces to an inner conductive layer of a metamaterial.
Figure 24B:
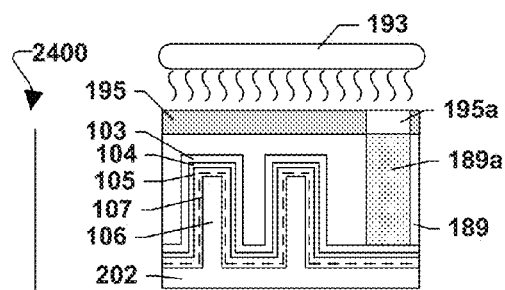
Figure 24C:
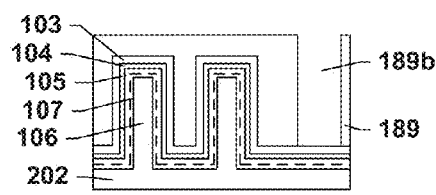
Figure 24D:
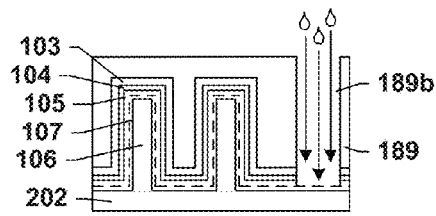
Figure 24E:
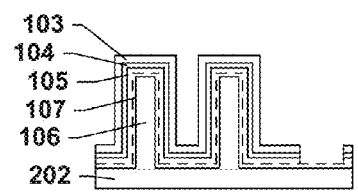
Figure 24F:
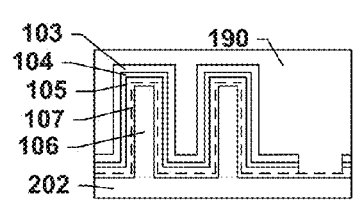
Figure 24G:
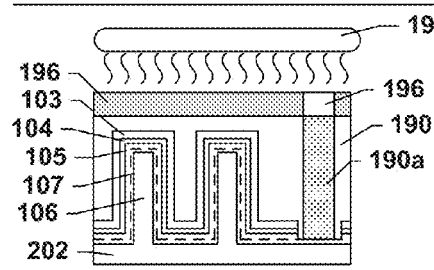
Figure 24H:
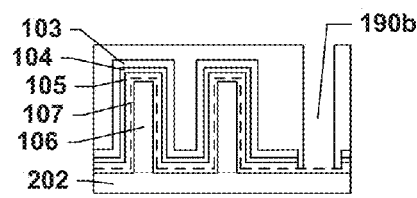
Figure 24I:
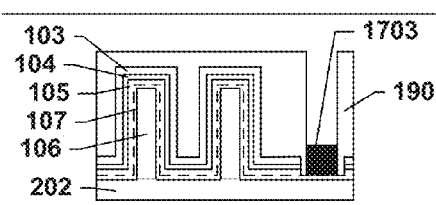
Figure 24J:
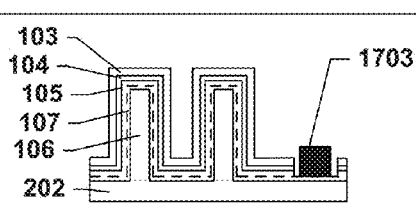

Current conducting trace 1703 may be formed by a different method as illustrated in FIGS. 24A-24J and FIG. 25. In block 2502 a first photoresist layer may be deposited over the metamaterial. As shown in FIG. 24A, a first photoresist layer 189 may be deposited over and between the bristles of the metamaterial. In block 2504 a first mask may be positioned over the first photoresist layer. As shown in FIG. 24B, the first mask 195 may block UV radiation to the photoresist 189 except through mask portion 195a. This controls the UV radiation to the desired portion of the photoresist layer 189. In block 2506 the method may include exposing a UV source to the first photoresist layer through the first mask to create an etching template. As illustrated in FIG. 24B, exposing only a portion of the photoresist layer 189 to UV radiation creates an exposed portion 189a within the photoresist layer 189. After creating the exposed portion 189a within the photoresist, the mask may be subsequently removed from the metamaterial. In block 2508 the first photoresist layer may be developed. For a positive photoresist layer this includes removing the exposed portion 189a leaving a template created by the remaining photoresist layer 189 with pores 189b as shown in FIG. 24C. In block 2510 the method may include etching the metamaterial through the etching template. As illustrated in FIG. 24D, the photoresist template 189 controls the etching process by removing only a portion of the outer conductive layer 103, the first absorber layer 105, and the second absorber layer 104. In block 2512 the first photoresist layer may be removed. As shown in FIG. 24E, after removing the first photoresist layer 189, the metamaterial may include a void in the outer conductive layer and the absorber layers. In block 2514 a second photoresist layer may be deposited over the metamaterial. As shown in FIG. 24F the second photoresist layer 190 covers the bristles and the void in the metamaterial created by the etching step. In block 2516 a second mask may be positioned over the second photoresist layer. As shown in FIG. 24G, a second mask 196 may block the UV radiation to the second photoresist layer 190 except through the second mask portion 190a. This controls the UV radiation to the desired portion of the second photoresist layer 190. In block 2518 the method may include exposing a UV source to the second photoresist layer through the second mask. As illustrated in FIG. 24G, exposing only a portion of the second photoresist layer 190 to UV radiation creates a second exposed portion 190a within the second photoresist layer 190. After creating the second exposed portion 190a within the second photoresist layer, the second mask may be subsequently removed from the metamaterial. In block 2520 the second photoresist layer may be developed. For a positive photoresist this includes removing the second exposed portion 190a leaving a template created by the remaining second photoresist layer 190 with pores 190b as shown in FIG. 24H. In block 2522 a current conducting trace may be deposited on the metamaterial. The current conducting trace 1703 may be deposited on the inner conductive layer 107 through the second photoresist pore 190b as shown in FIG. 24I. In block 2524 the second photoresist layer may be removed. As shown in FIG. 24J, when the second photoresist layer 190 is removed, only the bristles and the current conducting trace 1703 remains. After removing the photoresist, a transparent coating may be applied to the metamaterial covering the bristles and the deposited current conducting trace.

Figure 24K:
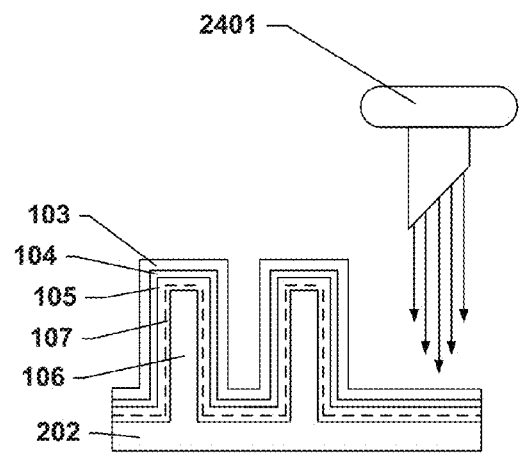
FIGS. 24K-24M are cross-sectional side views of methods using a laser prior to adding current conducting traces to an inner conductive layer of a metamaterial.
Figure 24L:
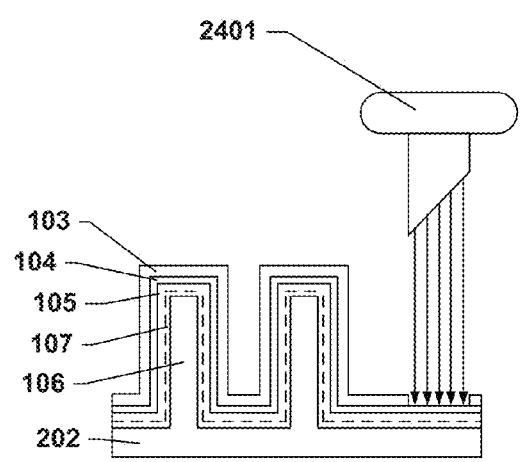
Figure 24M:
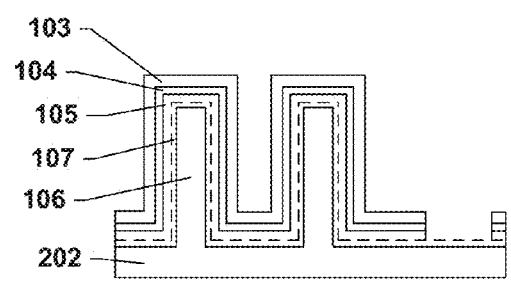

In another embodiment method that uses some of the same processes as in method 2500, the steps for etching may include laser ablation using a wavelength-tuned laser to etch only the desired layers, as illustrated in FIGS. 24K through 24M. This may reduce the number of steps associated with the photolithographic techniques of method 2500 thereby reducing manufacturing cost. As illustrated, a wavelength-tuned laser 2401 may be used to etch desired portions of the metamaterial for a conductive trace. Since this technique provides a controlled etching alternative, it allows for any of the methods above to deposit current conducting traces at any point within the method steps.

As an alternative embodiment to the conductive traces described above, high conductive regions may be applied to the various metamaterials though directional deposition such as solid angle physical vapor deposition or ion source deposition. The method may include preferentially coating highly conductive regions with metal while leaving other regions with minimal coating to refrain from blocking entering photons. For example, the method may include coating the area between the vias or bristles ten times as thick as the coating along the sidewalls of the vias or bristles allowing photons to pass through the sidewalls while simultaneously creating a highly conductive region to act as a conductive trace. As another example, the method may include using a thicker conductive coating only on the side of bristles or vias that will receive less exposure to photons during operation of the completed metamaterial. To accomplish the single region deposition, the method may include angling the substrate during the deposition process so that only the desired side receives the highly conductive coating. Regardless of the exact process, the conductive regions may be applied to any of the methods listed above.

Metamaterials 200, 300, 400, 1700, 1900, and 2100 formed by any of the processes above may be assembled into a solar panel. As briefly described above, the corrugated shape may be incorporated into an assembled solar panel as illustrated in FIGS. 26-32. The panel assembly may include a corrugated base with panel surfaces angled at approximately 30 to 60 degrees for increasing off-axis photon absorption in metamaterials 200 with flat substrates as well as increasing the planar bristle density without increasing shadowing, resulting in similar gains in total efficiency and power generation from metamaterials 300, 400 with corrugated substrates. However, the total efficiencies gains are compounded when the panel assembly and metamaterials include a corrugated shape (e.g., metamaterial 300 in a corrugated solar panel assembly) because the assembled panel benefits from an increase in planar bristle density and off-axis photon absorption.

Figure 26:
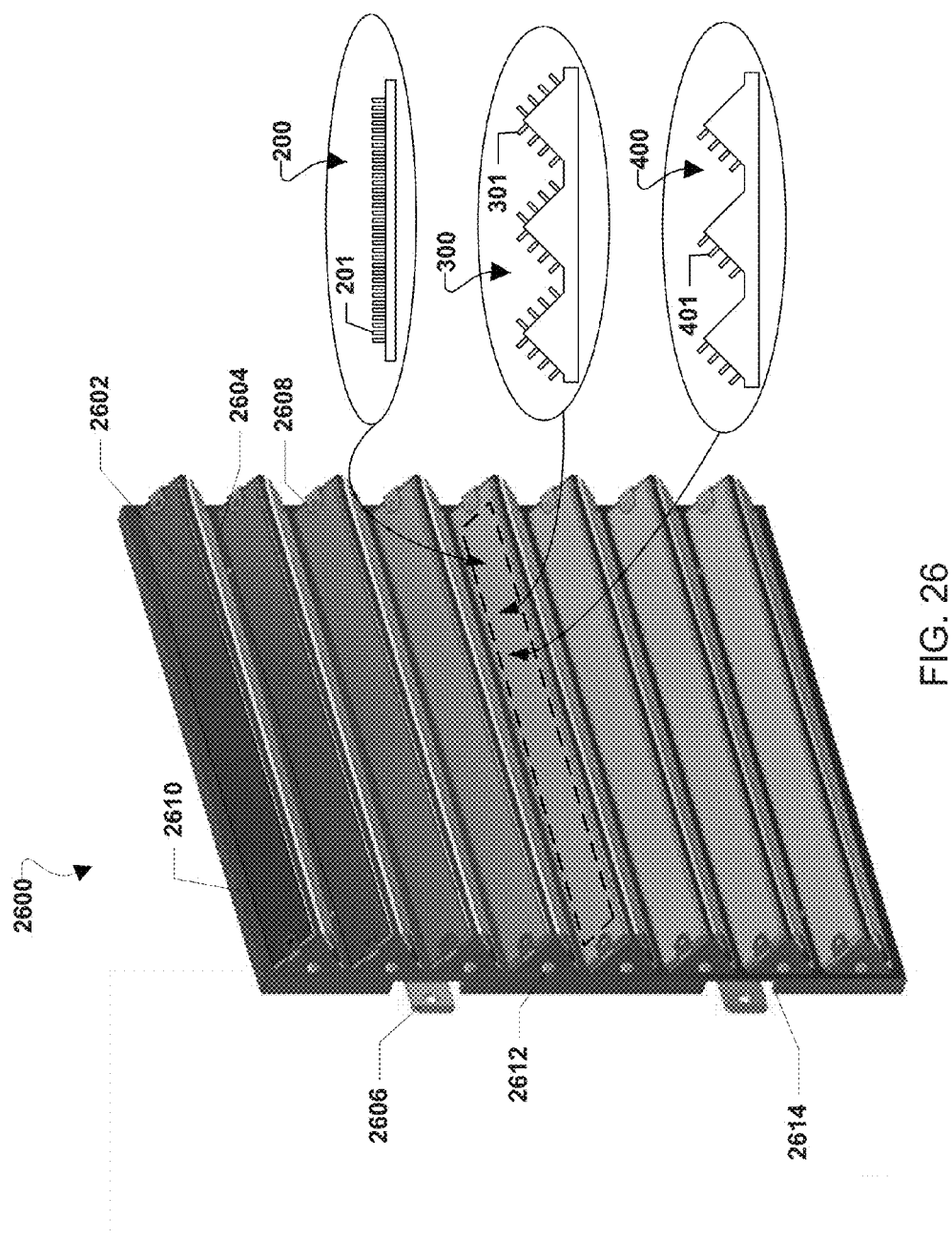
FIG. 26 is a perspective view of embodiment metamaterials in a solar panel section including a corrugated base.

FIGS. 26-32 illustrate an embodiment solar panel 3100 with a corrugated base 2610. Solar panels with a corrugated base 2610 may be formed by assembling metamaterials 200, 300, 400, 1700, 1900, and/or 2100 together. FIG. 26 illustrates a perspective view of a section of a solar panel 2600. Solar panel section 2600 may include one or more panel surfaces 2602, 2604 in an alternating fashion on a corrugated base 2610. In an embodiment, each panel surface 2602, 2604 may include metamaterials 200, 300, 400, 1700, 1900, and/or 2100 with photovoltaic bristles 201, 301, 401. In an embodiment, panel surfaces 2602, 2604 may include the same metamaterial. For example, each panel surface 2602, 2604 may include metamaterials 200 with a flat substrate 202. In an embodiment, panel surfaces 2602, 2604 may include different metamaterials. For example, panel surfaces 2602 may include metamaterials 200 with flat substrates 202 while panel surfaces 2604 may include metamaterials 300 with corrugated substrates 302. In an embodiment, a first panel surface 2602 may include metamaterials 200, 300, 400, 1700, 1900, and/or 2100, while a second panel surface 2604 is without metamaterial 200, 300, 400, 1700, 1900, and/or 2100. For example, solar panel section 2600 may include a first panel surface 2602 with metamaterials 300 alternating along a corrugated base 2610 with a second panel surface 2604 without metamaterials. In an embodiment, a second panel surface 2604 without metamaterials 200, 300, and/or 400 may include a reflective film (i.e., a mirror). For example, the first and second panel surfaces 2602, 2604 may alternate along the corrugated base 2610 with a first panel surface 2602 with metamaterials 400 and a second panel surface 2604 with only a reflective film. Regardless, each panel surface 2602, 2604 rests on the front of a corrugated base 2610.

In an embodiment, fasteners 2612 may be used to fasten the panel surfaces 2602, 2604 to the corrugated base 2610 with connectors 2608. The same fastener 2612 may also fasten the rails 2902 (shown in FIG. 29) to the corrugated base 2610 and the connectors 2608. In an embodiment, solar panel section 2600 may include a buss bar 2606 with connectors 2608 to connect the buss bar 2606 to each metamaterial 200, 300, 400, 1700, 1900, and/or 2100 of the panel surfaces 2602, 2604. In an embodiment, the buss bar 2606 may connect to the corrugated base 2610 in a slot 2614 of the corrugated based 2610. The slot 2614 may provide stability for the buss bar 2606 as well as allow solar panel section 2600 to rest on a flat back of the corrugated base 2610.

Figure 27:
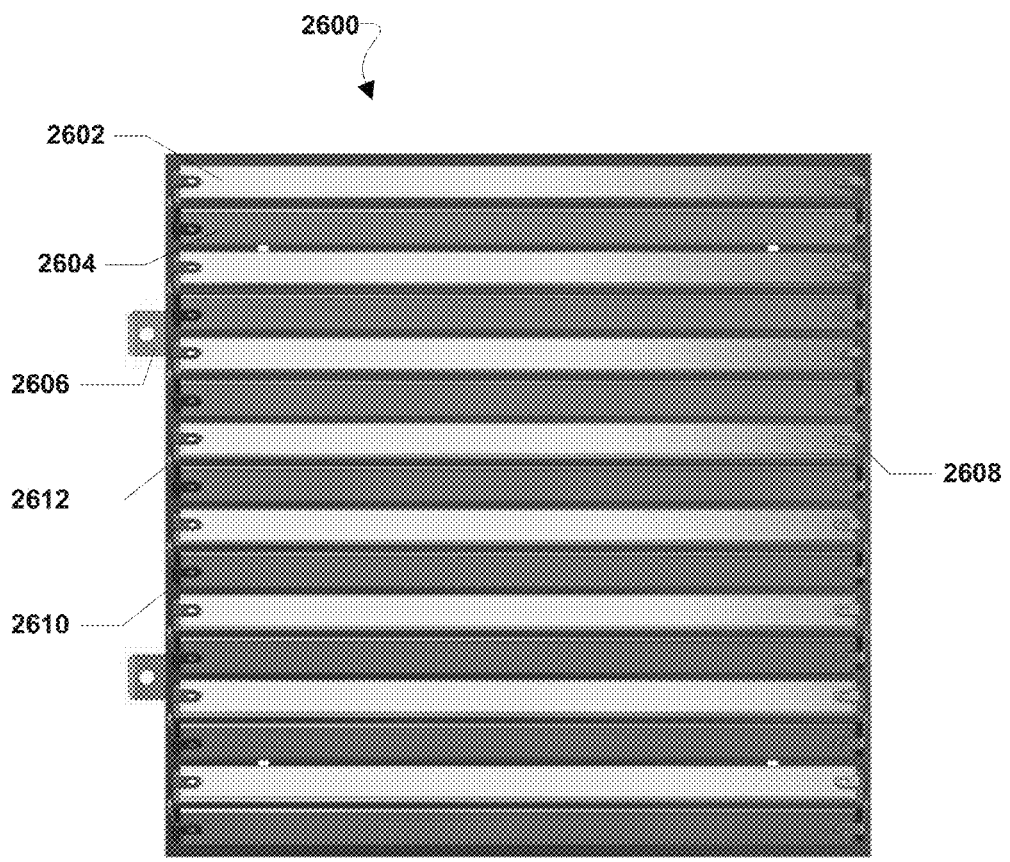
FIG. 27 is a top view of a section of a solar panel with a corrugated base according to an embodiment.

FIG. 27 illustrates a top view of solar panel section 2600. As illustrated with FIG. 26, the solar panel section 2600 may include panel surfaces 2602, 2604, a corrugated base 2610, a buss bar 2606, fasteners 2612, and connectors 2608.

Figure 28:
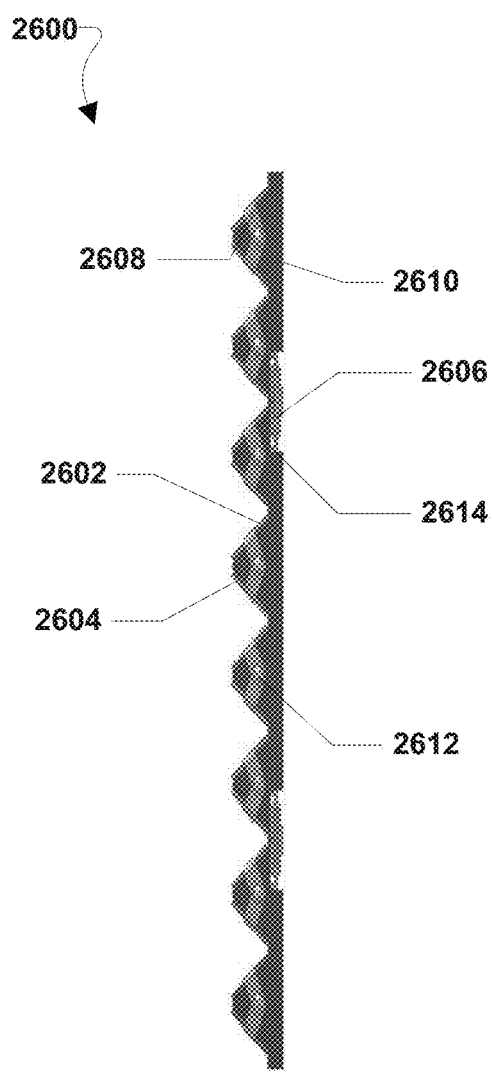
FIG. 28 is a side view of a section of a solar panel with a corrugated base according to an embodiment.

FIG. 28 illustrates a side view of solar panel section 2600. As illustrated, the connectors 2608 may use a single fastener 2612 for each pair of panel surfaces 2602, 2604. The fastener 2612 may be any means of fastening the connectors 2608 to the corrugated base 2610 and the panel surfaces 2602, 2604. For example, the fasteners 2612 may utilize a bolt, a joint, a rivet, screws, a pin, clips, latch, etc. In an embodiment, the fastener 2612 may be metal or metalized to create an electrical pathway from the metamaterials 200, 300, 400, 1700, 1900, and/or 2100 of panel surfaces 2602, 2604 to the connectors 2608. As referenced in FIG. 26, the corrugated base 2610 may have a slot 2614 for the buss bar 2606. The slot 2614 may allow the buss bar 2606 to connect to the backside of the corrugated base 2610 and form a flat surface (i.e. flat back) of the corrugated base 2610. The flat surface of the backside of the corrugated base 2610 may allow for a more stable assembly for the completed solar panel 2600.

Figure 29:
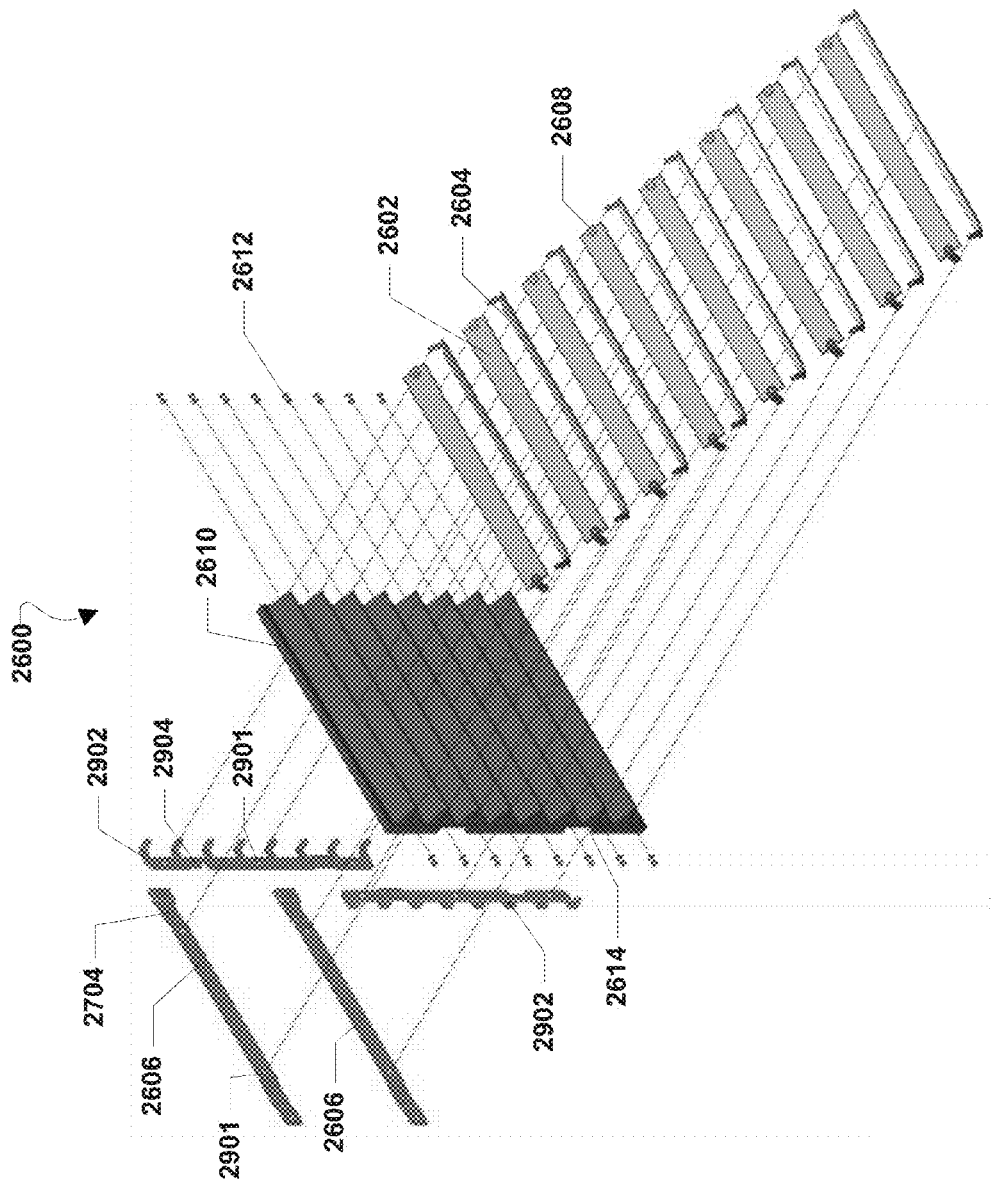
FIG. 29 is an exploded view of a section of a solar panel with a corrugated base according to an embodiment.

FIG. 29 illustrates an exploded view of a solar panel section 2600. As illustrated, rail 2902 may be secured to the corrugated base 2610 by a securing mechanism 2901. The rail 2902 may be secured to the corrugated base 2610 by any means possible. For example, the rail 2902 may be secured to the backside of the corrugated base 2610 by a rivet, crimping, a bolt, adhesive or any other securing means. In another example, the rail 2902 may be secured to the corrugated base 2610 similar to a fastener 2612 used to fasten the panel surfaces 2602, 2604 to the corrugated base 2610. In an embodiment, the rail 2902 also may be fastened by the fastener 2612 to panel surfaces 2602, 2604 on the backside of the corrugated base 2610 opposite the connectors 2608. In an embodiment, the rail 2902 may be fastened to the panel surfaces 2602, 2604 by any means possible including the fastening means as described with reference to FIG. 28. In an embodiment, the buss bar 2606 may be secured to the corrugated base 2610 by a securing mechanism 2901. In an embodiment, the buss bar 2606 may be attached to the rail 2902 with an attachment mechanism 2904. The attachment mechanism 2904 may be any means of attachment. The attachment mechanism may be the same as the securing mechanisms 2901, or the fasteners 2612 as described above.

In an embodiment, the rails 2902 and the buss bars 2606 may be electrically connected to the metamaterials 200, 300, 400, 1700, 1900, and/or 2100 of panel surfaces 2602, 2604. In an embodiment, the rails 2902 may be electrically connected to connectors 2608. The connectors 2608 may be electrically connected to the panel surfaces 2602, 2604 including metamaterials 200, 300, 400, 1700, 1900, and/or 2100. The metamaterials 200, 300, 400, 1700, 1900, and/or 2100 may create electron movement when the photovoltaic bristles 201, 301, 401 are struck by photons. In an embodiment, the outer conductive layer 103 of metamaterials 200, 300, 400 illustrated in FIGS. 2B, 3B, and 4B may be electrically connected to connectors 2608. In an embodiment the current conducting traces 1701, 1702, 1703, 1901, and/or 2101 of metamaterials 1700, 1900, 2100 as illustrated in FIGS. 17, 19, and 21 may be electrically connected the connectors 2608 to help reduce the electrical resistance in the metamaterial 1700, 1900, 2100. Regardless, electron movement may create electricity to flow from the metamaterials 200, 300, 400, 1700, 1900, and/or 2100 within the panel surfaces 2602, 2604 to the connectors 2608 to the rails 2902 and buss bars 2606 connected to the rails 2902. From the rails 2902 and buss bars 2606, the electricity may flow to other rails 2902 and buss bars 2606 in neighboring panel sections 2600 and eventually to an electrical destination (e.g. electrical storage) connected to the completed solar panel 3100.

Figure 30:
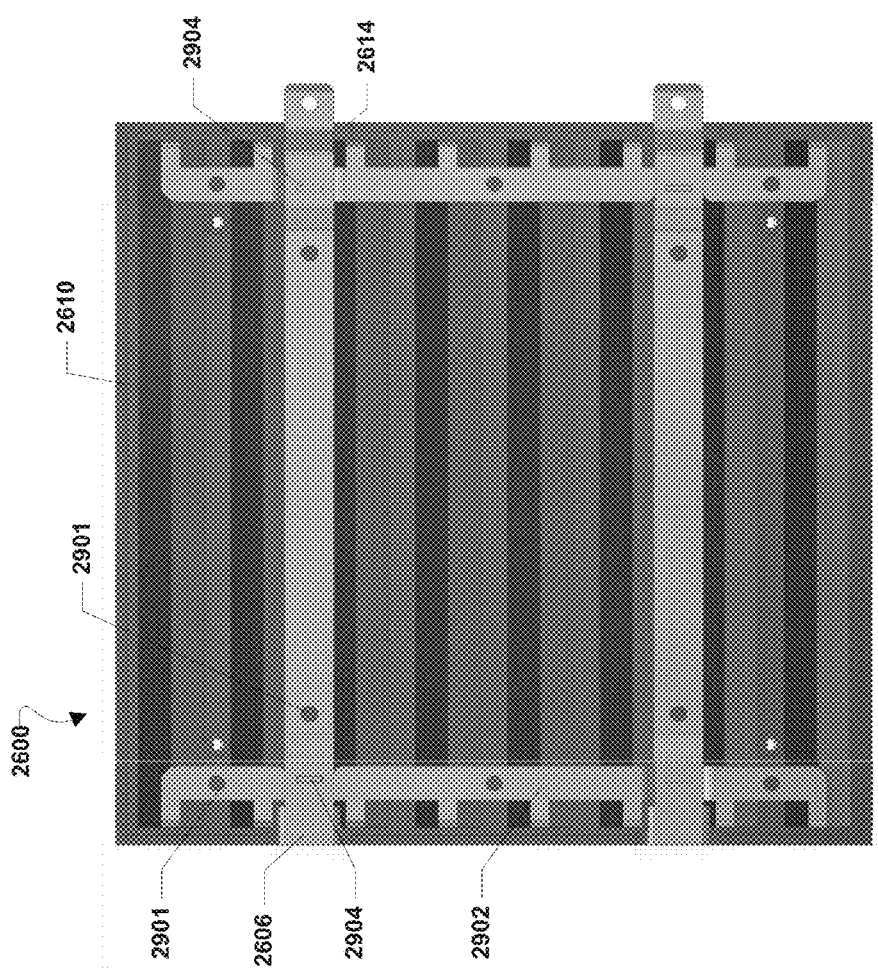
FIG. 30 is a back view of a section of a solar panel with a corrugated base according to an embodiment.

FIG. 30 illustrates a back view of a solar panel section 2600. As discussed earlier, the buss bar 2606 of the solar panel section 2600 may have a securing mechanism 2901 to help stabilize the buss bar 2606 on the backside of the corrugated section 2600. In an embodiment, each buss bar 2606 may have one or more securing mechanism 2901 to secure the buss bar 2606 to the back of the corrugated base 2610. Alternatively, each buss bar 2606 may not have a securing mechanism 2901 with the corrugated base 2610 and may be secured and connected only with the rails 2902. Although FIGS. 26-30 depict a solar panel section 2600 with two rails 2902 and two buss bars 2606, a solar panel section 2600 may have any number of rails 2902 and buss bars 2606. Some examples of solar panel sections 2600 with a different number of rails include solar panel sections with one rail, two rails, three rails, four rails, five rails, etc. Some other examples of solar panel sections with a different number of buss bars include panel sections with one buss bar, two buss bars, three buss bars, four buss bars, five buss bars, etc.

Figure 31:
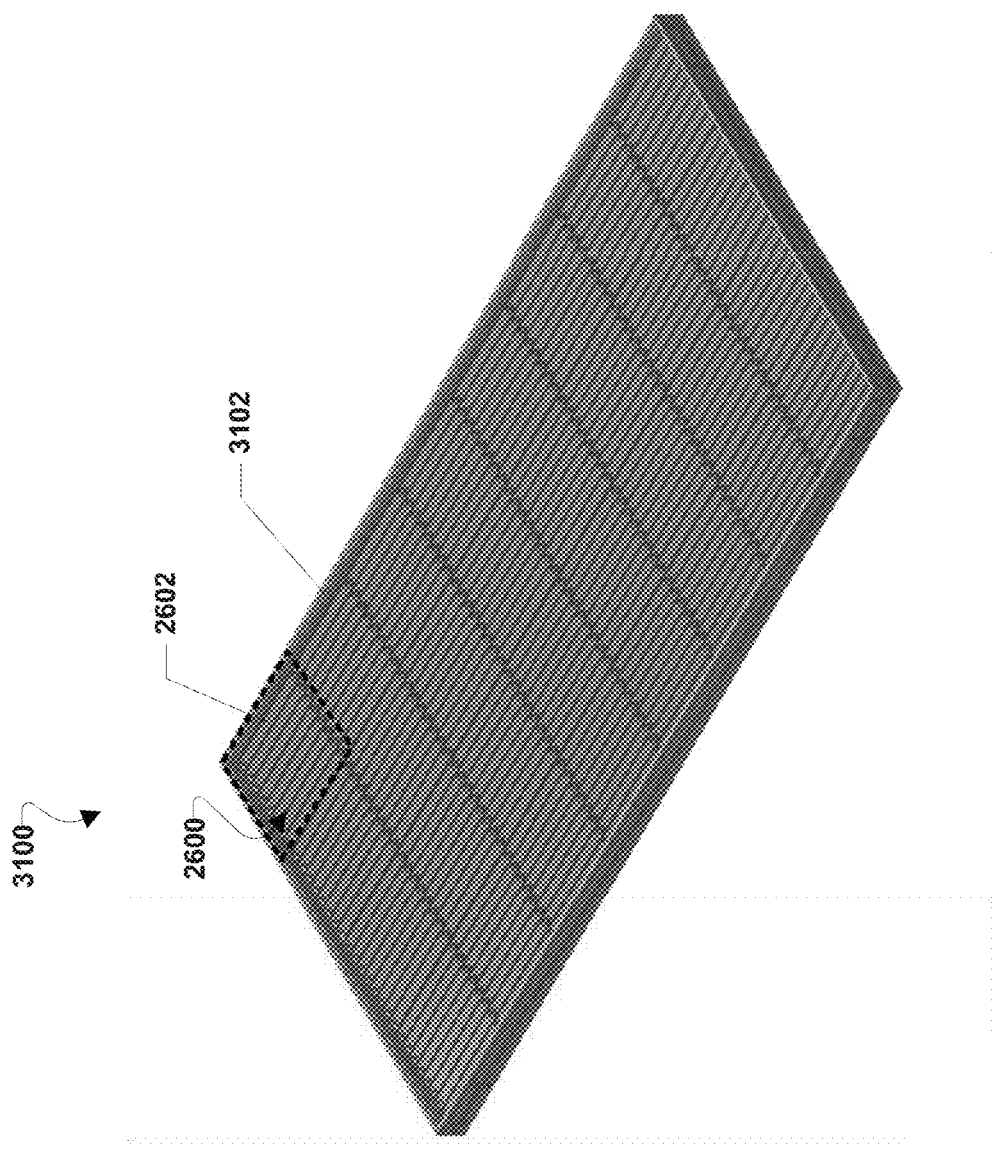
FIG. 31 is a perspective view of a solar panel according to an embodiment.

FIG. 31 illustrates a perspective view of a solar panel 3100 with multiple solar panel sections 2600. In an embodiment, each solar panel section 2600 may include metamaterials 200, 300, 400. In another embodiment, the metamaterials may include current conducting traces 1701, 1702, 1703, 1901, 2101 as illustrated in metamaterials 1700, 1900, or 2100 of FIGS. 17, 19, and 21. In an embodiment, each solar panel section 2600 may be adjacent and combine with one or more other solar panel sections 2600. In an embodiment, the solar panel 3100 may include a frame 3102 that surrounds the outer perimeter of the combined solar panel sections 2600 within the solar panel 3100.

Figure 32:
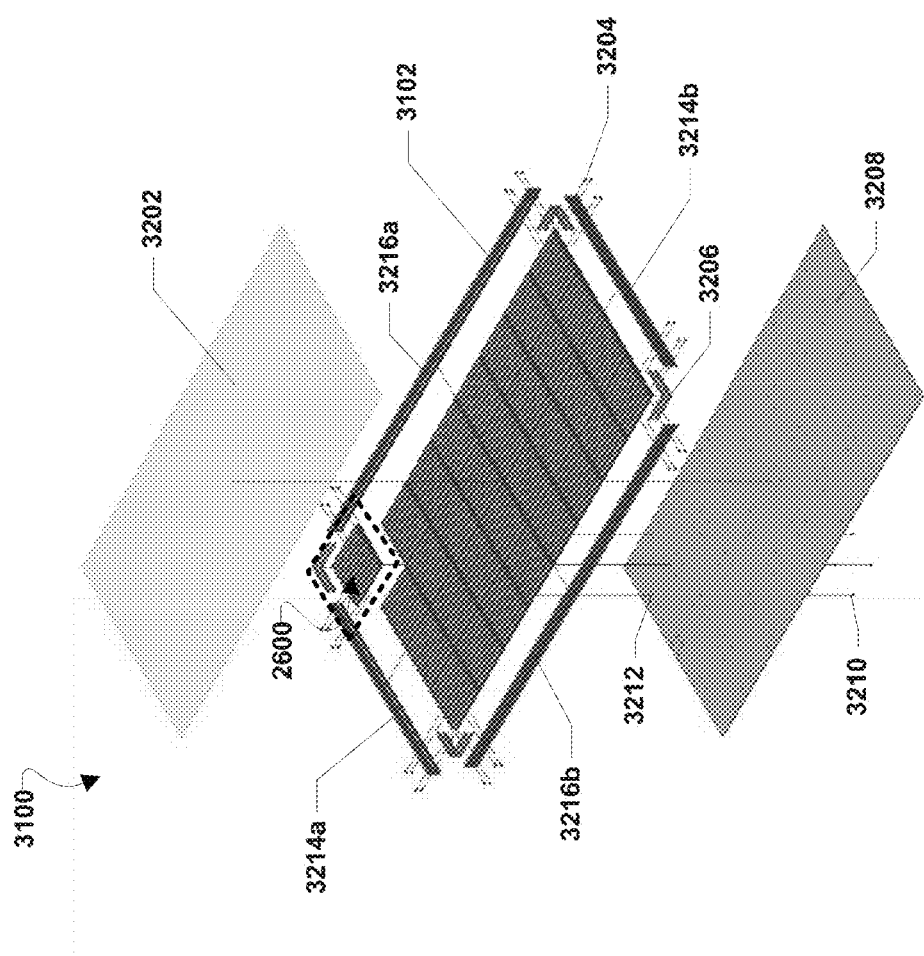
FIG. 32 is an exploded view of a solar panel according to an embodiment.

FIG. 32 illustrates an exploded view of a solar panel 3100. In an embodiment, the solar panel 3100 may include a frame 3102, a top cover 3202, and a back cover 3208. In an embodiment, the frame 3102 is connected with corner brackets 3206 and fasteners 3204 to the corners of solar panel sections 2600 positioned in the corners of solar panel 3100. In an embodiment, the frame 3102 for solar panel 3100 may include two short pieces 3214a, 3214b and two long pieces 3216a, 3216b to attach along the four sides of the assembled solar panel sections 2600. In an embodiment, the solar panel 3100 may have four or more corner brackets 3206 (e.g., eight as shown) to connect the pieces of the frame 3102 to the assembled solar panel sections 2600.

In an embodiment, the top cover 3202 of the solar panel 3100 may be transparent or semitransparent. The top cover 3202 may protect the solar panel section 3100 and their electrical and photovoltaic components. For example, the top cover 3202 may protect the solar panel section 2600 and their electrical and photovoltaic components from oxygen corrosion, wind, water, and dirt or anything else that may reduce the efficiency or life of the metamaterials 200, 300, 400, 1700, 1900, and/or 2100 in solar panel 3100.

In an embodiment, the back cover 3208 of solar panel 3100 may include rounded slots 3212 so that fasteners 3210 may connect the back cover 3208 to the assembled (i.e., combined) solar panel sections 2600. The fasteners 3210 may be any type that may connect the back cover 3208 to the assembled solar panel sections 2600. For example, the fasteners 3210 may fasten similar to the fasteners 2612 as described with reference to FIG. 28 (e.g., by bolts, screws, etc.).

In an embodiment, the back cover 3208 and the top cover 3202 may be sealed within the solar panel 3100 by the frame 3102. In an embodiment, only the back cover 3208 or the top cover 3202 may be sealed within the solar panel 3100 by the frame 3102. The back cover 3208 and the top cover 3202 may provide structural support to the solar panel 3100 and its subparts. In addition, the back cover 3208 and the top cover 3202 may protect the subparts of the solar panel 3100 from any contamination that may reduce the efficiency and life of the metamaterials 200, 300, 400, 1700, 1900, and/or 2100 in solar panel 3100 such as wind, water, dirt, or oxygen, etc.

In another embodiment, the volumetric efficiency gains realized from the solar panel with the corrugated sections may be achieved by mounting completed solar panels in corrugated patterns with respect to each other. Thus, completed solar panels may be mounted in an array of solar panels where the surfaces of each solar panel form an angle of approximately 30 to 60 degrees with a common plane such as a base connecting the solar panels that is perpendicular to the sun. As an alternative embodiment, reflectors may replace some completed solar panels in the corrugated pattern to help maximize efficiency gain of each completed solar panel.

Referring to FIG. 37A, a first exemplary in-process photovoltaic structure is illustrated. As used herein, an "in-process" structure or a "prototypical" structure refers to a transient structure that is subsequently modified by addition of another material, removal of an existing material, or a combination thereof to provide a final device structure.

The first exemplary in-process photovoltaic structure may include a final substrate 3609*d* as provided by the processing steps of FIG. 36A. The final substrate 3609*d* may include a sheet substrate 3710 and a moldable material layer 3720 that is an optically transparent layer, i.e., a layer composed of an optically transparent material. As used herein, an "optically transparent material" refers to a material having an absorption coefficient that is less than 100 cm$^{-1}$ between the entire wavelength range from 400 nm to 800 nm. In an embodiment, the optically transparent material of the moldable material layer 3720 may have an absorption coefficient that is less than 10 cm$^{-1}$ between the entire wavelength range from 400 nm to 800 nm. In another embodiment, the optically transparent material of the moldable material layer 3720 may have an absorption coefficient that is less than 1 cm$^{-1}$ between the entire wavelength range from 400 nm to 800 nm.

The refractive index of the moldable material layer 3720 may be in a range between 1 and 3 between the wavelength range from 400 nm to 800 nm. In an embodiment, the refractive index of the moldable material layer 3720 may be in a range between 1.2 and 2.4 between the wavelength range from 400 nm to 800 nm. In another embodiment, the refractive index of the moldable material layer 3720 may be in a range between 1.3 and 2.0 between the wavelength range from 400 nm to 800 nm. In an embodiment, the refractive index of the moldable material layer 3720 may be in a range between 1.4 and 1.7 between the wavelength range from 400 nm to 800 nm.

The moldable material layer 3720 may be a dielectric material layer. The resistivity of the moldable material layer 3720 may be greater than $1.0 \times 10^5$ Ohm-cm. In an embodiment, the resistivity of the moldable material layer 3720 may be greater than $1.0 \times 10^6$ Ohm-cm. In another embodiment, the resistivity of the moldable material layer 3720 may be greater than $1.0 \times 10^7$ Ohm-cm.

In an embodiment, the sheet substrate 3710 may be an optically transparent substrate, and may, or may not, be flexible. In an embodiment, the sheet substrate 3710 may include a rigid material such as glass (including doped or undoped silicate glass) or sapphire. In another embodiment, the sheet substrate 3710 may include a transparent flexible material such as transparent polymers (e.g., plastics). The sheet substrate 3710 may be a continuous sheet extending for hundreds of feet and stored in a roll, or may be discrete sheet having lateral dimensions on the order of 1 m and stored, for example, by stacking.

A metamaterial of the present disclosure may be formed by providing a moldable material layer 3720 on, or in, a sheet substrate 3710. In an embodiment, the moldable material layer 3720 may be formed on the sheet substrate 3710 by dispensing a moldable material on the sheet substrate 3710. The moldable material may be any optically transparent material that may be molded. The thickness of the moldable material layer 3720, prior to patterning by imprinting or alternative means, may be in a range from 6 microns to 1 mm, and typically in a range from 10 microns to 60 microns, although lesser and greater thicknesses may also be employed.

In an embodiment, the moldable material layer 3720 may contain a moldable material selected from a lacquer, a silicone precursor material, a gel derived from a sol containing a polymerizable colloid, and a glass transition material. In an embodiment, the moldable material layer 3720 may include a polymer resin-based plastic material, an organic material including at least one resin, or a flexible glass material based on silica. The transparent sheet substrate 3710 may include a plastic film or a glass film that is more rigid than the moldable material layer 3720. In one embodiment, the moldable material layer 3720 may be provided by applying a polymerizable material on a substrate (such as the sheet substrate 3710), and inducing partial polymerization of the polymerizable material.

In embodiments in which the moldable material layer 3720 includes a lacquer, the moldable material may be selected from phenylalkyl catechol-based lacquers, nitrocellulose lacquers, acrylic lacquers, and water-based lacquers. Phenylalkyl catechol-based lacquers include at least one phenylalkyl catechol that includes a long alkyl chain. Examples of such phenylalkyl catechols include urushiol and laccol (also referred to as thitsiol). Urushiol has the formula of $C_6H_3(OH)_2R$, in which R may be, for example, $(CH_2)_{14}CH_3$ or $(CH_2)_7CH=CHCH_2CH=CHCH_2CH=CH$, or a similar radical. Laccol is a crystalline phenol having the formula of or $(CH_2)_7CH=CHCH_2CH=CH(CH_2)_2CH_3$ or $(CH_2)_7CH=CH(CH_2)_5CH_3$ or $(CH_2)_7CH=CHCH_2CH=CHCH=CHCH_3$. Laccol has the formula of $C_{17}H_{31}C_6H_3(OH)_2$ (i.e., $C_6H_3(OH)_2R$ in which $R=C_{17}H_{31}$) and occurring in the sap of lacquer trees. Phenylalkyl catechol-based lacquers are generally slow-drying, and are set by oxidation and polymerization in addition to evaporation alone. Heat and humidity may be applied to accelerate partial setting of the phenylalkyl catechol-based lacquers prior to imprinting and/or to accelerate full setting of the phenylalkyl catechol-based lacquers after imprinting.

The phenols oxidize and polymerize under the action of an enzyme laccase, yielding a substrate that, upon proper evaporation of its water content, is hard.

Nitrocellulose lacquers are fast-drying solvent-based lacquers that contain nitrocellulose, which is a resin obtained from the nitration of a cellulostic material (such as cotton). Nitrocellulose lacquers may be applied by spraying. Nitrocellulose lacquers produce a flexible, hard, and transparent film.

Acrylic lacquers refer to lacquers using acrylic resin (which is a synthetic polymer). Acrylic resin is a transparent thermoplastic that is obtained by the polymerization of derivatives of acrylic acid. Acrylic lacquer has a fast drying time.

Water-based lacquers are less toxic than other types of lacquers, and various types of water-based lacquers are known. An illustrative exemplary composition for water-base lacquer may be acrylic Copolymer Resin 30% in weight percentage, dipropylene glycol monomethyl ether at about 5% in weight percentage, propylene glycol monomethyl ether at about 5% in weight percentage, and water in about 60% weight percentage. Other exemplary compositions for water-based lacquer are disclosed, for example, in European Patent Publication No. EP0555830 A1 and U.S. Pat. No. 5,550,179 A.

In an embodiment, the moldable material layer 3720 may include a plastic material prepared from semicrystalline or amorphous polymer resins. Examples of semicrystalline resins that may be employed for the moldable material layer 3720 include, but are not limited to, terephthalate (PET), polypropylene (PP), high density polyethylene (HDPE), low density polyethylene (LDPE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), or similar fluoro-based and non-fluoro-based polymers blended together or copolymerized in one or more mixtures. In an embodiment, the moldable material layer 3720 may include terephthalate (PET). Examples of amorphous polymer resins include, but are not limited to, polycarbonate (PC), polymethylmethacrylate (PMMA), polymethacrylate (PMA), cyclic polyolefin (branded under the trade name Topas™), or similar polymers blended together or copolymerized in one or more mixtures.

In an embodiment, the moldable material layer 3720 may include a resin material. In an embodiment, the resin material may be selected such that the resin material may be cured with a radiation with wavelengths between 200 nm and 450 nm (such as 365 nm), or may be cured or set thermally with heat treatment at a temperature in a range from 500° C. to 500° C.

In an embodiment, the resin material of the moldable material layer 3720 may be selected from radiation cured organic materials that are cured through radical polymerization of methacrylate and methylmethacrylate monomers, preferably methylmethacrylate monomers and methylmethacrylate derivations. Example of methylmethacrylate derivations include by not limited to methylmethylacrylic acid, hydroxyethylmethylmethacrylate, fluorofunctinoalized methylmethacrylate, and silicone-functionalized methylmethacrylate. These may be mixed in various proportions and blended with oligomers based on urethane acrylate precursors and photoinitiators activated by light in the wavelength range listed above.

In another embodiment, the resin material of the moldable material layer 3720 may be selected from radiation cured organic materials cured through cationic polymerization using a cationic photoinitiators activated by light in the wavelength range above. Monomers are epoxy based with single, double, or multiple functionality. Monomer examples include, but are not limited to, diglycidyl monomers based on bisphenol-A or bisphenol-F, cylic aliphatic monomers and oligomers, and mixtures thereof.

In another embodiment, the resin material of the moldable material layer 3720 may be selected from thermally cured sol-gel based chemistries that undergo hydrolysis and condensation reactions resulting in highly crosslinked inorganic matrices. Examples include but not limited to tetraethylorthosilicate (TEOS), tetramethylorthosilicate (TMOS), or organically modified silicates with one or more hydrolyzeable components, or mixtures thereof. These resin materials may be further sintered at an elevated temperature between 300° C. and 500° C. to densify the silicate, evaporate low molecular weight byproducts, and pyrolyze the organic materials to form a high temperature resistant ceramic.

In another embodiment, the resin material of the moldable material layer 3720 may be selected from thermally cured silicates that are crosslinked through hydrosilation addition reactions using platinum catalysts which may be sintered at an elevated temperature between 300° C. and 500° C. to densify silicate and pyrolyze away the organic materials to form a temperature resistant ceramic.

In another embodiment, the resin material of the moldable material layer 3720 may be selected from organic-inorganic hybrid resins based on radiation cured silicates from monomers of acrylate and methacrylate functionality that may be cured with radical polymerization after activation of photoinitiators irradiated with light in the wavelength range above and undergo further densification by sol-gel condensation of hydroxysiloxane groups in the materials. These materials may then be subsequently sintered at an elevated temperature between 300° C. and 500° C. to form a high temperature resistant ceramic.

In another embodiment, the resin material of the moldable material layer 3720 may be selected from a solid deformable material, which may be a thermoset or thermoplastic resin, that may be applied through a solvent cast method and may be laminated as a film. Examples of thermoset resins include, but are not limited to, epoxies, polyurethanes, silicones, ethylene propylene diene monomer (EPDM) rubber, and nitrile and natural rubbers. Examples of thermoplastic resins include both semi-crytalline and amorphous resins. Semi-crystalline polymer resins include, but are not limited to, polyethylene terephthalate (PET), polypropylene (PP), high density polyethylene (HDPE), low density polyethylene (LDPE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), and similar fluoro-based and non-fluoro-based polymers blended together or copolymerized in one or more mixtures. For films embossed with an imprinting lacquer, PET may be employed. For films embossed with heat and pressure, PE may be employed. Amorphous polymer resins include, but are not limited to, polycarbonate (PC), polymethylmethacrylate (PMMA), polymethacrylate (PMA), cyclic polyolefin (branded under the trade name Topas™), and similar polymers blended together or copolymerized in one or more mixtures.

In an embodiment, the moldable material layer 3720 may include a moldable material that may form silicone, i.e., a silicone precursor. Silicones are polymers that include any inert, synthetic compound made up of repeating units of siloxane, which is a functional group of two silicon atoms and one oxygen atom, and may be combined with carbon and/or hydrogen. In an embodiment, the moldable material of the moldable material layer 3720, as applied to the sheet substrate 3710 prior to imprinting, may be selected from polydimethylsiloxane, dimethyldichlorosilane, methyltrichlorosilane, and methyltrimethoxysilane.

In an embodiment, the moldable material layer 3720 may be formed by applying a precursor material for polydimethylsiloxane (PDMS; $CH_3[Si(CH_3)_2O]_nSi(CH_3)_3$) and inducing the polymerization of the precursor material. The number n of repetition of the monomer $[SiO(CH_3)_2]$ units determines the viscosity and elasticity of the polydimethylsiloxane material. The polymerization reaction evolves hydrogen chloride.

Silane precursors with more acid-forming groups and fewer methyl groups, such as methyltrichlorosilane, may be used to introduce branches or cross-links in the polymer chain, thereby producing hard silicone resins. Alternatively, chlorine atoms in the silane precursor for polydimethylsiloxane may be replaced with acetate groups. In this case, the polymerization produces acetic acid, which is less chemically aggressive than HCl. After polymerization and cross-linking, a silicone precursor material produces an optically transparent layer having a hydrophobic surface.

In an embodiment, the moldable material layer 3720 may contain a sol-gel material. As used herein, a sol-gel material refers to a sol material that may be subsequently transformed to a gel material or a gel material that is derived from a sol material, i.e., a material that may go through a sol-gel transition or has gone through a sol-gel transition. The moldable material layer 3720 as applied to the sheet substrate 3710 may be a sol material, which subsequently goes through a sol-gel transition to become a gel material prior to imprinting.

A sol-gel transition or a sol-gel process refers to a process in which a sol (a set of solid nanoparticles and a liquid in a state in which the solid particles are dispersed in the liquid) agglomerate to form a gel (a set of a liquid and a continuous three-dimensional network extending throughout the liquid). A sol is a colloid. A colloid is a mixture in which at least two different phases (such as solid and liquid) are intimately mixed at microscopic level. Solid nanoparticles or macromolecules are dispersed throughout the liquid in a sol. In a gel, the solid network of interconnected nanostructures spans the volume of a liquid medium. In the gel, the continuous phase is a solid network and the dispersed phase is a liquid. A sol may become a gel when the solid nanoparticles dispersed in it may join together to form a network of particles that spans the liquid. As a sol becomes a gel, its viscosity approaches infinity and finally becomes immobile. A sol-gel transition may be triggered with the passage of time, change of pH, addition of a gelation agent, temperature, agitation, and/or catalysts.

In an embodiment, the moldable material of the moldable material layer 3720 as applied to the sheet substrate 3710 may be a sol-gel material selected from a colloid containing a metal alkoxide and a colloid containing silicon alkoxide. In this case, hydrosis and condensation may be employed to form a gel from the sol so that the moldable material layer 3720 as provided for imprinting is in a gel state.

The precursor sol may be either deposited on a substrate to form a film (e.g., by dip coating or spin coating), cast into a suitable container with the desired shape (e.g., to obtain monolithic ceramics, glasses, fibers, membranes, aerogels), or used to synthesize powders (e.g., microspheres, nanospheres).

A typical sol-gel process includes solution, gelation, optional drying, and optional densification operations. In one exemplary embodiment, the moldable material layer 3720 may include an incompletely dried or incompletely densified silica glass. An alkoxide may be mixed with water and a mutual solvent to form a solution. During gelation, hydrolysis leads to the formation of silanol groups (Si—OH), which are intermediate groups. The moldable material layer 3720 as provided for imprinting may include silanol groups. Optionally, a partial condensation reaction that produces siloxane bonds (Si—O—Si) may be performed prior to imprinting. A second condensation reaction may be performed after imprinting. Alternatively, the condensation reaction may be performed only after imprinting. The silica gel formed by this process leads to an interconnected three-dimensional network including polymeric chains. Thus, drying and densification may be performed after imprinting of the moldable material layer 3720.

If a sol-gel material selected from a colloid containing a metal alkoxide and a colloid containing silicon alkoxide may be applied as the moldable material layer 3720 on the sheet substrate 3710, hydrosis and condensation may be employed to form a gel from the sol so that the moldable material layer 3720 as provided for imprinting is in a gel state. In an embodiment, a silcon alkoxide such as silicon tetraethoxide ($Si(OC_2H_5)_4$, i.e., tetraethyl orthosilicate (TEOS)) may be employed as the sol material for the moldable material layer 3720. In a subsequent hydrolysis (reaction with water), a hydroxyl ion becomes attached to the silicon atom as follows: $Si(OC_2H_5)_4 + H2O \rightarrow HO—Si(OC_2H_5)_3 + C_2H_5—OH$ In an embodiment, the amount of water added to silicon tetraethoxide for hydrolysis may be controlled such that hydrolysis proceeds partially, and does not result in 100% conversion of silicon tetraethoxide into silica, but provides a gel including polymer chains of intermediate species a partial hydrolysis reaction such as $HO—Si(OC_2H_5)_3$ and/or $(HO)_2—Si(OC_2H_5)_2$. The moldable material layer 3720 as provided for imprinting includes such a gel. After imprinting, complete hydrolysis may be performed by providing additional water and optionally employing a hydrolysis catalyst such as acetic acid or hydrochloric acid.

Formation of a metal oxide involves connecting the metal centers with oxo (M-O-M) or hydroxo (M-OH-M) bridges, therefore generating metal-oxo or metal-hydroxo polymers in solution.

In an embodiment, the moldable material layer 3720 may include a flexible glass material based on silica ($SiO_2$) manufactured and processed with a roll-to-roll manufacturing method. In an embodiment, the moldable material layer 3720 may include glass film commercially available from the glass manufacturer Corning™ and branded as Willow Glass™.

The web-to-plate system may include a first densification device configured to reduce elasticity of the moldable material prior imprinting, and/or a second densification device configured to reduce elasticity of the moldable material after imprinting. In an embodiment, each of the first and second densification devices may include at least one of a fan, a heater, an ultraviolet treatment system, an agitator, and a laser irradiation system. The first and/or second densification device may optionally include a spray device configured to spray a gelation accelerant or a catalyst that accelerates densification of the moldable material at various stages of densification.

In an embodiment, the pattern in the moldable material layer 3720 may be made by embossing the moldable material layer 3720 with a patterned metal plate with heat and pressure in case the moldable material layer 3720 includes a plastic or glass film, or may be made by embossing an imprinting resin on the plastic or glass film and subsequently curing the imprinting resin while in contact with the patterned metal plate in case the moldable material layer 3720 includes the resin.

During the imprinting process, a die (such as a daughter die web 3501d in FIG. 36A) including a pattern of protruding structures and incorporated into a web may be imprinted onto the moldable material layer 3720 to generate a pattern of trenches 1103 extending downward from a top surface of the moldable material layer 3720 to a depth, which may be the same as the height h of the trench 1103. The height h of the trenches 1103 may be the same as the height h of the bristles discussed above. In an embodiment, the height h of the trench 1103 may be less than the thickness t of the moldable material layer 3720. In an embodiment, the thickness t of the moldable material layer 3720 may be in a range from 6 microns to 200 microns. In another embodiment, the thickness t of the moldable material layer 3720 may be in a range from 10 microns to 100 microns. In yet another embodiment, the thickness t of the moldable material layer 3720 may be in a range from 15 microns to 30 microns.

In an embodiment, each of the trenches 1103 may have a height h in a range from 3 microns to 100 microns, although lesser and greater depths may also be employed. In an embodiment, each of the trenches 1103 may have a height h in a range from 6 microns to 30 microns. In another embodiment, each of the trenches 1103 may have a height h in a range from 9 microns to 15 microns. In another embodiment, each of the trenches 1103 may have a height h in a range from 10 microns to 12 microns. In another embodiment, the trenches 1103 may have the same depth.

A base lateral dimension bd may be in a range from 0.4 micron to 20 microns at the top portion of each trench 1103, although lesser and greater dimensions may also be employed. As used herein, a base lateral dimension bd refers to the maximum lateral dimension at the topmost portion of a trench 1103. The base lateral dimension becomes the base dimension of an inverted trench after the first exemplary structure is subsequently flipped upside down. The horizontal cross-sectional shape of each trench 1103 may be in a circular shape, an elliptical shape, or a closed curvilinear shape. In an embodiment, the horizontal cross-sectional shape of each trench 1103 may be a circle, and the base lateral dimension bd may be the diameter of each trench 1103 at a topmost portion, i.e., the portion that is most distal from the interface between the moldable material layer 3720 and the transparent sheet substrate 3710. In an embodiment, the base lateral dimension bd may be in a range from 1 micron to 10 microns. In another embodiment, the base lateral dimension bd may be in a range from 2 microns to 9 microns. In yet another embodiment, the base lateral dimension bd may be in a range from 4 microns to 8 microns. In another embodiment, the base lateral dimension bd may be in a range from 5 microns to 7 microns.

A tapered-end lateral dimension td may be in a range from 0.22 micron to 12 microns at the top portion of each trench 1103, although lesser and greater dimensions may also be employed. As used herein, a tapered-end lateral dimension td refers to the maximum lateral dimension at the bottommost portion of a trench 1103. The tapered-end lateral dimension becomes the dimension of the tapered upper portion of an inverted trench after the first exemplary structure is subsequently flipped upside down. In an embodiment, the horizontal cross-sectional shape of each trench 1103 may be a circle, and the tapered-end lateral dimension td may be the diameter of each trench 1103 at a bottommost portion, i.e., the portion that is most proximal to the interface between the moldable material layer 3720 and the transparent sheet substrate 3710. In an embodiment, the tapered-end lateral dimension td may be in a range from 0.6 micron to 6 microns. In another embodiment, the tapered-end lateral dimension td may be in a range from 1.2 microns to 4.8 microns. In another embodiment, the base lateral dimension bd may be in a range from 2.4 microns to 3.6 microns. In another embodiment, the base lateral dimension bd may be in a range from 3 microns to 4.2 microns.

The ratio of the base lateral dimension bd to the height h of the trench 1103 may be in a range from 0.5 to 0.75, although lesser and greater ratios may also be employed. In an embodiment, the ratio of the base lateral dimension bd to the height h of the trench 1103 may be in a range from 0.55 to 0.7. In another embodiment, the ratio of the base lateral dimension bd to the height h of the trench 1103 may be in a range from 0.6 to 0.65.

The horizontal cross-sectional shape of each trench 1103 may be circular, elliptical, polygonal, or of any other closed curvilinear shape. In an embodiment, the horizontal cross-sectional shape of each trench 1103 may be substantially circular. The sidewall of each trench 1103 may be substantially vertical, or may be tapered with a taper angle $\alpha$ in a range from 3 degrees to 15 degrees, although greater taper angles may also be employed. As used herein, a surface is substantially vertical if the angle of the surface with respect to a vertical direction does not exceed 3 degrees. In an embodiment, the taper angle $\alpha$ may be in a range from 6 degrees to 10 degrees. In another embodiment, the taper angle $\alpha$ may be in a range from 7 degrees to 9 degrees.

After imprinting, the material of the moldable material layer 3720 with an imprint pattern thereupon may be densified or otherwise transformed to increase the rigidity. For example, if the moldable material layer 3720 includes a lacquer, a silicone, or a gel, densification or additional transformation of the moldable material layer 3720 may be effected by heat, cold, moisture, agitation, application of a catalyst, irradiation by visible light, ultraviolet light, or infrared light, ventilation, or a combination thereof. In one embodiment, if the moldable material layer 3720 is provided by applying a polymerizable material on a substrate (such as the sheet substrate 3710) and subsequently inducing partial polymerization of the polymerizable material, the patterned moldable material layer 3720 may be cured for further polymerization after patterning and prior to depositing a layer stack, or after depositing the layer stack.

In case the moldable material layer 3720 after imprinting includes a gel, further polycondensation process may be performed to enhance mechanical properties and structural stability by application of heat to induce sintering, densification and/or grain growth. Optionally, a drying process may be employed to remove any residual liquid (solvent) in the moldable material layer 3720.

The moldable material layer 3720 after densification or rigidification functions an optically transparent template on which material layers for forming a photovoltaic structure may be sequentially deposited.

Referring to FIG. 37B, an outer conductive layer 103 may be deposited on the contiguous top surface of the moldable material layer 3720, which includes a planar top surface and surfaces of the trenches 1103. The outer conductive layer 103 may be the same as described above. In an embodiment, the outer conductive layer 103 may be a transparent conductive material layer, and may contain, for example, a transparent conductive oxide such as indium tin oxide (ITO), fluorine doped tin oxide (FTO), and doped zinc oxide.

The outer conductive layer 103 may be deposited, for example, by sputtering (physical vapor deposition), metal organic chemical vapor deposition (MOCVD), metal organic molecular beam deposition (MOMBD), spray pyrolysis, or pulsed laser deposition (PLD). The thickness of the outer conductive layer 103, as measured on the sidewalls of the trenches 1103, may be in a range from 200 nm to 6 microns, although lesser and greater thicknesses may also be employed. In an embodiment, the thickness of the outer conductive layer 103 may be in a range from 400 nm to 3 microns. In another embodiment, the thickness of the outer conductive layer 103 may be in a range from 600 nm to 1.5 microns. In another embodiment, the thickness of the outer conductive layer 103 may be in a range from 700 nm to 1 micron. A cavity 1103' may be present within each trench 1103 because the trenches 1103 are not completely filled by the outer conductive layer 103.

Subsequently, the outer conductive layer 103 may be patterned, for example, by laser ablation. The pattern of the outer conductive layer 103 may be selected to facilitate electrical wiring of photovoltaic devices to be formed on the transparent sheet substrate 3710. For example, the outer conductive layer 103 may be patterned into a plurality of electrically isolated portions, each of which functions as an electrode of a photovoltaic device that may be connected in a series connection and/or in a parallel connection.

Figure 37C:
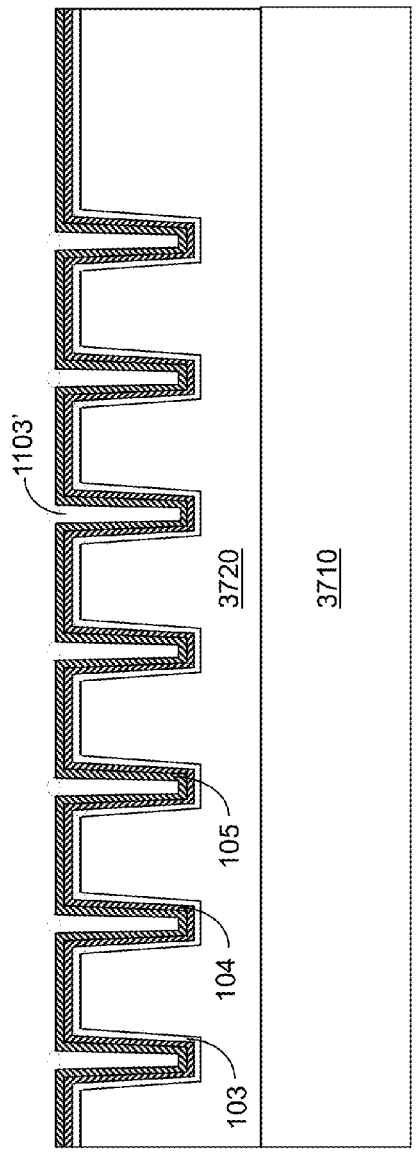

Referring to FIG. 37C, a photovoltaic material layer (104, 105) may be formed on the surfaces of the outer conductive layer 103. The surfaces of the outer conductive layer 103 on which the photovoltaic material layer (104, 105) may be deposited include a planar top surface of the outer conductive layer 103 located above the moldable material layer 3720, and inner sidewalls of the outer conductive layer 103 located inside the trenches 1103.

The photovoltaic material layer (104, 105) may include a second absorber sublayer 104 and a first absorber sublayer 105 as described above. The photovoltaic material layer (104, 105) may include a p-n junction or a p-i-n junction or a plurality of p-n junctions or p-i-n junctions provided that the photovoltaic material layer (104, 105) is a material stack that generates and separates photogenerated electron-hole pairs in opposite directions, i.e., one of the electron and the hole toward the outer conductive layer 103 and the other of the electron and the hole away from the outer conductive layer 103. The thickness of the photovoltaic material layer (104, 105) may be in a range from 200 nm to 6 microns, although lesser and greater thicknesses may also be employed. In an embodiment, the thickness of the photovoltaic material layer (104, 105) may be in a range from 400 nm to 3 microns. In another embodiment, the thickness of the photovoltaic material layer (104, 105) may be in a range from 600 nm to 1.5 microns. In yet another embodiment, the thickness of the photovoltaic material layer (104, 105) may be in a range from 700 nm to 1 micron. The photovoltaic material layer (104, 105) may be formed by low pressure chemical vapor deposition (LPCVD), physical vapor deposition (PVD), atomic layer deposition (ALD), or a combination thereof.

Subsequently, the photovoltaic material layer (104, 105) may be patterned, for example, by laser ablation. The pattern of the photovoltaic material layer (104, 105) may be selected to facilitate electrical wiring of photovoltaic devices to be formed on the transparent sheet substrate 3710. For example, the photovoltaic material layer (104, 105) may be patterned into a plurality of electrically isolated portions. In an embodiment, a portion of the photovoltaic material layer (104, 105) may be removed in a boundary region between a photovoltaic region containing the photovoltaic bristles to be formed and a conducting trace region in which a current conducting trace for a portion of the outer conductor layer 103 is to be formed.

Figure 37D:
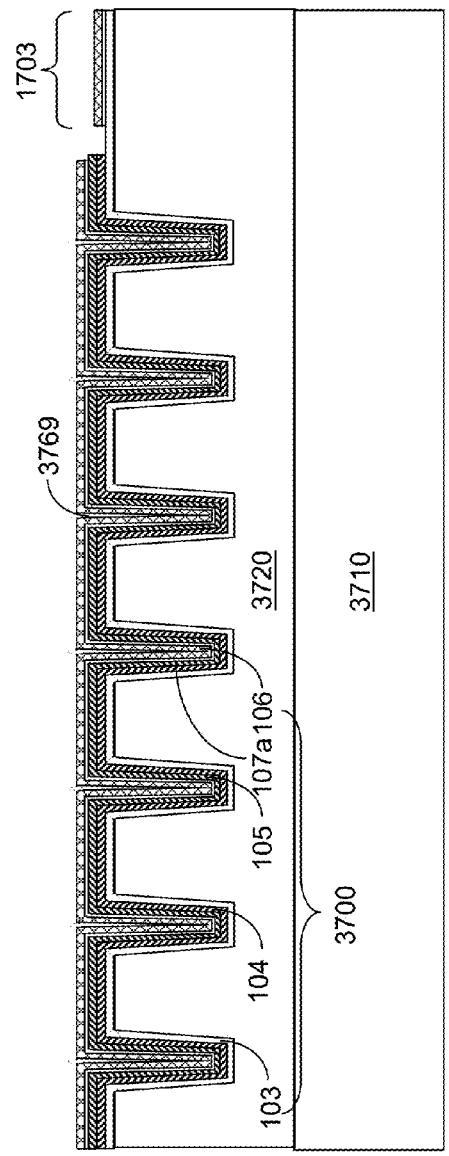

Referring to FIG. 37D, an optional transparent inner conductive layer 107a may be deposited by a conformal deposition method such as chemical vapor deposition, or atomic layer deposition. Alternatively, the optional transparent inner conductive layer 107a may be deposited by a non-conformal deposition method such as physical vapor deposition. The optional transparent inner conductive layer 107a may include a transparent conductive oxide material. In an embodiment, the transparent inner conductive layer 107a includes aluminum doped zinc oxide (Al:ZnO). The thickness of the optional transparent inner conductive layer 107a, if present, may be in a range from 50 nm to 200 nm, although lesser and greater thicknesses may also be employed.

A conductive core layer 106 may be formed by deposition of a conductive material on the transparent inner conductive layer 107a (if the transparent inner conductive layer 107a is present) or on the photovoltaic material layer (104, 105) (if the transparent inner conductive layer 107a is omitted). The conductive core layer 106 may include the same material as the conductive cores 106 described above. The conductive core layer 106 may be a contiguous layer of a conductive material, and may be a metallic conductive layer, i.e., a conductive layer composed of a metallic material. In an embodiment, the conductive core layer 106 may include aluminum, copper, silver, gold, tungsten, nickel, cobalt, and/or any other conductive elemental metal. Further, the conductive core layer 106 may include an alloy of at least two elemental metals and/or a stack of at least two metallic layers each including an elemental metal or an alloy of at least two elemental metals. In an embodiment, the conductive core layer 106 may include a stack of a silver layer that contacts the transparent inner conductive layer 107a or the photovoltaic material layer (104, 105), and an aluminum layer. The thickness of the conductive core layer 106, as measured on the sidewalls of the transparent inner conductive layer 107a or the photovoltaic material layer (104, 105) may be in a range from 300 nm to 6 microns. In an embodiment, the thickness of the conductive core layer 106 may be in a range from 500 nm to 3 microns. In another embodiment, the thickness of the conductive core layer 106 may be in a range from 750 nm to 1.5 microns. The conductive core layer 106 includes a core portion of each photovoltaic bristle formed in a respective trench 1103. The core portions of the photovoltaic bristles are electrically shorted together because the conductive core layer 106 is a contiguous material layer.

The conductive core layer 106 may include the same material as the cores 106 described above. The conductive core layer 106 (and the cores 106 described above) may include a reflective metallic material, or a transparent material. The thickness of the conductive core layer 106 may be in a range from 30 nm to 2,000 nm, although lesser and greater thicknesses may also be employed.

In an embodiment, the conductive core layer 106 may include a metallic material such as an elemental metal (e.g., aluminum, tungsten, copper, silver, gold, platinum, nickel, cobalt, chromium, titanium, tantalum, rhodium, iridium, zinc, and vanadium), an intermetallic alloy of at least two elemental metals (e.g., the elemental metals listed above), a conductive metallic nitride (e.g., TiN, TaN, WN), a metal-semiconductor alloy (e.g., a metal silicide, and a metal germanosilicide), and/or a combination or a stack thereof. In an embodiment, the conductive core layer 106 may include an optional diffusion barrier metallic liner such as a conductive metallic nitride and a high conductivity material such as an elemental metal. In an embodiment, the high conductivity material may be aluminum or copper.

In an embodiment, the conductive core layer 106 may employ a transparent conductive material that allows transmission of ambient light from the backside of a photovoltaic device to the photovoltaic material layer (104, 105). The backside of the photovoltaic device corresponds to the upside of the exemplary in-process photovoltaic structure of FIG. 37D. While the backside efficiency of the photovoltaic structure may be lower than the efficiency of the proper side (front side) of the photovoltaic structure due to higher intensity of radiation available from the front side, an additional gain in efficiency may be realized through the use of a transparent conductive material. Exemplary transparent conductive materials that may be employed for the conductive core layer 106 include, but are not limited to, boron doped zinc oxide and aluminum doped zinc oxide. In this case, the thickness of the transparent conductive core layer 106 may be in a range from 200 nm to 1,200 nm to provide a highly conductive path to the tip of each photovoltaic brush while allowing light to pass through the transparent conductive core layer 106.

The conductive core layer 106 may be formed by sputtering (physical vapor deposition), chemical vapor deposition, or atomic layer deposition. The thickness of the conductive core layer 106 may be selected such that the trenches 1103 are completely filled, or may be selected such that a via cavity 3769 is present within, or over, each trench 1103. As used herein, a via cavity 3769 refers to an unfilled volume (i.e., a volume that is not occupied by any liquid or solid) that extends most along a vertical direction. In other words, the maximum dimension of a via cavity may occur along the vertical direction. In an embodiment, the maximum vertical dimension of each via cavity 3769 may be greater than the maximum lateral dimension of the via cavity 3769. The via cavity 3769 may be formed through many mechanisms.

In an embodiment, the via cavities 3769 may be formed when the amount of the deposited material in the conductive core layer 106 is insufficient to fill the trenches 1103. In this case, the cavities 1103' within the trenches 1103 do not disappear even after the conductive core layer 106 is formed, and each remaining cavity 1103' constitutes a via cavity 3769. Such via cavities may also be present in the exemplary structures of FIGS. 13I-13L and 15G-15J. The top surface of the conductive core layer 106 includes a planar surface located within a horizontal plane (i.e., a Euclidean plane that is parallel to the top surface of the sheet substrate 3710) and inner sidewalls of the conductive core layer 106 that extend into the trenches 1103 and define the lateral boundaries of the via cavities 3769.

Subsequently, the conductive core layer 106 and the optional transparent inner conductive layer 107a may be patterned, for example, by laser ablation. The pattern of remaining stacks of the conductive core layer 106 and the optional transparent inner conductive layer 107a may be selected to facilitate electrical wiring of photovoltaic devices to be formed on the transparent sheet substrate 3710. For example, the conductive core layer 106 and the optional transparent inner conductive layer 107a may be patterned into a plurality of electrically isolated portions. In an embodiment, a portion of the conductive core layer 106 and the optional transparent inner conductive layer 107a may be removed in a boundary region between a photovoltaic region containing photovoltaic bristles and a conducting trace region in which a current conducting trace 1703 for the outer conductor layer 103 is formed.

Figure 37E:
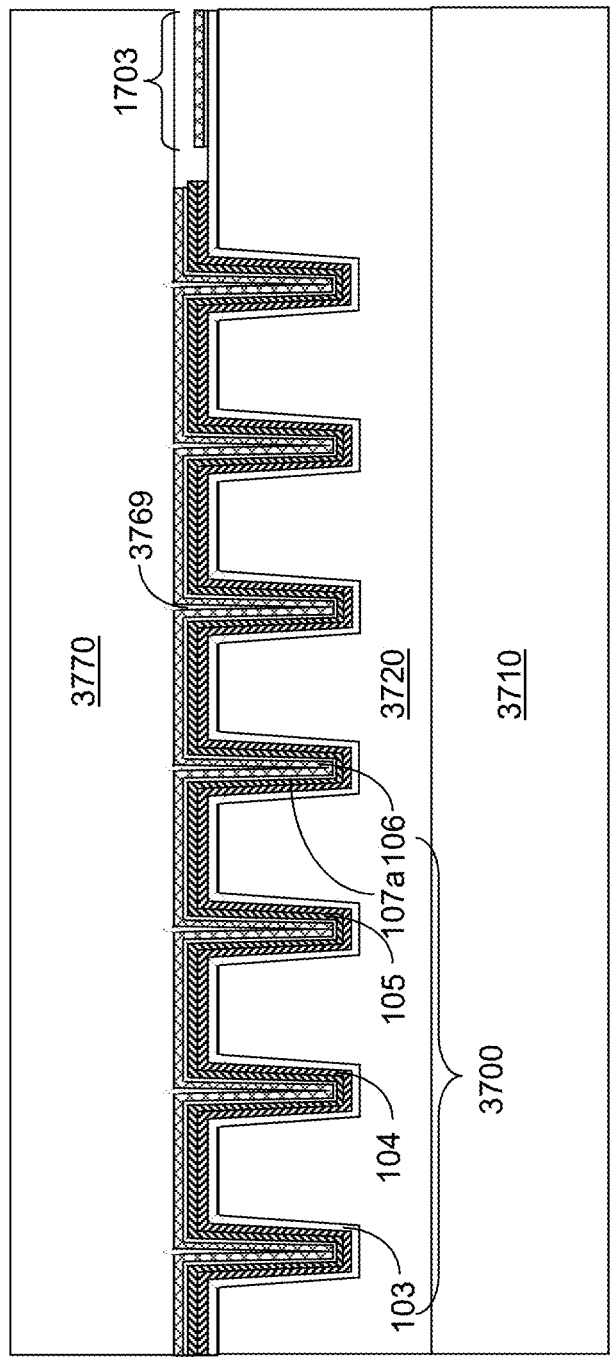

Referring to FIG. 37E, a passivation substrate 3770 may be disposed on the conductive core layer 106. In an embodiment, the bottom surface of the passivation substrate 3770 may contact the horizontal portion of the top surface of the conductive core layer 106. As used herein, a passivation substrate refers to a substrate that passivates a structure that it contacts, e.g., by protecting the structure from exposure to air or ambient conditions. In an embodiment, the passivation substrate 3770 may include glass, sapphire, plastics, or other inert materials that do not interact with the material of the conductive core layer 106. In an embodiment, the passivation substrate 3770 may have a thickness in a range from 100 microns to 1 cm, although lesser and greater thicknesses may also be employed. In an embodiment, the plurality of via cavities 3769 may be filled with a gas, or may be in vacuum upon disposition of the passivation substrate 3770.

The outer conductive layer 103, the photovoltaic layer (104, 105), the optional transparent inner conductive layer 107a, and the conductive core layer 106 collectively constitutes a photovoltaic layer stack 3700. The first exemplary photovoltaic structure may be flipped upside down such that a source of radiation (e.g., the sun) may be located within the upper hemisphere, which is defined as the space located above the horizontal interface between the passivation substrate 3770 and the photovoltaic layer stack 3700 after flipping of the first exemplary photovoltaic structure.

Figure 37F:
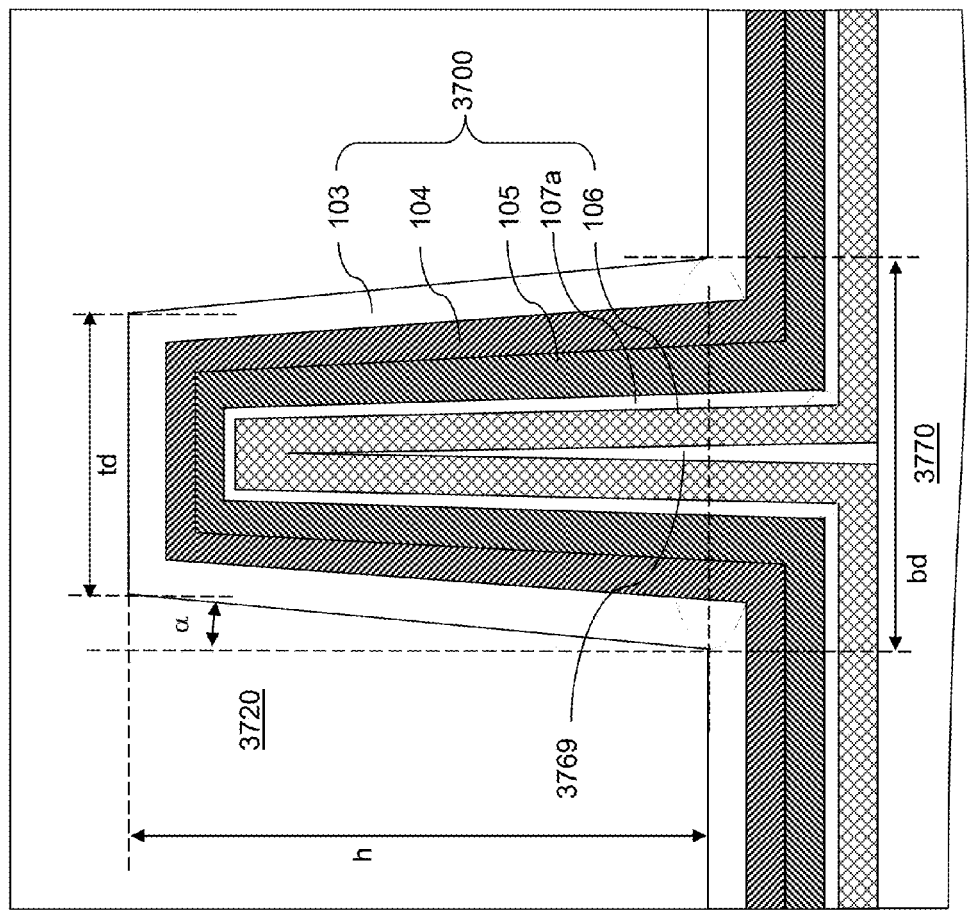
FIG. 37F is a magnified vertical cross-sectional view of the first exemplary photovoltaic structure of FIG. 37E.

Referring to FIG. 37F, a magnified vertical cross-sectional view of a portion of the first exemplary photovoltaic structure of FIG. 37E after flipping upside down is shown. A via cavity 3769 may be laterally bounded by a non-planar bottom surface of the conductive core layer 106, and may be vertically bounded by a top surface of the passivation substrate 3770, which is located within the same horizontal plane as the interface between the conductive core layer 106 and the passivation substrate 3770.

Figure 37G:
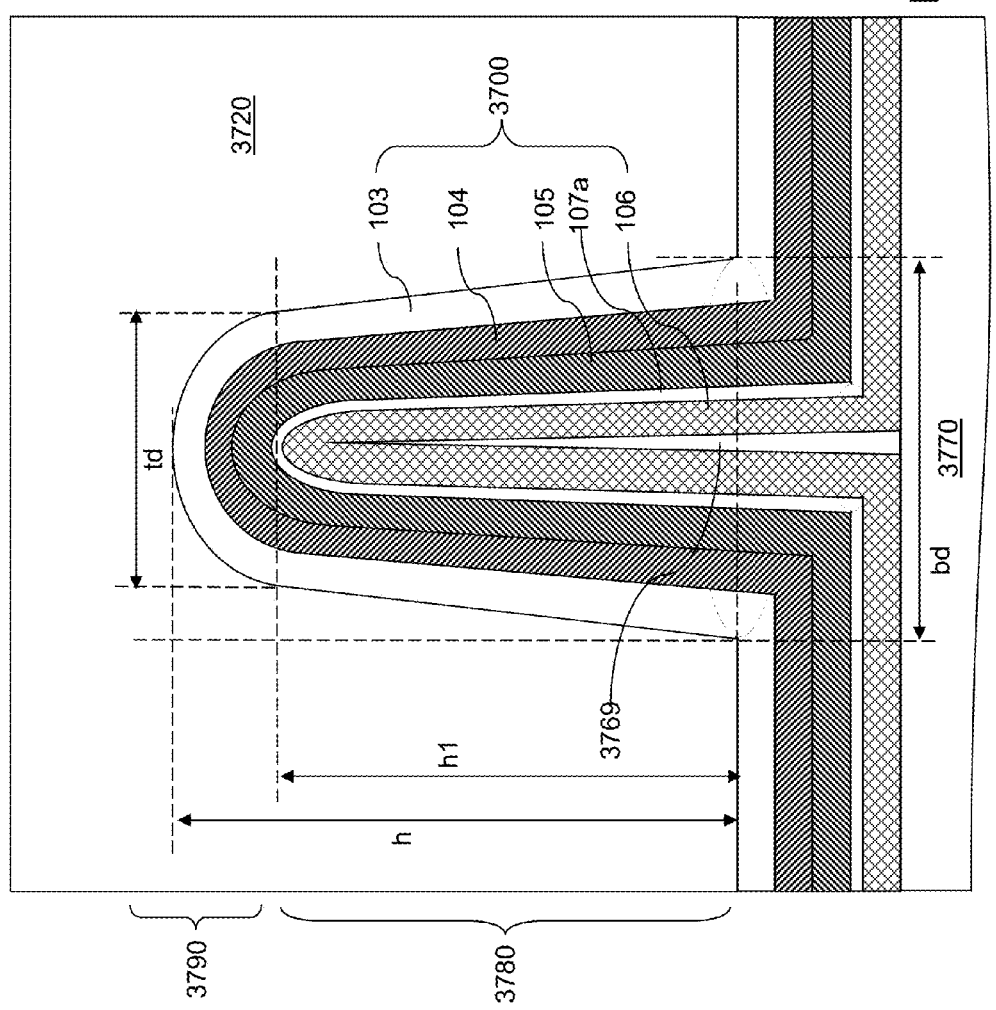
FIG. 37G is a magnified vertical cross-sectional view of another embodiment of the first exemplary photovoltaic structure.

Referring to FIG. 37G, a magnified vertical cross-sectional view of a portion of another embodiment of the first exemplary photovoltaic structure is shown. The bottommost portion of each trench 1103 as formed at the processing step of FIG. 37A, i.e., the topmost portion of each bristle as formed at the processing steps of FIG. 37E, may have a rounded tip. In this case, each bristle may include a frustum portion 3780 and a hemi-spheroid portion 3790. The hemi-spheroid portion 3790 may have a shape that is approximately a hemi-spheroid, i.e., about one half of a spheroid. The ratio of the frustum height h1 to the height h of the bristle (3789, 3790) may be in a range from 0.7 to 0.95, although lesser and greater ratios may also be employed. In an embodiment, the ratio of the frustum height h1 to the height h of the bristle (3789, 3790) may be in a range from 0.76 to 0.90. In another embodiment, the ratio of the frustum height h1 to the height h of the bristle (3789, 3790) may be in a range from 0.80 to 0.87.

Figure 37H:
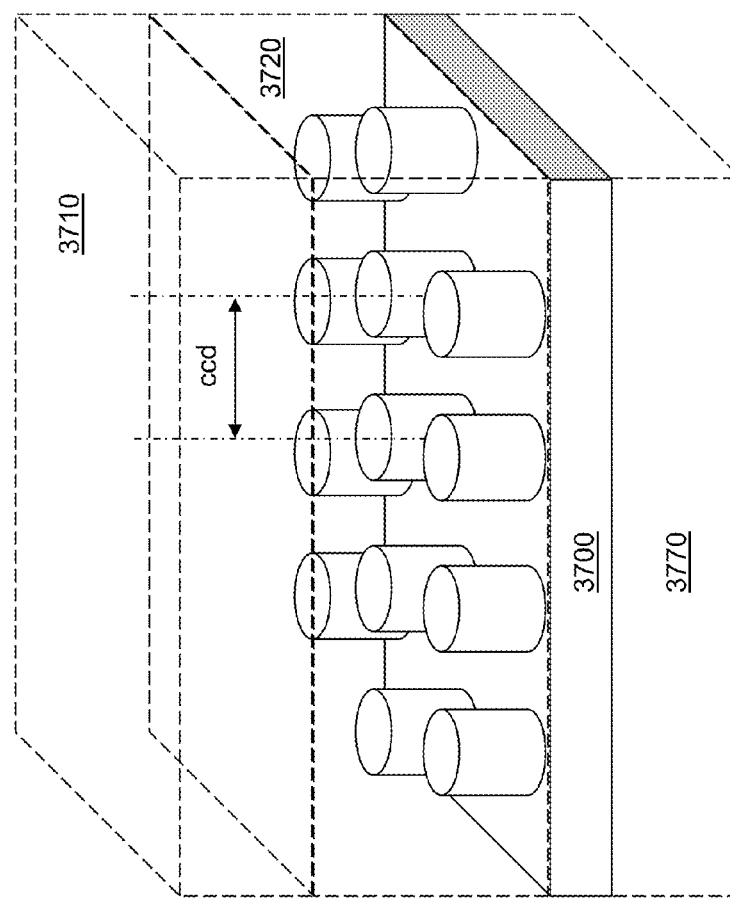
FIG. 37H is a perspective view of the first exemplary photovoltaic structure of FIG. 37E.

Referring to FIG. 37H, a perspective view of the first exemplary photovoltaic structure of FIG. 37E is illustrated, in which the transparent sheet substrate 3710, the moldable material layer 3720 (which is an optically transparent layer), and the passivation substrate 3770 are illustrated with dotted lines to clearly illustrate the shapes of the photovoltaic bristles embedded within the photovoltaic layer stack 3700. While cylindrical shapes are illustrated for the photovoltaic bristles, frustum shapes may also be employed for the photovoltaic bristles.

As discussed above, the bristles may be arranged in a two-dimensional hexagonal array. A center-to-center dimension ccd may be in a range from 0.5 micron to 25 microns. The center-to-center dimension ccd refers to the lateral distance between the a vertical axis passing through a geometrical center of a bristle (i.e., the geometrical center of the volume of the bristle) and a vertical axis passing through a geometrical center of a nearest neighbor bristle. If the bristles have a cylindrical symmetry, the center-to-center dimension ccd may be the lateral distance between a vertical symmetry axis of a bristle and a vertical symmetry axis of a nearest neighbor bristle. In an embodiment, the ratio between the base lateral dimension bd to the center-to-center dimension ccd may be in a range from 0.75 to 0.99. In another embodiment, the ratio between the base lateral dimension bd to the center-to-center dimension ccd may be in a range from 0.85 to 0.97. In yet another embodiment, the ratio between the base lateral dimension bd to the center-to-center dimension ccd may be in a range from 0.92 to 0.96. In an embodiment, the center-to-center dimension ccd may be in a range from 1.1 micron to 12 microns. In another embodiment, the center-to-center dimension ccd may be in a range from 2.2 microns to 10 microns. In yet another embodiment, the center-to-center dimension ccd may be in a range from 4.4 microns to 8.8 microns. In still another embodiment, the center-to-center dimension ccd may be in a range from 5.5 microns to 7.7 microns.

Figure 37I:
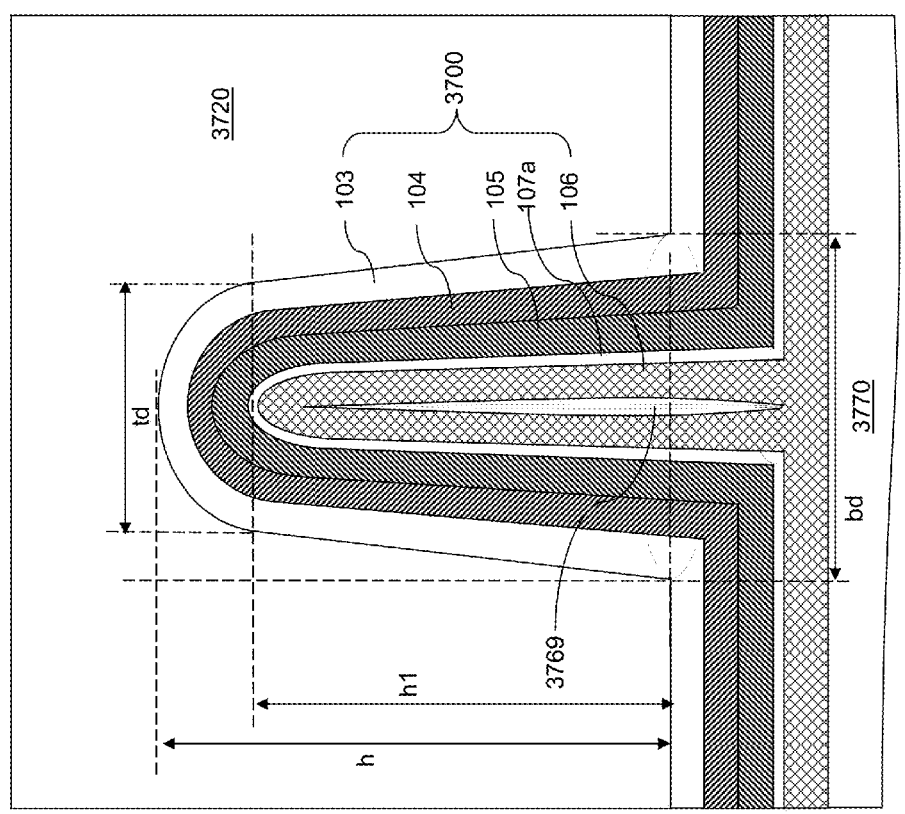
FIG. 37I is a magnified vertical cross-sectional view of yet another embodiment of the first exemplary photovoltaic structure.

Referring to FIG. 37I, an alternative embodiment of the first exemplary photovoltaic structure of FIG. 37E is illustrated. One mechanism that forms the via cavity 3769 is when the deposition method that deposits the conductive core layer 106 is not sufficiently conformal, thereby depositing more material on the horizontal surfaces of the photovoltaic material layer (104, 105) at the processing step of FIG. 37D than on the non-horizontal sidewalls of the photovoltaic material layer (104, 105) within the trenches 1103. In this case, each via cavity 3769 may be defined by a contiguous surface of the conductive core layer 106 that does not touch (i.e., is spatially spaced from) the interface between the conductive core layer 106 and the photovoltaic material layer (104, 105) and does not touch the interface between the conductive core layer 106 and the passivation substrate 3720.

Referring to FIG. 37J, an alternate embodiment of the first exemplary photovoltaic structure of FIG. 37E is illustrated. The process that forms the conductive core layer 106 may be a conformal deposition process and the thickness of the deposited material may be sufficient to completely fill each trench 1103. In this case, a dimple may be formed directly over each trench 1103 by the top surface of the conductive core layer 106 at the processing step of FIG. 37D. In this case, each via cavity 3769 may be defined by a non-planar portion of the top surface of the conductive core layer 106 at the processing step of FIG. 37D (or the bottom surface of the conductive core layer 106 as shown in FIG. 37J) and a portion of the horizontal surface of the passivation substrate 3770 that contacts the conductive core layer 106. A seam 3779 may be present through the center of each trench 1103. In an embodiment, each seam 3779 of the core conductive material layer 106 may extend vertically from an apex of each of the plurality of via cavities 3769.

Figure 37K:
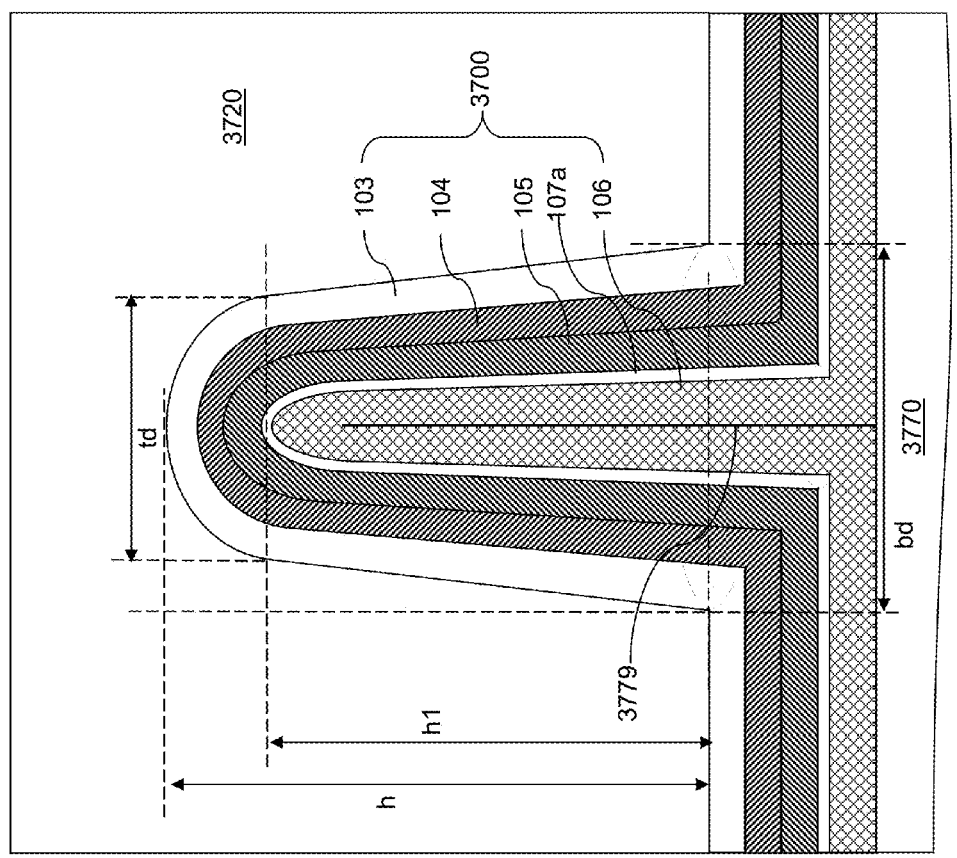
FIG. 37K is a magnified vertical cross-sectional view of another embodiment of the first exemplary photovoltaic structure.

Referring to FIG. 37K, a magnified vertical cross-sectional view of another embodiment of the first exemplary photovoltaic structure is illustrated. In this embodiment, a via cavity 3769 may not be formed within a photovoltaic bristle, and a seam 3779 extending along a one-dimensional line (in case the photovoltaic bristle has a cylindrical symmetry) or along a vertical plane (in case the photovoltaic bristle has a non-circular elliptical horizontal cross-sectional shape) may be present within each photovoltaic bristle.

Figure 37L:
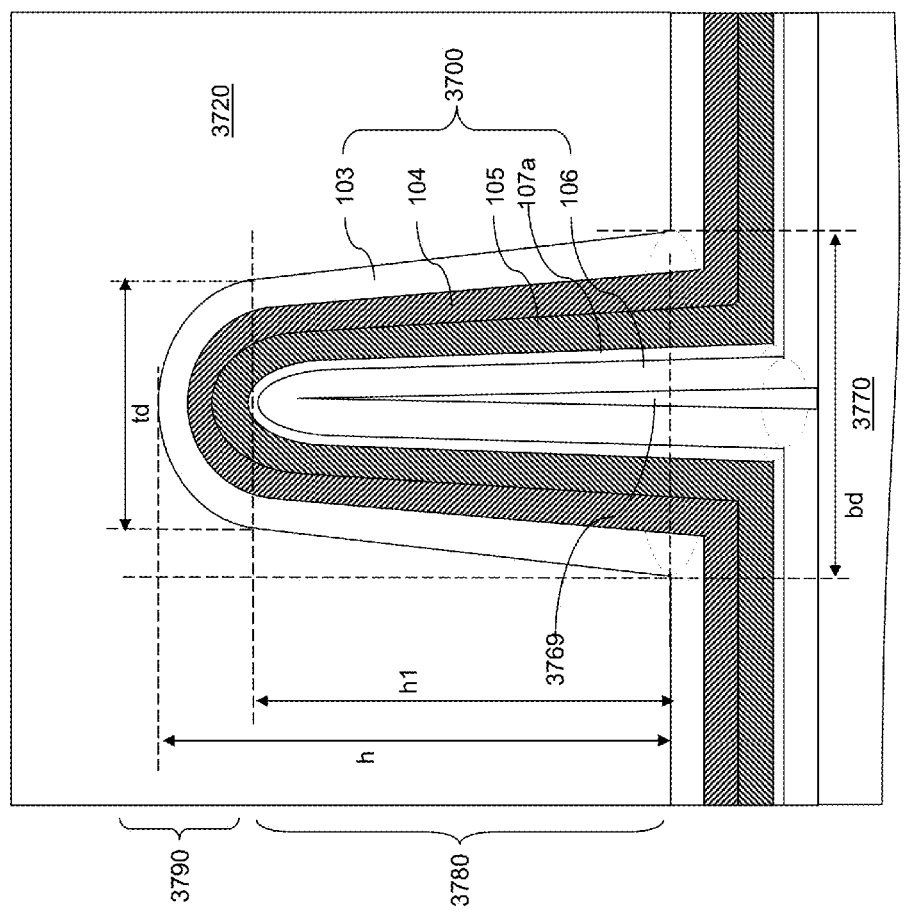
FIG. 37L is a magnified vertical cross-sectional view of another embodiment of the first exemplary photovoltaic structure.

Referring to FIG. 37L, a magnified vertical cross-sectional view of further another embodiment of the first exemplary photovoltaic structure is illustrated. In this embodiment, the conductive core layer 106 may include a transparent conductive material such as a transparent conductive oxide (TCO). In an embodiment, an optional inner transparent conductive layer 107a may also be deposited in the structure before the conductive core layer 106, such as by sputtering or chemical vapor deposition. The transparent conductive material of the conductive core layer 106 may be deposited, for example, by sputtering or chemical vapor deposition. A via cavity 3769 that is entirely laterally surrounded by a surface of the conductive core layer 106, including the transparent conductive material may be present within each photovoltaic bristle. In this case, backside illumination, which refers to radiation entering through the passivation substrate 3770, may contribute to additional photogeneration of electricity from each photovoltaic bristle. The passivation substrate 3770 may include a transparent material such as glass or sapphire.

Figure 37M:
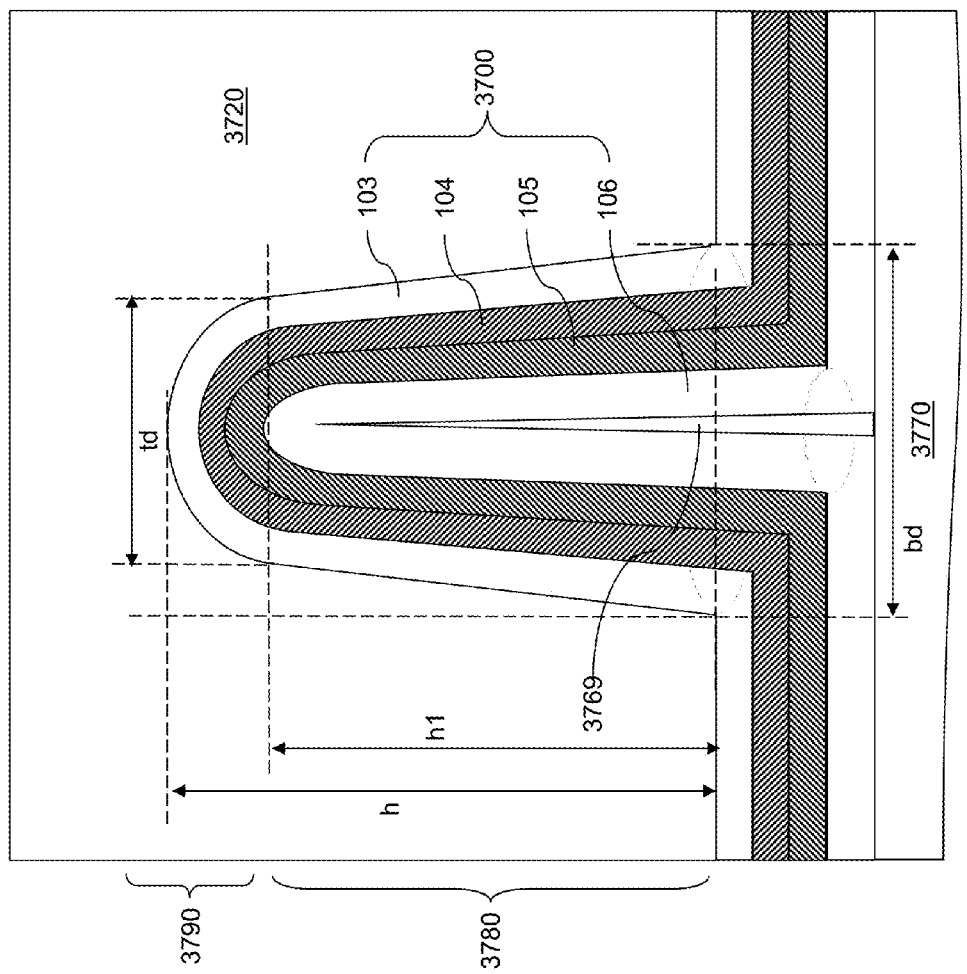
FIG. 37M is a magnified vertical cross-sectional view of another embodiment of the first exemplary photovoltaic structure.

Referring to FIG. 37M, a magnified vertical cross-sectional view of another embodiment of the first exemplary photovoltaic structure is illustrated. The optional inner transparent conductive layer 107a in the structure illustrated in FIG. 36L may be omitted to form the structure illustrated in FIG. 37M.

Figure 37N:
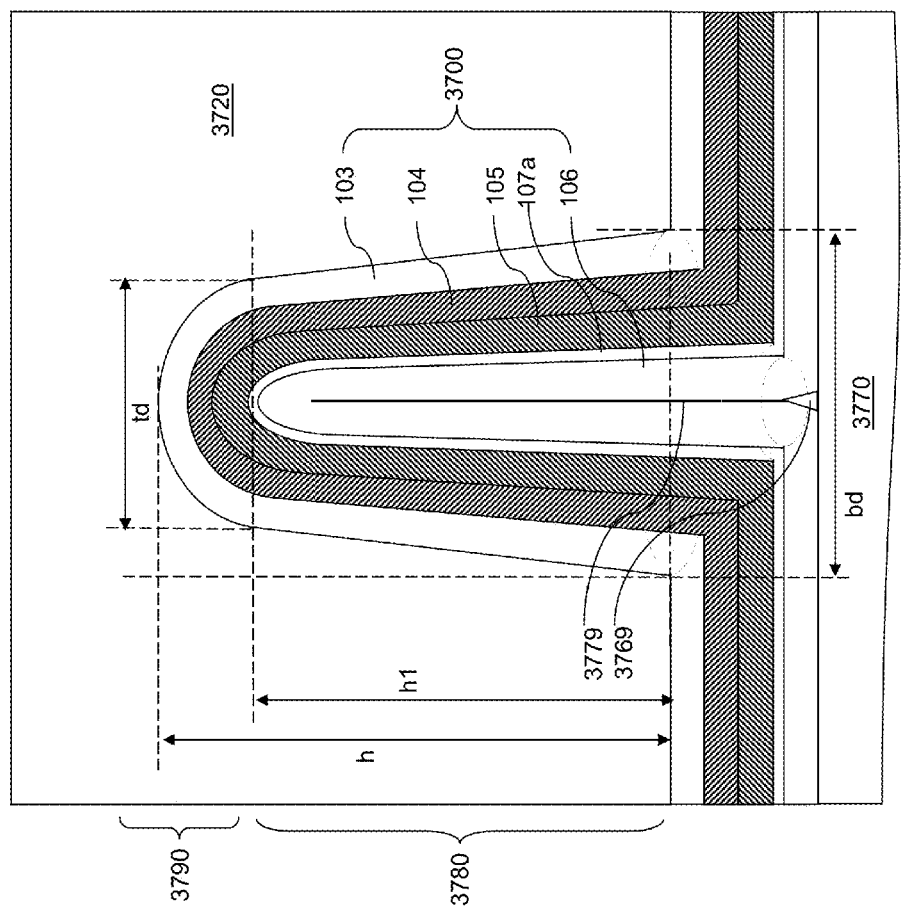
FIG. 37N is a magnified vertical cross-sectional view of another embodiment of the first exemplary photovoltaic structure.

Referring to FIG. 37N, a magnified vertical cross-sectional view of another embodiment of the first exemplary photovoltaic structure is illustrated. If the conformity of the deposition process employed to deposit the conductive core layer 106 is high enough, a seam 3779 may be formed within each photovoltaic bristle, and a via cavity 3769 may be formed below the horizontal plane including the bottommost surface of the photovoltaic material layer (104, 105).

Referring to FIG. 38A, a second exemplary in-process photovoltaic structure is illustrated, which may include a moldable material layer 3820 that is provided as a substrate and includes an imprint pattern. The imprint pattern may be the same as the imprint pattern of the first exemplary in-process photovoltaic structure of FIG. 37A. The moldable material of the moldable material layer 3820 may be an optically transparent material that is transparent within a visible wavelength range. The moldable material layer 3820 may be provided in a form having a sufficient mechanical strength to be handled manually or with mechanical devices. The moldable material layer 3820 may be a moldable substrate including a moldable material and having a thickness t in a range from 5 microns to 5 mm, although lesser and greater thicknesses may also be employed. As such, the moldable material layer 3820 may be the final substrate 3609d as provided by the processing steps of FIG. 36A. Alternatively, the moldable material layer 3820 may be provided on a substrate of another material.

In an embodiment, the moldable material layer 3820 may include a moldable substrate that includes a glass transition material. As used herein, a "glass transition material" is a material that displays the behavior of glass transition. A "glass transition" refers to a transition from a liquid to a solid-like state that occurs during cooling or compression in which viscosity increases by at least one order of magnitude. Thermal expansion coefficient, heat capacity, shear modulus, and many other properties of inorganic glasses show a relatively sudden change at the glass transition temperature. Any such step or kink may be used to define the glass transition temperature. Glass transition materials include, among others, plastics, resins, and glass materials based on silica.

Silica and many other polymer materials exhibit glass transition. In an embodiment, the glass transition material may be selected from terephthalate (PET), polypropylene (PP), polyethylene (PE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), polycarbonate (PC), polymethylmethacrylate (PMMA), polymethacrylate (PMA), cyclic polyolefin, methylmethylacrylic acid, hydroxyethylmethylmethacrylate, fluorofunctinoalized methylmethacrylate, silicone-functionalized methylmethacrylate, soda-lime-silica glass, borophosphosilicate glass, and phosphosilicate glass.

In an embodiment, the glass transition material of the moldable material layer 3820 may be a plastic material prepared from semicrystalline or amorphous polymer resins such as polyethylene terephthalate (PET), polypropylene (PP), high density polyethylene (HDPE), low density polyethylene (LDPE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), similar fluoro-based and non-fluoro-based polymers blended together or copolymerized in one or more mixtures, polycarbonate (PC), polymethylmethacrylate (PMMA), polymethacrylate (PMA), cyclic polyolefin (branded under the trade name Topas™), and similar polymers blended together or copolymerized in one or more mixtures.

In an embodiment, the glass transition material of the moldable material layer 3820 may be any of the resin material that may be employed for the moldable material layer 3720 as described above.

In an embodiment, the glass transition material of the moldable material layer 3820 may be a glass-based on silica (SiO$_2$) blended with other non-silicate glasses or elements. Examples of silica-based glasses include, but are not limited, to soda-lime glass, borosilicate glass, and borophosphate-silicate glass or similar materials. In an embodiment, the glass transition material may be soda-lime glass.

Figure 39:
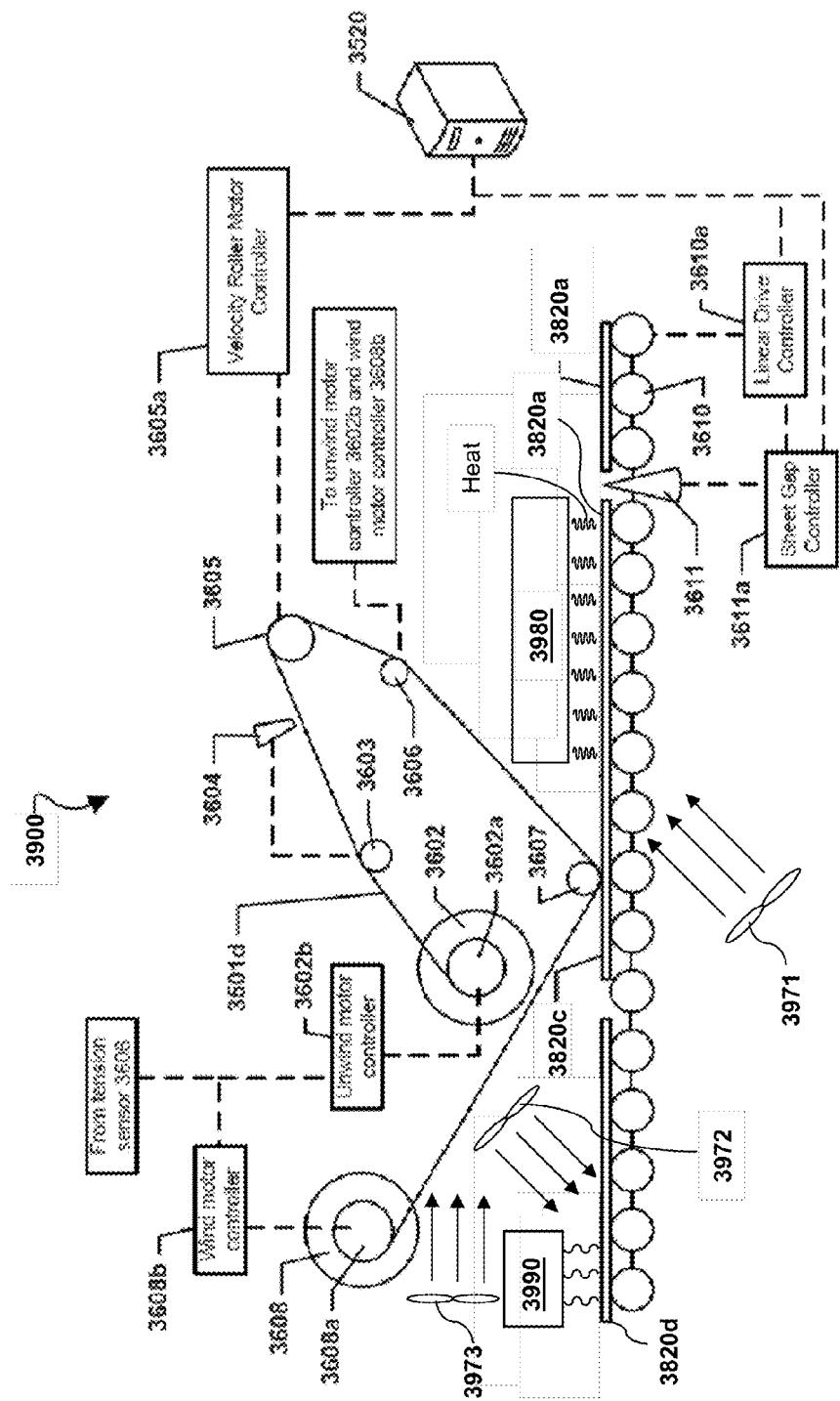
FIG. 39 is a system diagram illustrating an embodiment web-to-plate system.

A web-to-plate system 3500 of FIG. 35A may be adapted to process an unpatterned moldable material layer 3820 to provide an imprinted pattern. Referring to FIG. 39, a web-to-plate system 3900 is illustrated, which is a modification of the web-to-plate system 3500 of FIG. 35A to provide additional processing capabilities if the moldable material layer 3820 is provided as a moldable substrate including a glass transition material, or as a moldable material layer of a glass transition material provided on another substrate.

If the moldable material layer 3820 is provided as a moldable substrate or on another substrate, a moldable material applicator 3612 illustrated in FIG. 35A is not necessary. Instead of a moldable material applicator 3612, a pre-treatment device 3980 that may provide a suitable level of viscosity to the moldable material layer 3820 may be provided in the path of transit for a pre-imprint substrate 3820a (which is a moldable material layer 3820 or a combination of a moldable material layer 3820 and a substrate) prior to imprinting. In an embodiment, the pre-treatment device 3980 may be a temperature control device such as a heater or a refrigerator. Depending on the viscosity of the moldable material layer 3820 in the pre-imprint substrate 3820a, the pre-treatment device 3980 may harden (increase the viscosity of) or soften (decrease the viscosity of) the moldable material of the moldable material layer 380.

In an embodiment, the pre-treatment device 3980 may be a heater configured to heat the top side of the pre-imprint substrate 3820a (which may be a moldable substrate) during transportation to the imprint location. The amount of the heat transferred from the pre-treatment device 3980 to the pre-implant substrate 3820a may be controlled such that the top surface of the pre-implant substrate 3820 has a suitable level of viscosity. The temperature of the top surface of the pre-implant substrate 3820 at the time of imprinting may be at, above, or below the glass transition temperature of the glass transition material of the moldable material layer 3820 as provided within the pre-implant substrate 3820a.

In an embodiment, the temperature of the linear drive mechanism 3610 (such as rollers) may be controlled to provide a lower temperature to the backside of the pre-imprint substrate 3810a to prevent a lower level of viscosity than the front side of the pre-imprint substrate 3820, and thus, prevent sticking of the pre-imprint substrate 3820a to the linear drive mechanism 3610. The backside of the pre-imprint substrate 3820a may be cooled during transportation to the imprint location (the location of the transfer gap roller 3607). In an illustrative example, the cooling of the linear drive mechanism 3610 may be effected by air cooling effected, for example, by a first fan 3971, or may be effected by a refrigeration system or a cooling system that cools the linear drive mechanism 3610 in any other manner.

The imprinted substrate 3820c may be temperature cooled to prevent loss of the imprinted pattern due to excessive viscous flow of the moldable material layer 3820 within the imprinted substrate 3820c. For example, a second fan 3972 may be employed to circulate air over the imprinted substrate 3820c and to provide cooling of the imprinted substrate 3820c in case cooling of the imprinted substrate 3820c is desired to reduce the viscosity. In an embodiment, a refrigerated air may be circulated by the second fan 3972. In this case, the imprinted substrate 3820c may be placed in a mini-environment to reduce the cost of cooling a large space.

In case the top surface of the pre-imprint substrate 3810a is heated prior to imprinting, the die as incorporated into the web (such as a daughter die web 3501d) may be cooled after imprinting, i.e., after transfer of the pattern of the die into the moldable material layer 3820, to minimize damage to the web. Optionally, a third fan 3973 may be employed to cool the web before the web is wound into a roll.

The imprinted substrate 3820c may be further subjected to an optional densification or rigidification process. For example, a densification device 3990 may be employed to increase the viscosity of the moldable material layer 3820 in the imprinted substrate 3820c to provide a final substrate 3820d, which may be employed to perform the processing step of FIG. 38B thereupon. The densification device 3990 may use any suitable mechanism that increases the viscosity and/or rigidity of the moldable material layer 3820, for example, by providing heat, cold, moisture, agitation, application of a catalyst, irradiation by visible light, ultraviolet light, or infrared light, ventilation, or a combination thereof.

Referring to FIG. 38B, an outer conductive layer 103 may be formed on the moldable material layer 3820 (as provided within a finished substrate 3820d) by performing the processing steps of FIG. 37B.

Figure 38C:
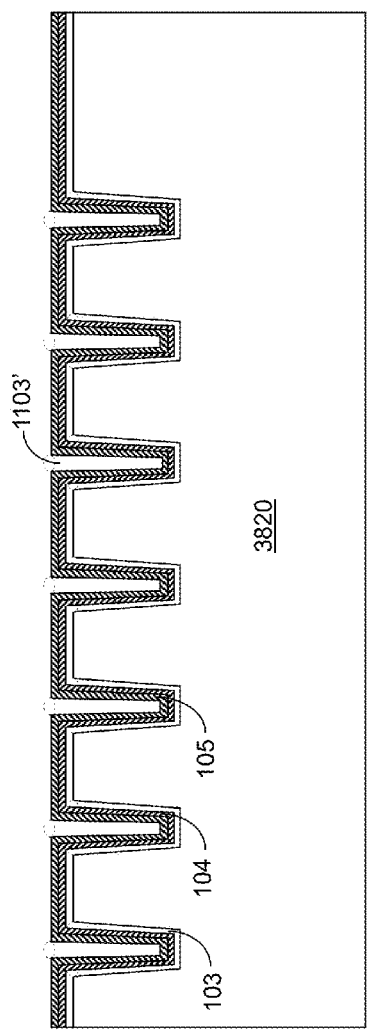

Referring to FIG. 38C, a photovoltaic material layer (104, 105) may be formed on the upper surface of the outer conductive layer 103 by performing the processing steps of FIG. 37C.

Figure 38D:
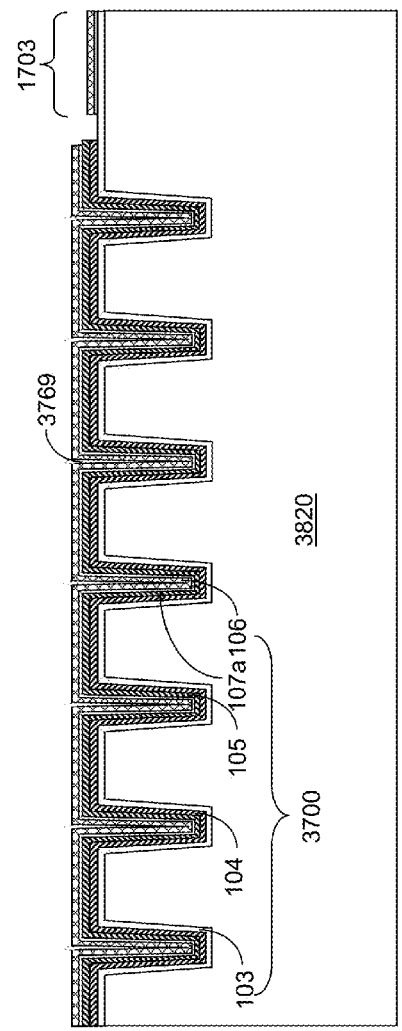

Referring to FIG. 38D, an optional transparent inner conductive layer 107a and a conductive core layer 106 may be on the upper surface of the photovoltaic material layer (104, 105) by performing the processing steps of FIG. 37D. Via cavities 3769 and/or seams 3779 may be formed in the same manner as illustrated in FIGS. 37F, 37G, 37I, and 37J. The plurality of via cavities 3769 may be filled with a gas, or may be in vacuum depending on the ambient conditions at the time of disposing the passivation substrate 3770.

Figure 38E:
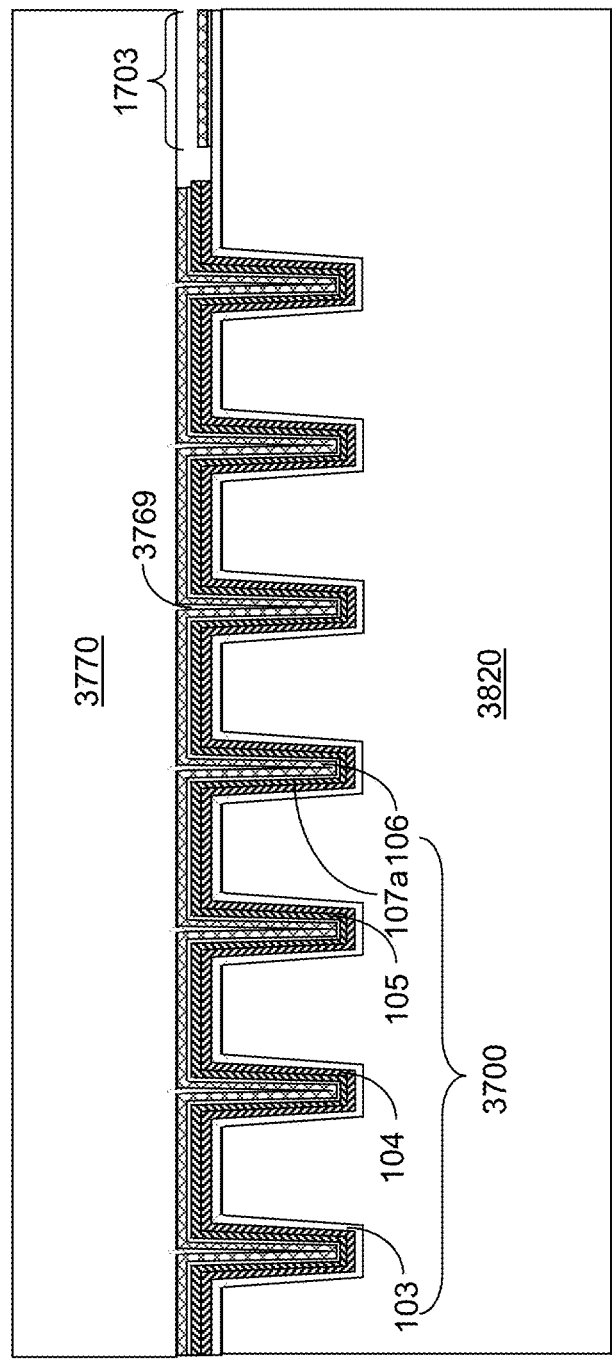
Figure 38F:
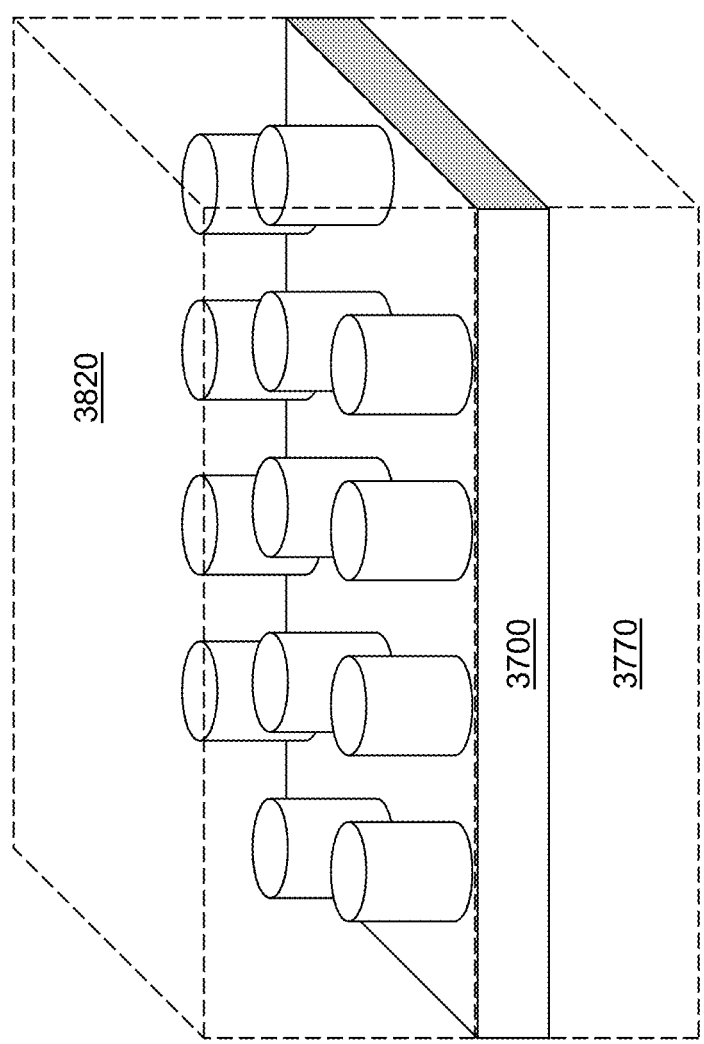
FIG. 38F is a perspective view of the second exemplary photovoltaic structure of FIG. 38E.

Referring to FIG. 38E, a passivation substrate 3770 may be disposed on the conductive core layer 106 to seal the conductive core layer 106 in the same manner as in the case of the first exemplary photovoltaic structure illustrated in FIG. 37E. A second exemplary photovoltaic structure is formed, which is illustrated in a perspective view in FIG. 38F.

Each of the photovoltaic structures illustrated in FIGS. 37E-37J, 38E, and 38F includes a layer stack 3700 located over a substrate 3770 and includes a core conductive material layer 106, a photovoltaic material layer (105, 104), and a transparent conductive material layer 103. A plurality of via cavities 3769 may be located underneath vertically protruding portions of the layer stack 3700 (which form photovoltaic bristles) and above the substrate 3770 and may be free of any solid phase material therein.

The passivation substrate 3770 having a planar bottom surface may be disposed directly on a physically exposed planar surface of the core conductive material layer 106. A plurality of via cavities 3769 may be laterally surrounded by the core conductive material layer 106, and may be vertically bounded by the passivation substrate 3770. In an embodiment, each of the plurality of via cavities 3769 may be a three-dimensional closed shape defined by a portion of a planar surface of the substrate 3770 and a non-planar portion of a contiguous surface of the core conductive material layer 106.

The contiguous surface of the core conductive material layer 106 may be the bottom surface of the core conductive material layer 106 in the upright position (as illustrated in FIGS. 37F-37J and 38F), and is a top surface of the core conductive material layer 106 prior to flipping the photovoltaic structures (as illustrated in FIGS. 37D, 37E, 38D, and 38E). The contiguous surface of the core conductive material layer 106 may be located within the same horizontal plane as the top surface of the substrate 3770 when the photovoltaic structure is in the upright position.

The three-dimensional closed shape may have a variable horizontal cross-sectional area that decreases strictly with a vertical distance from a top surface of the substrate 3770 as illustrated in FIG. 37F, 37G, and FIG. 37J. Alternatively, the three-dimensional closed shape may have a variable horizontal cross-sectional area that has a maximum at a certain vertical distance from a top surface of the substrate 3770 as illustrated in FIG. 37I. In an embodiment, the three-dimensional closed shape of a via cavity 3769 may be a conical shape. In an embodiment, a seam of the core conductive material layer 106 may extend upward vertically from a topmost apex of each of the plurality of via cavities 3769 as illustrated in FIG. 37J.

The moldable material layer (3720, 3820) may be located on the layer stack 3700, and may overlie the layer stack 3700 in the upright orientation. The moldable material layer (3720, 3820) may be an optically transparent layer, and the entirety of the top surface of the moldable material layer (3720, 3820) may be planar in the upright orientation. The moldable material layer (3720, 3820) may include an optically transparent material selected from a material selected from a lacquer, a silicone precursor material, a gel derived from a sol, and a glass transition material. In an embodiment, the optically transparent material may be selected from phenylalkyl catechol-based lacquers, nitrocellulose lacquers, acrylic lacquers, and water-based lacquers. In another embodiment, the optically transparent material may include silicone. In another embodiment, the optically transparent material may be selected from a gel of silicon oxide and a gel of dielectric metal oxide.

In another embodiment, the optically transparent material may be a glass transition material selected from terephthalate (PET), polypropylene (PP), polyethylene (PE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), polycarbonate (PC), polymethylmethacrylate (PMMA), polymethacrylate (PMA), cyclic polyolefin, methylmethylacrylic acid, hydroxyethylmethylmethacrylate, fluorofunctinoalized methylmethacrylate, silicone-functionalized methylmethacrylate, soda-lime-silica glass, borophosphosilicate glass, and phosphosilicate glass.

The moldable material layer (3720, 3820) may be a transparent dielectric layer. The moldable material layer (3720, 3820) may contact a top surface of the transparent conductive layer 103, and may have a top surface having a uniform vertical distance from a horizontal interface between the passivation substrate 3770 and the core conductive material layer 106. The top surface of the moldable material layer (3720, 3820) may be located above a horizontal plane including topmost surfaces of the transparent conductive material layer 103, i.e., the horizontal plane including the topmost surfaces of the photovoltaic bristles.

Each of the exemplary structures of FIGS. 37D-37N and 38D-38F illustrate a portion of a metamaterial including an array of photovoltaic bristles having approximately cylindrical shapes. As used herein, an "approximately cylindrical shape" refers to a shape that is topologically homeomorphic to a cylinder of a circular or polygonal horizontal cross-sectional shape and having sidewalls that are vertical or having a taper angle less than 10 degrees. The top portion of an "approximately cylindrical shape" may be pointed, or may be rounded.

The metamaterial may be formed by forming an array of vias 1103 extending into a substrate, which may be a combination of a sheet substrate 3710 and a moldable material layer 3720 as illustrated in FIG. 37A, or may be a moldable material layer 3820 as illustrated in FIG. 38A. Each via 1103 within the array has an approximately cylindrical shape and is laterally separated from one another, and is laterally surrounded, by the substrate ((3710, 3720); 3820). In one embodiment, the moldable material layer (3720, 3820) may be patterned by imprinting a die including a pattern of protruding structures and incorporated into a web onto the moldable material layer (3720, 3820). The patterned moldable material layer (3720, 3820) includes a pattern of via cavities. The patterned moldable material layer (3720, 3820) is subsequently cured to form a rigid structure.

A transparent conductive layer 103 (i.e., an outer conductive layer 103) is formed over the array of vias 1103. An absorber layer (104, 105) is formed over the outer conductive layer 103. A core conductive material layer 106 (i.e., the conductive core layer 106 or the core 106) is formed over the absorber layer (104, 105). Each via 1103 is partially filled with the core conductive material layer 106 to form a conductive core of a respective photovoltaic bristle. A base layer 3770 (which may be a passivation substrate 3770) is formed over the deposited conductive material. A non-solid core 3769 (i.e., a via cavity 3769) that does not include the conductive material or a material of the base layer 3770 is formed within each photovoltaic bristle and between the core conductive material layer 106 and the base layer 3770.

In one embodiment, the substrate ((3710, 3720); 3820) comprises a moldable material. Formation of the array of vias 1103 may be is effected by moving the moldable material under a rolling press or under a rolling die that transfers a pattern thereupon on the moldable material. The conductive cores 106 of photovoltaic bristles and the core conductive material layer 106 may be formed as a single contiguous structure in a same deposition process. The transparent conductive layer 103 may comprise transparent conductive oxide or transparent conductive nitride. In one embodiment, the passivation substrate 3770 may comprise a non-conductive transparent layer disposed over the array of vias 1103. In one embodiment, the substrate ((3710, 3720); 3820) comprises a polymer. For example, the substrate ((3710, 3720); 3820) may include a moldable material layer (3720, 3820) comprising a polymer.

Figure 40:
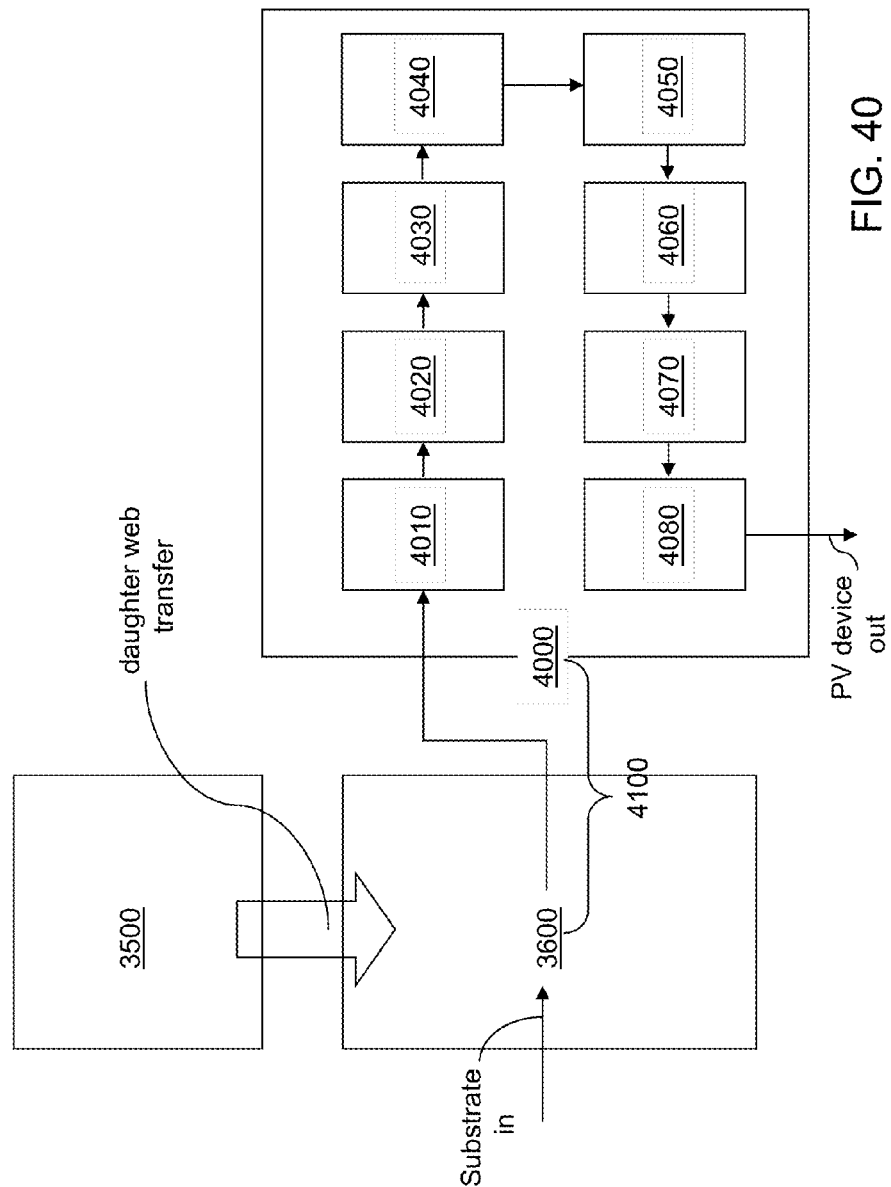
FIG. 40 is an illustration of a system for manufacture of a photovoltaic structure according to an embodiment.

Referring to FIG. 40, a system 4100 for manufacturing a photovoltaic structure may include a web-to-plate system (3600, 3900) such as the system illustrated in FIG. 36A, and a deposition system 4000 including a plurality of process chambers (4010, 4020, 4030, 4040, 4050, 4060). The web-to-plate system (3600, 3900) may be configured to imprint a die (e.g., a daughter die web 3501d in FIG. 36A) including a pattern of protruding structures onto a moldable material layer 3720 (which is the coating layer in a coated substrate 3509b in FIG. 36A) to generate a pattern of trenches 1103 extending downward from a top surface of the moldable material layer 3720. The die may be incorporated into a web as in the case of the daughter die web 3501d. A roll-to-web system 3500, as illustrated in FIG. 35A, may be employed to provide a web with an imprint pattern to the web-to-plate system (3600, 3900).

In an embodiment, the web-to-plate system (3600, 3900) may include a moldable material dispensation subsystem including a moldable material container (such as the container containing the moldable material 3613 illustrated in FIG. 36A) and a moldable material dispenser (such as the second moldable material applicator 3612 illustrated in FIG. 36A). The moldable material dispenser may be configured to coat the moldable material layer 3720 on a sheet substrate 3710 prior to transportation of the sheet substrate 3710 to an imprint location. The moldable material may be selected from a lacquer, a silicone precursor material, a gel derived from a sol, and a glass transition material as described above. In case a sol-gel material is employed for the moldable material layer (3720, 3820), a sol may be applied onto the sheet substrate 3710, and transition of the sol into a gel may be induced to form the moldable material layer 3720. In an embodiment, the moldable material layer 3720 may be selected from a gel of silicon oxide and a gel of dielectric metal oxide. The moldable material layer 3720 may include an optically transparent material that is transparent within the visible wavelength range.

Optionally, the web-to-plate system (3600, 3900) may further include a densification device configured to reduce elasticity of the moldable material prior to, or after, imprinting. For example, a curing mechanism 3615 illustrated in FIG. 36A and/or a densification device 3990 and/or a second fan 3972 illustrated in FIG. 39 may be employed. In an embodiment, the densification device may include at least one of a fan, a heater, an ultraviolet treatment system, an agitator, and a laser irradiation system.

In an embodiment, the moldable material layer 3820 may be a moldable substrate including a glass transition material, and the web-to-plate system 3900 may include a moldable substrate transportation subsystem (such as the linear drive mechanism 3610) configured to transport the moldable substrate to an imprint location. The moldable material layer 3820 may include an optically transparent material that is transparent within the visible wavelength range.

In an embodiment, the web-to-plate system 3900 may include a heating system 3980 configured to heat a top side of the moldable substrate during transportation to the imprint location. In an embodiment, the web-to-plate system 3900 may include a substrate backside cooling system (such as the first fan 3971 or a built-in cooling system within the linear drive mechanism 3600) configured to cool a backside of each moldable substrate during transportation to the imprint location. In an embodiment, a web cooling system (such as the third fan 3973 in FIG. 39) may be provided, which may be configured to cool the die after transfer of the pattern of the die into the moldable material layer 3820.

A die including a pattern of protruding structures and incorporated into a web may be imprinted onto the moldable material layer (3720, 3820). The patterned moldable material layer (3720, 3820) may be an optically transparent layer including the pattern of trenches 1103.

After the web-to-plate system (3600, 3900) forms a pattern of trenches 1103 extending downward from a top surface of a moldable material layer (3720, 3820) (which may be an optically transparent layer), a transparent conductive material layer 103, a photovoltaic material layer (104, 105), and a core conductive material layer 106 may be sequentially deposited within the pattern of trenches 1103 in the moldable material layer (3720, 3820) as described above. A via cavity 3769 may be formed within, or above, each trench 1103. In an embodiment, the core conductive material layer 106 may incompletely fill the trenches 1103.

The system 4100 for manufacturing the photovoltaic structure may further include a deposition system 4000 configured to sequentially deposit a transparent conductive material layer 103, a photovoltaic material layer (104, 105), and a core conductive material layer 106 within the pattern of trenches 1103 in the moldable material layer (3720, 3820).

The plurality of process chambers (4010-4080) in the deposition system 4000 may be integrated into an automated deposition system in which the in-process photovoltaic structure is processed step by step employing an integrated robotic transport system or a manual transport system. The plurality of process chambers (4010-4080) may include, for example, a transparent conductive layer deposition module 4010 that deposits a transparent conductive layer 103, a first laser scribing module 4020 that patterns the transparent conductive layer 103, a first photovoltaic material deposition module 4030 that deposits a first absorber sublayer 104 of a first conductivity type, a second photovoltaic material deposition module 4040 that deposits a second absorber sublayer 105 of a second conductivity type (which is the opposite of the first conductivity type), a second laser scribing module 4050 that patterns the first and second absorber sublayers (104, 105) (i.e., the photovoltaic material layer (104, 105)), an optional transparent inner conductive layer deposition module 4060 that deposits a transparent inner conductive layer 107a, a conductive core layer deposition module 4070 that deposits a conductive core layer 106, and a third laser scribing module 4080 that patterns the conductive core layer 106 and the optional transparent inner conductive layer 107a. Optionally, assembly of a passivation substrate 3770 may be automated employing another process module that processes the output substrate from the second conductive trace module 4060.

Referring to FIG. 41A, a third exemplary structure according to an embodiment of the present disclosure may be derived from the first exemplary structure illustrated in FIG. 37D. As discussed above, a top surface of a moldable material layer 3720 may be patterned with an array pattern. The array pattern includes an array of vertically extending shapes that protrude downward from that top surface of the moldable material layer 3720, i.e., an array of via 1103 that includes via cavities therein. A layer stack (103, 104, 105, 107a, 106) may be formed over the array pattern. The layer stack comprising a transparent conductive material layer 103, a photovoltaic material layer (104, 105), an optional transparent inner conductive layer 107a, and a core conductive material layer 106. Specifically, the transparent conductive material layer 103 is deposited on surfaces of the via cavities 1103 and the top surface of the moldable material layer (3720, 3820), the photovoltaic material layer (104, 105) is deposited on the transparent conductive material layer 103, and the core conductive material layer 103 is deposited on the photovoltaic material layer (104, 105). The conductive cores 106 of photovoltaic bristles and the core conductive material layer 106 may be formed as a single contiguous structure in a same deposition process. The transparent conductive layer 103 may comprise transparent conductive oxide or transparent conductive nitride.

A dielectric material layer 4120 is deposited in each of the cavities that overlying recessed portions (i.e., portions that protrude downward) of the core conductive material layer 106. The dielectric material layer 4120 comprises a dielectric material, i.e., an electrical insulator), and may be deposited by a conformal deposited method (such as chemical vapor deposition), a self-planarizing deposition method (such as spin-coating, spraying, immersion in a bath including the dielectric material, etc. In one embodiment, each via cavity 1103 may be entirely filled with a respective photovoltaic bristle, which includes vertically extending portions of the transparent conductive material layer 103, the photovoltaic material layer (104, 105), the core conductive material layer 106, and the dielectric material layer 4120. Each vertically extending portion of the dielectric material layer 4120 constitutes a dielectric core 4122. Thus, each dielectric core 4122 may be a portion of the dielectric material layer 4120 that protrudes into a respective via cavity.

The polymer material that may be employed for the dielectric material layer 4120 may, or may not, be an optically transparent material. Non-limiting examples of the polymer material that may be employed for the dielectric material layer 4120 include poly(hexafluoropropylene oxide), hydroxypropyl cellulose, poly(tetrafluoroethylene-co-hexafluoropropylene), poly(pentadecafluorooctyl acrylate), poly(tetrafluoro-3-(heptafluoropropoxy)propyl acrylate), poly(tetrafluoro-3-(pentafluoroethoxy)propyl acrylate), poly(tetrafluoroethylene), poly(undecafluorohexyl acrylate), poly(nonafluoropentyl acrylate), poly(tetrafluoro-3-(trifluoromethoxy)propyl acrylate), poly(pentafluorovinyl propionate), poly(heptafluorobutyl acrylate), poly(trifluorovinyl acetate), poly(octafluoropentyl acrylate), poly(methyl 3,3,3-trifluoropropyl siloxane), poly(pentafluoropropyl acrylate), poly(2-heptafluorobutoxy)ethyl acrylate), poly(chlorotrifluoroethylene), poly(2,2,3,4,4-hexafluorobutyl acrylate), poly(methyl hydro siloxane), poly(methacrylic acid), poly(dimethyl siloxane), poly(trifluoroethyl acrylate), poly(2-(1,1,2,2-tetrafluoroethoxy)ethyl acrylate, poly(trifluoroisopropyl methacrylate), poly(2,2,2-trifluoro-1-methylethyl methacrylate), poly(2-trifluoroethoxyethyl acrylate), poly(vinylidene fluoride), poly(trifluoroethyl methacrylate), poly(methyl octadecyl siloxane), poly(methyl hexyl siloxane), poly(methyl octyl siloxane), poly(isobutyl methacrylate), poly(vinyl isobutyl ether), poly(methyl hexadecyl siloxane), poly(ethylene oxide), poly(vinyl ethyl ether), poly (methyl tetradecyl siloxane), poly(ethylene glycol monomethyl ether), poly(vinyl n-butyl ether), polypropylene oxide), poly(3-butoxypropylene oxide), poly(3-hexoxypropylene oxide), poly(ethylene glycol), poly(vinyl n-pentyl ether), poly(vinyl n-hexyl ether), poly(4-fluoro-2-trifluoromethylstyrene), poly(vinyl octyl ether), poly(vinyl n-octyl acrylate), poly(vinyl 2-ethylhexyl ether), poly(vinyl n-decyl ether), poly(2-methoxyethyl acrylate), poly(acryloxypropyl methyl siloxane), poly(4-methyl-1-pentene), poly(3-methoxypropylene oxide), poly(t-butyl methacrylate), poly (vinyl n-dodecyl ether), poly(3-ethoxypropyl acrylate), poly (vinyl propionate), poly(vinyl acetate), poly(vinyl propionate), poly(vinyl methyl ether), poly(ethyl acrylate), poly(vinyl methyl ether) (isotactic), poly(3-methoxypropyl acrylate), poly(1-octadecene), poly(2-ethoxyethyl acrylate), poly(isopropyl acrylate), poly(1-decene), poly(propylene), poly(lauryl methacrylate), poly(vinyl sec-butyl ether), poly (n-butyl acrylate), poly(dodecyl methacrylate), poly(ethylene succinate), poly(tetradecyl methacrylate), poly(hexadecyl methacrylate), cellulose acetate butyrate, cellulose acetate, poly(vinyl formate), poly(2-fluoroethyl methacrylate), poly(octyl methyl silane), ethyl cellulose, poly(methyl acrylate), poly(dicyanopropyl siloxane), poly(oxymethylene), poly(sec-butyl methacrylate), poly(dimethylsiloxane-co-alpha-methyl styrene), poly(n-hexyl methacrylate), poly (n-butyl methacrylate), poly(ethylidene dimethacrylate), poly(2-ethoxyethyl methacrylate), poly(n-propyl methacrylate), poly(ethylene maleate), poly(ethyl methacrylate), poly (vinyl butyral), poly(3,3,5-trimethylcyclohexyl methacrylate), poly(2-nitro-2-methylpropyl methacrylate), poly (dimethylsiloxane-co-diphenylsiloxane), poly(1,1-diethylpropyl methacrylate), poly(triethylcarbinyl methacrylate), poly(methyl methacrylate), poly(2-decyl-1,4-butadiene), polypropylene, isotactic, poly(mercaptopropyl methyl siloxane), poly(ethyl glycolate methacrylate), poly (3-methylcyclohexyl methacrylate), poly(cyclohexyl alpha-ethoxyacrylate), methyl cellulose, poly(4-methylcyclohexyl methacrylate), poly(decamethylene glycol dimethacrylate), poly(vinyl alcohol), poly(vinyl formal), poly(2-bromo-4-trifluoromethyl styrene), poly(1,2-butadiene), poly(sec-butyl alpha-chloroacrylate), poly(2-heptyl-1,4-butadiene), poly(vinyl methyl ketone), poly(ethyl alpha-chloroacrylate), poly(vinyl formal), poly(2-isopropyl-1,4-butadiene), poly (2-methylcyclohexyl methacrylate), poly(bornyl methacrylate), poly(2-t-butyl-1,4-butadiene), poly(ethylene glycol dimethacrylate), poly(cyclohexyl methacrylate), poly(cyclohexanediol-1,4-dimethacrylate), butyl rubber, poly(tetrahydrofurfuryl methacrylate), poly(isobutylene), polyethylene, cellulose nitrate, polyacetal, poly(1-methylcyclohexyl methacrylate), poly(2-hydroxyethyl methacrylate), poly(1-butene), poly(vinyl methacrylate), poly(vinyl chloroacetate), poly(N-butyl methacrylamide), Poly(2-chloroethyl methacrylate), poly(methyl alpha-chloroacrylate), poly(2-diethylaminoethyl methacrylate), poly(2-chlorocyclohexyl methacrylate), poly(1,4-butadiene) (35% cis; 56% trans; 7% 1,2-content), poly(acrylonitrile), poly(isoprene), poly(allyl methacrylate), poly(methacrylonitrile), poly(methyl isopropenyl ketone), poly(butadiene-co-acrylonitrile), poly(2-ethyl-2-oxazoline), poly(N-2-methoxyethyl)methacrylamide, poly(2,3-dimethylbutadiene), poly(2-chloro-1-

(chloromethyl)ethyl methacrylate), poly(1,3-dichloropropyl methacrylate), poly(acrylic acid), poly(N-vinyl pyrrolidone), nylon 6 [Poly(caprolactam)], poly(butadiene-co-styrene), poly(cyclohexyl alpha-chloroacrylate), poly(methyl phenyl siloxane), poly(2-chloroethyl alpha-chloroacrylate), poly(2-aminoethyl methacrylate), poly(furfuryl methacrylate), poly(vinyl chloride), poly(butylmercaptyl methacrylate), poly(1-phenyl-n-amyl methacrylate), poly(N-methyl methacrylamide), polyethylene, cellulose, poly(cyclohexyl alpha-bromoacrylate), poly(sec-butyl alpha-bromoacrylate), poly(2-bromoethyl methacrylate), poly(dihydroabietic acid), poly(abietic acid), poly(ethylmercaptyl methacrylate), poly(N-allyl methacrylamide), poly(1-phenylethyl methacrylate), poly(2-vinyltetrahydrofuran), poly(vinylfuran), poly(methyl m-chlorophenylethyl siloxane), poly(p-methoxybenzyl methacrylate), poly(isopropyl methacrylate), poly(p-isopropyl styrene), poly(isoprene), poly(p,p'-xylylenyl dimethacrylate), poly(cyclohexyl methyl silane), poly(1-phenylallyl methacrylate), poly(p-cyclohexylphenyl methacrylate), poly(chloroprene), poly(2-phenylethyl methacrylate), poly(methyl m-chlorophenyl siloxane), poly[4,4-heptane bis(4-phenyl)carbonate)], poly[1-(o-chlorophenyl) ethyl methacrylate)], styrene/maleic anhydride copolymer, poly(1-phenylcyclohexyl methacrylate), nylon 6,10 [poly (hexamethylene sebacamide)], nylon 6,6 [poly(hexamethylene adipamide)], nylon 6(3)T [poly(trimethyl hexamethylene terephthalamide)], poly(2,2,2'-trimethylhexamethylene terephthalamide), poly(methyl alpha-bromoacrylate), poly (benzyl methacrylate), poly[2-(phenylsulfonyl)ethyl methacrylate], poly(m-cresyl methacrylate), styrene/acrylonitrile copolymer, poly(o-methoxyphenol methacrylate), poly(phenyl methacrylate), poly(o-cresyl methacrylate), poly(diallyl phthalate), poly(2,3-dibromopropyl methacrylate), poly(2,6-dimethyl-p-phenylene oxide), poly(ethylene terephthalate), poly(vinyl benozoate), poly[2,2-propane bis[4-(2-methylphenyl)]carbonate], poly[1,1-butane bis(4-phenyl)carbonate], poly(1,2-diphenylethyl methacrylate), poly(o-chlorobenzyl methacrylate), poly(m-nitrobenzyl methacrylate), poly(oxycarbonyloxy-1,4-phenyleneisopropylidene-1,4-phenylene), poly[N-(2-phenylethyl)methacrylamide], poly (1,1-cyclohexane bis[4-(2,6-dichlorophenyl)]carbonate], polycarbonate resin, bisphenol-A polycarbonate, poly(4-methoxy-2-methylstyrene), poly(o-methyl styrene), polystyrene, poly[2,2-propane bis[4-(2-chlorophenyl)]carbonate], poly[1,1-cyclohexane bis(4-phenyl)carbonate], poly(o-methoxy styrene), poly(diphenylmethyl methacrylate), poly [1,1-ethane bis(4-phenyl)carbonate], poly(propylene sulfide), poly(p-bromophenyl methacrylate), poly(N-benzyl methacrylamide), poly(p-methoxy styrene), poly(4-methoxystyrene), poly[1,1-cyclopentane bis(4-phenyl)carbonate], poly(vinylidene chloride), poly(o-chlorodiphenylmethyl methacrylate), poly[2,2-propane bis[4-(2,6-dichlorophenyl)]carbonate], poly(pentachlorophenyl methacrylate), poly(2-chlorostyrene), poly(alpha-methylstyrene), poly (phenyl alpha-bromoacrylate), poly[2,2-propane bis[4-(2,6-dibromophenyl)cabonate], poly(p-divinylbenzene), poly(N-vinyl phthalimide), poly(2,6-dichlorostyrene), poly(chloro-p-xylene), poly(beta-naphthyl methacrylate), poly(alpha-naphthyl carbinyl methacrylate), poly(phenyl methyl silane), poly(sulfone) [Poly[4,4'-isopropylidene diphenoxy di(4-phenylene)sulfone]], polysulfone resin, poly(2-vinylthiophene), poly(2,6-diphenyl-1,4-phenylene oxide), poly(alpha-naphthyl methacrylate), poly(p-phenylene ether-sulphone), poly[diphenylmethane bis(4-phenyl)carbonate], poly(vinyl phenyl sulfide), poly(styrene sulfide), butylphenol formaldehyde resin, polyp-xylylene), poly(2-vinylnaphthalene), poly(N-vinyl carbazole), naphthalene-formaldehyde rubber, phenol-formaldehyde resin, and poly (pentabromophenyl methacrylate). In one embodiment, the dielectric material layer 4120 may include ethylene vinyl acetate.

In one embodiment, the thickness of the deposited dielectric material of the dielectric material layer 4120 may be selected such that all unfilled volumes of the via cavities 1103 are filled with the dielectric material of the dielectric material layer 4120. For example, the thickness of the dielectric material layer 4120 as measured over a topmost surface of the core conductive material layer 107 may be in a range from 200 nm to 10 microns, although lesser and greater thicknesses may also be employed. In one embodiment, the dielectric material layer 4120 comprises a self-planarizing polymer material. In one embodiment, the dielectric material layer 4120 comprises a transparent material. The top surface of the dielectric material 4120 (which is a bottom surface of the dielectric material layer 4120 upon flipping the third exemplary photovoltaic structure) may be a planar surface, i.e., a surface that is within a flat plane.

A two-dimensional array of photovoltaic bristles (103, 104, 105, 107a, 106, 4122) is formed. Each photovoltaic bristle bristles (103, 104, 105, 107a, 106, 4122) comprises a vertically protruding portion of the layer stack (103, 104, 105, 107a, 106) and embedding a dielectric core 4122 comprising a dielectric material. The dielectric core 4122 contacts a sidewall of the core conductive material layer 106. The transparent conductive material layer 103 is spaced from the core conductive material layer 106 by the photovoltaic material layer (104, 105).

Referring to FIG. 41B, a substrate, which is herein referred to as a passivation substrate 3770) is having a planar bottom surface may be disposed on the top surface of the dielectric material layer 4120. The passivation substrate 3770 may be the same as in the first and second exemplary photovoltaic structures. The passivation substrate 3770 may, or may not, be optically transparent. The passivation substrate 3770 may include a material such as glass, sapphire, a polymer material, or a plastic material.

Figure 41C:
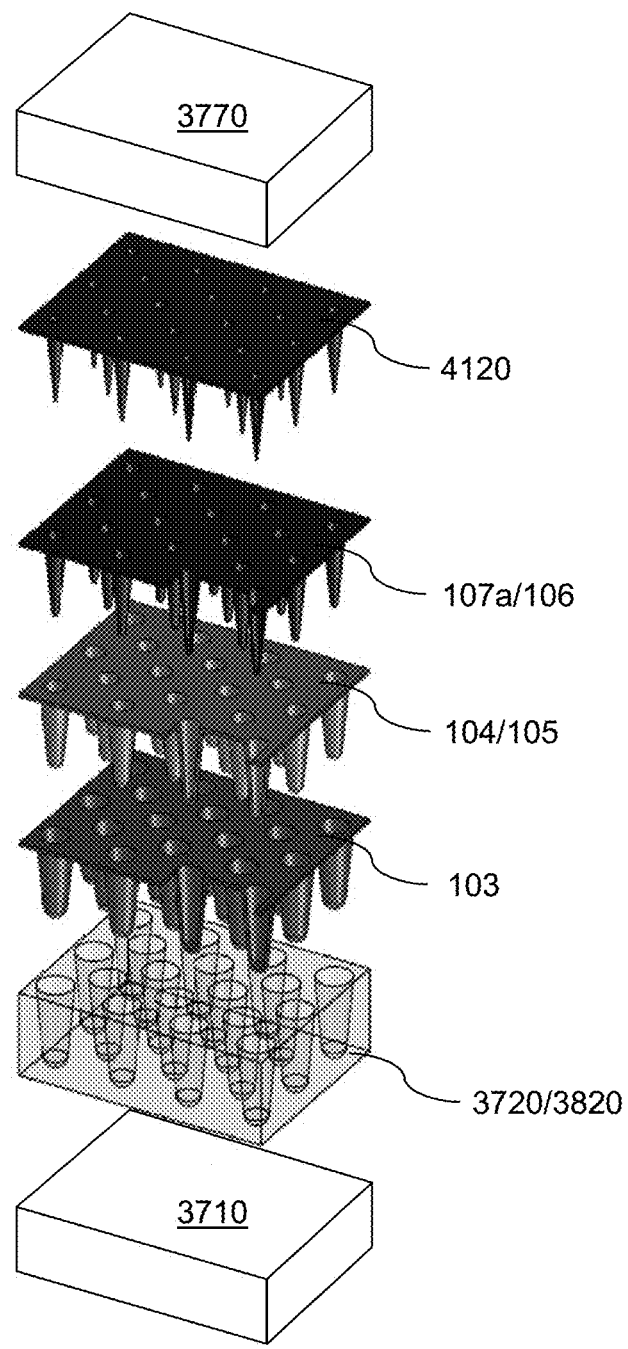
FIG. 41C is an exploded view of the third exemplary photovoltaic structure according to an embodiment.
Figure 41D:
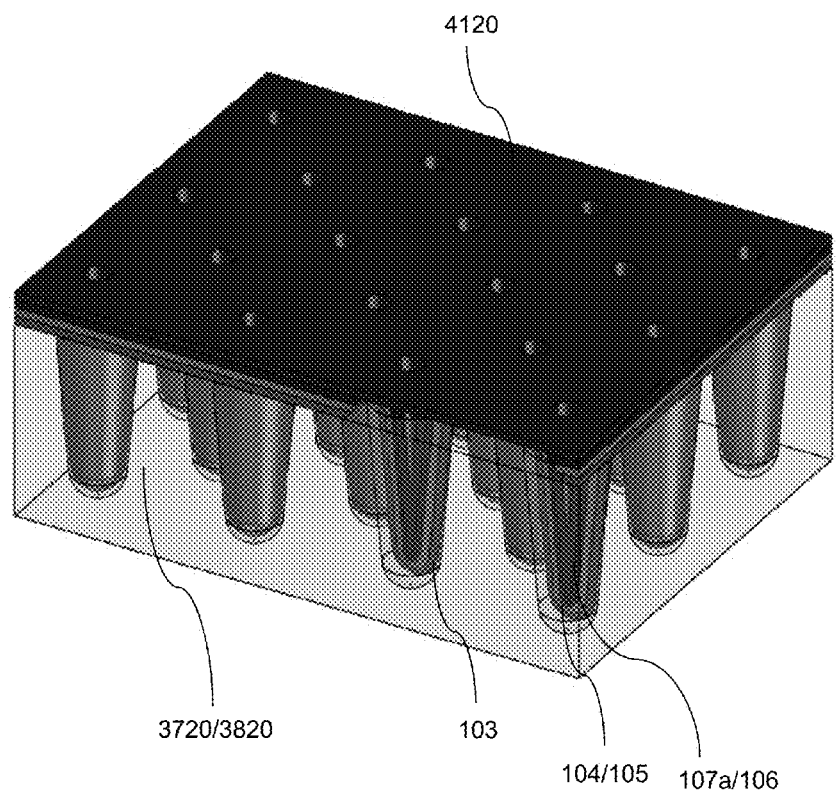
FIG. 41D is a see-through perspective view of the third exemplary photovoltaic structure according to an embodiment.

FIG. 41C is an exploded view of the third exemplary photovoltaic structure after formation of the passivation substrate 3770. The combination of the sheet substrate 3710 and the moldable material layer 3720 may be replaced with a moldable material layer 3820 that functions as a substrate that provides mechanical support to provide a fourth exemplary photovoltaic structure. FIG. 41D provides a see-through perspective view of the third or fourth exemplary photovoltaic structure.

Figure 41E:
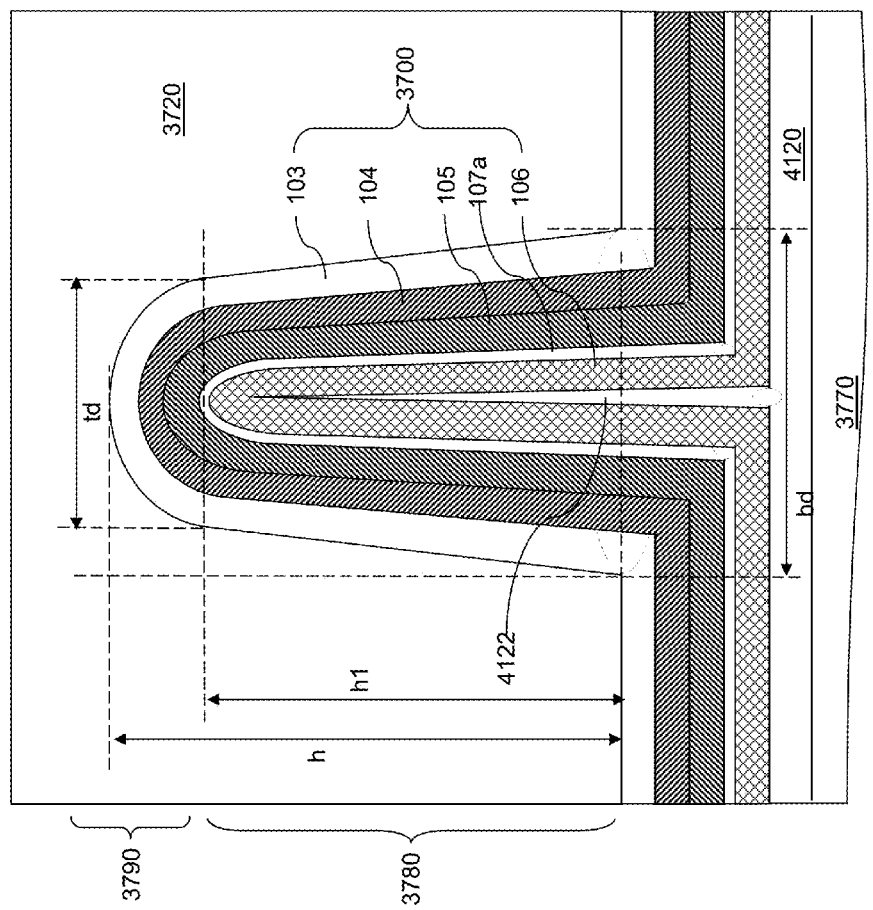
Figure 41F:
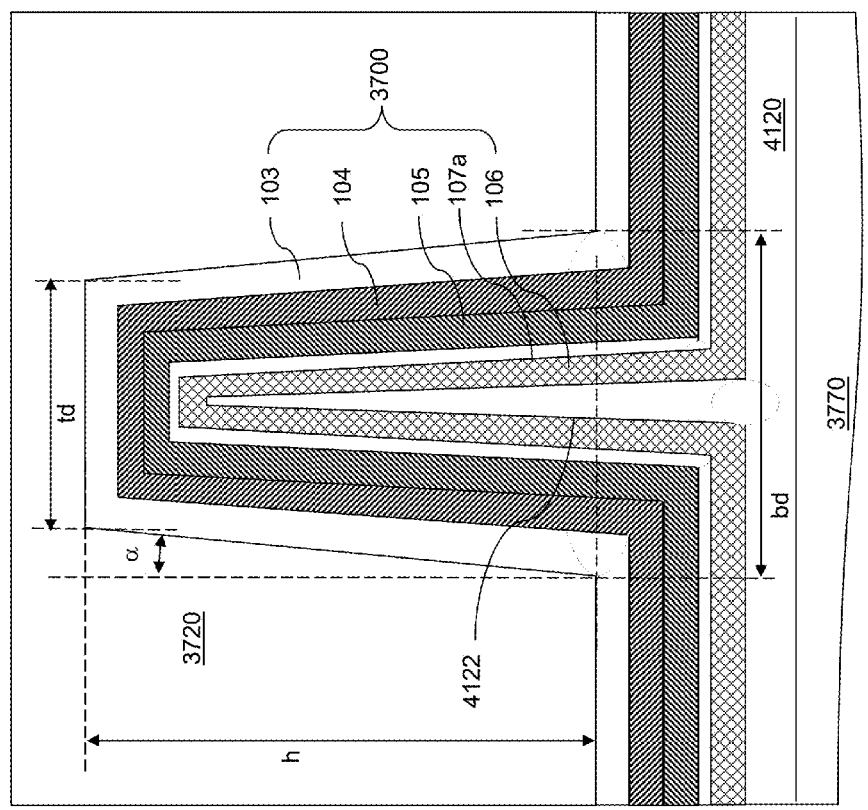
Figure 41G:
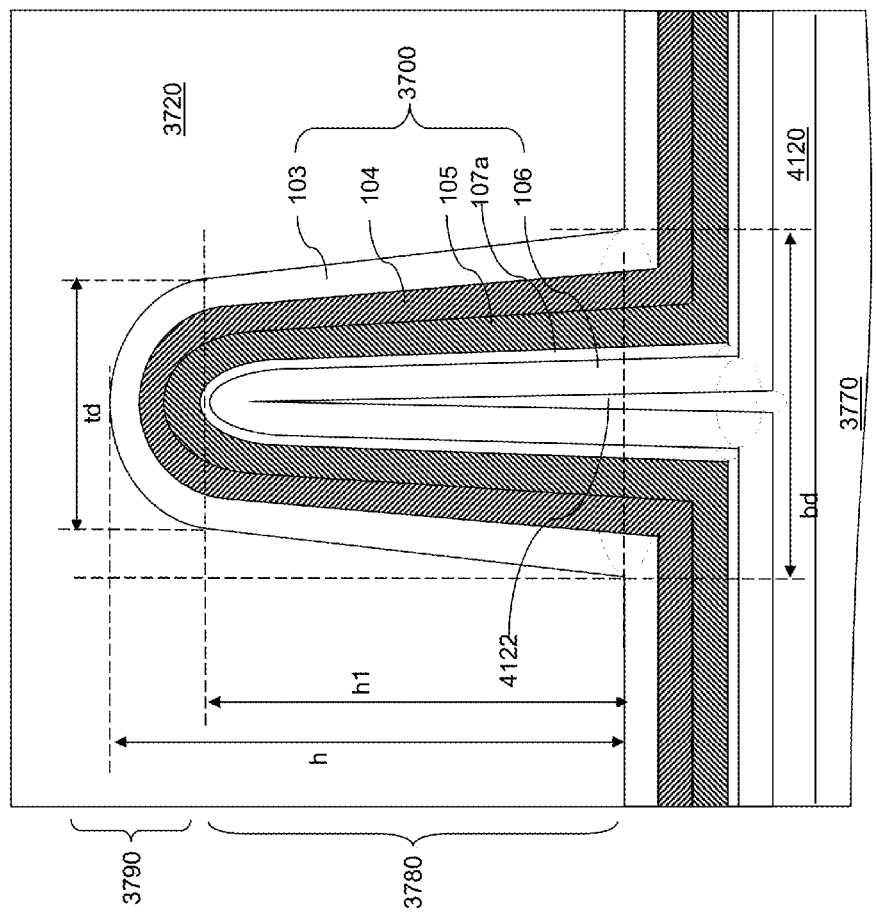
Figure 41I:
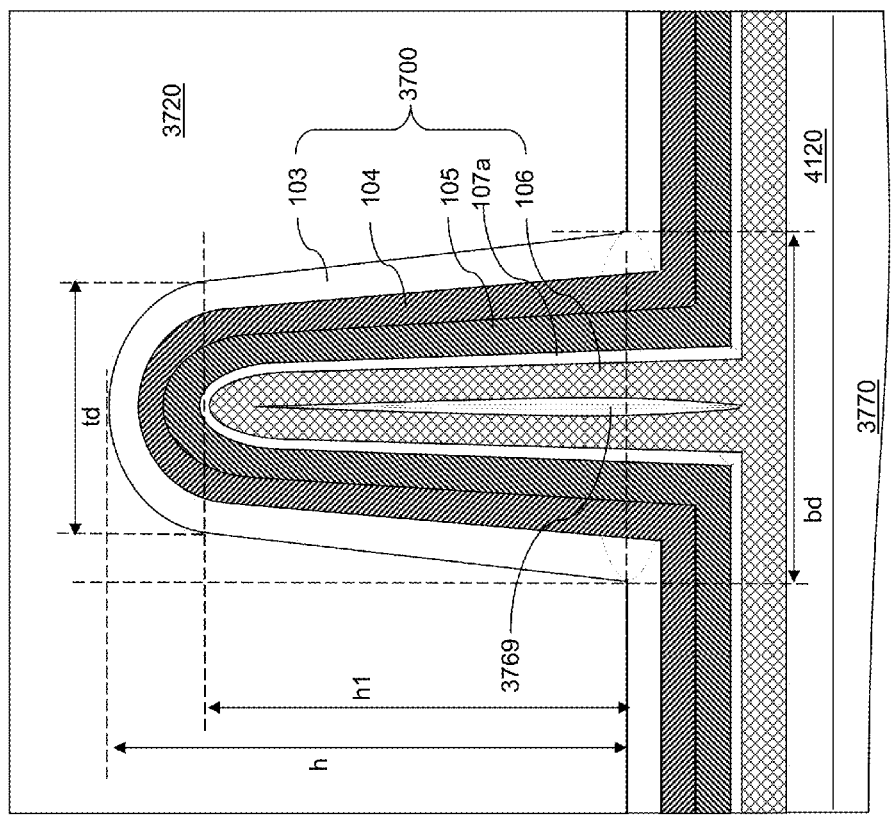

FIGS. 41E-41I are magnified views of various embodiments of a photovoltaic bristle of the third exemplary photovoltaic structure. The various dimensions such as a taper angle α, a base lateral dimension bd, a tapered-end lateral dimension td, the frustum height h1, and the height h of the bristle 3700 may be the same as in the various embodiments of the first exemplary photovoltaic structure. FIG. 41E illustrates a photovoltaic bristle including a hemispheroid region. FIG. 41F illustrates a photovoltaic bristle including a substantially planar top surface. FIG. 41F illustrates a photovoltaic bristle including a transparent conductive material as the material of the core conductive material layer 106. FIG. 41H illustrates a photovoltaic bristle including a seam 3779 therein. FIG. 41I illustrates a photovoltaic bristle including a via cavity 3769.

Figure 42A:
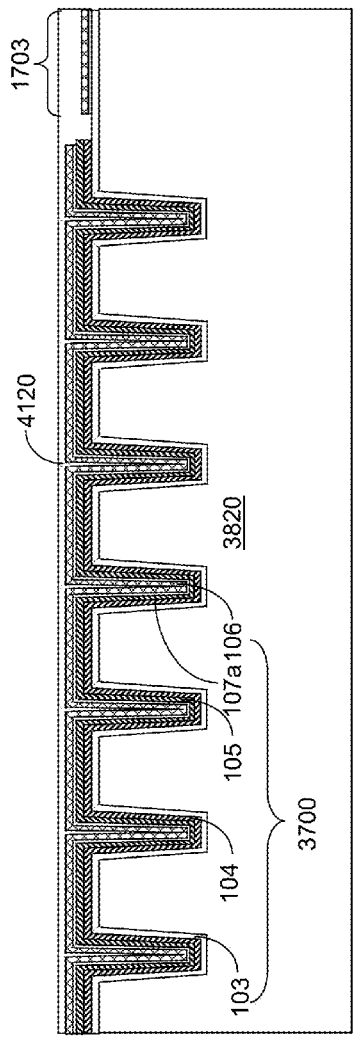
FIGS. 42A-42B are sequential vertical cross-sectional views of a fourth exemplary photovoltaic structure during a manufacturing process according to an embodiment.
Figure 42B:
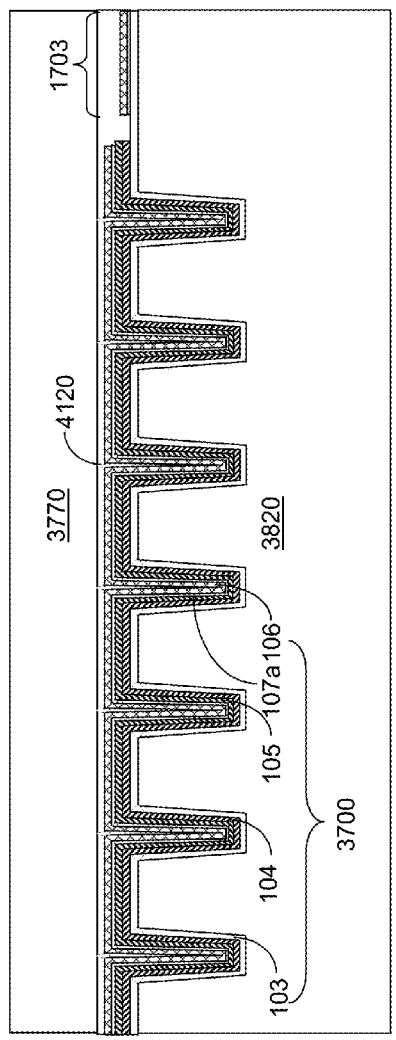

Referring to FIG. 42A, a fourth exemplary photovoltaic structure may be derived from the second exemplary photovoltaic structure of FIG. 38D by depositing a dielectric material layer 4120 employing the same processing steps of the processing steps of FIG. 41A. Thus, the combination of the sheet substrate 3710 and the moldable material layer 3720 is replaced with the moldable material layer 3820 that provides mechanical support to the photovoltaic bristles.

Each of the third and fourth exemplary photovoltaic structures may be flipped upside down prior to installation and/or use. In this configuration, each of the third and fourth exemplary photovoltaic structures comprises a dielectric material layer 4120 comprising a planar portion having a uniform thickness and an array of protruding portions 4122 extending from a planar surface of the planar portion; and a layer stack (103, 104, 105, 107a, 106) located on the dielectric material layer 4120 and comprising a core conductive material layer 106, a photovoltaic material layer (104, 105), and a transparent conductive material layer 103. The core conductive material layer 106 is in contact with the planar surface and the protruding portions 4122 of the dielectric material layer 4120. The transparent conductive material layer 103 is spaced from the core conductive material layer 106 by the photovoltaic material layer (104, 105). Each combination of a protruding portion 4122 of the dielectric material layer 4120 and portions of the layer stack (103, 104, 105, 107a, 106) surrounding the protruding portion 4122 constitutes a photovoltaic bristle (103, 104, 105, 107a, 106, 4122).

In one embodiment, the entirety of the dielectric material layer 4120 may be a single material layer without any interface or seam therein. In one embodiment, the entirety of the dielectric material layer 4120 may have a homogeneous material composition throughout. In one embodiment, the dielectric material layer 4120 comprises an optically transparent material. In one embodiment, each protruding portion 4122 of the dielectric layer 4120 may have a variable horizontal cross-sectional area that decreases strictly with a vertical distance from the planar surface of the planar portion of the dielectric material layer 4120. In one embodiment, each protruding portion 4122 of the dielectric material layer 4120 may have a conical shape.

In one embodiment, a seam 3779 of the core conductive material layer 106 may extend vertically from an apex of each protruding portion 4122 of the dielectric material layer 4120 as illustrated in FIG. 41H. In one embodiment, a substrate (such as a passivation substrate 3770) contacting another planar surface of the planar portion of the dielectric material layer 4120 may be provided. Such a substrate 3770 may be vertically spaced from the layer stack (103, 104, 105, 107a, 106) by the planar portion of the dielectric material layer 4120. In one embodiment, each protruding portion 4122 may have a lateral dimension less than 10 microns (which may be less than 5 microns, and may be, for example, in a range from 10 nm to 3 microns) and a height less than 100 microns (for example, in a range from 0.3 micron to 10 microns).

In one embodiment, the moldable material layer (3720, 3820) may be an optically transparent layer. In this case, the optically transparent layer (3720, 3820) may overlie, and laterally surround protruding portions of, the layer stack (103, 104, 105, 107a, 106). The entirety of a top surface of the optically transparent layer (3720, 3820) (that does not contact the layer stack) may be planar. In one embodiment, the sheet substrate 3710 may be a transparent substrate, which is located on the top surface of the optically transparent layer (3720, 3820). In one embodiment, the optically transparent layer (3720, 3820) may have a refractive index less than the refractive index of the transparent conductive material layer 103 to induce refraction at the interface between the optically transparent layer (3720, 3820) and the transparent conductive material layer 103.

The optically transparent material of the optically transparent layer (3720, 3820) may be any transparent material that may be employed for the moldable material layer (3720, 3820) of the first exemplary photovoltaic structure, or any transparent material that may be employed for the moldable material layer 3820 of the second exemplary photovoltaic structure. In one embodiment, the optically transparent layer (3720, 3820) comprises a polymer material. In one embodiment, the optically transparent layer (3720, 3820) comprises a moldable material selected from a lacquer, a silicone precursor material, a gel derived from a sol containing a polymerizable colloid, and a glass transition material. In one embodiment, the optically transparent layer (3720, 3820) comprises a moldable material selected from a polymer resin-based plastic material, an organic material including at least one resin, a flexible glass material based on silica, phenylalkyl catechol-based lacquers, nitrocellulose lacquers, acrylic lacquers, water-based lacquers, silicone, a gel of silicon oxide, and a gel of dielectric metal oxide. In one embodiment, the optically transparent layer (3720, 3820) comprises a polymer material.

Referring to FIG. 43A, a fifth exemplary photovoltaic structure is illustrated during a manufacturing step. A sheet substrate 3710 and a moldable material layer 3720 having a uniform thickness may be provided as in the case of the first and third exemplary photovoltaic structures. For example, the moldable material layer 3720 may include an optically transparent material selected from a lacquer, a plastic material, a resin material, a silicone precursor material, a gel derived from a sol, and a glass transition material. The processing steps illustrated in FIG. 39 may be employed to patterning a top surface of the moldable material layer 3720 with an array pattern. In one embodiment, the moldable material layer 3720 may be patterned by imprinting a die including a pattern of recessed structures and incorporated into a web onto the moldable material layer 3720. In one embodiment, the patterned moldable material layer 3720 includes a pattern of dielectric cores 3722. In one embodiment, the dielectric cores 3722 may be nanorods, which are structures each having a shape of a rod and having at least one nanoscale dimension (i.e., a dimension less than 1 micron). For example, a diameter of a topmost portion of each dielectric core 3722 may be less than 1 micron.

In this case, the array pattern may comprise a pattern of dielectric cores 3722 extending upward from the top surface of the moldable material layer 3720. Each dielectric core 3722 may be a patterned portion of the moldable material layer 3720. The array pattern includes an array of vertically extending shapes 3722 that protrude upward from that top surface of the moldable material layer 3720. Each vertically extending shape 3720 may be a dielectric core 3722 of a respective photovoltaic bristle to be subsequently formed.

Figure 43B:
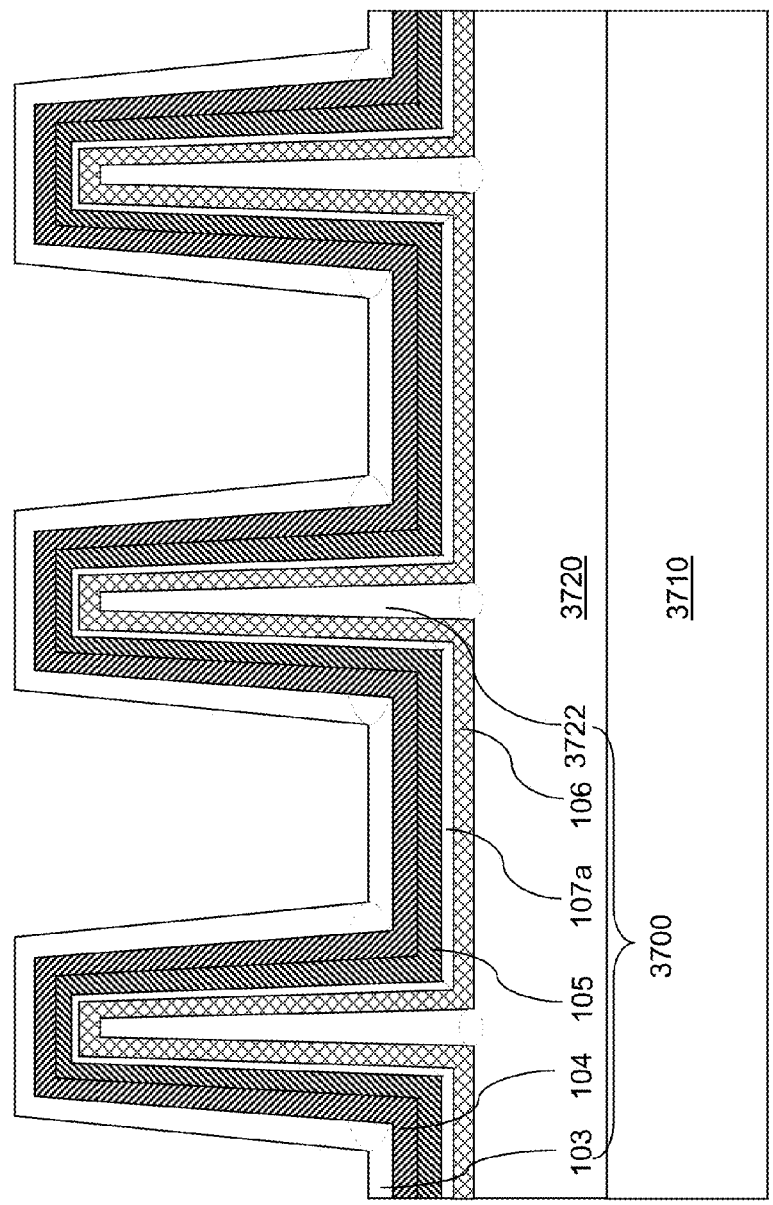

Referring to FIG. 43B, a layer stack (103, 104, 105, 107a, 106) is deposited over the array pattern. The layer stack comprises a core conductive material layer 106, an optional inner transparent conductive layer 107a, a photovoltaic material layer (105, 104), and a transparent conductive material layer 103. Specifically, the core conductive material layer 106 may be deposited on the top surface of the planar portion of the moldable material layer 3720 and the dielectric cores 3722 (vertically extending portions) of the moldable material layer 3720. The optional inner transparent conductive layer 107a may be deposited on the core conductive material layer 106. The photovoltaic material layer (105, 104) may be deposited on the optional inner transparent conductive layer 107a and over the core conductive material layer 106. The transparent conductive material layer 103 may be formed on the photovoltaic material layer (105, 104). The thickness and composition of each layer within the layer stack (103, 104, 105, 107a, 106) may be the same as in the first, second, third, or fourth exemplary photovoltaic structures.

A two-dimensional array of photovoltaic bristles (103, 104, 105, 107a, 106, 3722) is formed. Each photovoltaic bristle (103, 104, 105, 107a, 106, 3722) comprises a vertically protruding portion of the layer stack (103, 104, 105, 107a, 106) and embedding a dielectric core 3722 comprising a dielectric material. The dielectric core 3722 contacts a sidewall of the core conductive material layer 106. The transparent conductive material layer 103 is spaced from the core conductive material layer 106 by the photovoltaic material layer (105, 106).

Figure 43C:
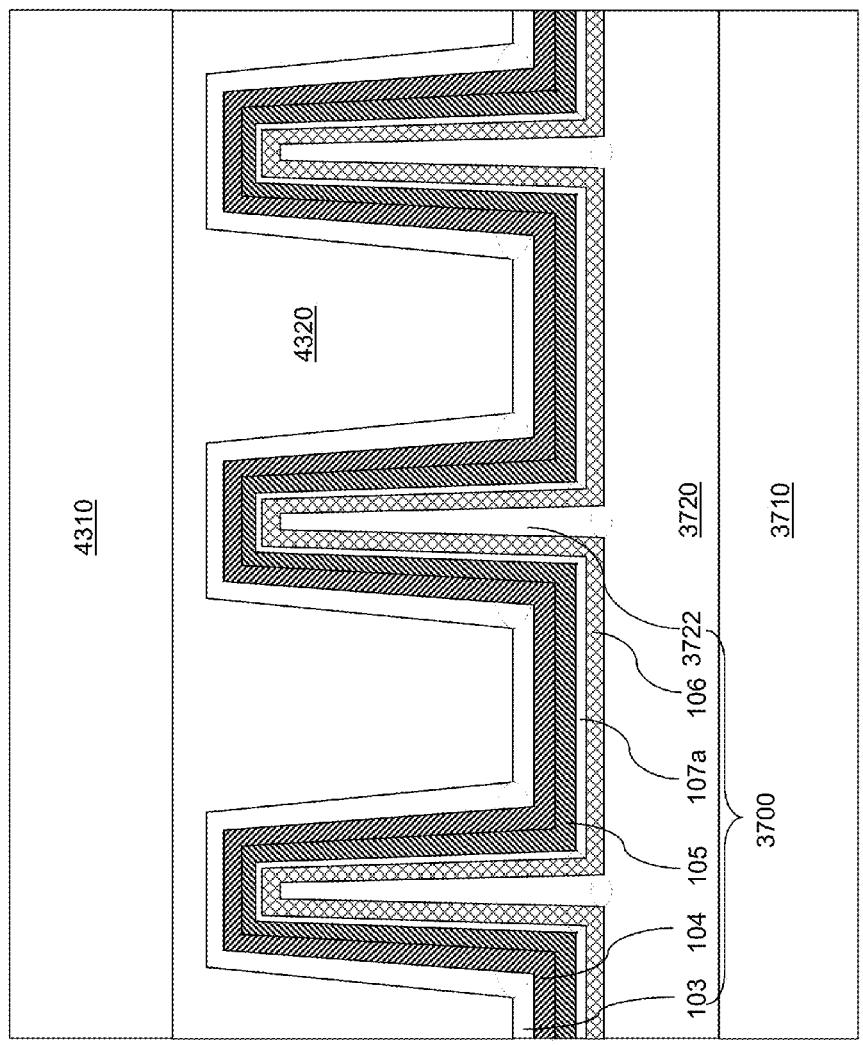

Referring to FIG. 43C, a dielectric material layer 4320 is deposited over the layer stack (103, 104, 105, 107a, 106). The dielectric material layer 4320 may include any of the transparent materials that may be employed for the dielectric material layer 4210 of the third and fourth exemplary photovoltaic structures. In one embodiment, the dielectric material layer 4320 may include ethylene vinyl acetate. The dielectric material layer 4320 may be deposited by a conformal deposition method or a self-planarizing deposition method. The thickness of the dielectric material layer 4320, as measured over a topmost surface of the transparent conductive material layer 103, may be in a range from 0.5 micron to 20 microns, although lesser and greater thicknesses may also be employed. The top surface of the dielectric material layer 4320 may be planar as formed if a self-planarizing deposition process (such as spin coating) is employed, or may be planarized, for example, by polishing.

Subsequently, a passivation substrate 4310 having a planar bottom surface may be disposed on a top surface of the dielectric material layer 4320. The passivation substrate 4320 comprises an optically transparent material. The passivation substrate 4320 may include a material such as glass, sapphire, an optically transparent polymer material, or an optically transparent plastic material.

Figure 43D:
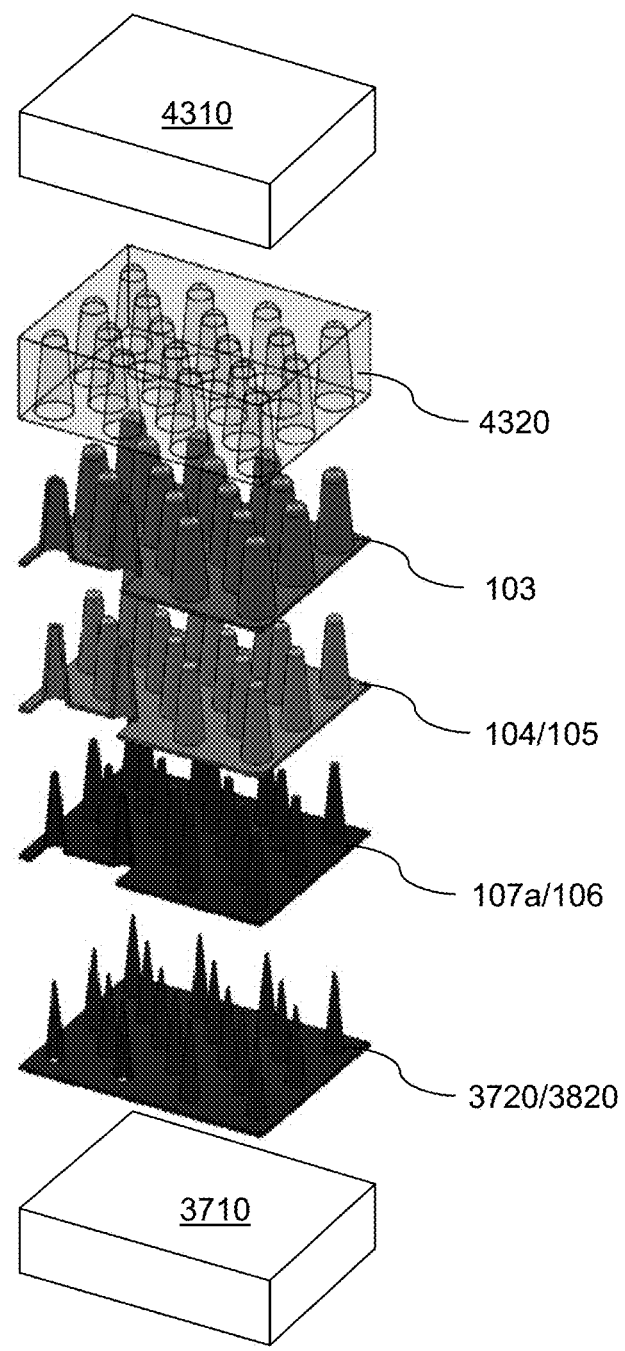
FIG. 43D is an exploded view of the fifth exemplary photovoltaic structure according to an embodiment.
Figure 43E:
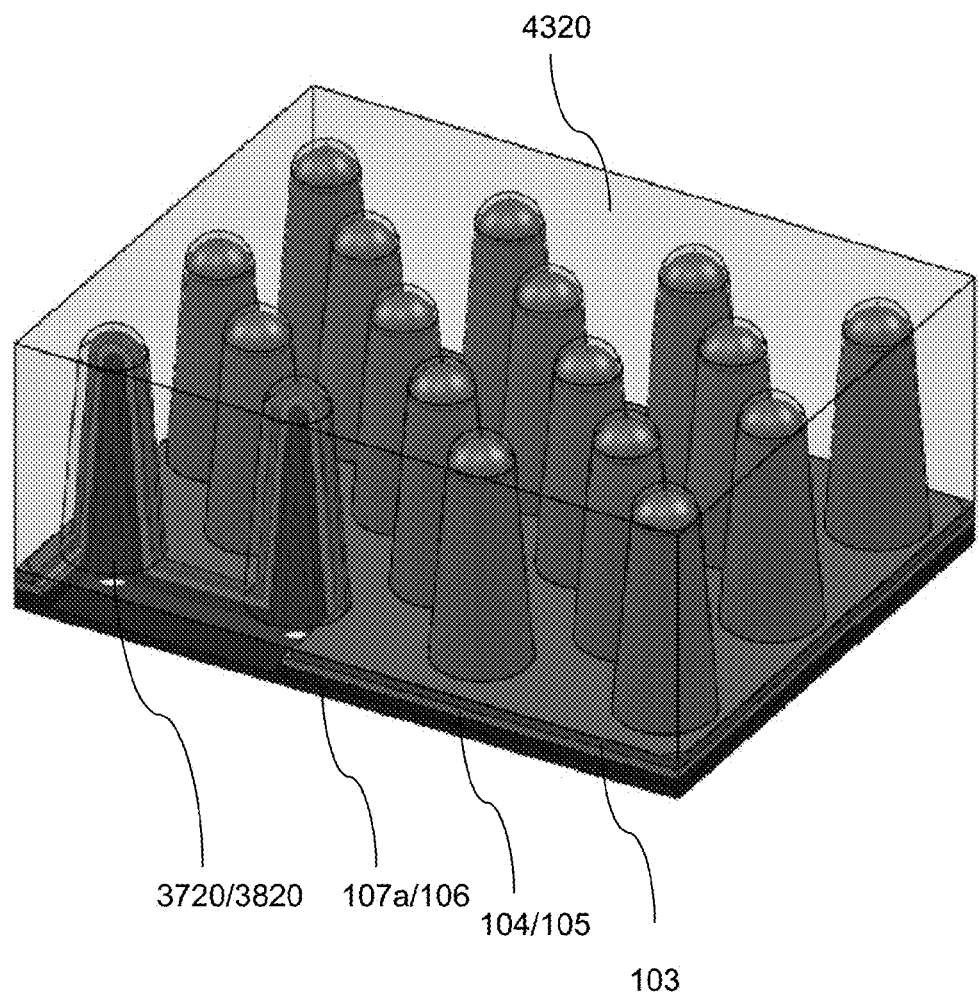
FIG. 43E is a see-through perspective view of the fifth exemplary photovoltaic structure according to an embodiment.

FIG. 43D is an exploded view of the fifth exemplary photovoltaic structure after formation of the passivation substrate 4310. The combination of the sheet substrate 3710 and the moldable material layer 3720 may be replaced with a moldable material layer 3820 that functions as a substrate that provides mechanical support to provide a sixth exemplary photovoltaic structure. FIG. 43E provides a see-through perspective view of the fifth or sixth exemplary photovoltaic structure.

Figure 44A:
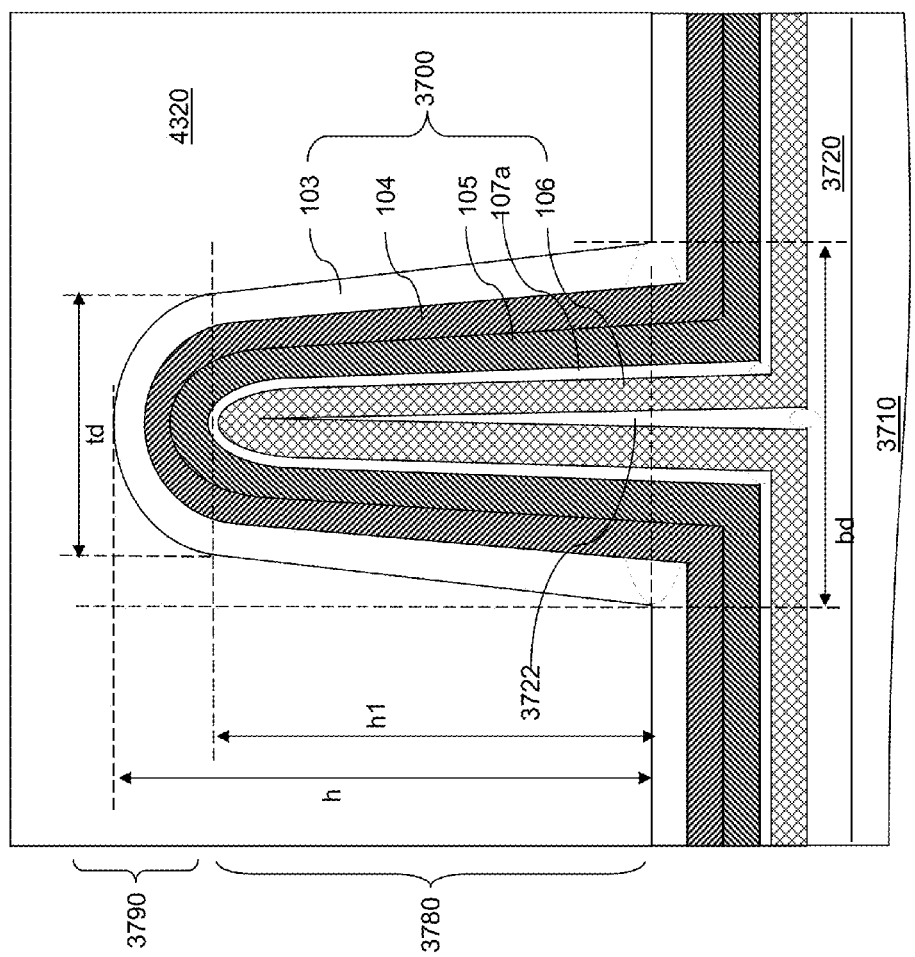
FIG. 44A is a vertical cross-sectional view of the fifth exemplary photovoltaic structure of FIG. 43C.
Figure 44B:
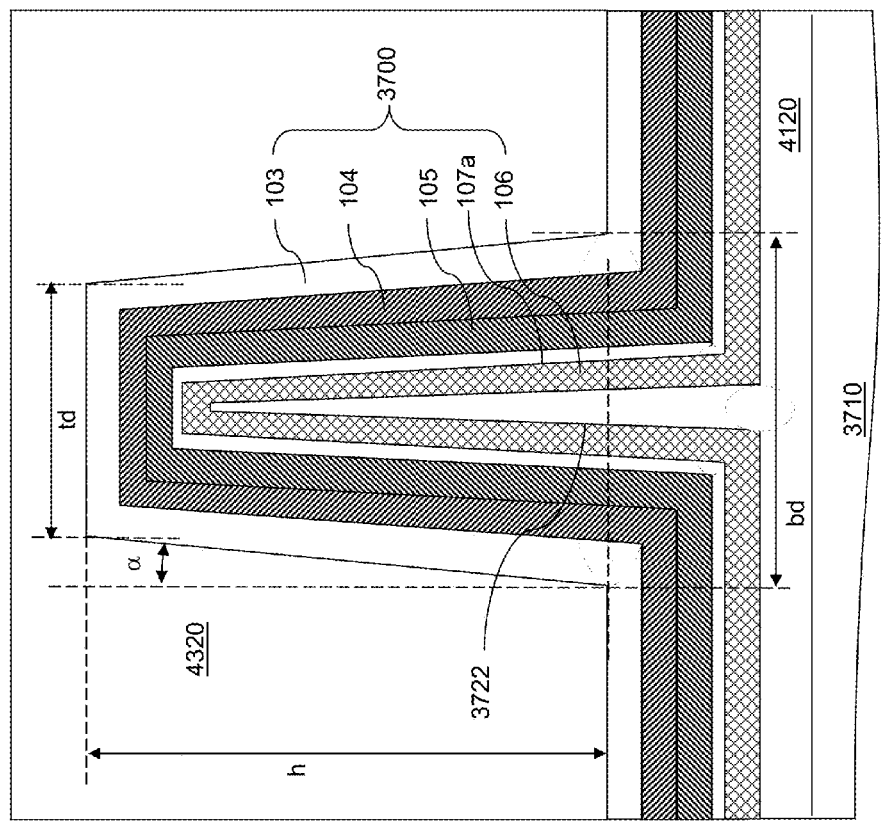
FIG. 44B is a vertical cross-sectional view of another embodiment of the fifth exemplary photovoltaic structure.
Figure 44C:
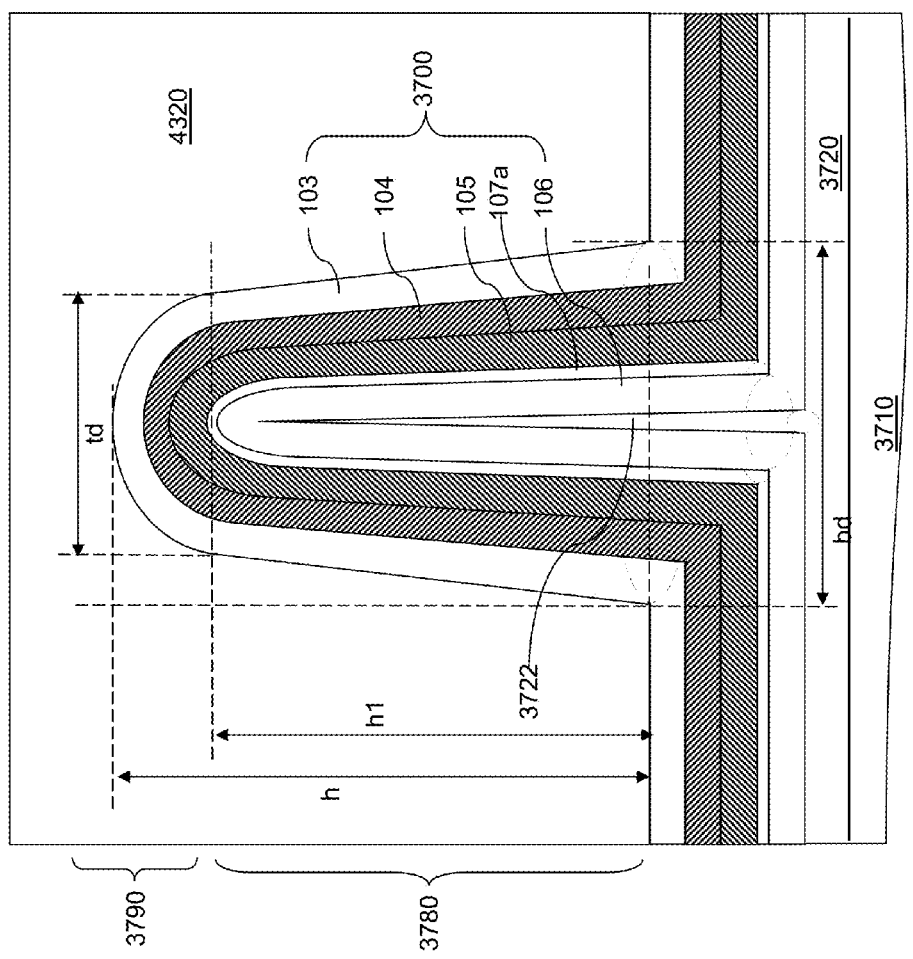
FIG. 44C is a vertical cross-sectional view of yet another embodiment of the fifth exemplary photovoltaic structure.

FIGS. 44A-44C are magnified views of various embodiments of a photovoltaic bristle of the fifth exemplary photovoltaic structure. The various dimensions such as a taper angle α, a base lateral dimension bd, a tapered-end lateral dimension td, the frustum height h1, and the height h of the bristle 3700 may be the same as in the various embodiments of the first exemplary photovoltaic structure. FIG. 44A illustrates a photovoltaic bristle including a hemi-spheroid region. FIG. 44B illustrates a photovoltaic bristle including a substantially planar top surface. FIG. 44C illustrates a photovoltaic bristle including a transparent conductive material as the material of the core conductive material layer 106.

Figure 45:
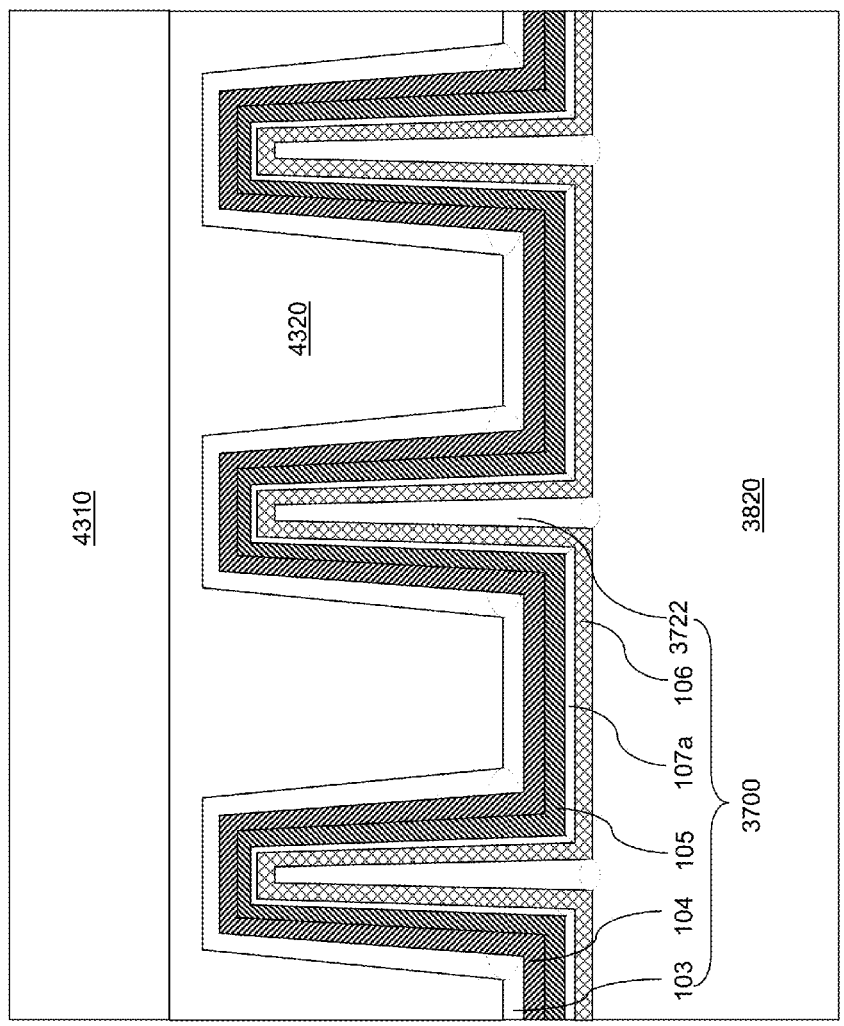
FIG. 45 is a vertical cross-sectional view of a sixth exemplary photovoltaic structure.

Referring to FIG. 45, a sixth exemplary photovoltaic structure may be derived from the fifth exemplary photovoltaic structure by substituting a moldable material layer 3820 for a combination of a sheet substrate 3710 and a moldable material layer 3820. In other words, the combination of the sheet substrate 3710 and the moldable material layer 3720 of the fifth exemplary photovoltaic structure is replaced with the moldable material layer 3820 that provides mechanical support to the photovoltaic bristles of the sixth exemplary photovoltaic structure.

Each of the fifth and sixth exemplary photovoltaic structures comprises a dielectric material layer (3720, 3820), which is a moldable material layer. The dielectric material layer (3720, 3820) comprises a planar portion having a uniform thickness and an array of protruding portions 3722 extending from a planar surface of the planar portion; and a layer stack (103, 104, 105, 107a, 106) located on the dielectric material layer (3720, 3820) and comprising a core conductive material layer 106, a photovoltaic material layer (104, 105), and a transparent conductive material layer 103. The core conductive material layer 106 is in contact with the planar surface and the protruding portions 3722 of the dielectric material layer (3720, 3820). The transparent conductive material layer 103 is spaced from the core conductive material layer 106 by the photovoltaic material layer (104, 105). Each combination of a protruding portion 3722 of the dielectric material layer (3720, 3820) and portions of the layer stack (103, 104, 105, 107a, 106) surrounding the protruding portion 3722 constitutes a photovoltaic bristle (103, 104, 105, 107a, 106, 3722).

In one embodiment, the dielectric material layer (3720, 3820) comprises a self-planarizing polymer material, which forms a film of a uniform thickness prior to imprinting, and is subsequently cured to provide the dielectric cores 3722 that do not change shapes. In one embodiment, the dielectric material layer (3720, 3820) comprises an optically transparent material. The core conductive material layer 106 is deposited on surfaces of the dielectric cores 3722 and the top surface of the planar portion of the dielectric material layer (3720, 3820), i.e., the moldable material layer. The photovoltaic material layer (104, 105) is deposited on the core conductive material layer 106. The transparent conductive material layer 103 is deposited on the photovoltaic material layer (104, 105).

In one embodiment, the entirety of the dielectric material layer (3720, 3820) may be a single material layer without any interface or seam therein. In one embodiment, the entirety of the dielectric material layer (3720, 3820) may have a homogeneous material composition throughout. In one embodiment, the dielectric material layer (3720, 3820) comprises an optically transparent material. In one embodiment, each protruding portion (i.e., each dielectric core 3722) of the dielectric material layer (3720, 3820) may have a variable horizontal cross-sectional area that decreases strictly with a vertical distance from the planar surface of the planar portion of the dielectric material layer (3720, 3820). In one embodiment, each protruding portion of the dielectric material layer may have a conical shape.

In one embodiment, a substrate (e.g., a sheet substrate 3710) contacting another planar surface of the planar portion of the dielectric material layer 3720 and vertically spaced from the layer stack (103, 104, 105, 107a, 106) by the planar portion of the dielectric material layer 3720. In one embodiment, each protruding portion 3722 may have a lateral dimension less than 10 microns and a height less than 100 microns.

In one embodiment, an optically transparent layer 4320 may overlie the layer stack (103, 104, 105, 107a, 106). The entirety of the top surface of the optically transparent layer 4320 may be planar. A transparent substrate (such as a passivation substrate 4310) may be located on the top surface of the optically transparent layer 4320. The optically transparent layer 4320 may have a refractive index less than a refractive index of the transparent conductive material layer 103. In one embodiment, the optically transparent layer 4320 may comprise a polymer material, which may be any transparent material that may be employed for the dielectric material layer 4120 discussed above.

In one embodiment, the dielectric material layer (3720, 3820) of the fifth or sixth exemplary photovoltaic structure may comprise a moldable material selected from a lacquer, a silicone precursor material, a gel derived from a sol containing a polymerizable colloid, and a glass transition material. In one embodiment, the dielectric material layer (3720, 3820) comprises a moldable material selected from a polymer resin-based plastic material, an organic material including at least one resin, a flexible glass material based on silica, phenylalkyl catechol-based lacquers, nitrocellulose lacquers, acrylic lacquers, water-based lacquers, silicone, a gel of silicon oxide, and a gel of dielectric metal oxide. In one embodiment, the dielectric material layer (3720, 3820) comprises a polymer material.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method of forming a photovoltaic structure, comprising:
    forming a pattern of trenches extending downward from a top surface of an optically transparent layer; and
    sequentially depositing a transparent conductive material layer, a photovoltaic material layer, and a core conductive material layer within the pattern of trenches in the moldable material layer, wherein a via cavity laterally bound by a surface of the core conductive material layer is formed within, or above, each trench.

2. The method of claim 1, further comprising disposing a passivation substrate having a planar bottom surface directly on a physically exposed planar surface of the core conductive material layer, wherein a plurality of via cavities is laterally surrounded by the core conductive material layer and is vertically bounded by the passivation substrate.

3. The method of claim 2, wherein each of the plurality of via cavities is a three-dimensional closed shape defined by a portion of the planar bottom surface of the passivation substrate and a non-planar portion of a contiguous surface of the core conductive material layer.

4. The method of claim 3, wherein the three-dimensional closed shape has a variable horizontal cross-sectional area that decreases strictly with a vertical distance from the planar bottom surface of the passivation substrate.

5. The method of claim 3, wherein a seam of the core conductive material layer extends vertically from an apex of each of the plurality of via cavities.

6. The method of claim 2, wherein the plurality of via cavities is filled with a gas or is in vacuum upon disposition of the passivation substrate.

7. The method of claim 1, wherein the optically transparent layer is formed by:
    providing a moldable material layer on, or in, a substrate; and
    imprinting a die including a pattern of protruding structures and incorporated into a web onto the moldable material layer, wherein the patterned moldable material layer is the optically transparent layer including the pattern of trenches.

8. The method of claim 7, wherein the moldable material layer is selected from a material selected from a lacquer, a plastic material, a resin material, a silicone precursor material, a gel derived from a sol, and a glass transition material.

9. The method of claim 7, wherein the moldable material layer is selected from phenylalkyl catechol-based lacquers, nitrocellulose lacquers, acrylic lacquers, and water-based lacquers.

10. The method of claim 7, wherein the moldable material layer comprises silicone.

11. The method of claim 7, further comprising:
    applying a sol onto the substrate; and
    inducing transition of the sol into a gel to form the moldable material layer, wherein the moldable material layer is selected from a gel of silicon oxide and a gel of dielectric metal oxide.

12. The method of claim 7, wherein the moldable material layer comprises a glass transition material selected from terephthalate (PET), polypropylene (PP), polyethylene (PE), nylon, polyoxymethylene (POM), polybutylene terephthalate (PBT), polytetrafluoroethylene (PTFE), polyvinylidene fluoride (PVFD), polyethylenechlorotrifluoroethylene (PECTFE), polyethylene tetrafluoroethylene (PETFE), polycarbonate (PC), polymethylmethacrylate (PMMA), polymethacrylate (PMA), cyclic polyolefin, methylmethylacrylic acid, hydroxyethylmethylmethacrylate, fluorofunctinoalized methylmethacrylate, silicone-functionalized methylmethacrylate, soda-lime-silica glass, borophosphosilicate glass, and phosphosilicate glass.

13. The method of claim 7, wherein:
    the substrate is a transparent substrate; and
    the moldable material layer formed on the transparent substrate, and the bottommost portions of the trenches are formed above the interface between the transparent substrate and the moldable material layer.

14. The method of claim 7, wherein the substrate consists of the moldable material layer.

* * * * *